US009723696B2

(12) United States Patent
Carrigan et al.

(10) Patent No.: US 9,723,696 B2
(45) Date of Patent: Aug. 1, 2017

(54) HANDHELD DEVICE FOR CONTROLLING SETTINGS OF A LIGHTING FIXTURE

(71) Applicant: Cree, Inc., Durham, NC (US)

(72) Inventors: Brian Carrigan, Carboro, NC (US); John J. Trainor, Durham, NC (US); Joseph P. Chobot, Morrisville, NC (US); Matthew Deese, Raleigh, NC (US); Keith Bryan, Raleigh, NC (US)

(73) Assignee: Cree, Inc., Durham, NC (US)

( * ) Notice: Subject to any disclaimer, the term of this patent is extended or adjusted under 35 U.S.C. 154(b) by 1 day.

(21) Appl. No.: 14/498,219

(22) Filed: Sep. 26, 2014

(65) Prior Publication Data

US 2015/0015145 A1 Jan. 15, 2015

Related U.S. Application Data

(63) Continuation-in-part of application No. 13/782,040, filed on Mar. 1, 2013, now Pat. No. 8,975,827, and a
(Continued)

(51) Int. Cl.
G08B 1/08 (2006.01)
H05B 37/02 (2006.01)
H05B 33/08 (2006.01)

(52) U.S. Cl.
CPC ..... *H05B 37/0272* (2013.01); *H05B 33/0842* (2013.01); *H05B 37/0218* (2013.01);
(Continued)

(58) Field of Classification Search
CPC ................ H05B 37/02; H05B 37/0272; H05B 37/0254; H05B 37/0227; H05B 33/0842
See application file for complete search history.

(56) References Cited

U.S. PATENT DOCUMENTS

D259,514 S 6/1981 Welch
D317,363 S 6/1991 Welch
(Continued)

FOREIGN PATENT DOCUMENTS

AT 492840 T 1/2011
AU 3666702 A 5/2002
(Continued)

OTHER PUBLICATIONS

Author Unknown, "Cluster Analysis", Wikipedia—the free encyclopedia, Updated May 21, 2013, Retrieved on May 30, 2013, http://en.wikipedia.org/wiki/cluster_analysis, 16 pages.
(Continued)

*Primary Examiner* — Tung X Le
*Assistant Examiner* — Raymond R Chai
(74) *Attorney, Agent, or Firm* — Withrow & Terranova, P.L.L.C.

(57) ABSTRACT

A handheld device having a communication interface configured to wirelessly communicate with a plurality of lighting fixtures and control circuitry is described. In one embodiment, the circuitry is configured to effect selection of a first lighting fixture in a first group of lighting fixtures via the communication interface; identify the first group of lighting fixtures based on information from the first lighting fixture; determine new settings for the first group of lighting fixtures; and send the new settings to each of the first group of lighting fixtures via the communication interface, wherein the first group of lighting fixtures includes a defined plurality of lighting fixtures that are associated to operate in a coordinated manner.

20 Claims, 62 Drawing Sheets

Related U.S. Application Data continuation-in-part of application No. 13/589,899, filed on Aug. 20, 2012, and a continuation-in-part of application No. 13/589,928, filed on Aug. 20, 2012.

(60) Provisional application No. 61/923,999, filed on Jan. 6, 2014, provisional application No. 61/932,058, filed on Jan. 27, 2014, provisional application No. 61/738,749, filed on Dec. 18, 2012, provisional application No. 61/666,920, filed on Jul. 1, 2012.

(52) U.S. Cl.
CPC ..... *H05B 37/0227* (2013.01); *H05B 37/0254* (2013.01); *Y02B 20/46* (2013.01)

(56) References Cited

U.S. PATENT DOCUMENTS

| | | |
|---|---|---|
| 5,079,680 A | 1/1992 | Kohn |
| D344,361 S | 2/1994 | Friedman et al. |
| D349,582 S | 8/1994 | Bain et al. |
| 5,471,119 A | 11/1995 | Ranganath et al. |
| D373,438 S | 9/1996 | McCann-Compton et al. |
| 6,100,643 A | 8/2000 | Nilssen |
| 6,118,230 A | 9/2000 | Fleischmann |
| 6,137,408 A | 10/2000 | Okada |
| 6,160,359 A | 12/2000 | Fleischmann |
| 6,166,496 A | 12/2000 | Lys et al. |
| 6,437,692 B1 | 8/2002 | Petite et al. |
| 6,441,558 B1 | 8/2002 | Muthu et al. |
| 6,528,954 B1 | 3/2003 | Lys et al. |
| 6,553,218 B1 | 4/2003 | Boesjes |
| 6,735,630 B1 | 5/2004 | Gelvin et al. |
| 6,804,790 B2 | 10/2004 | Rhee et al. |
| 6,826,607 B1 | 11/2004 | Gelvin et al. |
| 6,832,251 B1 | 12/2004 | Gelvin et al. |
| 6,859,831 B1 | 2/2005 | Gelvin et al. |
| 6,914,893 B2 | 7/2005 | Petite |
| 6,975,851 B2 | 12/2005 | Boesjes |
| 6,990,394 B2 | 1/2006 | Pasternak |
| 7,009,348 B2 | 3/2006 | Mogilner et al. |
| 7,020,701 B1 | 3/2006 | Gelvin et al. |
| 7,031,920 B2 | 4/2006 | Dowling et al. |
| 7,103,511 B2 | 9/2006 | Petite |
| 7,139,562 B2 | 11/2006 | Matsui |
| 7,288,902 B1 | 10/2007 | Melanson |
| 7,305,467 B2 | 12/2007 | Kaiser et al. |
| 7,313,399 B2 | 12/2007 | Rhee et al. |
| D560,006 S | 1/2008 | Garner et al. |
| 7,344,279 B2 | 3/2008 | Mueller et al. |
| D565,771 S | 4/2008 | Garner et al. |
| D567,431 S | 4/2008 | Garner et al. |
| 7,391,297 B2 | 6/2008 | Cash et al. |
| D582,598 S | 12/2008 | Kramer et al. |
| 7,468,661 B2 | 12/2008 | Petite et al. |
| 7,482,567 B2 | 1/2009 | Hoelen et al. |
| 7,484,008 B1 | 1/2009 | Gelvin et al. |
| D586,950 S | 2/2009 | Garner et al. |
| D587,390 S | 2/2009 | Garner et al. |
| D588,064 S | 3/2009 | Garner et al. |
| 7,522,563 B2 | 4/2009 | Rhee |
| D594,576 S | 6/2009 | Chan et al. |
| 7,587,289 B1 | 9/2009 | Sivertsen |
| 7,606,572 B2 | 10/2009 | Rhee et al. |
| 7,638,743 B2 | 12/2009 | Bartol et al. |
| 7,649,456 B2 | 1/2010 | Wakefield et al. |
| 7,657,249 B2 | 2/2010 | Boesjes |
| 7,683,301 B2 | 3/2010 | Papamichael et al. |
| 7,697,492 B2 | 4/2010 | Petite |
| 7,797,367 B1 | 9/2010 | Gelvin et al. |
| 7,844,308 B2 | 11/2010 | Rhee et al. |
| 7,844,687 B1 | 11/2010 | Gelvin et al. |
| 7,868,562 B2 | 1/2011 | Salsbury et al. |
| 7,891,004 B1 | 2/2011 | Gelvin et al. |
| 7,904,569 B1 | 3/2011 | Gelvin et al. |
| 7,924,174 B1 | 4/2011 | Gananathan |
| 7,924,927 B1 | 4/2011 | Boesjes |
| 7,948,930 B2 | 5/2011 | Rhee |
| 8,011,794 B1 | 9/2011 | Sivertsen |
| 8,021,021 B2 | 9/2011 | Paolini |
| 8,035,320 B2 | 10/2011 | Sibert |
| 8,079,118 B2 | 12/2011 | Gelvin et al. |
| 8,098,615 B2 | 1/2012 | Rhee |
| 8,126,429 B2 | 2/2012 | Boesjes |
| 8,140,658 B1 | 3/2012 | Gelvin et al. |
| D663,048 S | 7/2012 | Chen |
| 8,228,163 B2 | 7/2012 | Cash |
| 8,271,058 B2 | 9/2012 | Rhee et al. |
| 8,274,928 B2 | 9/2012 | Dykema et al. |
| 8,275,471 B2 | 9/2012 | Huizenga et al. |
| 8,344,660 B2 | 1/2013 | Mohan et al. |
| 8,364,325 B2 | 1/2013 | Huizenga et al. |
| 8,461,781 B2 | 6/2013 | Schenk et al. |
| 8,466,626 B2 | 6/2013 | Null et al. |
| 8,497,634 B2 | 7/2013 | Scharf |
| 8,511,851 B2 | 8/2013 | Van de Ven et al. |
| 8,536,792 B1 | 9/2013 | Roosli |
| 8,536,984 B2 | 9/2013 | Benetz et al. |
| 8,604,714 B2 | 12/2013 | Mohan et al. |
| 8,610,377 B2 | 12/2013 | Chemel et al. |
| D703,841 S | 4/2014 | Feng et al. |
| D708,360 S | 7/2014 | Shibata et al. |
| 8,829,800 B2 | 9/2014 | Harris |
| 8,829,821 B2 | 9/2014 | Chobot et al. |
| 9,041,315 B2 | 5/2015 | Cho et al. |
| 9,326,358 B2 | 4/2016 | Campbell et al. |
| 9,351,381 B2 | 5/2016 | Verfuerth et al. |
| 9,408,268 B2 | 8/2016 | Recker et al. |
| 9,504,133 B2 | 11/2016 | Verfuerth et al. |
| 9,538,617 B2 | 1/2017 | Rains, Jr. et al. |
| 2002/0195975 A1 | 12/2002 | Schanberger et al. |
| 2004/0001963 A1 | 1/2004 | Watanabe et al. |
| 2004/0002792 A1 | 1/2004 | Hoffknecht |
| 2004/0051467 A1 | 3/2004 | Balasubramaniam et al. |
| 2004/0193741 A1 | 9/2004 | Pereira et al. |
| 2004/0232851 A1 | 11/2004 | Roach, Jr. et al. |
| 2005/0127381 A1 | 6/2005 | Vitta et al. |
| 2005/0132080 A1 | 6/2005 | Rhee et al. |
| 2006/0022214 A1 | 2/2006 | Morgan et al. |
| 2006/0044152 A1 | 3/2006 | Wang |
| 2006/0066266 A1 | 3/2006 | Li Lim et al. |
| 2006/0125426 A1 | 6/2006 | Veskovic et al. |
| 2006/0262545 A1 | 11/2006 | Piepgras et al. |
| 2007/0040512 A1 | 2/2007 | Jungwirth et al. |
| 2007/0085700 A1 | 4/2007 | Walters et al. |
| 2007/0126656 A1 | 6/2007 | Huang et al. |
| 2007/0132405 A1 | 6/2007 | Hillis et al. |
| 2007/0189000 A1 | 8/2007 | Papamichael et al. |
| 2007/0291483 A1 | 12/2007 | Lys |
| 2008/0031213 A1 | 2/2008 | Kaiser et al. |
| 2008/0088435 A1* | 4/2008 | Cash .................. H05B 37/0272 340/539.11 |
| 2008/0197790 A1 | 8/2008 | Mangiaracina et al. |
| 2008/0218087 A1 | 9/2008 | Crouse et al. |
| 2009/0021955 A1 | 1/2009 | Kuang et al. |
| 2009/0026966 A1 | 1/2009 | Budde et al. |
| 2009/0184616 A1 | 7/2009 | Van De Ven et al. |
| 2009/0212718 A1 | 8/2009 | Kawashima et al. |
| 2009/0230894 A1 | 9/2009 | De Goederen et al. |
| 2009/0231832 A1 | 9/2009 | Zukauskas et al. |
| 2009/0284169 A1 | 11/2009 | Valois |
| 2009/0284184 A1 | 11/2009 | Valois et al. |
| 2009/0302994 A1 | 12/2009 | Rhee et al. |
| 2009/0302996 A1 | 12/2009 | Rhee et al. |
| 2009/0305644 A1 | 12/2009 | Rhee et al. |
| 2009/0315485 A1 | 12/2009 | Verfuerth et al. |
| 2009/0315668 A1 | 12/2009 | Leete, III et al. |
| 2010/0007289 A1 | 1/2010 | Budike, Jr. |
| 2010/0084992 A1 | 4/2010 | Valois et al. |
| 2010/0128634 A1 | 5/2010 | Rhee et al. |
| 2010/0134051 A1 | 6/2010 | Huizenga et al. |
| 2010/0148940 A1 | 6/2010 | Gelvin et al. |
| 2010/0150122 A1 | 6/2010 | Berger et al. |
| 2010/0201516 A1 | 8/2010 | Gelvin et al. |

(56) References Cited

U.S. PATENT DOCUMENTS

| | | |
|---|---|---|
| 2010/0203515 A1 | 8/2010 | Rigler |
| 2010/0270935 A1 | 10/2010 | Otake et al. |
| 2010/0295473 A1* | 11/2010 | Chemel ............... H05B 37/029 315/294 |
| 2010/0301770 A1 | 12/2010 | Chemel et al. |
| 2010/0301773 A1 | 12/2010 | Chemel et al. |
| 2010/0301774 A1 | 12/2010 | Chemel et al. |
| 2010/0308664 A1 | 12/2010 | Face et al. |
| 2011/0025469 A1 | 2/2011 | Erdmann et al. |
| 2011/0031897 A1 | 2/2011 | Henig et al. |
| 2011/0035491 A1 | 2/2011 | Gelvin et al. |
| 2011/0057581 A1 | 3/2011 | Ashar et al. |
| 2011/0080120 A1* | 4/2011 | Talstra .................. G08C 17/02 315/312 |
| 2011/0101871 A1* | 5/2011 | Schenk ............. H05B 37/0272 315/149 |
| 2011/0115407 A1 | 5/2011 | Wibben et al. |
| 2011/0133655 A1 | 6/2011 | Recker et al. |
| 2011/0137757 A1 | 6/2011 | Paolini et al. |
| 2011/0156596 A1 | 6/2011 | Salsbury |
| 2011/0178650 A1 | 7/2011 | Picco |
| 2011/0199004 A1 | 8/2011 | Henig et al. |
| 2011/0199020 A1 | 8/2011 | Henig et al. |
| 2011/0215725 A1 | 9/2011 | Paolini |
| 2011/0221350 A1 | 9/2011 | Staab |
| 2011/0249441 A1 | 10/2011 | Donegan |
| 2011/0254554 A1 | 10/2011 | Harbers |
| 2011/0298598 A1 | 12/2011 | Rhee |
| 2012/0007725 A1 | 1/2012 | Penisoara et al. |
| 2012/0013257 A1 | 1/2012 | Sibert |
| 2012/0026733 A1 | 2/2012 | Graeber et al. |
| 2012/0040606 A1 | 2/2012 | Verfuerth |
| 2012/0050535 A1 | 3/2012 | Densham et al. |
| 2012/0079149 A1 | 3/2012 | Gelvin et al. |
| 2012/0082062 A1 | 4/2012 | Mccormack |
| 2012/0086345 A1 | 4/2012 | Tran |
| 2012/0087290 A1 | 4/2012 | Rhee et al. |
| 2012/0091915 A1 | 4/2012 | Ilyes et al. |
| 2012/0126705 A1 | 5/2012 | Pezzutti et al. |
| 2012/0130544 A1 | 5/2012 | Mohan et al. |
| 2012/0136485 A1 | 5/2012 | Weber et al. |
| 2012/0139426 A1 | 6/2012 | Ilyes et al. |
| 2012/0147604 A1 | 6/2012 | Farmer |
| 2012/0147808 A1 | 6/2012 | Rhee |
| 2012/0153840 A1 | 6/2012 | Dahlen et al. |
| 2012/0161643 A1 | 6/2012 | Henig et al. |
| 2012/0176041 A1 | 7/2012 | Birru |
| 2012/0206050 A1 | 8/2012 | Spero |
| 2012/0223657 A1 | 9/2012 | Van de Ven |
| 2012/0224457 A1 | 9/2012 | Kim et al. |
| 2012/0229407 A1 | 9/2012 | Archer |
| 2012/0230696 A1 | 9/2012 | Pederson et al. |
| 2012/0235579 A1 | 9/2012 | Chemel et al. |
| 2012/0235600 A1 | 9/2012 | Simonian et al. |
| 2012/0242242 A1 | 9/2012 | Linz et al. |
| 2012/0242254 A1 | 9/2012 | Kim et al. |
| 2012/0271477 A1 | 10/2012 | Okubo et al. |
| 2012/0299485 A1 | 11/2012 | Mohan et al. |
| 2012/0306375 A1 | 12/2012 | van de Ven |
| 2012/0306377 A1 | 12/2012 | Igaki et al. |
| 2012/0320262 A1 | 12/2012 | Chung |
| 2013/0002157 A1 | 1/2013 | van de Ven et al. |
| 2013/0002167 A1 | 1/2013 | Van de Ven |
| 2013/0013091 A1 | 1/2013 | Cavalcanti et al. |
| 2013/0026953 A1 | 1/2013 | Woytowitz |
| 2013/0049606 A1 | 2/2013 | Ferstl et al. |
| 2013/0051806 A1 | 2/2013 | Quilici et al. |
| 2013/0058258 A1 | 3/2013 | Boesjes |
| 2013/0063042 A1 | 3/2013 | Bora et al. |
| 2013/0069539 A1 | 3/2013 | So |
| 2013/0075484 A1 | 3/2013 | Rhee et al. |
| 2013/0077299 A1 | 3/2013 | Hussell et al. |
| 2013/0088168 A1 | 4/2013 | Mohan et al. |
| 2013/0093328 A1 | 4/2013 | Ivey et al. |
| 2013/0147366 A1 | 6/2013 | Huizenga et al. |
| 2013/0154831 A1 | 6/2013 | Gray et al. |
| 2013/0155392 A1 | 6/2013 | Barrilleaux et al. |
| 2013/0155672 A1 | 6/2013 | Vo et al. |
| 2013/0200805 A1 | 8/2013 | Scapa et al. |
| 2013/0221857 A1 | 8/2013 | Bowers |
| 2013/0229784 A1 | 9/2013 | Lessard et al. |
| 2013/0320862 A1 | 12/2013 | Campbell et al. |
| 2013/0328486 A1 | 12/2013 | Jones |
| 2013/0342911 A1 | 12/2013 | Bartol et al. |
| 2014/0001952 A1 | 1/2014 | Harris et al. |
| 2014/0001959 A1 | 1/2014 | Motley et al. |
| 2014/0001962 A1 | 1/2014 | Harris |
| 2014/0001977 A1 | 1/2014 | Zacharchuk et al. |
| 2014/0062678 A1 | 3/2014 | de Clercq et al. |
| 2014/0167621 A1 | 6/2014 | Trott et al. |
| 2014/0167646 A1 | 6/2014 | Zukauskas et al. |
| 2014/0212090 A1 | 7/2014 | Wilcox et al. |
| 2014/0232299 A1 | 8/2014 | Wang |
| 2014/0268790 A1 | 9/2014 | Chobot et al. |
| 2014/0312777 A1 | 10/2014 | Shearer et al. |
| 2015/0008827 A1 | 1/2015 | Carrigan et al. |
| 2015/0008828 A1 | 1/2015 | Carrigan et al. |
| 2015/0008829 A1 | 1/2015 | Lurie et al. |
| 2015/0008831 A1 | 1/2015 | Carrigan et al. |
| 2015/0022096 A1 | 1/2015 | Deixler |
| 2015/0042243 A1 | 2/2015 | Picard |
| 2015/0048758 A1 | 2/2015 | Carrigan et al. |
| 2015/0160673 A1 | 6/2015 | Vasylyev |
| 2015/0195883 A1 | 7/2015 | Harris et al. |
| 2015/0264780 A1 | 9/2015 | Harris et al. |
| 2015/0345762 A1 | 12/2015 | Creasman et al. |
| 2015/0351169 A1 | 12/2015 | Pope et al. |
| 2015/0351187 A1 | 12/2015 | McBryde et al. |
| 2015/0351191 A1 | 12/2015 | Pope et al. |
| 2016/0029464 A1 | 1/2016 | Hughes et al. |

FOREIGN PATENT DOCUMENTS

| | | |
|---|---|---|
| AU | 2002219810 A8 | 5/2002 |
| AU | 2002352922 A1 | 6/2003 |
| CA | 2426769 | 5/2002 |
| CA | 2511368 A1 | 5/2002 |
| CN | 101461151 A | 6/2009 |
| CN | 102119507 A | 7/2011 |
| DE | 60143707 D1 | 2/2011 |
| EP | 1330699 A1 | 7/2003 |
| EP | 1334608 A2 | 8/2003 |
| EP | 1461907 A1 | 9/2004 |
| EP | 1719363 A2 | 11/2006 |
| EP | 1886415 A2 | 2/2008 |
| EP | 2304311 A1 | 4/2011 |
| EP | 2327184 A1 | 6/2011 |
| EP | 2440017 A2 | 4/2012 |
| HK | 1114508 | 10/2008 |
| IN | 4576/KOLNP/2007 | 7/2008 |
| JP | H11345690 A | 12/1999 |
| JP | 2005510956 A | 4/2005 |
| JP | 3860116 B2 | 12/2006 |
| JP | 3896573 B2 | 3/2007 |
| JP | 2010198877 | 9/2010 |
| JP | 2011526414 A | 10/2011 |
| KR | 20060050614 A | 5/2006 |
| KR | 20080025095 A | 3/2008 |
| WO | 0126068 A1 | 4/2001 |
| WO | 0126327 A2 | 4/2001 |
| WO | 0126328 A2 | 4/2001 |
| WO | 0126329 A2 | 4/2001 |
| WO | 0126331 A2 | 4/2001 |
| WO | 0126332 A2 | 4/2001 |
| WO | 0126333 A2 | 4/2001 |
| WO | 0126334 A2 | 4/2001 |
| WO | 0126335 A2 | 4/2001 |
| WO | 0126338 A2 | 4/2001 |
| WO | 0239242 A1 | 5/2002 |
| WO | 0241604 A2 | 5/2002 |
| WO | 03047175 A1 | 6/2003 |
| WO | 2004109966 A2 | 12/2004 |
| WO | 2006095316 A1 | 9/2006 |
| WO | 2006130662 A2 | 12/2006 |

(56) References Cited

FOREIGN PATENT DOCUMENTS

| WO | 2007102097 A1 | 9/2007 |
| --- | --- | --- |
| WO | 2009011898 A2 | 1/2009 |
| WO | 2009076492 A1 | 6/2009 |
| WO | 2009145747 A1 | 12/2009 |
| WO | 2009151416 A1 | 12/2009 |
| WO | 2009158514 A1 | 12/2009 |
| WO | 2010010493 A2 | 1/2010 |
| WO | 2010047971 A2 | 4/2010 |
| WO | 2010122457 A2 | 10/2010 |
| WO | 2011087681 A1 | 7/2011 |
| WO | 2011090938 A1 | 7/2011 |
| WO | 2011152968 A1 | 12/2011 |
| WO | 2012112813 A2 | 8/2012 |
| WO | 2012125502 A2 | 9/2012 |
| WO | 2013050970 A1 | 4/2013 |
| WO | 2014120971 A1 | 8/2014 |

OTHER PUBLICATIONS

Author Unknown, "IEEE Standard for Information Technology—Telecommunications and Information Exchange Between Systems—Local and Metropolitan Area Networks—Specific Requirements—Part 3: Carrier Sense Multiple Access with Collision Detection (CSMA/CD) Access Method and Physical Layer Specifications—Amendment: Data Terminal Equipment (DTE) Power Via Media Dependent Interface (MDI)," Standard 802.3af-2003, Jun. 18, 2003, The Institute of Electrical and Electronics Engineers, Inc., 133 pages.

Author Unknown, "IEEE Standard for Information Technology—Telecommunications and Information Exchange Between Systems—Local and Metropolitan Area Networks—Specific Requirements—Part 3: Carrier Sense Multiple Access with Collision Detection (CSMA/CD) Access Method and Physical Layer Specifications—Amendment 3: Data Terminal Equipment (DTE) Power via the Media Dependent Interface (MDI) Enhancements," Standard 802.3at-2009, Sep. 11, 2009, The Institute of Electrical and Electronics Engineers, Inc., 141 pages.

Author Unknown, "Multi-Agent System", Wikipedia—the free encyclopedia, Updated Apr. 18, 2013, Retrieved May 30, 2013, http://en.wikipedia.org/wiki/multi-agent_system, 7 pages.

Author Unknown, i2C-Bus: What's That?, Updated 2012, Retrieved May 30, 2013, http://www.i2c-bus.org, 1 page.

Kuhn, Fabian et al., "Initializing Newly Deployed Ad Hoc & Sensor Network", The Tenth Annual International Conference on Mobile Computing and Networking (MobiCom '04), Sep. 26-Oct. 4, 2004, 15 pages, Philadelphia, PA.

Teasdale, Dana et al., "Annual Technical Progress Report: Adapting Wireless Technology to Lighting Control and Environmental Sensing," Dust Networks, Aug. 1, 2004, 41 pages.

Non-Final Office Action for U.S. Appl. No. 13/782,022, mailed Nov. 14, 2014, 14 pages.

International Search Report and Written Opinion for PCT/US2013/075723, mailed May 9, 2014, 8 pages.

Non-Final Office Action for U.S. Appl. No. 13/782,040, mailed May 8, 2013, 10 pages.

Final Office Action for U.S. Appl. No. 13/782,040, mailed Oct. 18, 2013, 16 pages.

Non-Final Office Action for U.S. Appl. No. 13/782,040, mailed Feb. 11, 2014, 10 pages.

Notice of Allowance for U.S. Appl. No. 13/782,040 mailed Jul. 23, 2014, 8 pages.

Notice of Allowance for U.S. Appl. No. 13/782,040 mailed Nov. 17, 2014, 8 pages.

International Search Report and Written Opinion for International Application PCT/US2013/075729, mailed Apr. 29, 2014, 8 pages.

Non-Final Office Action for U.S. Appl. No. 13/782,053, mailed Nov. 14, 2014, 11 pages.

Invitation to Pay Additional Fees and Partial International Search for PCT/US2013/075737, mailed May 13, 2014, 5 pages.

International Search Report and Written Opinion for PCT/US2013/075737, mailed Aug. 27, 2014, 11 pages.

Non-Final Office Action for U.S. Appl. No. 13/782,068, mailed Jul. 16, 2013, 6 pages.

Notice of Allowance for U.S. Appl. No. 13/782,068, mailed Oct. 22, 2013, 9 pages.

Non-Final Office Action for U.S. Appl. No. 13/782,068, mailed Nov. 15, 2013, 5 pages.

Final Office Action for U.S. Appl. No. 13/782,068, mailed Mar. 7, 2014, 7 pages.

Notice of Allowance for U.S. Appl. No. 13/782,068, mailed May 12, 2014, 7 pages.

Non-Final Office Action for U.S. Appl. No. 13/782,068, mailed Aug. 15, 2014, 6 pages.

Invitation to Pay Additional Fees and Partial International Search for PCT/US2013/075742, mailed May 14, 2014, 6 pages.

International Search Report and Written Opinion for PCT/US2013/075742, mailed Aug. 27, 2014, 11 pages.

Quayle Action for U.S. Appl. No. 13/782,078, mailed Jun. 12, 2013, 4 pages.

Notice of Allowance for U.S. Appl. No. 13/782,078, mailed Sep. 16, 2013, 7 pages.

Supplemental Notice of Allowability for U.S. Appl. No. 13/782,078, mailed Sep. 27, 2013, 2 pages.

International Search Report and Written Opinion for PCT/US2013/075748, mailed May 9, 2014, 7 pages.

Non-Final Office Action for U.S. Appl. No. 13/782,096, mailed Jun. 10, 2013, 12 pages.

Final Office Action for U.S. Appl. No. 13/782,096, mailed Nov. 18, 2013, 15 pages.

Advisory Action for U.S. Appl. No. 13/782,096, mailed Jan. 27, 2014, 3 pages.

Examiner's Answer to the Appeal Brief for U.S. Appl. No. 13/782,096, mailed Jul. 7, 2014, 17 pages.

International Search Report and Written Opinion for PCT/US2013/075754, mailed May 15, 2014, 8 pages.

Non-Final Office Action for U.S. Appl. No. 13/782,131, mailed May 28, 2013, 10 pages.

Non-Final Office Action for U.S. Appl. No. 13/782,131, mailed Nov. 6, 2013, 8 pages.

Notice of Allowance for U.S. Appl. No. 13/782,131, mailed Feb. 20, 2014, 9 pages.

Notice of Allowance for U.S. Appl. No. 13/782,131, mailed Jun. 5, 2014, 5 pages.

Notice of Allowance for U.S. Appl. No. 13/782,131, mailed Oct. 28, 2014, 5 pages.

International Search Report and Written Opinion for PCT/US2013/075761, mailed May 15, 2014, 7 pages.

Requirement for Restriction/Election for U.S. Appl. No. 29/452,813, mailed Nov. 21, 2014, 6 pages.

Non-Final Office Action for U.S. Appl. No. 13/719,786, mailed Mar. 6, 2014, 12 pages.

Final Office Action for U.S. Appl. No. 13/719,786, mailed Jul. 29, 2014, 14 pages.

Non-Final Office Action for U.S. Appl. No. 13/719,786, mailed Nov. 20, 2014, 16 pages.

Invitation to Pay Additional Fees and Partial International Search Report for PCT/US2013/075777, mailed Jun. 5, 2014, 6 pages.

International Search Report and Written Opinion for PCT/US2013/075777, mailed Aug. 12, 2014, 14 pages.

U.S. Appl. No. 13/649,531, filed Oct. 11, 2012.

U.S. Appl. No. 13/589,899, filed Aug. 20, 2012.

Notice of Allowance for U.S. Appl. No. 13/782,022, mailed Apr. 27, 2015, 8 pages.

Notice of Allowance for U.S. Appl. No. 13/782,053, mailed Apr. 2, 2015, 8 pages.

Notice of Allowance for U.S. Appl. No. 29/452,813, mailed Mar. 18, 2015, 7 pages.

Supplemental Notice of Allowability for U.S. Appl. No. 29/452,813, mailed May 1, 2015, 4 pages.

Non-Final Office Action for U.S. Appl. No. 13/868,021, mailed Apr. 17, 2015, 10 pages.

(56) References Cited

OTHER PUBLICATIONS

Non-Final Office Action for U.S. Appl. No. 13/719,786, mailed Apr. 21, 2015, 13 pages.
International Search Report and Written Opinion for PCT/US2015/010050, mailed Mar. 24, 2015, 10 pages.
Notice of Allowance for U.S. Appl. No. 13/782,022, mailed Jul. 22, 2015, 8 pages.
International Preliminary Report on Patentability for PCT/US2013/075723, mailed Jul. 2, 2015, 6 pages.
International Preliminary Report on Patentability for PCT/US2013/075729, mailed Jul. 2, 2015, 6 pages.
Notice of Allowance for U.S. Appl. No. 13/782,053, mailed Jul. 17, 2015, 8 pages.
International Preliminary Report on Patentability for PCT/US2013/075737, mailed Jul. 2, 2015, 7 pages.
International Preliminary Report on Patentability for PCT/US2013/075742, mailed Jul. 2, 2015, 7 pages.
International Preliminary Report on Patentability for PCT/US2013/075748, mailed Jul. 2, 2015, 5 pages.
International Preliminary Report on Patentability for PCT/US2013/075754, mailed Jul. 2, 2015, 5 pages.
International Preliminary Report on Patentability for PCT/US2013/075761, mailed Jul. 2, 2015, 5 pages.
Notice of Allowance for U.S. Appl. No. 29/452,813, mailed Sep. 3, 2015, 7 pages.
Final Office Action for U.S. Appl. No. 13/868,021, mailed Jul. 23, 2015, 11 pages.
Non-Final Office Action for U.S. Appl. No. 13/719,786, mailed Sep. 18, 2015, 16 pages.
International Preliminary Report on Patentability for PCT/US2013/075777, mailed Jul. 2, 2015, 10 pages.
International Search Report and Written Opinion for PCT/US2015/032431, mailed Jul. 24, 2015, 11 pages.
Non-Final Office Action for U.S. Appl. No. 14/292,286, mailed Nov. 19, 2015, 16 pages.
Non-Final Office Action for U.S. Appl. No. 14/292,363, mailed Nov. 19, 2015, 9 pages.
Non-Final Office Action for U.S. Appl. No. 14/292,332, mailed Dec. 3, 2015, 18 pages.
Applicant-Initiated Interview Summary for U.S. Appl. No. 14/287,812, mailed Jan. 5, 2016, 4 pages.
Notice of Allowance for U.S. Appl. No. 13/782,068, mailed Oct. 1, 2015, 7 pages.
Non-Final Office Action for U.S. Appl. No. 14/287,812, mailed Oct. 23, 2015, 9 pages.
Examination Report for European Patent Application No. 13818895.8, mailed Mar. 11, 2016, 3 pages.
Final Office Action for U.S. Appl. No. 14/292,286, mailed Apr. 14, 2016, 16 pages.
Notice of Allowance for U.S. Appl. No. 14/292,363, mailed Apr. 4, 2016, 7 pages.
Non-Final Office Action for U.S. Appl. No. 14/498,168, mailed Mar. 29, 2016, 15 pages.
Non-Final Office Action for U.S. Appl. No. 14/498,119, mailed Mar. 18, 2016, 21 pages.
Non-Final Office Action for U.S. Appl. No. 14/498,197, mailed Apr. 26, 2016, 21 pages.
Notice of Allowance for U.S. Appl. No. 14/681,846, mailed Apr. 19, 2016, 7 pages.
Examination Report for European Patent Application No. 13814809.3, mailed Apr. 29, 2016, 5 pages.
First Office Action for Chinese Patent Application 201380073247.X, mailed May 17, 2016, 18 pages.
Examination Report for European Patent Application No. 13814810.1, mailed May 24, 2016, 4 pages.
Communication under Rule 164(2)(a) EPC for European Patent Application No. 13821549.6, mailed May 2, 2016, 4 pages.
Examination Report for European Patent Application No. 13821550.4, mailed May 2, 2016, 4 pages.
Examination Report for European Patent Application No. 13821552.0, mailed May 2, 2016, 4 pages.
International Search Report for International Patent Application No. PCT/US2016/024426, mailed Jun. 23, 2016, 11 pages.
Notice of Allowance for U.S. Appl. No. 13/782,068, mailed Jun. 3, 2016, 7 pages.
Non-Final Office Action for U.S. Appl. No. 13/868,021, mailed Jun. 27, 2016, 9 pages.
Final Office Action for U.S. Appl. No. 13/719,786, mailed Apr. 28, 2016, 19 pages.
Non-Final Office Action for U.S. Appl. No. 14/588,762, mailed Jun. 23, 2016, 12 pages.
Non-Final Office Action for U.S. Appl. No. 14/725,687, mailed Jun. 30, 2016, 18 pages.
Advisory Action for U.S. Appl. No. 14/292,286, mailed Jun. 20, 2016, 3 pages.
Final Office Action for U.S. Appl. No. 14/292,332, mailed May 12, 2016, 21 pages.
Final Office Action for U.S. Appl. No. 14/287,812, mailed May 6, 2016, 11 pages.
Non-Final Office Action for U.S. Appl. No. 14/498,147, mailed May 24, 2016, 15 pages.
Decision on Appeal for U.S. Appl. No. 13/782,096, mailed Jul. 8, 2016, 14 pages.
Advisory Action for U.S. Appl. No. 14/292,332, mailed Jul. 14, 2016, 3 pages.
Advisory Action for U.S. Appl. No. 14/287,812, mailed Jul. 14, 2016, 3 pages.
Notice of Allowance for U.S. Appl. No. 14/292,363, mailed Jul. 21, 2016, 8 pages.
Final Office Action for U.S. Appl. No. 14/498,168, mailed Jul. 27, 2016, 14 pages.
Final Office Action for U.S. Appl. No. 14/498,119, mailed Aug. 16, 2016, 15 pages.
Final Office Action for U.S. Appl. No. 14/498,197, mailed Aug. 11, 2016, 22 pages.
Examination and Search Report for European Patent Application No. 13821549.6, mailed Aug. 24, 2016, 7 pages.
International Preliminary Report on Patentability for PCT/US2015/010050, mailed Jul. 21, 2016, 7 pages.
English Translation of Notice of Reason(s) for Rejection for Japanese Patent Application No. 2015-549572, mailed Oct. 18, 2016, 5 pages.
Final Office Action for U.S. Appl. No. 13/868,021, mailed Nov. 25, 2016, 11 pages.
Non-Final Office Action for U.S. Appl. No. 13/719,786, mailed Nov. 28, 2016, 6 pages.
Final Office Action for U.S. Appl. No. 14/588,762, mailed Dec. 30, 2016, 18 pages.
Final Office Action for U.S. Appl. No. 14/725,687, mailed Nov. 1, 2016, 14 pages.
Notice of Allowance for U.S. Appl. No. 14/292,363, mailed Nov. 4, 2016, 8 pages.
Advisory Action and Examiner-Initiated Interview Summary for U.S. Appl. No. 14/498,119, mailed Dec. 8, 2016, 5 pages.
Advisory Action and Examiner-Initiated Interview Summary for U.S. Appl. No. 14/498,147, mailed Nov. 29, 2016, 4 pages.
Advisory Action and Examiner-Initiated Interview Summary for U.S. Appl. No. 14/498,197, mailed Dec. 8, 2016, 4 pages.
Advisory Action and Examiner-Initiated Interview Summary for U.S. Appl. No. 14/498,168, mailed Dec. 8, 2016, 5 pages.
International Preliminary Report on Patentability for PCT/US2015/032431, mailed Dec. 15, 2016, 9 pages.
Second Office Action for Chinese Patent Application No. 201380073247.X, mailed Dec. 21, 2016, 14 pages.
Advisory Action for U.S. Appl. No. 13/868,021, mailed Jan. 31, 2017, 2 pages.
Notice of Allowance and Examiner-Initiated Interview Summary for U.S. Appl. No. 14/498,119, mailed Jan. 23, 2017, 10 pages.
Second Office Action for Chinese Patent Application No. 201380073345.3, issued Dec. 30, 2016, 16 pages.
First Office Action for Chinese Patent Application No. 201380073345.3, issued Aug. 3, 2016, 23 pages.

(56) References Cited

OTHER PUBLICATIONS

Examination Report for European Patent Application No. 13814809.3, mailed Oct. 14, 2016, 5 pages.
Examination Report for European Patent Application No. 13814810.1, mailed Oct. 14, 2016, 4 pages.
Notice of Allowance for U.S. Appl. No. 13/782,096, mailed Sep. 26, 2016, 10 pages.
Advisory Action for U.S. Appl. No. 13/719,786, mailed Sep. 6, 2016, 3 pages.
Non-Final Office Action for U.S. Appl. No. 14/292,286, mailed Oct. 6, 2016, 15 pages.
Non-Final Office Action for U.S. Appl. No. 14/292,332, mailed Oct. 6, 2016, 20 pages.
Non-Final Office Action for U.S. Appl. No. 14/287,812, mailed Sep. 27, 2016, 13 pages.
Final Office Action for U.S. Appl. No. 14/498,147, mailed Sep. 8, 2016, 14 pages.
Digeronimo, John, "Search Report," EIC 2800, Tracking No. 533769, Scientific & Technical Information Center, Feb. 1, 2017, 16 pages.
Non-Final Office Action for U.S. Appl. No. 13/868,021, dated Mar. 3, 2017, 18 pages.
Final Office Action for U.S. Appl. No. 13/719,786, dated Apr. 19, 2017, 7 pages.
Advisory Action and Applicant-Initiated Interview Summary for U.S. Appl. No. 14/588,762, dated Mar. 3, 2017, 6 pages.
Non-Final Office Action for U.S. Appl. No. 14/588,762, dated Apr. 6, 2017, 13 pages.
Advisory Action for U.S. Appl. No. 14/725,687, dated Feb. 15, 2017, 3 pages.
Non-Final Office Action for U.S. Appl. No. 14/725,687, dated Apr. 6, 2017, 16 pages.
Final Office Action for U.S. Appl. No. 14/292,286, dated Mar. 27, 2017, 17 pages.
Non-Final Office Action for U.S. Appl. No. 14/498,168, dated Feb. 9, 2017, 15 pages.
Notice of Allowance for U.S. Appl. No. 14/292,332, dated Feb. 16, 2017, 8 pages.
Final Office Action for U.S. Appl. No. 14/287,812, dated Apr. 20, 2017, 12 pages.
Notice of Allowance and Examiner-Initiated Interview Summary for U.S. Appl. No. 14/498,147, dated Mar. 2, 2017, 11 pages.
Notice of Allowance for U.S. Appl. No. 14/498,197, dated Feb. 10, 2017, 9 pages.
Examination Report for European Patent Application No. 13814809.3, dated Apr. 7, 2017, 4 pages.
Examination Report for European Patent Application No. 13814810.1, dated Mar. 31, 2017, 6 pages.
Examination Report for European Patent Application No. 13821549.6, dated Apr. 6, 2017, 4 pages.
Examination Report for European Patent Application No. 13821550.4, dated Feb. 13, 2017, 5 pages.
Examination Report for European Patent Application No. 15700917.6, dated Apr. 20, 2017, 5 pages.
Notice of Reasons for Rejection for Japanese Patent Application No. 2015-549572, dated Apr. 25, 2017, 3 pages.
Third Office Action for Chinese Patent Application No. 201380073247.X, dated Apr. 6, 2017, 14 pages.
Examination Report for European Patent Application No. 13821550.4, dated Jun. 6, 2018, 5 pages.
First Office Action for Chinese Patent Application No. 201580012209.2, dated Mar. 16, 2017, 14 pages.
Notice of Allowance for U.S. Appl. No. 15/416,764, dated Jun. 6, 2017, 11 pages.
Final Office Action for U.S. Appl. No. 13/868,021, dated Jun. 8, 2017, 23 pages.
Notice of Allowance for U.S. Appl. No. 14/498,168, dated May 24, 2017, 9 pages.

* cited by examiner

|   | A | B | C | D | E | F | G | H | I | J | K | L | M | N | O | P | Q | R |
|---|---|---|---|---|---|---|---|---|---|---|---|---|---|---|---|---|---|---|
| A | 1 |   |   |   |   |   |   |   |   |   |   |   |   |   |   |   |   |   |
| B |   | 1 | 0.7 | 0.3 | 0.1 |   |   |   |   |   |   |   |   |   |   |   |   |   |
| C |   | 0.7 | 1 | 0.7 | 0.3 |   |   |   |   |   |   |   |   |   |   |   |   |   |
| D |   | 0.3 | 0.7 | 1 | 0.7 |   |   |   |   |   |   |   |   |   |   |   |   |   |
| E |   | 0.1 | 0.3 | 0.7 | 1 |   |   |   |   |   |   |   |   |   |   |   |   |   |
| F |   |   |   |   |   | 1 | 0.6 | 0.2 |   |   |   |   |   |   |   |   |   |   |
| G |   |   |   |   |   | 0.6 | 1 | 0.6 |   |   |   |   |   |   |   |   |   |   |
| H |   |   |   |   |   | 0.2 | 0.6 | 1 |   |   |   |   |   |   |   |   |   |   |
| I |   |   |   |   |   |   |   |   | 1 | 0.5 |   |   |   |   |   |   |   |   |
| J |   |   |   |   |   |   |   |   | 0.5 | 1 |   |   |   |   |   |   |   |   |
| K |   |   |   |   |   |   |   |   |   |   | 1 |   |   |   |   | 0.1 | 0.2 | 0.1 |
| L |   |   |   |   |   | 0.1 | 0.3 | 0.6 | 0.6 | 0.3 |   | 1 | 0.5 |   |   |   |   | 0.2 |
| M |   |   |   |   |   |   |   |   | 0.3 | 0.6 | 0.3 | 0.6 | 1 |   |   |   |   |   |
| N |   |   |   |   |   |   |   |   |   |   | 0.6 | 1 |   |   |   | 0.6 | 0.6 | 0.3 |
| O |   |   |   |   |   |   |   |   |   |   |   | 0.5 | 1 |   |   |   | 0.3 | 0.6 |
| N |   |   |   |   |   |   |   |   |   |   |   |   |   | 1 | 0.7 |   |   |   |
| O |   |   |   |   |   |   |   |   |   |   |   |   |   | 0.7 | 1 |   |   |   |
| P |   |   |   |   |   |   |   |   |   |   |   |   |   |   |   | 1 |   |   |
| Q |   |   |   |   |   | 0.1 |   | 0.2 | 0.2 | 0.1 |   | 0.6 | 0.3 |   |   |   | 1 | 0.5 |

*FIG. 7*

SPARE-PAIR POWER FEED

PHANTOM POWER FEED

HANDHELD DEVICE FOR CONTROLLING SETTINGS OF A LIGHTING FIXTURE

This application claims the benefit of U.S. Provisional Application No. 61/923,999 filed Jan. 6, 2014 and U.S. Provisional Application No. 61/932,058 filed Jan. 27, 2014 the disclosures of which are incorporated herein by reference in their entireties. This application is a continuation-in-part filing of U.S. patent application Ser. No. 13/782,040, now U.S. Pat. No. 8,975,827, filed Mar. 1, 2013, which claims the benefit of U.S. Provisional Application No. 61/738,749, filed Dec. 18, 2012, the disclosures of which are incorporated herein by reference in their entireties.

U.S. patent application Ser. No. 13/782,040 was further a continuation-in-part filing of U.S. patent application Ser. No. 13/589,899, filed Aug. 20, 2012; and Ser. No. 13/589,928, filed Aug. 20, 2012, each of which claims the benefit of U.S. Provisional Application No. 61/666,920, filed Jul. 1, 2012, the disclosures of which are incorporated herein by reference in their entireties.

CROSS-REFERENCE TO RELATED APPLICATIONS

This application is related to U.S. Application Ser. No. 14/498,119, filed Sep. 26, 2014, entitled HANDHELD DEVICE THAT IS CAPABLE OF INTERACTING WITH A LIGHTING FIXTURE; Ser. No. 14/498,147 filed Sep. 26, 2014, entitled ENHANCED LIGHTING FIXTURE; Ser. No. 14/498,168 filed on Sep. 26, 2014, entitled HANDHELD DEVICE FOR GROUPING A PLURALITY OF LIGHTING FIXTURES; and Ser. No. 14/498,197 filed on Sep. 26, 2014, entitled HANDHELD DEVICE FOR MERGING GROUPS OF LIGHTING FIXTURES, all filed concurrently herewith, the disclosures of which are incorporated herein by reference in their entireties.

FIELD OF THE DISCLOSURE

This application relates to a handheld device for controlling settings of a lighting fixture.

BACKGROUND

In recent years, a movement has gained traction to replace incandescent light bulbs with lighting fixtures that employ more efficient lighting technologies as well as to replace relatively efficient fluorescent lighting fixtures with lighting technologies that produce a more pleasing, natural light. One such technology that shows tremendous promise employs light emitting diodes (LEDs). Compared with incandescent bulbs, LED-based light fixtures are much more efficient at converting electrical energy into light, are longer lasting, and are also capable of producing light that is very natural. Compared with fluorescent lighting, LED-based fixtures are also very efficient, but are capable of producing light that is much more natural and more capable of accurately rendering colors. As a result, lighting fixtures that employ LED technologies are expected to replace incandescent and fluorescent bulbs in residential, commercial, and industrial applications.

Unlike incandescent bulbs that operate by subjecting a filament to a desired current, LED-based lighting fixtures require electronics to drive one or more LEDs. The electronics generally include a power supply and a special control circuitry to provide uniquely configured signals that are required to drive the one or more LEDs in a desired fashion. The presence of the control circuitry adds a potentially significant level of intelligence to the lighting fixtures that can be leveraged to employ various types of lighting control.

Lighting control systems for traditional or LED-based lighting fixtures generally employ a central controller to control a group of lighting fixtures. The central controller is configured to send commands or signals to each of the lighting fixtures in the group, and the lighting fixtures will respond to the commands or signals to turn on or off, dim to a desired level, and the like. As such, the lighting control decisions are made by the central controller based on inputs received by the central controller, and the lighting fixtures are simply controlled in response to these lighting control decisions.

SUMMARY

A handheld device having a communication interface configured to wirelessly communicate with a plurality of lighting fixtures and control circuitry is described. In one embodiment, the circuitry is configured to effect selection of a first lighting fixture in a first group of lighting fixtures via the communication interface; identify the first group of lighting fixtures based on information from the first lighting fixture; determine new settings for the first group of lighting fixtures; and send the new settings to each of the first group of lighting fixtures via the communication interface, wherein the first group of lighting fixtures includes a defined plurality of lighting fixtures that are associated to operate in a coordinated manner.

The circuitry may be further configured to receive current settings for the first group of lighting fixtures from the first lighting fixture prior to determining the new settings. The circuitry may be further configured to send a request for the current settings for the first group of lighting fixtures to the first lighting fixture, such that the current settings are received in response to the request. The circuitry may be further configured to present the current settings to a user and receive input from the user such that the new settings are based at least in part on the input from the user. The circuitry may be further configured to, upon selection of the first lighting fixture, instruct the first group of lighting fixtures to change its light output to provide human perceptible feedback indicative of being selected.

In another embodiment, circuitry is configured to effect selection of a first lighting fixture in a first group of lighting fixtures via the communication interface; identify the first group of lighting fixtures based on information from the first lighting fixture; receive a light output setting from a user via the user interface; and send the light output setting to each lighting fixture in the first group of lighting fixtures via the communication interface, wherein each lighting fixture in the first group of lighting fixtures will adjust its light output based on the light output setting.

The light output setting may dictate a color, color temperature, and/or a light output level of the light output for each lighting fixture in the first group of lighting fixtures.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 7 is a table illustrating lightcast data for the lighting system illustrated in FIG. 6.

DETAILED DESCRIPTION

Figure 1:
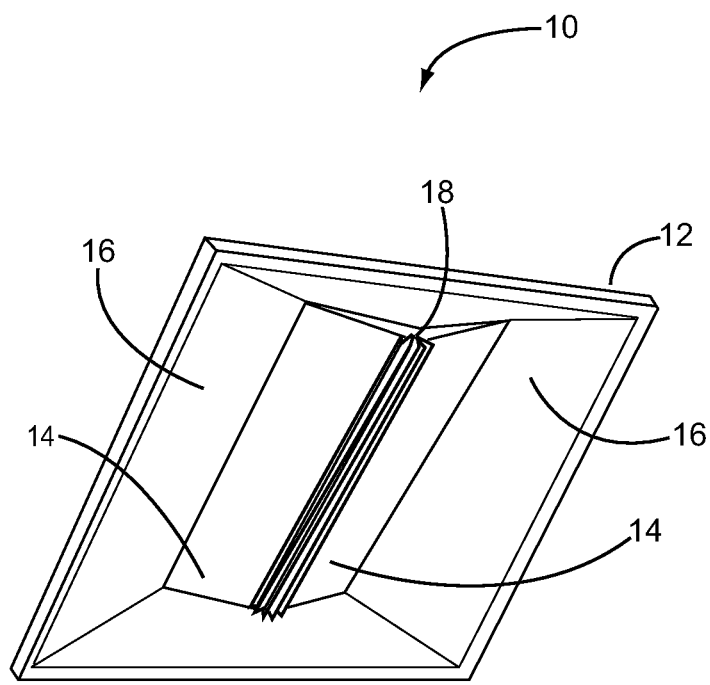
FIG. 1 is a perspective view of a troffer-based lighting fixture according to one embodiment of the disclosure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that relative terms such as "front," "forward," "rear," "below," "above," "upper," "lower," "horizontal," or "vertical" may be used herein to describe a relationship of one element, layer or region to another element, layer or region as illustrated in the figures. It will be understood that these terms are intended to encompass different orientations of the device in addition to the orientation depicted in the figures.

The present disclosure relates to a lighting network where control of the lighting fixtures in the network may be distributed among the lighting fixtures. The lighting fixtures may be broken into groups that are associated with different lighting zones. At least some of the lighting fixtures will have or be associated with one or more sensors, such as occupancy sensors, ambient light sensors, and the like. Within the overall lighting network or the various lighting zones, the lighting fixtures may share sensor data from the sensors. Each lighting fixture may process sensor data provided by its own sensor, a remote standalone sensor, or lighting fixture, and process the sensor data according to the lighting fixture's own internal logic to control operation of the lighting fixture. The lighting fixtures may also receive control input from other lighting fixtures, control nodes, light switches, and commissioning tools. The control input may be processed along with the sensor data according to the internal logic to further enhance control of the lighting fixture.

Accordingly, control of the lighting network of the present disclosure may be decentralized so that each lighting fixture essentially operates independently of the lighting network; however, the internal logic in each of the lighting fixtures is configured so that the lighting fixtures may act in concert as a group. While acting in concert, each lighting fixture may operate in a different manner depending on the goals for the particular lighting application. The lighting fixtures may also respond to any user inputs that are presented.

For example, a switch may be used to turn on all of the lighting fixtures in a particular zone. However, the amount of light provided by the various lighting fixtures may vary from one lighting fixture to the next based on the amount of ambient light present or the relative occupancy in the different areas of the lighting zone. The lighting fixtures closer to windows may provide less light or light of a different color or color temperature than those lighting fixtures that are near an interior wall. Further, lighting fixtures closer to people or those proximate to larger groups of people may provide more light or light of a different color or color temperature relative to the other lighting fixtures. For example, in a long hallway, the presence of an occupant could not only turn on the hallway group of lighting fixtures, but could also dictate dimming levels for the various fixtures so that the whole hallway is lit with a low light level while the area (or areas) immediately around the occupant (or occupants) has a higher light level. The areas with more occupants could have higher light output than those with fewer or more occupants. The speed of travel could also dictate relative light output levels.

Traditional lighting control systems rely on a central controller to make all decisions and control the various lighting fixtures from afar. The distributed control approach of the present disclosure is not so limited. While a central controller may be employed, the commands from the central controller may be treated as a suggestion or just another input to be considered by each lighting fixture's internal logic. Particularly unique to the present disclosure is the ability to share sensor data between lighting fixtures. Being able to share sensor data allows otherwise independently functioning lighting fixtures to act as a group in a coordinated fashion.

For example, each lighting fixture in a lighting zone may take its own ambient light reading, but rather than acting only on its own ambient light reading, the ambient light reading is shared with the other lighting fixtures in the group. When all of the light fixtures in the lighting zone have shared their ambient light readings, each lighting fixture can independently determine an average or a minimum light output based on the ambient light readings from the entire group. As such, the lighting fixtures in the group will adjust their output consistently with one another while operating independently from one another.

Prior to delving into the details of the present disclosure, an overview of an exemplary lighting fixture in which the distributed lighting control system may be employed is described. While the concepts of the present disclosure may be employed in any type of lighting system, the immediately following description describes these concepts in a troffer-type lighting fixture, such as the lighting fixture 10 illustrated in FIGS. 1-3. While the disclosed lighting fixture 10 employs an indirect lighting configuration wherein light is initially emitted upward from a light source and then reflected downward, direct lighting configurations may also take advantage of the concepts of the present disclosure. In addition to troffer-type lighting fixtures, the concepts of the present disclosure may also be employed in recessed lighting configurations, wall mount lighting configurations, outdoor lighting configurations, and the like. Reference is made to co-pending and co-assigned U.S. patent application Ser. No. 13/589,899 filed Aug. 20, 2013, Ser. No. 13/649,531 filed Oct. 11, 2012, and Ser. No. 13/606,713 filed Sep. 7, 2012, now U.S. Pat. No. 8,829,800, the contents of which are incorporated herein by reference in their entireties. Further, the functionality and control techniques described below may be used to control different types of lighting fixtures, as well as different groups of the same or different types of lighting fixtures at the same time.

Figure 2:
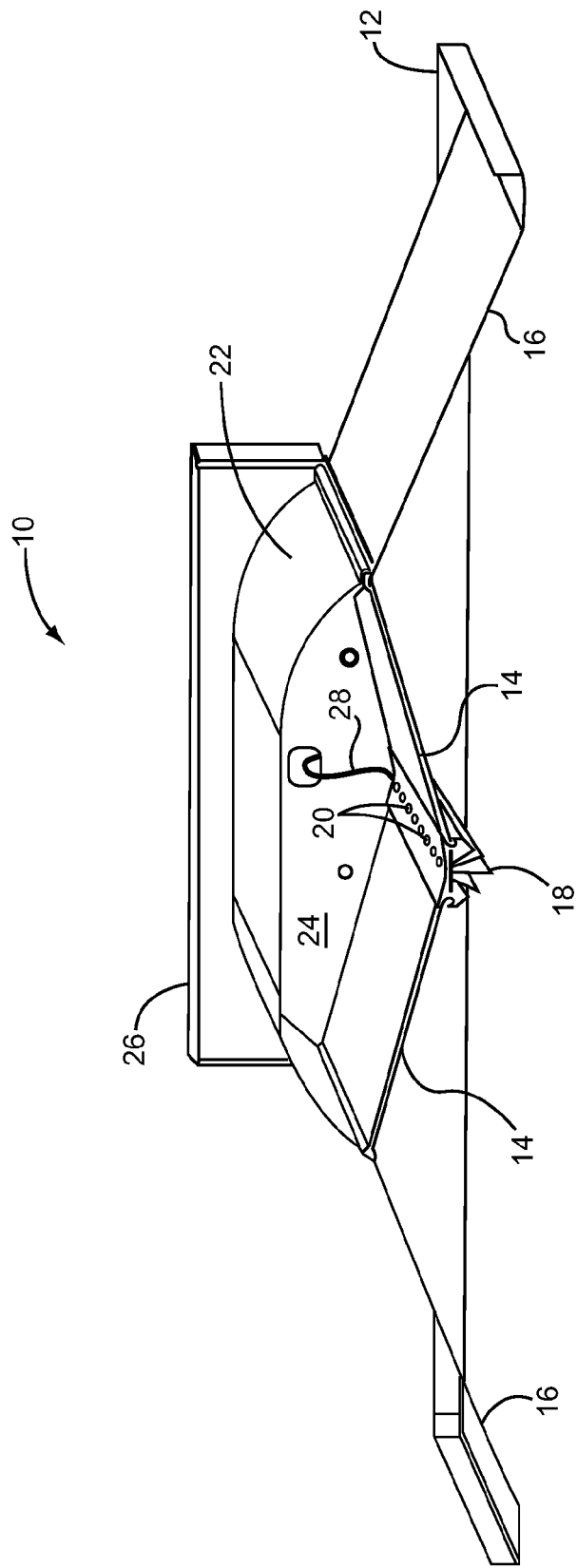
FIG. 2 is a cross section of the lighting fixture of FIG. 1.
Figure 3:
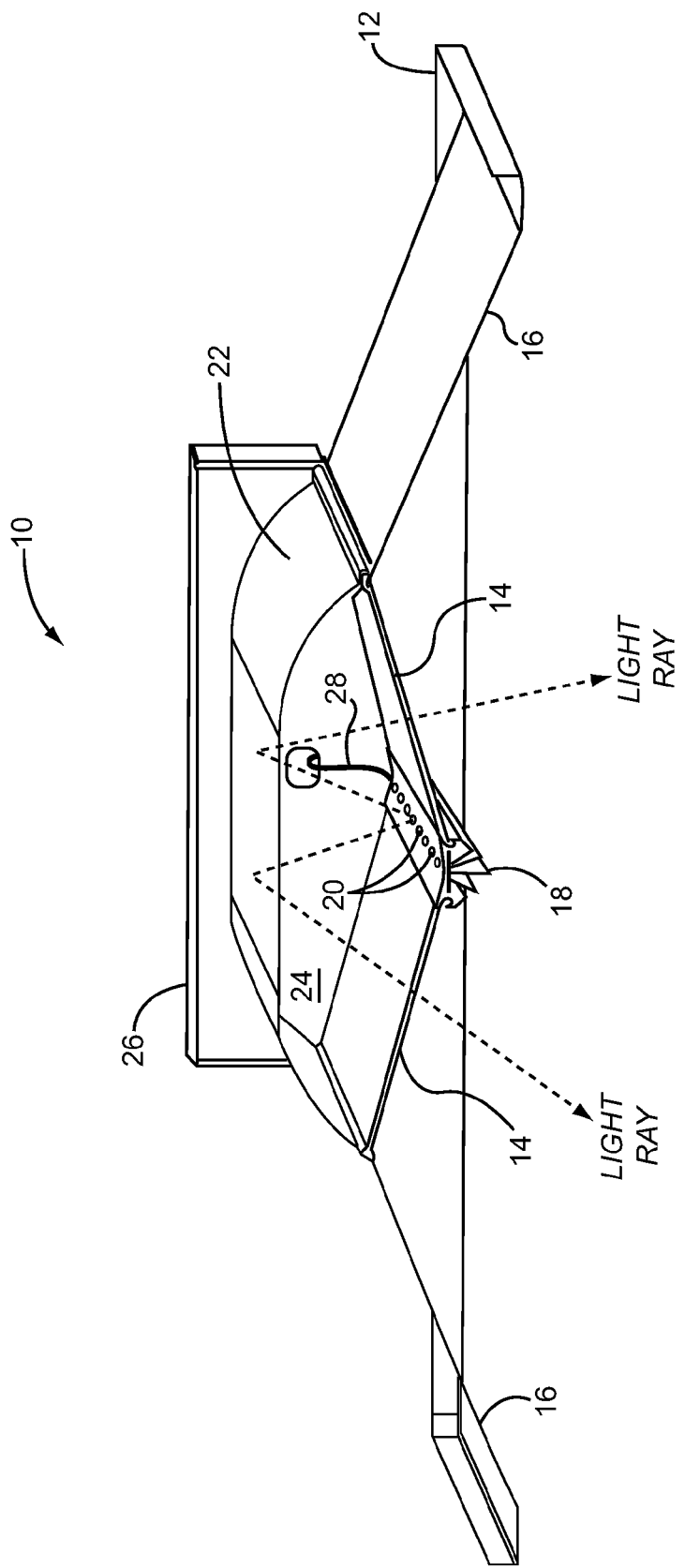
FIG. 3 is a cross section of the lighting fixture of FIG. 1 illustrating how light emanates from the LEDs of the lighting fixture and is reflected out through lenses of the lighting fixture.

In general, troffer-type lighting fixtures, such as the lighting fixture 10, are designed to mount in a ceiling. In most applications, the troffer-type lighting fixtures are mounted into a drop ceiling (not shown) of a commercial, educational, or governmental facility. As illustrated in FIGS. 1-3, the lighting fixture 10 includes a square or rectangular outer frame 12. In the central portion of the lighting fixture 10 are two rectangular lenses 14, which are generally transparent, translucent, or opaque. Reflectors 16 extend from the outer frame 12 to the outer edges of the lenses 14. The lenses 14 effectively extend between the innermost portions of the reflectors 16 to an elongated heatsink 18, which functions to join the two inside edges of the lenses 14.

Turning now to FIGS. 2 and 3 in particular, the back side of the heatsink 18 provides a mounting structure for an LED array 20, which includes one or more rows of individual LEDs mounted on an appropriate substrate. The LEDs are oriented to primarily emit light upwards toward a concave cover 22. The volume bounded by the cover 22, the lenses 14, and the back of the heatsink 18 provides a mixing chamber 24. As such, light will emanate upwards from the LEDs of the LED array 20 toward the cover 22 and will be reflected downward through the respective lenses 14, as illustrated in FIG. 3. Notably, not all light rays emitted from the LEDs will reflect directly off of the bottom of the cover 22 and back through a particular lens 14 with a single reflection. Many of the light rays will bounce around within the mixing chamber 24 and effectively mix with other light rays, such that a desirably uniform light is emitted through the respective lenses 14.

Those skilled in the art will recognize that the type of lenses 14, the type of LEDs, the shape of the cover 22, and any coating on the bottom side of the cover 22, among many other variables, will affect the quantity and quality of light emitted by the lighting fixture 10. As will be discussed in greater detail below, the LED array 20 may include LEDs of different colors, wherein the light emitted from the various LEDs mixes together to form a white light having a desired color temperature and quality based on the design parameters for the particular embodiment.

As is apparent from FIGS. 2 and 3, the elongated fins of the heatsink 18 may be visible from the bottom of the lighting fixture 10. Placing the LEDs of the LED array 20 in thermal contact along the upper side of the heatsink 18 allows any heat generated by the LEDs to be effectively transferred to the elongated fins on the bottom side of the heatsink 18 for dissipation within the room in which the lighting fixture 10 is mounted. Again, the particular configuration of the lighting fixture 10 illustrated in FIGS. 1-3 is merely one of the virtually limitless configurations for lighting fixtures 10 in which the concepts of the present disclosure are applicable.

Figure 4:
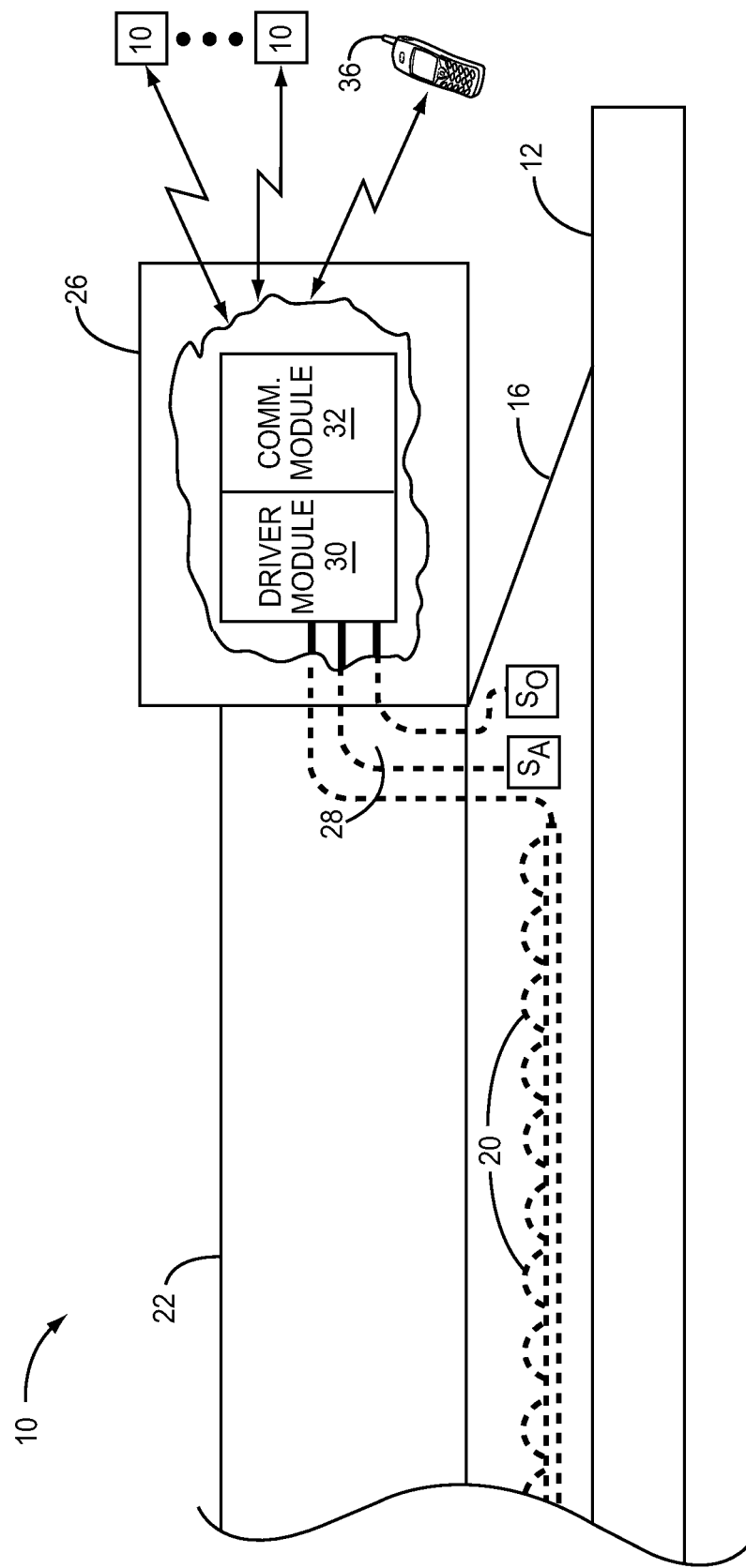
FIG. 4 illustrates a driver module and a communications module integrated within an electronics housing of the lighting fixture of FIG. 1.

With continued reference to FIGS. 2 and 3, an electronics housing 26 is shown mounted at one end of the lighting fixture 10, and is used to house all or a portion of the electronics used to power and control the LED array 20. These electronics are coupled to the LED array 20 through appropriate cabling 28. With reference to FIG. 4, the electronics provided in the electronics housing 26 may be divided into a driver module 30 and a communications module 32.

At a high level, the driver module 30 is coupled to the LED array 20 through the cabling 28 and directly drives the LEDs of the LED array 20 based on control information provided by the communications module 32. The driver module 30 provides the intelligence for the lighting fixture 10 and is capable of driving the LEDs of the LED array 20 in a desired fashion. The driver module 30 may be provided on a single, integrated module or divided into two or more sub-modules depending on the desires of the designer.

The communications module 32 acts as an intelligent communication interface that facilitates communications between the driver module 30 and other lighting fixtures 10, a remote control system (not shown), or a portable handheld commissioning tool, which may also be configured to communicate with a remote control system in a wired or wireless fashion. The commissioning tool is referred to herein as a commissioning tool 36, which may be used for a variety of functions, including the commissioning of a lighting network. As noted above, these communications may include the sharing of sensor data, instructions, and any other data between the various lighting fixtures 10 in the lighting network. In essence, the communications module 32 functions to coordinate the sharing of intelligence and data among the lighting fixtures 10.

In the embodiment of FIG. 4, the communications module 32 may be implemented on a separate printed circuit board (PCB) than the driver module 30. The respective PCBs of the driver module 30 and the communications module 32 may be configured to allow the connector of the communications module 32 to plug into the connector of the driver module 30, wherein the communications module 32 is mechanically mounted, or affixed, to the driver module 30 once the connector of the communications module 32 is plugged into the mating connector of the driver module 30.

In other embodiments, a cable may be used to connect the respective connectors of the driver module 30 and the communications module 32, other attachment mechanisms may be used to physically couple the communications module 32 to the driver module 30, or the driver module 30 and the communications module 32 may be separately affixed to the inside of the electronics housing 26. In such embodiments, the interior of the electronics housing 26 is sized appropriately to accommodate both the driver module 30 and the communications module 32. In many instances, the electronics housing 26 provides a plenum rated enclosure for both the driver module 30 and the communications module 32.

Figure 5:
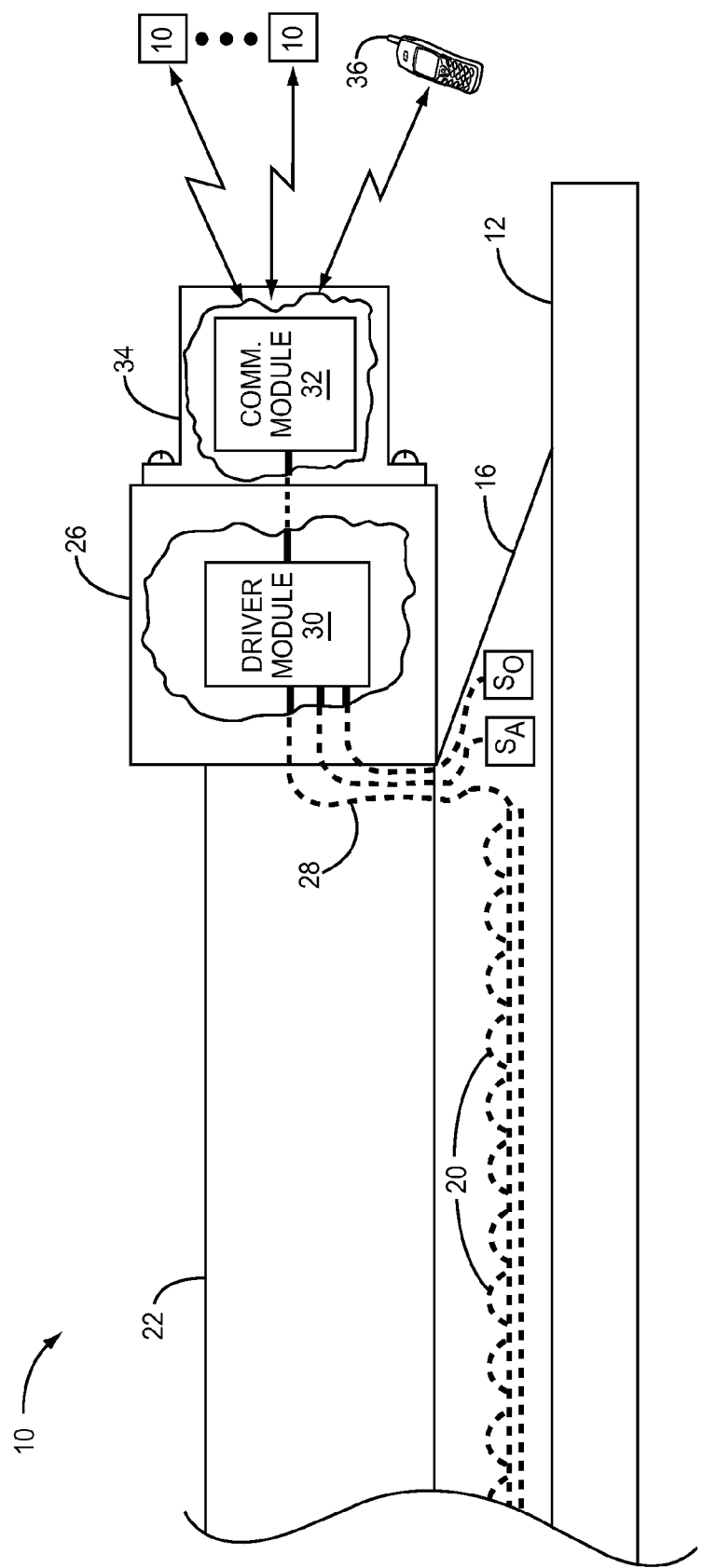
FIG. 5 illustrates a driver module provided in an electronics housing of the lighting fixture of FIG. 1 and a communications module in an associated housing coupled to the exterior of the electronics housing according to one embodiment of the disclosure.

With the embodiment of FIG. 4, adding or replacing the communications module 32 requires gaining access to the interior of the electronics housing 26. If this is undesirable, the driver module 30 may be provided alone in the electronics housing 26. The communications module 32 may be mounted outside of the electronics housing 26 in an exposed fashion or within a supplemental housing 34, which may be directly or indirectly coupled to the outside of the electronics housing 26, as shown in FIG. 5. The supplemental housing 34 may be bolted to the electronics housing 26. The supplemental housing 34 may alternatively be connected to the electronics housing using snap-fit or hook-and-snap mechanisms. The supplemental housing 34, alone or when coupled to the exterior surface of the electronics housing 26, may provide a plenum rated enclosure.

In embodiments where the electronics housing 26 and the supplemental housing 34 will be mounted within a plenum rated enclosure, the supplemental housing 34 may not need to be plenum rated. Further, the communications module 32 may be directly mounted to the exterior of the electronics housing 26 without any need for a supplemental housing 34, depending on the nature of the electronics provided in the communications module 32, how and where the lighting fixture 10 will be mounted, and the like. The latter embodiment wherein the communications module 32 is mounted outside of the electronics housing 26 may prove beneficial when the communications module 32 facilitates wireless communications with the other lighting fixtures 10, the remote control system, or other network or auxiliary device. In essence, the driver module 30 may be provided in the plenum rated electronics housing 26, which may not be conducive to wireless communications. The communications module 32 may be mounted outside of the electronics housing 26 by itself or within the supplemental housing 34 that is more conducive to wireless communications. A cable may be provided between the driver module 30 and the communications module 32 according to a defined communication interface.

The embodiments that employ mounting the communications module 32 outside of the electronics housing 26 may be somewhat less cost effective, but provide significant flexibility in allowing the communications module 32 or other auxiliary devices to be added to the lighting fixture 10, serviced, or replaced. The supplemental housing 34 for the communications module 32 may be made of a plenum rated plastic or metal, and may be configured to readily mount to the electronics housing 26 through snaps, screws, bolts, or the like, as well as receive the communications module 32. The communications module 32 may be mounted to the inside of the supplemental housing 34 through snap-fits, screws, twistlocks, and the like. The cabling and connectors used for connecting the communications module 32 to the driver module 30 may take any available form, such as with standard category 5 (cat 5) cable having RJ45 connectors, edge card connectors, blind mate connector pairs, terminal blocks and individual wires, and the like. Having an externally mounted communications module 32 relative to the electronics housing 26 that includes the driver module 30 allows for easy field installation of different types of communications modules 32 for a given driver module 30.

Figure 6:
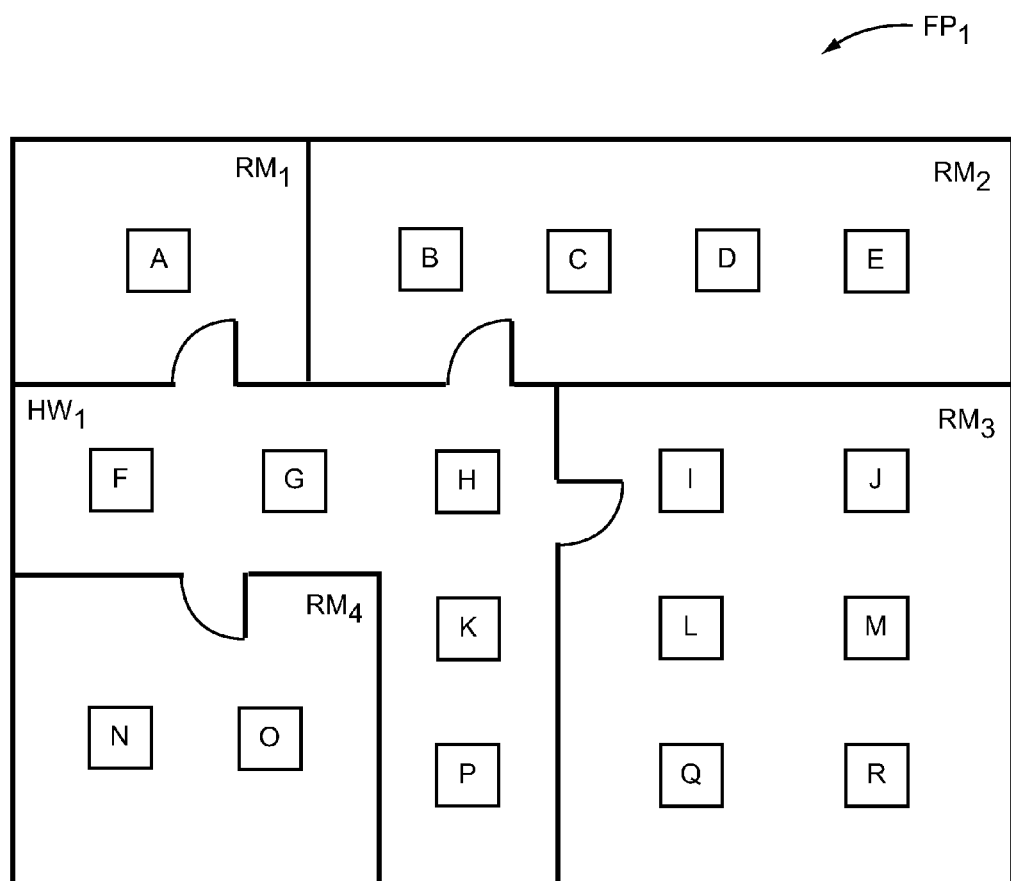
FIG. 6 illustrates a lighting system for an exemplary floor plan.

In one embodiment, the capabilities of the lighting fixtures 10 allow them to be readily grouped into different lighting zones. With reference to FIG. 6, assume that there are 18 ceiling mounted lighting fixtures 10, which are uniquely referenced as lighting fixtures A through R and placed in different rooms $RM_1$ through $RM_4$ and hallway $HW_1$ of floor plan $FP_1$.

In particular, lighting fixture A resides in room $RM_1$; lighting fixtures B-E reside in room $RM_2$; lighting fixtures I, J, L, M, Q, and R reside in room $RM_3$; lighting fixtures N and O reside in room $RM_4$, and lighting fixtures F, G, H, K, and P reside in hallway $HW_1$. Assuming that the doors from the hallway $HW_1$ into each of the respective rooms $RM_1$-$RM_4$ are closed, lighting fixtures A-R may be grouped into five unique lighting zones using a lightcast procedure. During a lightcast procedure, one light fixture A-R will adjust or modulate its light output while the other lighting fixtures A-R attempt to monitor or detect the adjusted or modulated light output of the first lighting fixture A-R.

Assume that the modulated or adjusted lightcast signal is a visible or near visible, such as infrared, light signal, which can be detected by the ambient light sensors that are provided in or associated with the various lighting fixtures A-R. Initially, assume lighting fixture A emits the visible or near visible lightcast signal, while the rest of the lighting fixtures B-R monitor their ambient light sensors to detect the relative strength of the lightcast signal being received by the integrated or associated ambient light sensors. Again assuming that the door between room $RM_1$ and the hallway $HW_1$ is closed, none of the other lighting fixtures A-R will detect the lightcast signal provided by lighting fixture A, and thus lighting fixture A will be grouped alone. Next, lighting fixture B will provide a lightcast signal, and lighting fixtures A and C-R will begin monitoring for the lightcast signal being provided by lighting fixture B. In this instance, lighting fixture C will detect the lightcast signal relatively strongly, lighting fixture D will detect the lightcast signal more weakly, and lighting fixture E will detect a faint lightcast signal, if the lightcast signal is detected at all.

A relative magnitude may be assigned to the lightcast signal monitored by each of the lighting fixtures C-E. These magnitudes may be used to populate a table, such as that illustrated in FIG. 7, or a portion thereof that is pertinent for to a specific lighting fixture A-R. In this example, the lightcast signal emitted by lighting fixture B is assigned a relative strength of 0.7 for a range of 0 to 1.0 by lighting fixture C, 0.3 by lighting fixture D, and 0.1 by lighting fixture E. Since the door between room $RM_2$ and the hallway $HW_1$ is closed, none of the other lighting fixtures A or F-R will be able to detect the lightcast signal from lighting fixture B.

Next, lighting fixture C will begin providing the lightcast signal and the other lighting fixtures A, B, and D-R will begin monitoring for the lightcast signal provided by lighting fixture C. Lighting fixtures B, D, and E in room $RM_2$ will detect the lightcast signal and assign a relative magnitude for the lightcast signal. The magnitudes are provided in FIG. 7. Again, lighting fixtures A and F-R will not detect the lightcast signal due to their relative locations. This process is systematically repeated for each of the remaining lighting fixtures D-R such that the table of FIG. 7 is fully populated. By analyzing the signal strength magnitudes of the various lighting fixtures A-R, one can readily divide the various groups of lighting fixtures A-R into associated lighting zones. Visually, one can readily determine that lighting fixture A should be in a zone by itself, lighting fixtures B-E should be in a second zone, lighting fixture I, J, L, M, Q, and R should be in a third zone, lighting fixtures N and O should be in a fourth zone, and lighting fixtures F, G, H, K, and P should be in a fifth zone. Each of these zones directly corresponds to the placement of the various lighting fixtures A-R in rooms $RM_1$-$RM_4$ and the hallway $HW_1$. In additional to simply grouping the lighting fixtures A-R of the different rooms into corresponding zones, one can readily determine the relative proximity and placement of the various lighting fixtures A-R with respect to each other based on the relative magnitudes of the lightcast signals.

As described further below, the various lighting fixtures A-R may also monitor RF signals strengths from the one another. The RF signal strength between the various lighting fixtures A-R can be used to determine the distance between and relative location of lighting fixtures A-R. Further, the relative distance between and location of groups with respect to one another may be determined. As such, a relative distance and location can be determined for every fixture in the RF network and any groups thereof using the lightcast signal, RF signal strength, or a combination thereof. The results can be used to generate a scaled map of the lighting fixtures A-R and other elements in the lighting network. The map may include the commissioning tool 36 as well. In addition to using RF signal strength, microphones and speakers could be used in association with or instead of lightcasting techniques for grouping, communications, and the like. Each lighting fixture A-R could have or be associated with a microphone, or like acoustic (sonic or ultrasonic) sensor, and an audio amplifier and speaker (sonic or ultrasonic).

The microphones would allow the lighting fixture to pick up voice commands, like "brighter," "dimmer," "on," or "off," (or other acoustic data, perhaps footsteps for occupancy) and process the acoustic information. The information may cause the lighting fixture to control the light source in a desired fashion, issue commands to other lighting fixtures A-R (or other nodes), or share the acoustic information with other lighting fixtures A-R (or other nodes). A network of distributed microphones provided by the lighting fixtures A-R or in association therewith could determine not only things like where sounds are coming from (is the user in the same room?), but which direction and how fast the source of the sounds is moving (if the user is hurrying toward the exit, or even yelling "fire," maybe there's an emergency and the space should be more well-lit for safety reasons).

There is also the capability to provide a network of noise suppressing or noise canceling lighting fixtures all working together to keep office spaces quiet. The speakers may be driven with white or pink noise, which is configured to reduce the impact of ambient noise. For true noise canceling, the ambient noise monitored by the microphones at one or a group of the lighting fixtures A-R could be inverted (or played out of phase with respect to the ambient noise) and played back with the corresponding speakers at a volume that will provide a noise canceling effect for nearby occupants.

Notably, each lighting fixture A-R may generate its own table, as shown in FIG. 7, or a portion thereof. For example, each lighting fixture A-R may simply maintain an array that stores the relative magnitudes of the lightcast signals from the other lighting fixtures A-R. In this instance, each of the lighting fixtures A-R will respond to commands and share data with only those lighting fixtures A-R from which a lightcast signal was detected at all or detected above a certain magnitude. In these instances, each lighting fixture A-R can effectively associate itself with a zone. Alternatively, all of the lightcast signal data may be delivered to a master lighting fixture 10, which is capable of collecting all of the data for the table of FIG. 7, analyzing the data, assigning each of the lighting fixtures A-R to various zones, and communicating the zoning information to the lighting fixtures A-R. Further, the processing provided by the master lighting fixture 10 could also be outsourced to a remote control entity, such as the commissioning tool 36, or a central control system.

In the prior example, all of the doors in the hallway $HW_1$ were closed. As such, grouping the various lighting fixtures A-R into the five different zones was relatively clear cut, wherein all of the lighting fixtures in a room $RM_1$-$RM_4$ or the hallway $HW_1$ were grouped into different zones. As such, none of the lighting fixtures A-R were assigned to more than one zone.

Figure 8A:
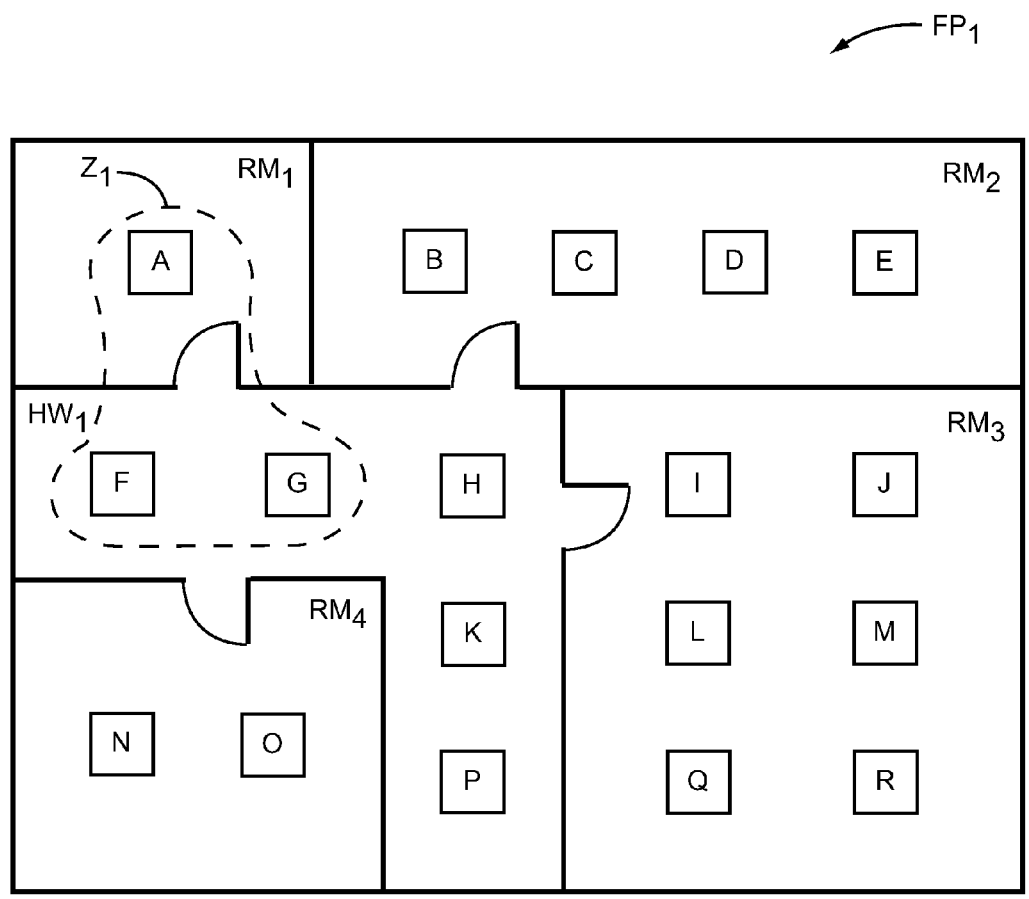
FIGS. 8A-8E illustrate exemplary zones for the floor plan illustrated in FIG. 6, when the lightcast process is provided with the doors from each room into the hallway open.
Figure 8B:
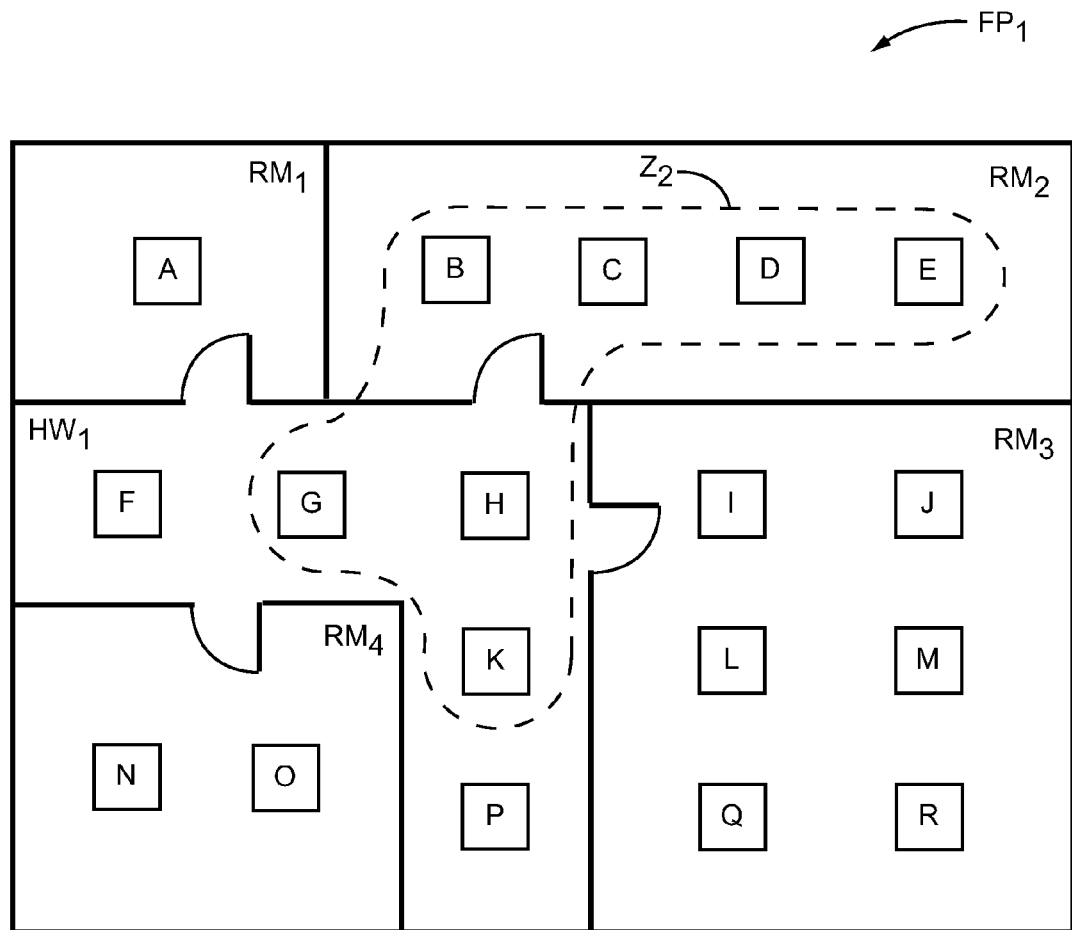
Figure 8C:
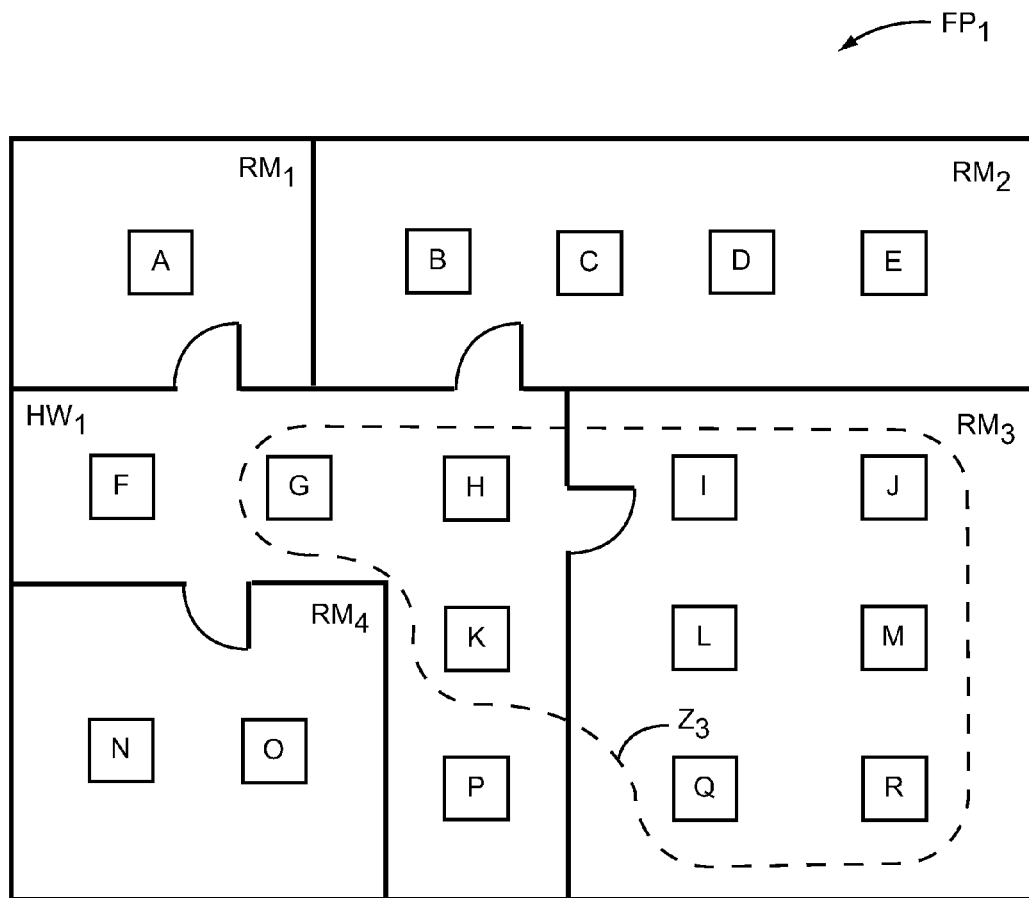
Figure 8D:
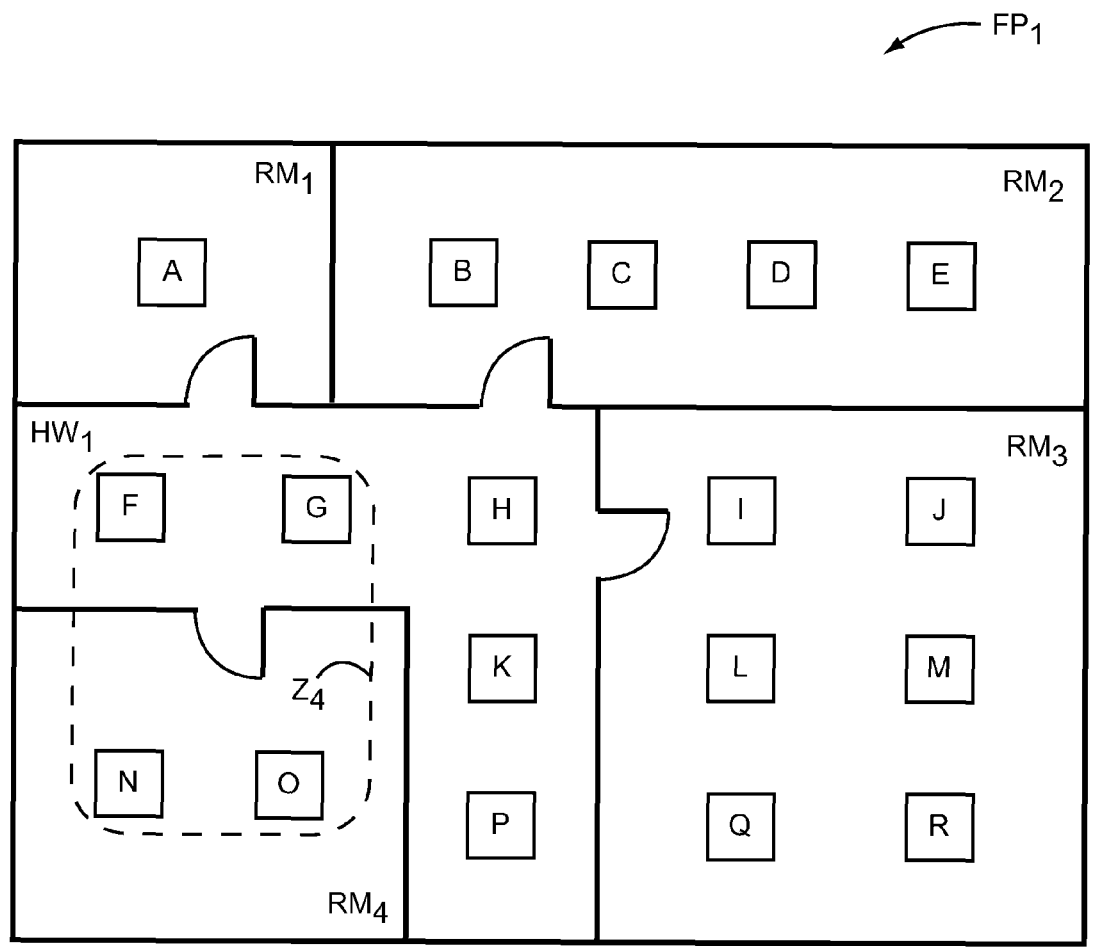

However, it may be desirable to have certain lighting fixtures A-R assigned to more than one zone. As an example, if the door into room $RM_1$ is normally open, it may be desirable to have lighting fixtures F and G, which are in the hallway $HW_1$, associated in some fashion with the zone for room $RM_1$, which includes lighting fixture A. Continuing with this concept, when lighting fixture A is providing the lightcast signal, lighting fixtures F and G of the hallway $HW_1$ may detect the lightcast signal. Similarly, when lighting fixtures F and G are providing a lightcast signal, they may pick up each others' lightcast signal, and lighting fixture A may also pick up the lightcast signals of lighting fixtures F and G. As such, respective lighting fixtures A, F, and G, or another control entity, will analyze the lightcast signal information and associate lighting fixtures A, F, and G with zone $Z_1$ as illustrated in FIG. 8A. If all of the doors in the hallway $HW_1$ remain open, the lightcast process may continue such that lighting fixtures B, C, D, and E of room $RM_2$ are grouped with lighting fixtures G, H, and K of hallway $HW_1$ in zone $Z_2$ as illustrated in FIG. 8B. Similarly, the lighting fixtures I, J, L, M, Q, and R of room $RM_3$ may also be associated with lighting fixtures G, H, and K of hallway $HW_1$ in zone $Z_3$, as shown in FIG. 8C. Lighting fixtures N and O of room $RM_4$ may be associated with lighting fixtures F and G of hallway $HW_1$ for zone $Z_4$, as illustrated in FIG. 8D.

Figure 8E:
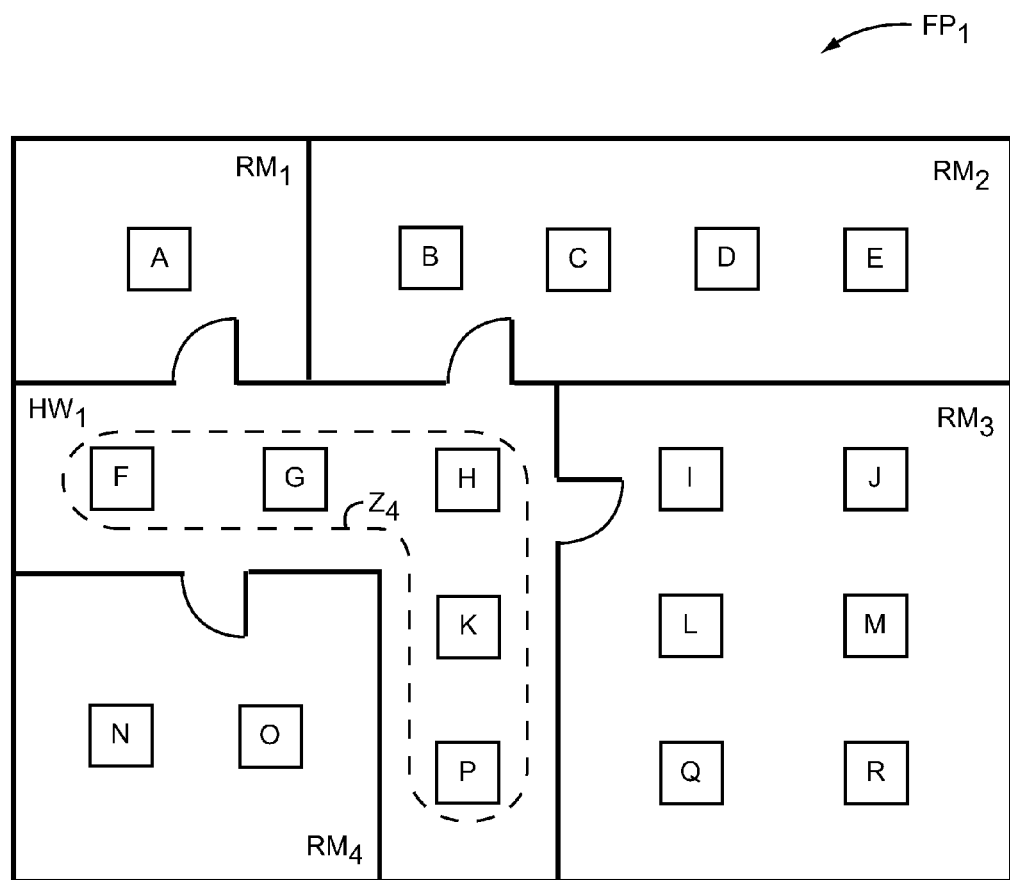

With reference to the hallway $HW_1$, when the doors are all open, the lighting fixtures H, G, K, and P may be associated with various lighting fixtures A, B, C, I, L, N, and O of the various rooms $RM_1$-$RM_4$. If this is not desired, a user may modify the grouping of the various lighting fixtures A-R such that just the lighting fixtures F, G, H, K, and P are associated with zone $Z_4$, which represents the lighting for just the hallway $HW_1$, as illustrated in FIG. 8E. Accordingly, the automatic grouping of the lighting fixtures 10 can be readily modified through direct interaction with each of the lighting fixtures 10 or from a remote control entity, such as the commissioning tool 36. Further details with respect to how the lighting fixtures 10 communicate with each other, share data, and operate in a concerted fashion are provided further below.

Figure 9:
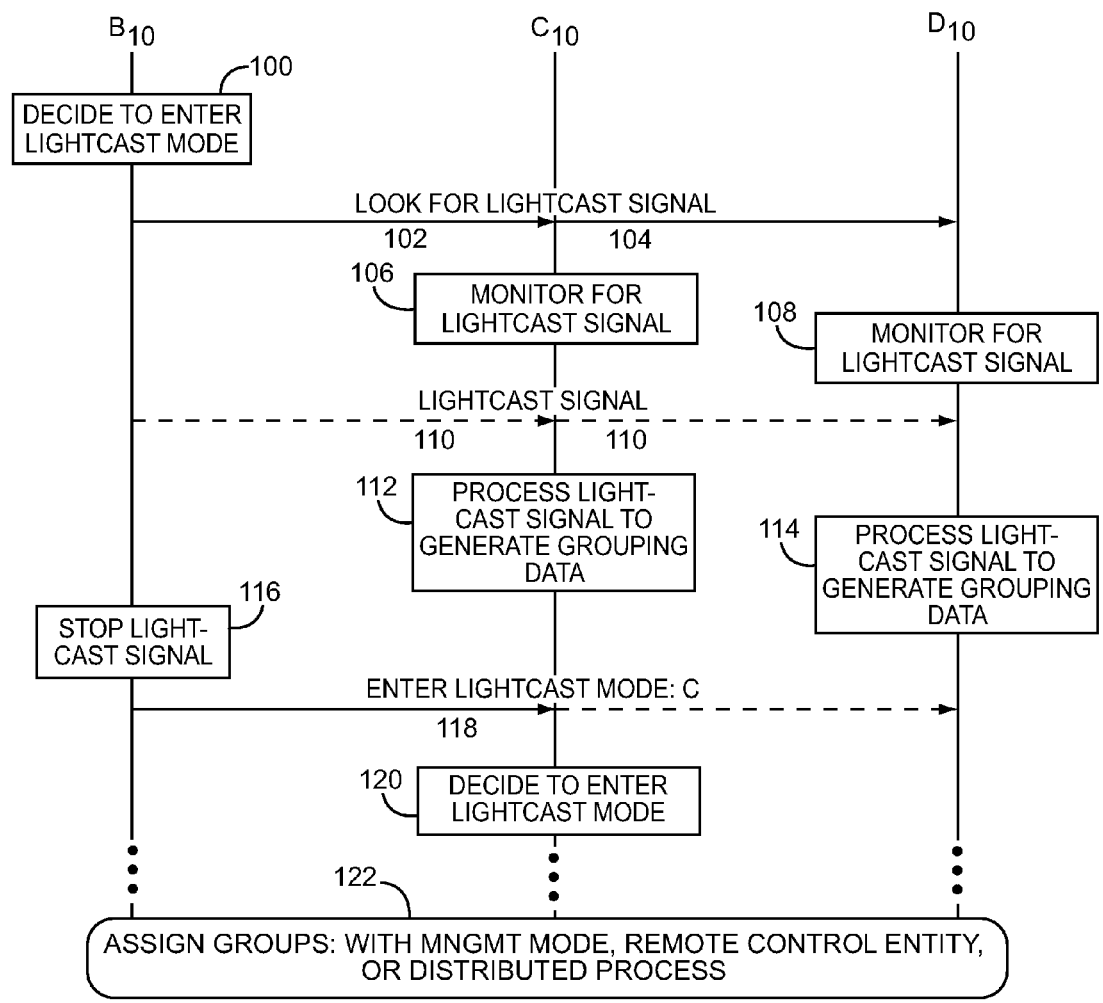
FIG. 9 is a communication flow diagram illustrating a grouping process according to one embodiment of the present disclosure.

With reference to FIG. 9, a partial communication flow is provided to illustrate an exemplary lightcast process and the functionality of each lighting fixture 10 involved in the process. The operation of lighting fixtures B-D, which are assumed to be in the same room, is highlighted. Initially, lighting fixture B decides to enter the lightcast mode based on an instruction from lighting fixture A or some other control entity (step 100). Deciding to enter the lightcast mode may be triggered internally, from an external input over a wired or wireless network, or optically in response to receiving a lightcast signal with a certain signature. For example, lighting fixture B may enter a lightcast mode based on the time of day, periodically, based on sensor readings, or in response to a manual (user) request. Alternatively, the lightcast signal may always be monitored for, and may take the form of a specific off/on signature or modulation of the light, which gets automatically detected and measured by the monitoring light fixture 10.

Upon entering the lightcast mode, lighting fixture B will send an instruction out to the other lighting fixtures 10 directly or via a broadcast signal to look for a lightcast signal from lighting fixture B. Notably, these instructions may be sent directly from one lighting fixture 10 to another or may be relayed from one lighting fixture 10 to another throughout the lighting fixture network. As illustrated, the instructions to look for the lightcast signal provided by lighting fixture B is received by lighting fixture C (step 102) and relayed to lighting fixture D (step 104). However, instructions may be sent directly to lighting fixture D from lighting fixture B without being relayed.

At this point, both lighting fixtures C and D will begin monitoring for the lightcast signal to be provided by lighting fixture B (steps 106 and 108). Accordingly, lighting fixture B will begin adjusting or modulating its light source in some fashion to provide the lightcast signal (step 110). Notably, the lightcast signal is an optical signal that will not be relayed from one lighting fixture 10 to another. Instead, lighting fixtures C and D will detect and process the lightcast signal to generate the grouping data (steps 112 and 114). The grouping data may range from simply determining whether or not the lightcast signal is detected or detected above a given threshold to assigning a relative magnitude to the lightcast signal, as discussed in association with the table of FIG. 7. After a certain amount of time, lighting fixture B will stop providing the lightcast signal (step 116) and provide instructions for lighting fixture C to enter the lightcast mode (step 118). Alternatively, a remote controlling entity, such as the commissioning tool 36, may provide instructions to lighting fixture C to enter the lightcast mode. At this point, lighting fixture C will decide to enter lightcast mode (step 120) and the process will repeat for lighting fixture C. This sequence of events will continue for each of the lighting fixtures 10 in the lighting network.

With regard to processing the lightcast signals, the lightcast signal measurements, which are monitored by the receiving lighting fixtures 10, may be associated with an ID of the sending lighting fixture 10, the receiving lighting fixture 10, or both. The sending lighting fixture 10 may be identified based on an ID provided in the message to look for a lightcast signal (in step 110) or a unique modulation signal that either includes the ID of the sending lighting fixture 10 or that is associated with the lighting fixture 10. The associations may be done by internal or remote control systems. Further, associations could be made based on time stamping or synchronizing the sending of lightcast signals by the different lighting fixtures 10 so that the sending lighting fixture 10 can be associated with the lightcast signal measurements from the various receiving fixtures 10.

The receiving lighting fixtures 10 may report the lightcast signal measurements along with the associated IDs of the receiving lighting fixtures 10 and the synchronizing or identifying information that can be used to associate the lightcast signal with a particular sending lighting fixture 10. Timestamping or other sensor information may be included in such a measurement report. These types of lightcast measurement reports can be used to develop tables of information, such as that shown in FIG. 7, for different times and include other sensor parameters. As such, greater granularity is provided into the control of the lighting fixtures 10 or light groupings, wherein the type of control can change at different times and/or based on different inputs from the sensors. For instance, control may change once an hour or when certain sensor readings are monitored.

Throughout this process or at the end of the process, each of the lighting fixtures 10 will either exchange the grouping data or provide the grouping data to a master lighting fixture 10 or a remote control entity to process the grouping data and assign the various lighting fixtures 10 to corresponding zones (step 122). In a primarily distributed control process, the internal logic provided in each of the lighting fixtures 10 will allow the lighting fixtures 10 to effectively assign themselves to an appropriate zone based on the grouping data. Once a lighting fixture 10 has been assigned to a zone or has identified itself as being associated with a group of lighting fixtures 10, various information may be exchanged between the lighting fixtures 10 within a given zone. This information may range from sensor data to instructions for controlling operation.

Lightcast techniques may also be used to detect occupancy or lack thereof. The lighting fixtures 10 (and any other lightcast capable devices) may be configured to periodically or relatively continuously providing lightcasting, perhaps in a manner not visible or perceptible to the human eye, to compare lightcast readings relative to an empty room. Changes in the reference lightcast readings may indicate the presence of occupants, the amount of change may be indicative of the number of occupants, and the locations of the changes may be indicative of the location of the occupants. A return to the reference lightcast reading may indicate the area has been vacated, thus potentially eliminating the need to check for vacancy using traditional body heat or motion sensors.

Notably, acknowledgments may be provided in response to each communication signal or message as well as upon detecting a lightcast signal. These acknowledgements may be provided over the wired or wireless networks that support inter-lighting fixture communications, or may be provided optically using a type of lightcast signal having a certain modulation signature that is indicative of an acknowledgement. The acknowledgement signals or other response signals may be used to exchange status, signal strength information, requests for additional information, and the like. Within a given lighting system, different communication techniques (wired, wireless, lightcast modulation) may be used for different types of communications, data/information exchange, control, and the like. Communications may also be provided over AC power lines using conventional techniques.

Figure 10:
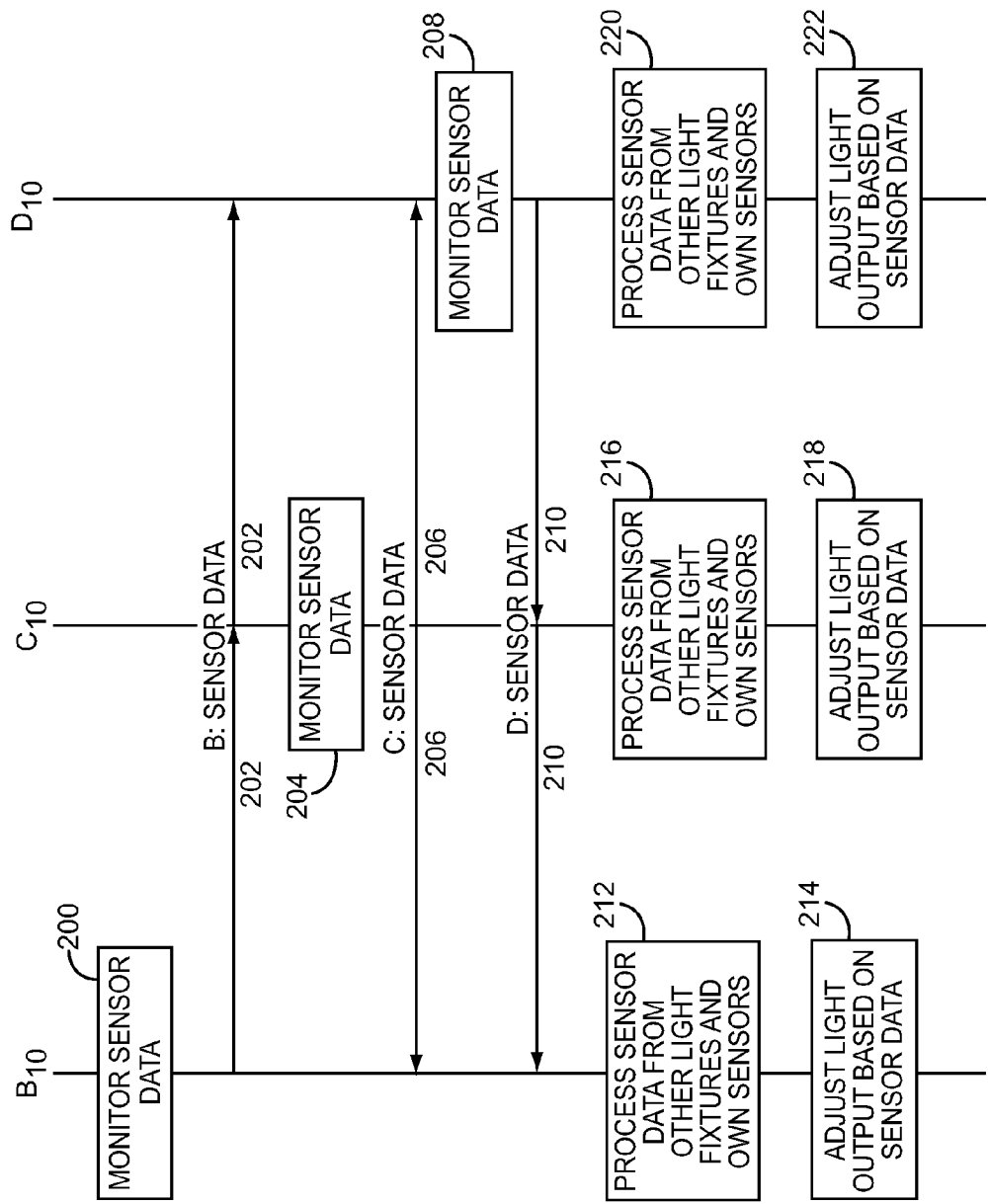
FIG. 10 is a communication flow diagram illustrating the sharing of sensor data among the lighting fixtures of the lighting system.

With reference to FIG. 10, a partial communication flow is provided to illustrate how sensor data may be exchanged among the various lighting fixtures 10 within a zone or a lighting network in general. Assume that lighting fixtures B, C, and D have been assigned to a particular zone. During operation, lighting fixtures B, C, and D will monitor and exchange sensor data and collectively use the sensor data to determine how to adjust their respective light outputs. Initially, lighting fixture B will monitor its sensor data, which is data from an associated ambient light, occupancy, or other sensor (step 200). Lighting fixture B will send its sensor data to the other lighting fixtures C and D in the zone (step 202). Meanwhile, lighting fixture C is monitoring its sensor data (step 204) and providing the sensor data to lighting fixtures B and D (step 206). Similarly, lighting fixture D is monitoring its sensor data and (step 208) and providing the sensor data to lighting fixtures C and B (step 210). Thus, each of the lighting fixtures B, C, and D has access to its own sensor data and the sensor data of the other lighting fixtures in its zone. While this example is zone-oriented, all of the lighting fixtures 10 in the entire lighting network may be providing all sensor data to one another or certain sensor data or all or certain ones of the lighting fixtures 10 in the lighting network. Within a given zone, a group of fixtures may separate themselves into one or more separate (or sub) zones if their ambient light sensors detect more light than the rest of the lighting fixtures in the zone. This could correspond to a group of lights that are closest to the window.

In a relatively continuous fashion, lighting fixture B will process the sensor data from its own sensor and the sensor data from the other lighting fixtures C and D (step 212) and determine how to adjust its light output based on the sensor data (step 214). Accordingly, lighting fixture B is independently controlling its light output; however, the internal logic of lighting fixture B may take into consideration not only its own sensor data but the sensor data of the other lighting fixtures C and D when determining precisely how to adjust its light output. In an independent yet concerted fashion, lighting fixtures C and D will also process their sensor data and the sensor data from the other lighting fixtures, and adjust their light output based on the sensor data (steps 216-222).

Interestingly, the internal logic of the different lighting fixtures B, C, and D may be configured to function identically to one another or differently from one another. For example, lighting fixtures B, C, and D may apply the same weighting to the sensor data as the other lighting fixtures B, C, and D in the zone. Thus, given the same sensor data from its own sensor and from the other lighting fixtures B, C, and D, each lighting fixture B, C, and D will adjust its light output in exactly the same fashion. If the internal logic varies among the lighting fixtures B, C, and D, the light output of the respective lighting fixtures B, C, and D may vary given the same sensor data. Notably, the sensor data may include data from different types of sensors. For example, sensor data from both ambient light and occupancy sensors may be exchanged and processed as dictated by the internal logic of each lighting fixture B, C, and D to determine how to adjust their respective light outputs.

Figure 11:
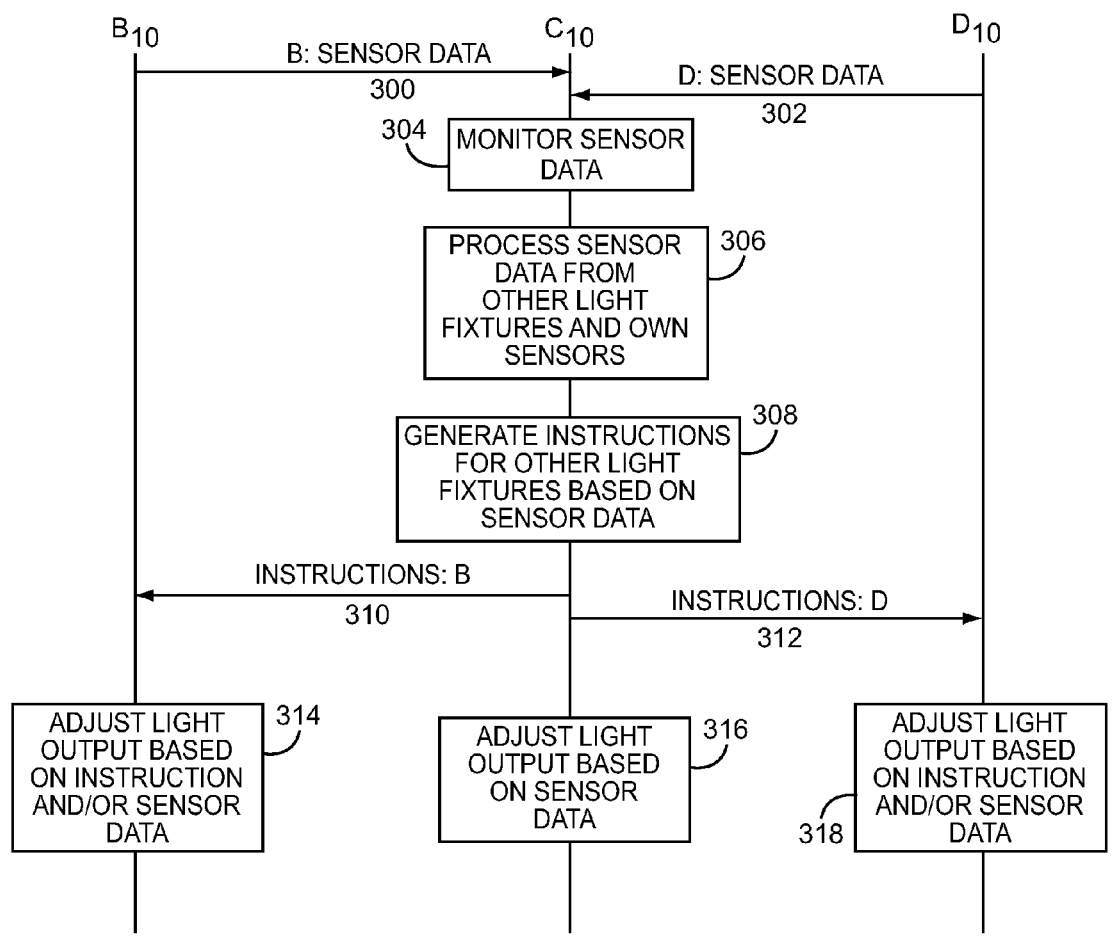
FIG. 11 is a communication flow diagram illustrating the sharing of sensor data and the creation of instructions within the lighting system.

In addition to exchanging sensor data and controlling operation in view thereof, the lighting fixtures B, C, and D may also use their own sensor data as well as the sensor data received from other lighting fixtures B, C, and D to control operation of other lighting fixtures B, C, and D. With reference to FIG. 11, a partial communication flow is shown to illustrate this concept. Initially, assume that lighting fixture B and lighting fixture D are gathering sensor data from their respective sensors and providing that sensor data to lighting fixture C (steps 300 and 302). While not illustrated, lighting fixture C may be providing its sensor data to the other lighting fixtures B and D. Lighting fixture C may also be monitoring its own sensor data (step 304), and processing the sensor data from its own sensor as well as the sensor data from the other lighting fixtures B and D (step 306) to generate instructions for lighting fixtures B and C (step 308). Once the instructions are generated, they may be provided to the respective lighting fixtures B and D (steps 310 and 312). Accordingly, lighting fixture B may adjust its light output based on the instructions provided from lighting fixture C, the sensor data of lighting fixture D, or a combination thereof, depending on the internal logic of lighting fixture B (step 314). Lighting fixture C may adjust its light output based on its own sensor data or a combination of its own sensor data and the sensor data received from lighting fixtures B and D (step 316). Like lighting fixture B, lighting fixture D may adjust its light output based on instructions received from lighting fixture C, sensor data from lighting fixture D, or a combination thereof (step 318).

As a practical example, lighting fixtures B, C, and D may share ambient light information, which may dictate the intensity of the light output, the color temperature of the light output, the color of the light output, or any combination thereof. However, lighting fixture C may also be associated with an occupancy sensor. As such, the instructions provided by lighting fixture C to lighting fixtures B and D may instruct lighting fixtures B and D to turn on and provide light output at a certain level, color temperature, or color. Lighting fixtures B and D may respond directly to these instructions or may process these instructions in light of their respective internal logic to determine whether to turn on and how to control the respective light outputs. As such, the instructions provided from one lighting fixture 10 to another may be taken as an absolute command and responded to accordingly, or may be taken as a mere "suggestion" depending on the programming of the lighting fixture 10 that receives the instructions. For example, in the scenario above wherein lighting fixture C is instructing lighting fixture B to turn on, there may be sufficient sunlight measured at lighting fixture B that negates the need for lighting fixture B to turn on. Or, if lighting fixture B does decide to turn on, the color, intensity, or color temperature of the light may be adjusted by the amount and color of the sunlight being measured at lighting fixture B. Again, the distributed control described in the present disclosure allows these lighting fixtures 10 to operate independently, yet in concert if the internal logic so dictates.

Figure 12:
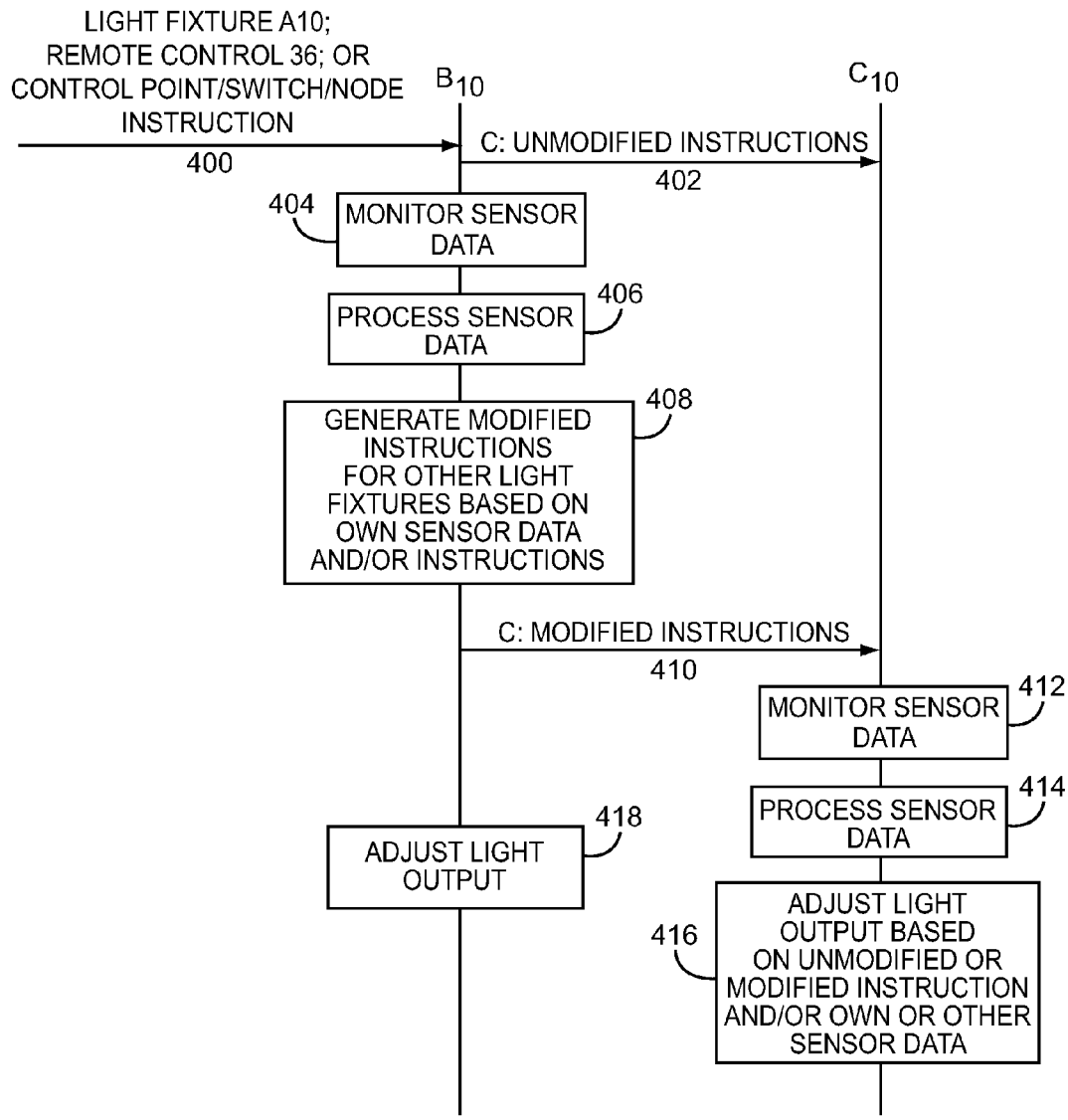
FIG. 12 is a communication flow diagram illustrating both the relay of instructions and the ability to modify instructions within the lighting system.

As shown in the partial communication flow of FIG. 12, the instructions provided from one lighting fixture 10 to another may be relayed through an intermediate lighting fixture 10. Further, the instructions may be modified as they are passed from one lighting fixture 10 to another, based on internal logic, sensor data, or the like. Initially, assume that lighting fixture A, a commissioning tool 36, or some other control point, switch, or node provides instructions to lighting fixture B (step 400). Lighting fixture B may receive these instructions and pass the unmodified instructions on to one or more other lighting fixtures 10 such as lighting fixture C (step 402). Lighting fixture B may then monitor its own sensor data (step 404), process the sensor data (step 406), and generate modified instructions for the other lighting fixtures 10, including lighting fixture C, based on its own sensor data, the sensor data of others, the instructions provided, or a combination thereof (step 408). The modified instructions may be sent to the other lighting fixtures 10, such as lighting fixture C (step 410). Lighting fixture B can then adjust its light output based on its own sensor data, the sensor data of others, and the instructions received (step 418). Lighting fixture C may monitor its own sensor data (step 412), process its sensor data (step 414), and then adjust its light output based on the various sensor data, the modified instructions, the unmodified instructions, or a combination thereof (step 416). Through this ability to share sensor data, communicate with each other, and operate independently according to internal logic, the various lighting fixtures 10 provide tremendous flexibility to lighting configurators.

Figure 13A:
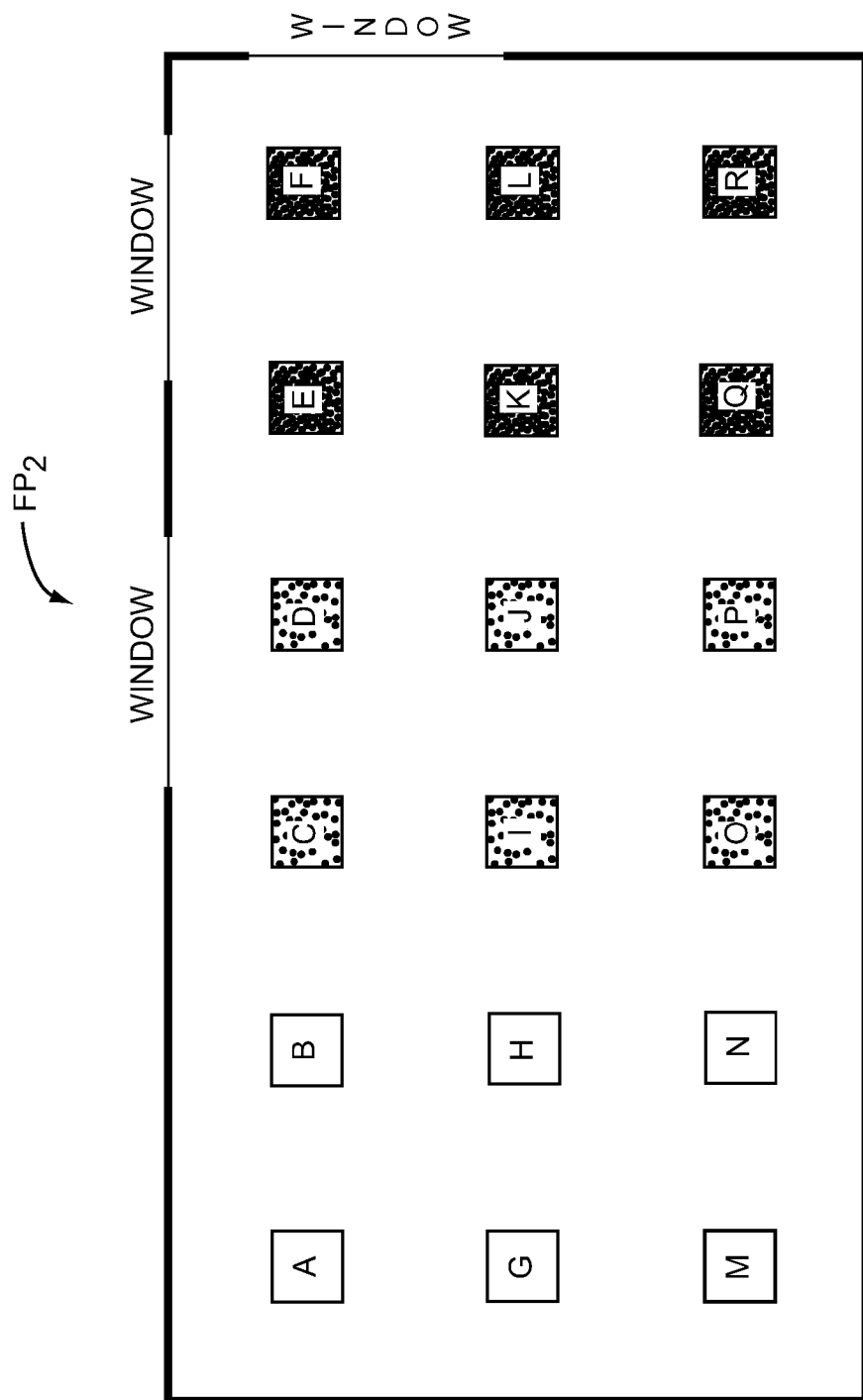
FIG. 13A illustrates a lighting system with three distinct zones, wherein each zone may have a different output level based on the presence of ambient light.
Figure 13B:
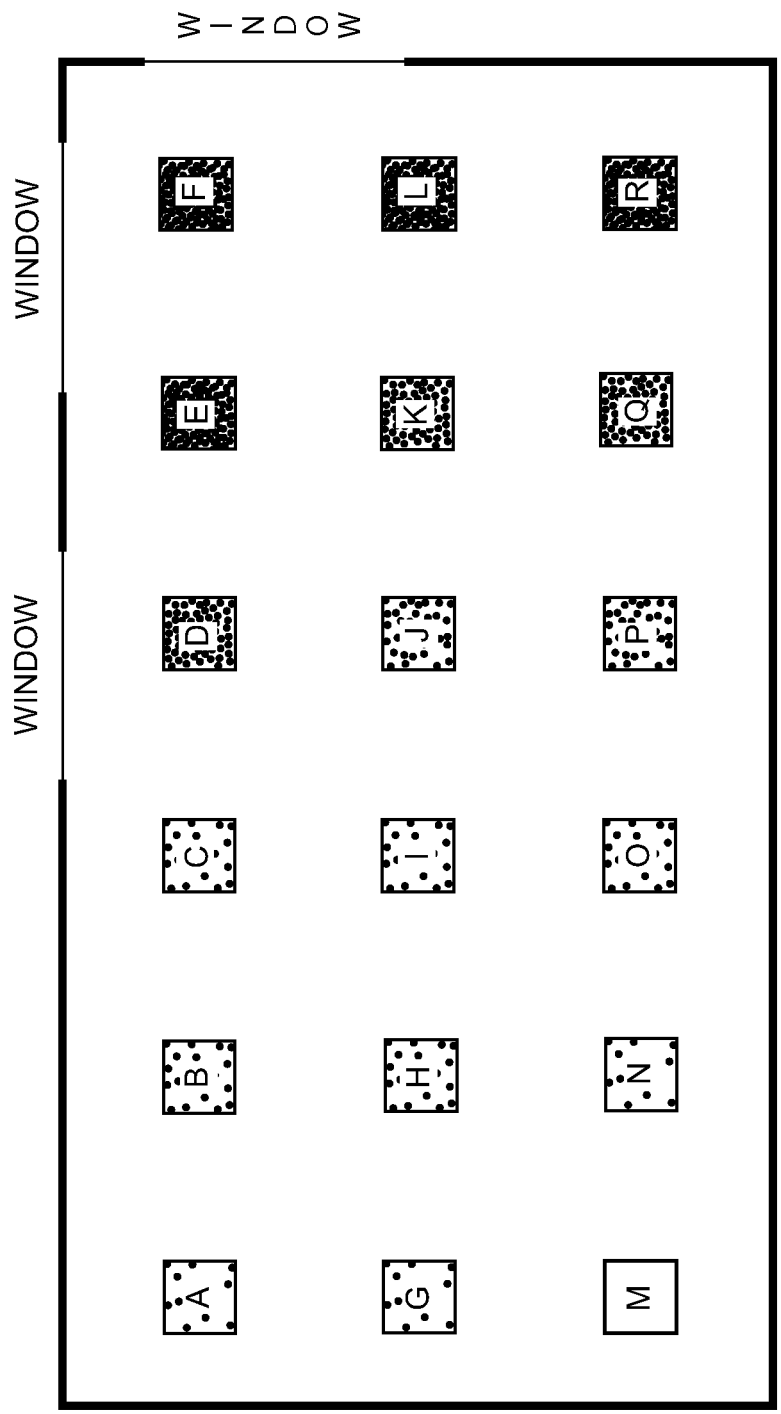
FIG. 13B illustrates a lighting system wherein there is a gradient in the light output based on the presence of ambient light.

With reference to FIGS. 13A and 13B, a floor plan FP2 with lighting fixtures A-R is illustrated. In FIG. 13A, the lighting fixtures A-R may be grouped such that the six lighting fixtures A, B, G, H, M, and N that are farthest from the windowed end of the room are at their full light outputs when on, the six lighting fixtures C, D, I, J, O, and P in the middle of the room are producing an intermediate light output when on, and the six lighting fixtures E, F, K, L, Q, and R that are closest to the windows are producing the least amount of light output when on and sunlight is detected by one of more of the lighting fixtures A-R. In this instance, the portion of the room with the most ambient sunlight will employ the least amount of artificial light. Each of the lighting fixtures A-R is associated with an overall zone for the room and different sub-zones for each of the three sets of six lighting fixtures A-R. While the lighting fixtures A-R are broken into three groups providing three distinct light output levels when ambient sunlight is detected, the lighting fixtures A-R may be configured such that every one of the lighting fixtures A-R provides light output at a different intensity (or color and color temperature) when ambient sunlight is detected.

For example and with reference to FIG. 13B, each of the lighting fixtures A-R may be treated as being in the same zone, yet the light output is subject to a gradient that occurs across the entire zone. The gradient may be linear or non-linear. For example, lighting fixture M, which is farthest away from any of the windows, will provide the most light output, while lighting fixture F, which is likely to be in an area receiving the most ambient sunlight, will provide the least light output.

Each of the lighting fixtures between lighting fixtures M and F may provide a continuously decreasing amount of light output according to a defined linear or non-linear gradient that is shared amongst the lighting fixtures A-R. Notably, the gradient may be known by all of the lighting fixtures A-R, wherein the gradient is continuously adjusted based on the amount of ambient sunlight available. Thus, the effective slope of the gradient is greatest when lighting fixture F detects the greatest amount of ambient sunlight, wherein the light output differential between the lighting fixtures M and F is the greatest. At night, when there is no ambient sunlight and very little light, if any, being received through the windows, all of the lighting fixtures A-R may determine to provide the same amount of light output, based on those lighting fixtures A-R that are closest to the windows sharing ambient light sensor data with the other lighting fixtures A-R in the zone. Again, the lighting fixtures A-R are capable of acting independently based on their own or shared sensor data. The internal logic used to control the light output based on the various sensor data may be fixed, manually adjusted, or dynamically adjusted based on interaction among the lighting fixtures A-R.

With continued reference to FIGS. 13A and 13B, assume that a doorway (not shown) is located near lighting fixture A and that at least lighting fixture A has or is associated with an occupancy sensor $S_O$. Further assume that all, or at least numerous ones, of the lighting fixtures A-R have or are associated with ambient light sensors $S_A$ and are currently in an off state. When someone walks into the room through the doorway into the room, the occupancy sensor $S_O$ will provide an occupied signal, which will alert lighting fixture A that the room is now occupied. In response, lighting fixture A may be programmed to instruct all of the other lighting fixtures B-R to turn on. Alternatively, lighting fixture A may share its occupancy sensor (or other sensor) information with the other lighting fixtures B-R, which will independently use their own internal logic to process the occupancy sensor information and turn themselves on.

Alternatively, lighting fixture A may instruct only a subgroup that is associated with a zone to turn. In the latter case, lighting fixture A may be programmed to only instruct lighting fixtures A, B, G, H, M, and N to turn on. The other zones [C, D, I, J, O, P] and [E, F, K, L, Q, R] in the room may turn on only when occupancy sensors $S_O$ associated with those zones detect an occupant. In either case, all of the lighting fixtures A-R may monitor the amount of ambient light being received through the windows, and perhaps the doorway, and individually control the level, color, and color temperature of the light to output once turned on. The level, color, and color temperature may dynamically change as ambient light levels change.

Instead of being instructed to turn on by another lighting fixture, each of the lighting fixtures A-R may have or be associated with an occupancy sensor $S_O$ and react independently to detecting an occupant. The occupancy sensor $S_O$ may employ any available type of motion, heat, or like sensor technology that is capable of detecting movement or the presence of people. The lighting fixtures A-R could also be programmed to turn on when light from another lighting fixture A-R is detected. Thus, when lighting fixture A turns on in response to detecting an occupant, the other lighting fixtures B-R will detect the presence of light from lighting fixture A and turn on in response to detecting the light from lighting fixture A turning on.

In certain embodiments, only one of the lighting fixtures A-R needs to be wired or wirelessly coupled to an on/off switch or dimmer. If lighting fixture A is coupled to the switch or dimmer, lighting fixture A can instruct the other lighting fixtures to turn on (as well as dim to a certain level). Alternatively, lighting fixture A could simply turn on to a certain output level. The other lighting fixtures B-R would detect the light as a result of lighting fixture A turning on, and perhaps the relative level of dimming through an associated ambient light sensor $S_A$, and turn on to a certain output level. If not sensed, the relative dimming level could be shared with lighting fixtures B-R by lighting fixture A.

The intelligence of the network is virtually limitless and affords the potential for highly intelligent lighting systems. For example, the lighting fixtures A-R may be able to determine (or be programmed with) their relative location to one another. Using the occupancy sensors $S_O$, the collective group of lighting fixtures A-R may be configured to develop predictive algorithms based on historical occupancy data and use these predictive algorithms to determine how long to keep lights on, what lights should turn on as a person walks into a room or down a hallway, and the like. For instance, the lighting fixtures 10 along a hallway may turn on sequentially and well in advance of a person walking down the hallway. The lights may turn off sequentially and behind the person as well. The sequential turning on of the lights may be triggered by a first lighting fixture 10 detecting the person, but the remaining lighting fixtures 10 in the hallway may sequentially turn on based on the historical walking speeds, paths, and the like that are embodied in the predictive algorithms. Each of the lighting fixtures 10 may share sensor data, instructions, and the like and then operate independently in light of this shared information.

The above concept of "light tracking" is illustrated below with two examples. For the first example, reference is made to FIG. 8A, which provides a light tracking example for a person walking along the hallway $HW_1$. Assume that the person enters the hallway near lighting fixture F, and exits the hallway near lighting fixture P. Also assume that each of the lighting fixtures F, G, H, K, and P include occupancy sensors $S_O$. As the person enters the hallway near lighting fixture F, lighting fixture F will sense the presence of the person via its occupancy sensor $S_O$ and turn itself on. Lighting fixture F may be programmed to alert lighting fixture G that lighting fixture F has detected a user. Lighting fixture G may know that lighting fixture H is currently off, and since lighting fixture F is detecting the presence of a person, lighting fixture G may turn itself on in a predictive fashion. If lighting fixture G subsequently detects the presence of a person, it may alert lighting fixture H and lighting fixture F. Once lighting fixture H receives an indication that the occupancy sensor of lighting fixture G has detected a person, it may turn on. If lighting fixture H detects the presence of a person through its occupancy sensor $S_O$, it may alert lighting fixture K, lighting fixture G, and lighting fixture F. Lighting fixture F may take this information as an indication that the person is travelling along the hallway $HW_1$ toward lighting fixture P, and thus turn off, as it may no longer be needed. Lighting fixture G may remain on for the time being, while lighting fixture K will turn on in a predictive fashion. This process may continue such that one, two, or more lights are on in the hallway $HW_1$ near the current location of the person. The time between adjacent occupancy sensor detections can also be used to approximate the speed at which the person is traveling. This can be used to predict where the person or object is going. For example, if someone is slowing down to enter a room, then the lights in the room may react accordingly.

Further, the ability of the lights to communicate with each other and to share their occupancy sensor information allows the group of lighting fixtures in the hallway $HW_1$ to light the current location of the person and predictively turn on lighting fixtures in advance of the person reaching a particular lighting fixture. Of course, all of the lighting fixtures in the hallway $HW_1$ could be turned on when lighting fixture F detects the presence of a person, and turn off when none of the lighting fixtures F, G, H, K, and P detect the presence of a person after a certain amount of time. As yet another tracking example, each of the lighting fixtures F, G, H, K, and P may merely turn on when they detect the presence of a person and turn off after a certain amount of time of no longer detecting the presence of a person or when none of the lighting fixtures in the group detects the presence of a person.

The tracking concepts are equally applicable to larger areas, such as rooms or outdoor areas. Reference is made to FIG. 13A or 13B for the following example. In a simplistic example, each of the lighting fixtures A-R may include an occupancy sensor $S_O$ and be programmed as follows. If the occupancy sensor $S_O$ for a particular lighting fixture A-R detects the presence of a person, that lighting fixture will turn on and instruct immediately adjacent lighting fixtures to turn on if they are not already on. As such, different ones of the lighting fixtures A-R or groups thereof may turn on and track the people in the room. The lighting fixture that detected the presence of a person (as well as those fixtures that were instructed to turn on by that lighting fixture) may stay on for a set period of time after the presence of the person is no longer detected. While the prior example is a simplistic tracking of room occupants and selectively turning lighting fixtures on or off based thereon, predictive algorithms may also be employed. For example, assume a person enters the room near lighting fixture M and walks diagonally across the room to the opposing corner near lighting fixture F. When lighting fixture M detects the presence of the person, it may turn on and instruct lighting fixtures G, H, and N to turn on. The remaining lighting fixtures will remain off. If lighting fixture N subsequently detects the presence of the person, it will remain on and will instruct lighting fixtures I and O to turn on, because it knows that lighting fixture M first detected the person and now lighting fixture N is detecting the person. When lighting fixture I detects the person, it may alert lighting fixtures B, C, D, H, J, N, O, and P to turn on as well, and may alert lighting fixture M as well. Lighting fixture M may no longer detect the presence of a person and may turn off, based on the knowledge that it is no longer detecting the presence of a person, and that lighting fixtures N and I have subsequently detected the presence of the person. This process may continue across the room, as lighting fixtures J, K, E, L, and F progressively turn on as lighting fixtures M, H, N, and the like turn off after the person has left the corresponding area of the room. Thus, basic tracking and predictive control may be used in virtually any environment to selectively turn on and turn off or otherwise control lighting fixtures in a room, group, or the like.

Figure 14:
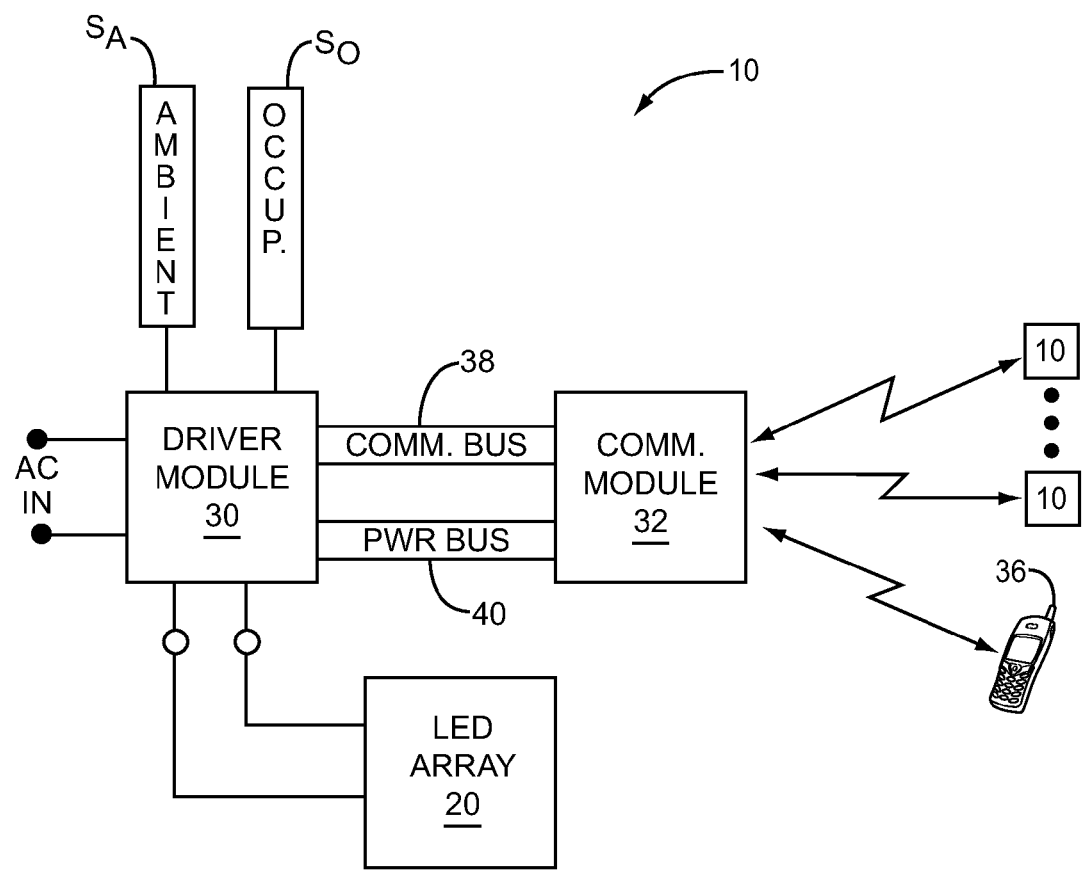
FIG. 14 is a block diagram of a lighting system according to one embodiment of the disclosure.

Turning now to FIG. 14, a block diagram of a lighting fixture 10 is provided according to one embodiment. Assume for purposes of discussion that the driver module 30, communications module 32, and LED array 20 are ultimately connected to form the core of the lighting fixture 10, and that the communications module 32 is configured to bidirectionally communicate with other lighting fixtures 10, the commissioning tool 36, or other control entity through wired or wireless techniques. In this embodiment, a standard communication interface and a first, or standard, protocol are used between the driver module 30 and the communications module 32. This standard protocol allows different driver modules 30 to communicate with and be controlled by different communications modules 32, assuming that both the driver module 30 and the communications module 32 are operating according to the standard protocol used by the standard communication interface. The term "standard protocol" is defined to mean any type of known or future developed, proprietary or industry-standardized protocol.

In the illustrated embodiment, the driver module 30 and the communications module 32 are coupled via a communication (COMM) bus 38 and a power (PWR) bus 40. The communication bus 38 allows the communications module 32 to receive information from the driver module 30 as well as control the driver module 30. An exemplary communication bus 38 is the well-known inter-integrated circuitry ($I^2C$) bus, which is a serial bus and is typically implemented with a two-wire interface employing data and clock lines. Other available buses include: serial peripheral interface (SPI) bus, Dallas Semiconductor Corporation's 1-Wire serial bus, universal serial bus (USB), RS-232, Microchip Technology Incorporated's UNI/O®, and the like.

In this embodiment, the driver module 30 is configured to collect data from the ambient light sensor $S_A$ and the occupancy sensor $S_O$ and drive the LEDs of the LED array 20. The data collected from the ambient light sensor $S_A$ and the occupancy sensor $S_O$ as well as any other operational parameters of the driver module 30 may be shared with the communications module 32. As such, the communications module 32 may collect data about the configuration or operation of the driver module 30 and any information made available to the driver module 30 by the LED array 20, the ambient light sensor $S_A$, and the occupancy sensor $S_O$. The collected data may be used by the communications module 32 to control how the driver module 30 operates, may be shared with other lighting fixtures 10 or control entities, or may be processed to generate instructions that are sent to other lighting fixtures 10.

The communications module 32 may also be controlled in whole or in part by a remote control entity, such as the commissioning tool 36 or another lighting fixture 10. In general, the communications module 32 will process sensor data and instructions provided by the other lighting fixtures 10 or remote control entities and then provide instructions over the communication bus 38 to the driver module 30. An alternative way of looking at it is that the communications module 32 facilitates the sharing of the system's information, including occupancy sensing, ambient light sensing, dimmer switch settings, etc., and provides this information to the driver module 30, which then uses its own internal logic to determine what action(s) to take. The driver module 30 will respond by controlling the drive current or voltages provided to the LED array 20 as appropriate. An exemplary command set for a hypothetical protocol is provided below.

Exemplary Command Set

| Command | Source | Receiver | Description |
|---|---|---|---|
| On/Off | Communications Module | Driver Module | On/Off |
| Color Temperature | Communications Module | Driver Module | Color temperature of solid state light |

-continued

| Command | Source | Receiver | Description |
| --- | --- | --- | --- |
| Dimming Level | Communications Module | Driver Module | Set light level |
| Fixture ID | Driver Module | Communications Module | Solid State light id |
| Health | Driver Module | Communications Module | Health of solid state light |
| Power Usage | Driver Module | Communications Module | Power used by solid state light |
| Usage | Driver Module | Communications Module | Hours of use |
| Lifetime | Driver Module | Communications Module | Useful life (factors hours, ambient temp and power level) |
| Zone ID | Driver Module | Communications Module | Identifies the zone the fixture is in |
| Temperature | Driver Module | Communications Module | Solid State temperature level (protection) |
| Emergency Enabled | Driver Module | Communications Module | Identifies the fixture as an emergency enabled fixture. |
| Emergency Health | Driver Module | Communications Module | Battery State |
| Emergency Test | Communications Module | Driver Module | Remote method to allow testing of emergency solid state fixture |
| Emergency Pass | Driver Module | Communications Module | Pass indication for emergency test |
| Emergency time remaining | Driver Module | Communications Module | Battery time left |
| Occupancy Statistics | Driver Module | Communications Module | Number of occupancy events |
| Daylighting statistics | Driver Module | Communications Module | Average dim level to maintain ambient light level |
| Sensor Data Update | Any Device with Sensor(s) | Any Device | Ambient light level, occupancy detection status, etc. |
| User Dimmer/Switch Setting Update | Dimmer/Switch | Fixtures & Wireless Relay Modules | Value of dimmer switch setting |

The above table has four columns: command, source, receiver, and description. The command represents the actual instruction passed either from the communications module 32 to the driver module 30 or from the driver module 30 to the communications module 32. The source identifies the sender of the command. The receiver identifies the intended recipient of the command. The communication column provides a description of the command. For example, the "on/off" command is sent by the communications module 32 to the driver module 30 and effectively allows the communications module 32 to instruct the driver module 30 to either turn on or turn off the LED array 20. The "color temperature" command allows the communications module 32 to instruct the driver module 30 to drive the LED array 20 in a manner to generate a desired color temperature. The "color temperature" command may actually include the desired color temperature or a reference to available color temperature.

The "dimming level" command is sent from the communications module 32 to the driver module 30 to set an overall light level based on a desired level of dimming. The "fixture ID" command allows the driver module 30 to identify itself to the communications module 32. The "health" command allows the driver module 30 to send the communications module 32 information relative to its operational capability or, in other words, health. The "power usage" command allows the driver module 30 to tell the communications module 32 how much power is being used by the driver module 30 on average or at any given time, depending on the capabilities of the driver module 30. The "usage" command allows the driver module 30 to identify the total hours of use, hours of consistent use, or the like to the communications module 32. The "lifetime" command allows the driver module 30 to provide an estimate of the useful remaining life of the driver module 30, the LED array 20, or a combination thereof to the communications module 32. Based on the capabilities of the driver module 30, the amount of remaining life may factor in past usage, ambient temperatures, power levels, or the like.

The "zone ID" command allows the driver module 30 to tell the communications module 32 in which zone the driver module 30 resides. This command is useful when the other lighting fixtures 10 or the remote control entity is controlling multiple lighting fixtures and is collecting information about the zones in which the lighting fixtures 10 reside. The "temperature" command allows the driver module 30 to provide ambient temperature information for the driver module 30 or the LED array 20 to the communications module 32.

The "emergency enabled" command allows the driver module 30 to tell the communications module 32 that the lighting fixture 10 is an emergency enabled fixture, which can be used for emergency lighting. The "emergency health" command allows the driver module 30 to provide information bearing on the ability of the driver module 30 or the lighting fixture 10 to function as an emergency lighting fixture. In a simple embodiment, the command may provide the state of an emergency backup battery that has been made available to drive the lighting fixture 10 in case of an emergency. The "emergency test" command allows the communications module 32 to send an instruction to the driver module 30 to run an emergency lighting test to ensure that the lighting fixture 10 can operate in an emergency lighting mode, if so required. The "emergency pass" command allows the driver module 30 to inform the communications module 32 that the emergency test was passed (or failed). The above commands primarily describe the direction of information flow. However, the protocol may allow the communications module 32 or the driver module 30 to selectively or periodically request any of this or other information specifically or in batches.

The use of a standard communication interface and a standard protocol for communications between the driver module 30 and the communications module 32 supports a modular approach for the driver module 30 and the communications module 32. For example, different manufacturers may make different communications modules 32 that interface with a particular driver module 30. The different communications modules 32 may be configured to drive the driver module 30 differently based on different lighting applications, available features, price points, and the like. As such, the communications module 32 may be configured to communicate with different types of driver modules 30. Once a communications module 32 is coupled to a driver module 30, the communications module 32 identifies the type of driver module 30 and will interface with the driver module 30 accordingly. Further, a driver module 30 may be able to operate over various ranges for different lighting parameters. Different communications modules 32 may be configured to control these parameters to varying degrees. The first communications module 32 may only be given access to a limited parameter set, wherein another communications module 32 may be given access to a much greater parameter set. The table below provides an exemplary parameter set for a given driver module 30.

Parameters

| | |
|---|---|
| PWM dimming Frequency | 200 Hz through 1000 Hz |
| Maximum Light Level | 50% to 100% |
| Color Temperature | 2700 K to 6000 K |
| Maximum allowable hours | 50,000 to 100,000 |
| Minimum dimming level | 0 to 50% |
| Response time | 100 ms to 1 sec |
| Color temperature settable | 0 or 1 |
| Dimming curve | Linear, exponential. Dim to warmer or cooler color temperature |
| Alarm Indication | 0 or 1 |

The parameters in the above table may represent the available control points for a given driver module 30. A given parameter set may be assigned to the driver module 30 during manufacture or may be set by the communications module 32 during installation of the lighting fixture 10 or upon associating the communications module 32 with the driver module 30. The parameter set includes various parameters, such as the pulse width modulation (PWM) dimming frequency, maximum light level, and color temperature. The parameter set represents the allowable ranges for each of these parameters. Each parameter may be set within the identified range in the parameter set during operation or the like by the communications module 32 or the remote control system, depending on the desires of the designer or the particular application.

As an example, the maximum light level for the exemplary parameter set indicates it can be set from anywhere from 50% to 100% of the capabilities of the driver module 30 and the associated LED array 20. If the end user or owner of the lighting system that employs the lighting fixture 10 initiates the appropriate instructions, the maximum light level may be set to 80% in an appropriate parameter field. As such, the driver module 30 would not drive the LED array 20 to exceed 80%, even if the communications module 32 provided a command to the driver module 30 to increase the lighting level above 80% of its maximum capability. These parameters may be stored in the driver module 30 or in the communications module 32 in non-volatile memory.

In certain embodiments, the driver module 30 includes sufficient electronics to process an alternating current (AC) input signal (AC IN) and provide an appropriate rectified or direct current (DC) signal sufficient to power the communications module 32, and perhaps the LED array 20. As such, the communications module 32 does not require separate AC-to-DC conversion circuitry to power the electronics residing therein, and can simply receive DC power from the driver module 30 over the power bus 40, which may be separate from the communication bus 38 or may be integrated with the communication bus 38, as will be described below.

In one embodiment, one aspect of the standard communication interface is the definition of a standard power delivery system. For example, the power bus 40 may be set to a low voltage level, such as 5 volts, 12 volts, 24 volts, or the like. The driver module 30 is configured to process the AC input signal to provide the defined low voltage level and provide that voltage over the power bus 40, thus the communications module 32 or auxiliary devices may be designed in anticipation of the desired low voltage level being provided over the power bus 40 by the driver module 30 without concern for connecting to or processing an AC signal to a DC power signal for powering the electronics of the communications module 32.

Figure 15:
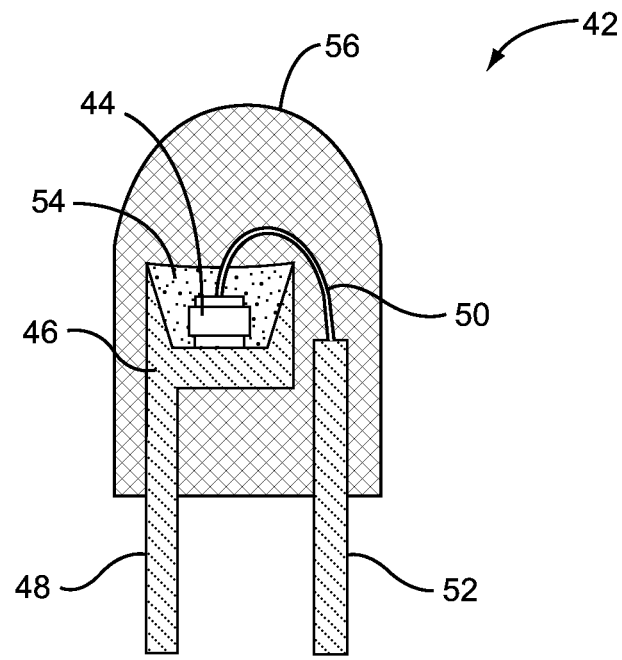
FIG. 15 is a cross section of an exemplary LED according to a first embodiment of the disclosure.

A description of an exemplary embodiment of the LED array 20, driver module 30, and the communications module 32 follows. As noted, the LED array 20 includes a plurality of LEDs, such as the LEDs 42 illustrated in FIGS. 15 and 16. With reference to FIG. 15, a single LED chip 44 is mounted on a reflective cup 46 using solder or a conductive epoxy, such that ohmic contacts for the cathode (or anode) of the LED chip 44 are electrically coupled to the bottom of the reflective cup 46. The reflective cup 46 is either coupled to or integrally formed with a first lead 48 of the LED 42. One or more bond wires 50 connect ohmic contacts for the anode (or cathode) of the LED chip 44 to a second lead 52.

The reflective cup 46 may be filled with an encapsulant material 54 that encapsulates the LED chip 44. The encapsulant material 54 may be clear or contain a wavelength conversion material, such as a phosphor, which is described in greater detail below. The entire assembly is encapsulated in a clear protective resin 56, which may be molded in the shape of a lens to control the light emitted from the LED chip 44.

Figure 16:
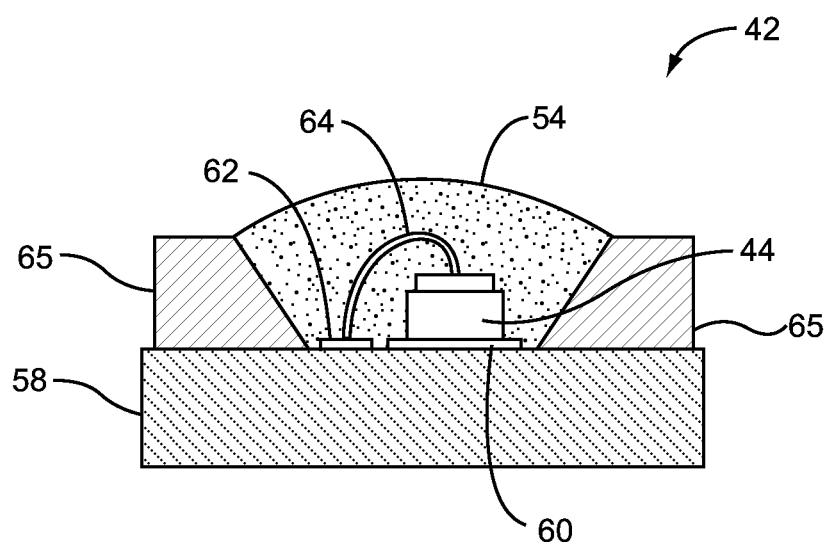
FIG. 16 is a cross section of an exemplary LED according to a second embodiment of the disclosure.

An alternative package for an LED 42 is illustrated in FIG. 16 wherein the LED chip 44 is mounted on a substrate 58. In particular, the ohmic contacts for the anode (or cathode) of the LED chip 44 are directly mounted to first contact pads 60 on the surface of the substrate 58. The ohmic contacts for the cathode (or anode) of the LED chip 44 are connected to second contact pads 62, which are also on the surface of the substrate 58, using bond wires 64. The LED chip 44 resides in a cavity of a reflector structure 65, which is formed from a reflective material and functions to reflect light emitted from the LED chip 44 through the opening formed by the reflector structure 65. The cavity formed by the reflector structure 65 may be filled with an encapsulant material 54 that encapsulates the LED chip 44. The encapsulant material 54 may be clear or contain a wavelength conversion material, such as a phosphor.

In either of the embodiments of FIGS. 15 and 16, if the encapsulant material 54 is clear, the light emitted by the LED chip 44 passes through the encapsulant material 54 and the protective resin 56 without any substantial shift in color. As such, the light emitted from the LED chip 44 is effectively the light emitted from the LED 42. If the encapsulant material 54 contains a wavelength conversion material, substantially all or a portion of the light emitted by the LED chip 44 in a first wavelength range may be absorbed by the wavelength conversion material, which will responsively emit light in a second wavelength range. The concentration and type of wavelength conversion material will dictate how much of the light emitted by the LED chip 44 is absorbed by the wavelength conversion material as well as the extent of the wavelength conversion. In embodiments where some of the light emitted by the LED chip 44 passes through the wavelength conversion material without being absorbed, the light passing through the wavelength conversion material will mix with the light emitted by the wavelength conversion material. Thus, when a wavelength conversion material is used, the light emitted from the LED 42 is shifted in color from the actual light emitted from the LED chip 44.

For example, the LED array 20 may include a group of BSY or BSG LEDs 42 as well as a group of red LEDs 42. BSY LEDs 42 include an LED chip 44 that emits bluish light, and the wavelength conversion material is a yellow phosphor that absorbs the blue light and emits yellowish light. Even if some of the bluish light passes through the phosphor, the resultant mix of light emitted from the overall BSY LED 42 is yellowish light. The yellowish light emitted from a BSY LED 42 has a color point that falls above the Black Body Locus (BBL) on the 1931 CIE chromaticity diagram wherein the BBL corresponds to the various color temperatures of white light.

Similarly, BSG LEDs 42 include an LED chip 44 that emits bluish light; however, the wavelength conversion material is a greenish phosphor that absorbs the blue light and emits greenish light. Even if some of the bluish light passes through the phosphor, the resultant mix of light emitted from the overall BSG LED 42 is greenish light. The greenish light emitted from a BSG LED 42 has a color point that falls above the BBL on the 1931 CIE chromaticity diagram wherein the BBL corresponds to the various color temperatures of white light.

The red LEDs 42 generally emit reddish light at a color point on the opposite side of the BBL as the yellowish or greenish light of the BSY or BSG LEDs 42. As such, the reddish light from the red LEDs 42 mixes with the yellowish or greenish light emitted from the BSY or BSG LEDs 42 to generate white light that has a desired color temperature and falls within a desired proximity of the BBL. In effect, the reddish light from the red LEDs 42 pulls the yellowish or greenish light from the BSY or BSG LEDs 42 to a desired color point on or near the BBL. Notably, the red LEDs 42 may have LED chips 44 that natively emit reddish light wherein no wavelength conversion material is employed. Alternatively, the LED chips 44 may be associated with a wavelength conversion material, wherein the resultant light emitted from the wavelength conversion material and any light that is emitted from the LED chips 44 without being absorbed by the wavelength conversion material mixes to form the desired reddish light.

The blue LED chip 44 used to form either the BSY or BSG LEDs 42 may be formed from a gallium nitride (GaN), indium gallium nitride (InGaN), silicon carbide (SiC), zinc selenide (ZnSe), or like material system. The red LED chip 44 may be formed from an aluminum indium gallium nitride (AlInGaP), gallium phosphide (GaP), aluminum gallium arsenide (AlGaAs), or like material system. Exemplary yellow phosphors include cerium-doped yttrium aluminum garnet (YAG:Ce), yellow BOSE (Ba, O, Sr, Si, Eu) phosphors, and the like. Exemplary green phosphors include green BOSE phosphors, Lutetium aluminum garnet (LuAg), cerium doped LuAg (LuAg:Ce), Maui M535 from Lightscape Materials, Inc. of 201 Washington Road, Princeton, N.J. 08540, and the like. The above LED architectures, phosphors, and material systems are merely exemplary and are not intended to provide an exhaustive listing of architectures, phosphors, and materials systems that are applicable to the concepts disclosed herein.

Figure 17:
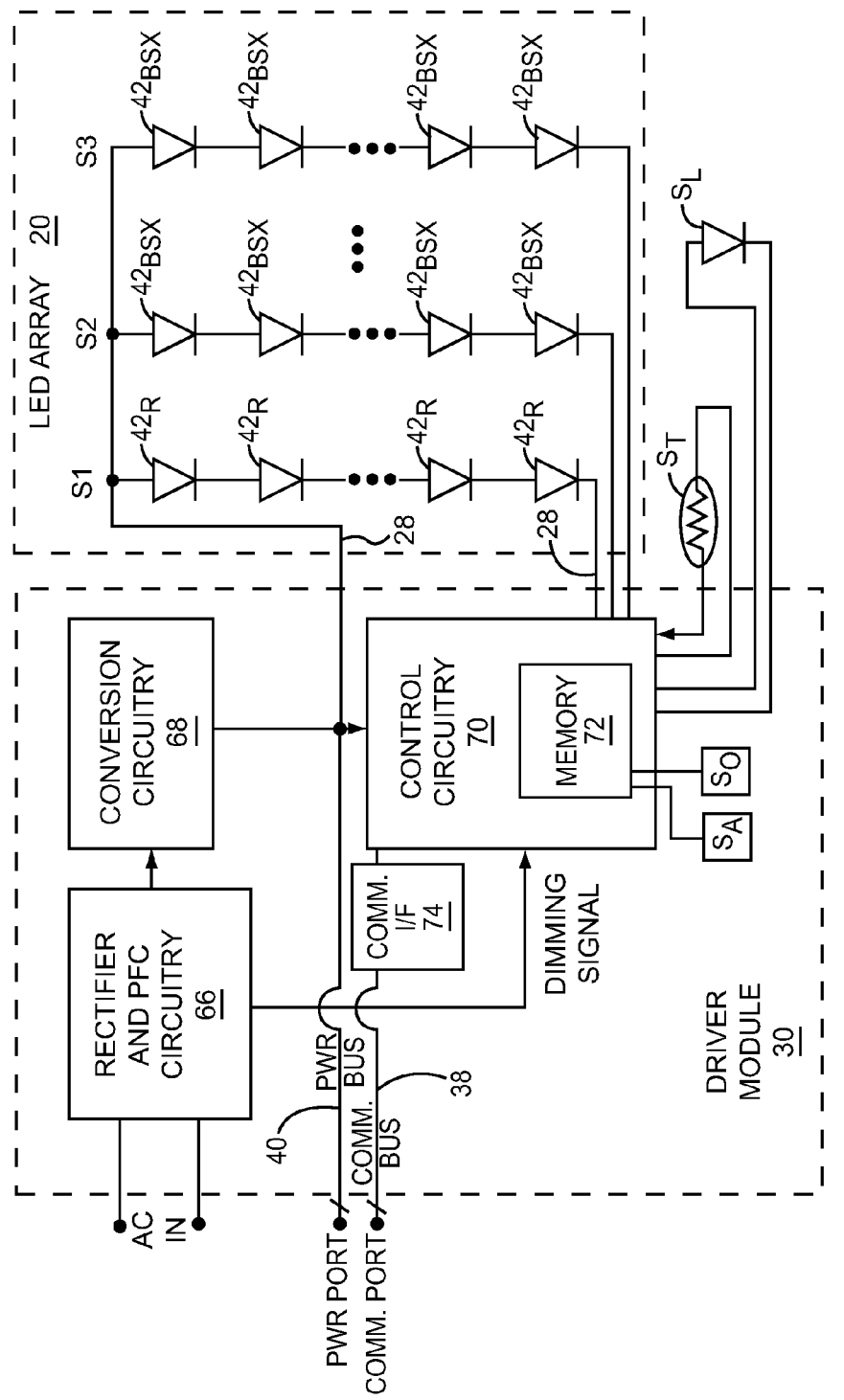
FIG. 17 is a schematic of a driver module and an LED array according to one embodiment of the disclosure.

As noted, the LED array 20 may include a mixture of red LEDs 42 and either BSY or BSG LEDs 42. The driver module 30 for driving the LED array 20 is illustrated in FIG. 17 according to one embodiment of the disclosure. The LED array 20 may be electrically divided into two or more strings of series connected LEDs 42. As depicted, there are three LED strings S1, S2, and S3. For clarity, the reference number "" will include a subscript indicative of the color of the LED 42 in the following text where 'R' corresponds to red, 'BSY' corresponds to blue shifted yellow, 'BSC' corresponds to blue shifted green, and 'BSX' corresponds to either BSG or BSY LEDs. LED string S1 includes a number of red LEDs $42_R$, LED string S2 includes a number of either BSY or BSG LEDs $42_{BSX}$, and LED string S3 includes a number of either BSY or BSG LEDs $42_{BSX}$. The driver module 30 controls the current delivered to the respective LED strings S1, S2, and S3. The current used to drive the LEDs 42 is generally pulse width modulated (PWM), wherein the duty cycle of the pulsed current controls the intensity of the light emitted from the LEDs 42.

The BSY or BSG LEDs $42_{BSX}$ in the second LED string S2 may be selected to have a slightly more bluish hue (less yellowish or greenish hue) than the BSY or BSG LEDs $42_{BSX}$ in the third LED string S3. As such, the current flowing through the second and third strings S2 and S3 may be tuned to control the yellowish or greenish light that is effectively emitted by the BSY or BSG LEDs $42_{BSX}$ of the second and third LED strings S2, S3. By controlling the relative intensities of the yellowish or greenish light emitted from the differently hued BSY or BSG LEDs $42_{BSX}$ of the second and third LED strings S2, S3, the hue of the combined yellowish or greenish light from the second and third LED strings S2, S3 may be controlled in a desired fashion.

The ratio of current provided through the red LEDs $42_R$ of the first LED string S1 relative to the currents provided through the BSY or BSG LEDs $42_{BSX}$ of the second and third LED strings S2 and S3 may be adjusted to effectively control the relative intensities of the reddish light emitted from the red LEDs $42_R$ and the combined yellowish or greenish light emitted from the various BSY or BSG LEDs $42_{BSX}$. As such, the intensity and the color point of the yellowish or greenish light from BSY or BSG LEDs $42_{BSX}$ can be set relative to the intensity of the reddish light emitted from the red LEDs $42_R$. The resultant yellowish or greenish light mixes with the reddish light to generate white light that has a desired color temperature and falls within a desired proximity of the BBL.

Notably, the number of LED strings Sx may vary from one to many and different combinations of LED colors may be used in the different strings. Each LED string Sx may have LEDs 42 of the same color, variations of the same color, or substantially different colors, such as red, green, and blue. In one embodiment, a single LED string may be used, wherein the LEDs in the string are all substantially identical in color, vary in substantially the same color, or include different colors. In another embodiment, three LED strings Sx with red, green, and blue LEDs may be used, wherein each LED string Sx is dedicated to a single color. In yet another embodiment, at least two LED strings Sx may be used, wherein different colored BSY LEDs are used in one of the LED strings Sx and red LEDs are used in the other of the LED strings Sx.

The driver module 30 depicted in FIG. 17 generally includes rectifier and power factor correction (PFC) circuitry 66, conversion circuitry 68, and control circuitry 70. The rectifier and power factor correction circuitry 66 is adapted to receive an AC power signal (AC IN), rectify the AC power signal, and correct the power factor of the AC power signal. The resultant signal is provided to the conversion circuitry 68, which converts the rectified AC power signal to a DC power signal. The DC power signal may be boosted or bucked to one or more desired DC voltages by DC-DC converter circuitry, which is provided by the conversion circuitry 68. Internally, ThE DC power signal may be used to power the control circuitry 70 and any other circuitry provided in the driver module 30.

The DC power signal is also provided to the power bus 40, which is coupled to one or more power ports, which may be part of the standard communication interface. The DC power signal provided to the power bus 40 may be used to provide power to one or more external devices that are coupled to the power bus and separate from the driver module 30. These external devices may include the communications module 32 and any number of auxiliary devices, which are discussed further below. Accordingly, these external devices may rely on the driver module 30 for power and can be efficiently and cost effectively designed accordingly. The rectifier and PFC circuitry 66 and the conversion circuitry 68 of the driver module 30 are robustly designed in anticipation of being required to supply power to not only its internal circuitry and the LED array 20, but also to supply power to these external devices as well. Such a design greatly simplifies the power supply design, if not eliminating the need for a power supply, and reduces the cost for these external devices.

As illustrated, the DC power signal may be provided to another port, which will be connected by the cabling 28 to the LED array 20. In this embodiment, the supply line of the DC power signal is ultimately coupled to the first end of each of the LED strings S1, S2, and S3 in the LED array 20. The control circuitry 70 is coupled to the second end of each of the LED strings S1, S2, and S3 by the cabling 28. Based on any number of fixed or dynamic parameters, the control circuitry 70 may individually control the pulse width modulated current that flows through the respective LED strings S1, S2, and S3 such that the resultant white light emitted from the LED strings S1, S2, and S3 has a desired color temperature and falls within a desired proximity of the BBL. Certain of the many variables that may impact the current provided to each of the LED strings S1, S2, and S3 include: the magnitude of the AC power signal, the resultant white light, ambient temperature of the driver module 30 or LED array 20. Notably, the architecture used to drive the LED array 20 in this embodiment is merely exemplary, as those skilled in the art will recognize other architectures for controlling the drive voltages and currents presented to the LED strings S1, S2, and S3.

In certain instances, a dimming device controls the AC power signal. The rectifier and PFC circuitry 66 may be configured to detect the relative amount of dimming associated with the AC power signal and provide a corresponding dimming signal to the control circuitry 70. Based on the dimming signal, the control circuitry 70 will adjust the current provided to each of the LED strings S1, S2, and S3 to effectively reduce the intensity of the resultant white light emitted from the LED strings S1, S2, and S3 while maintaining the desired color temperature. Dimming instructions may alternatively be delivered from the communications module 32 to the control circuitry 70 in the form of a command via the communication bus 38.

The intensity or color of the light emitted from the LEDs 42 may be affected by ambient temperature. If associated with a thermistor $S_T$ or other temperature-sensing device, the control circuitry 70 can control the current provided to each of the LED strings S1, S2, and S3 based on ambient temperature in an effort to compensate for adverse temperature effects. The intensity or color of the light emitted from the LEDs 42 may also change over time. If associated with an LED light sensor $S_L$, the control circuitry 70 can measure the color of the resultant white light being generated by the LED strings S1, S2, and S3 and adjust the current provided to each of the LED strings S1, S2, and S3 to ensure that the resultant white light maintains a desired color temperature or other desired metric. The control circuitry 70 may also monitor the output of the occupancy and ambient light sensors $S_O$ and $S_A$ for occupancy and ambient light information.

The control circuitry 70 may include a central processing unit (CPU) and sufficient memory 72 to enable the control circuitry 70 to bidirectionally communicate with the communications module 32 or other devices over the communication bus 38 through an appropriate communication interface (I/F) 74 using a defined protocol, such as the standard protocol described above. The control circuitry 70 may receive instructions from the communications module 32 or other device and take appropriate action to implement the received instructions. The instructions may range from controlling how the LEDs 42 of the LED array 20 are driven to returning operational data, such as temperature, occupancy, light output, or ambient light information, that was collected by the control circuitry 70 to the communications module 32 or other device via the communication bus 38. As described further below in association with FIG. 21, the functionality of the communications module 32 may be integrated into the driver module 30, and vice versa.

Figure 18:
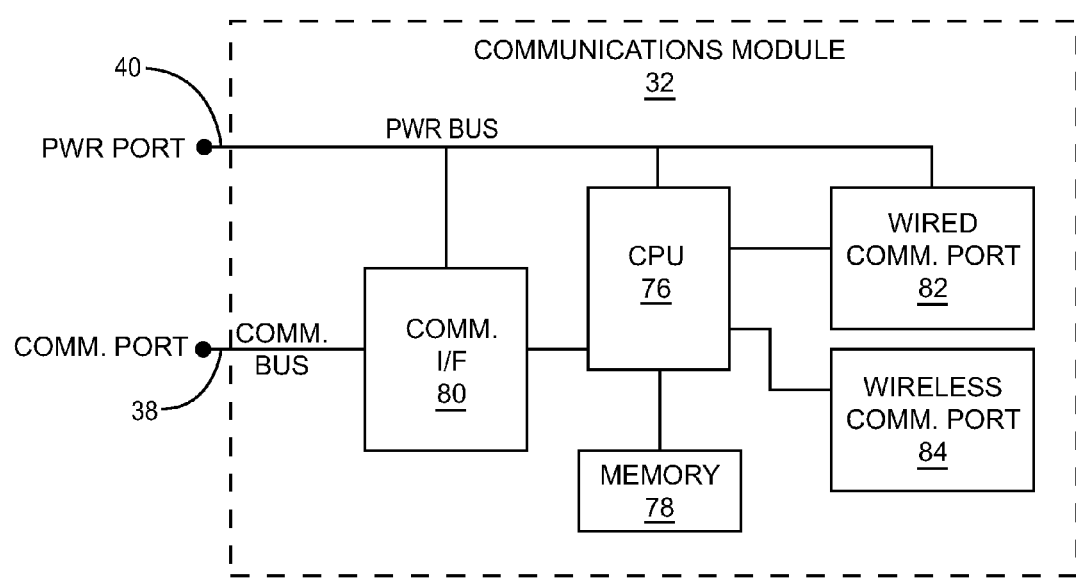
FIG. 18 is a block diagram of a communications module according to one embodiment of the disclosure.

With reference to FIG. 18, a block diagram of one embodiment of the communications module 32 is illustrated. The communications module 32 includes a CPU 76 and associated memory 78 that contains to the requisite software instructions and data to facilitate operation as described herein. The CPU 76 may be associated with a communication interface 80, which is to be coupled to the driver module 30, directly or indirectly via the communication bus 38. The CPU 76 may also be associated with a wired communication port 82, a wireless communication port 84, or both, to facilitate wired or wireless communications with other lighting fixtures 10 and remote control entities.

The capabilities of the communications module 32 may vary greatly from one embodiment to another. For example, the communications module 32 may act as a simple bridge between the driver module 30 and the other lighting fixtures 10 or remote control entities. In such an embodiment, the CPU 76 will primarily pass data and instructions received from the other lighting fixtures 10 or remote control entities to the driver module 30, and vice versa. The CPU 76 may translate the instructions as necessary based on the protocols being used to facilitate communications between the driver module 30 and the communications module 32 as well as between the communications module 32 and the remote control entities. In other embodiments, the CPU 76 plays an important role in coordinating intelligence and sharing data among the lighting fixtures 10 as well as providing significant, if not complete, control of the driver module 30. While the communications module 32 may be able to control the driver module 30 by itself, the CPU 76 may also be configured to receive data and instructions from the other lighting fixtures 10 or remote control entities and use this information to control the driver module 30. The communication module 32 may also provide instructions to other lighting fixtures 10 and remote control entities based on the sensor data from the associated driver module 30 as well as the sensor data and instructions received from the other lighting fixtures 10 and remote control entities.

Power for the CPU 76, memory 78, the communication interface 80, and the wired and/or wireless communication ports 82 and 84 may be provided over the power bus 40 via the power port. As noted above, the power bus 40 may receive its power from the driver module 30, which generates the DC power signal. As such, the communications module 32 may not need to be connected to AC power or include rectifier and conversion circuitry. The power port and the communication port may be separate or may be integrated with the standard communication interface. The power port and communication port are shown separately for clarity. The communication bus 38 may take many forms. In one embodiment, the communication bus 38 is a 2-wire serial bus, wherein the connector or cabling configuration may be configured such that the communication bus 38 and the power bus 40 are provided using four wires: data, clock, power, and ground.

Figure 19:
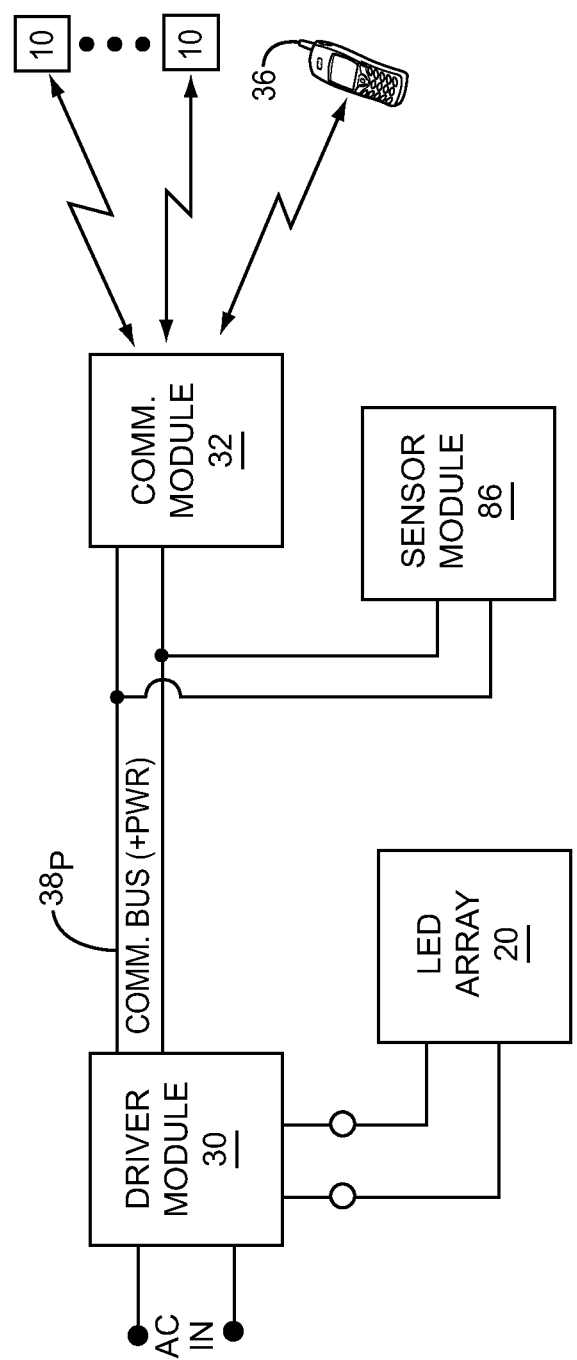
FIG. 19 is a block diagram of a lighting fixture according to a first embodiment of the disclosure.

In other embodiments, the communication bus 38 and the power bus 40 may be effectively combined to provide a communication bus $38_P$ that not only supports bidirectional communications, but also provides DC power, as shown in FIG. 19. In a 4-wire system, two wires may be used for data and clock signals, and another two wires may be used for power and ground. The availability of the communication bus $38_P$ (or communication bus 38) allows auxiliary modules to be coupled to the communication bus $38_P$. As shown in FIG. 19, the driver module 30, a communications module 32, and an auxiliary sensor module 86 are all coupled to the communication bus $38_P$ and configured to use a standard protocol to facilitate communications therebetween. The auxiliary sensor module 86 may be specially configured to sense occupancy, ambient light, light output, temperature, or the like and provide corresponding sensor data to the communications module 32 or the driver module 30. The auxiliary sensor module 86 may be used to provide different types of supplemental control for the driver module 30 as well as the communications module based on different lighting applications or requirements.

Figure 20:
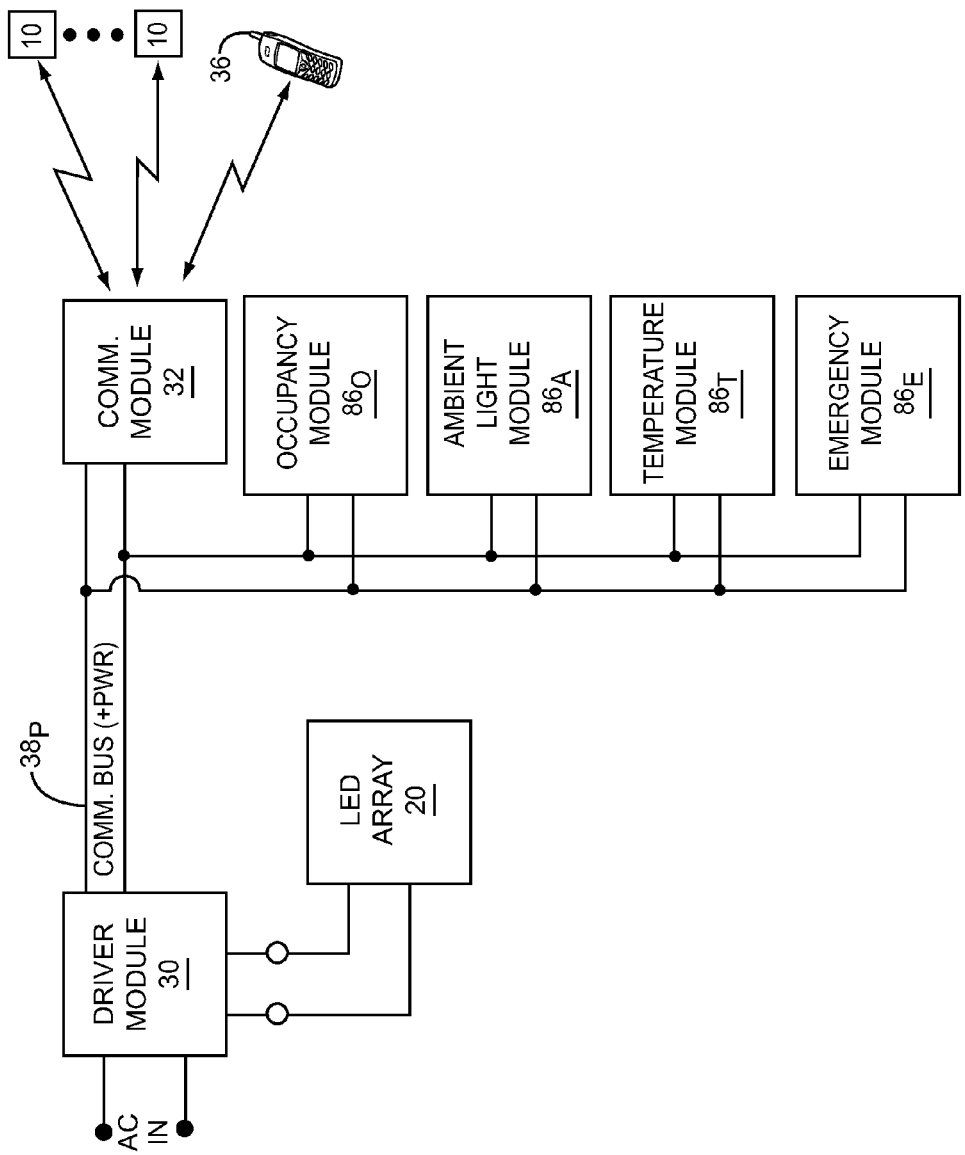
FIG. 20 is a block diagram of a lighting fixture according to a second embodiment of the disclosure.

While any number of functions or control techniques may be employed by an auxiliary sensor module 86, several examples are shown in FIG. 20. The illustrated auxiliary sensor modules include: an occupancy module $86_O$, an ambient light module $86_A$, a temperature module $86_T$, and an emergency module $86_E$. The occupancy module $86_O$ may be configured with an occupancy sensor and function to provide information bearing on whether the room in which the lighting fixture 10 is mounted is occupied. When the room is initially occupied, the communications module 32 may instruct the driver module 30 to drive the LED array 20 such that the lighting fixture 10 is effectively turned on and provide instructions for other lighting fixtures 10 in the same zone to do the same.

The ambient light module $86_A$ may include an ambient light sensor that is capable of measuring ambient light, determining the characteristics of the ambient light, and then providing such information to the communications module 32 or the driver module 30. As a result, either the communications module 32 will instruct the driver module 30 or the driver module 30 will independently function to drive the LED array 20 in a manner based on the amount or characteristics of the ambient light. For example, if there is a lot of ambient light, the driver module 30 may only drive the LED array 20 to a level corresponding to 20% of its maximum light output. If there is little or no ambient light, the driver module 30 may drive the LED array 20 at or near maximum capacity. In more sophisticated embodiments, the ambient light module $86_A$, the driver module 30, or the communications module 32 may analyze the quality of the ambient light and cause the driver module 30 to drive the LED array 20 in a manner based on the quality of the ambient light. For example, if there is a relatively large amount of reddish light in the ambient light, the ambient light module $86_A$ may instruct the driver module 30 to drive the LED array 20 such that the less efficient, red LEDs $42_R$ are driven at a lower level than normal to improve the overall efficiency of the lighting fixture 10. The communications module 32 may share the ambient light data with the other lighting fixtures 10 or remote control entities as well as process the ambient light data from one or more lighting fixtures 10 and provide instructions to other lighting fixtures 10 based thereon.

The temperature module $86_T$ may include a sensor capable of determining the ambient temperature of the room, the LED array 20, or electronics associated with any of the modules. The ambient temperature data may be used to cause the driver module 30 to drive the LED array 20 in an appropriate fashion. The last illustrated auxiliary sensor module is an emergency module $86_E$. The emergency module $86_E$ illustrates an application type module, wherein the overall lighting fixture 10 may be converted to operate as an emergency lighting fixture when associated with the emergency module $86_E$. The emergency module $86_E$ may be able to communicate with the driver module 30 and determine the state of the AC input signal (AC IN), the operational state of the driver module 30, or the like, and then control the driver module 30 in an appropriate fashion or provide information bearing on the operational state to the communications module 32. For example, if there is a power failure in the AC input signal (AC IN), the emergency module $86_E$ may instruct the driver module 30 to switch over to a battery backup supply (not shown) and drive the LED array 20 at an appropriate level for an emergency lighting condition. The emergency module $86_E$ may also retrieve various metrics for the AC input signal (AC IN), the driver module 30, or the LED array 20, and pass this information to the communications module 32. The communications module 32 may then pass the information or generate instructions for the other lighting fixtures 10 or a remote control entity.

For the various modules that are coupled to the communication bus $38_P$, one embodiment assigns a unique ID to each of the modules, such that one or more of the other modules can uniquely identify them. The identifiers may also correspond to the functionality or type of module. As such, the driver module 30 may be able to identify the various auxiliary sensor modules 86 and communications module 32 that reside on the communication bus $38_P$ and recognize the functionality provided by those modules. As such, the driver module 30 or communications module 32 can prioritize commands received by the various modules and manage conflicts therebetween.

Figure 21:
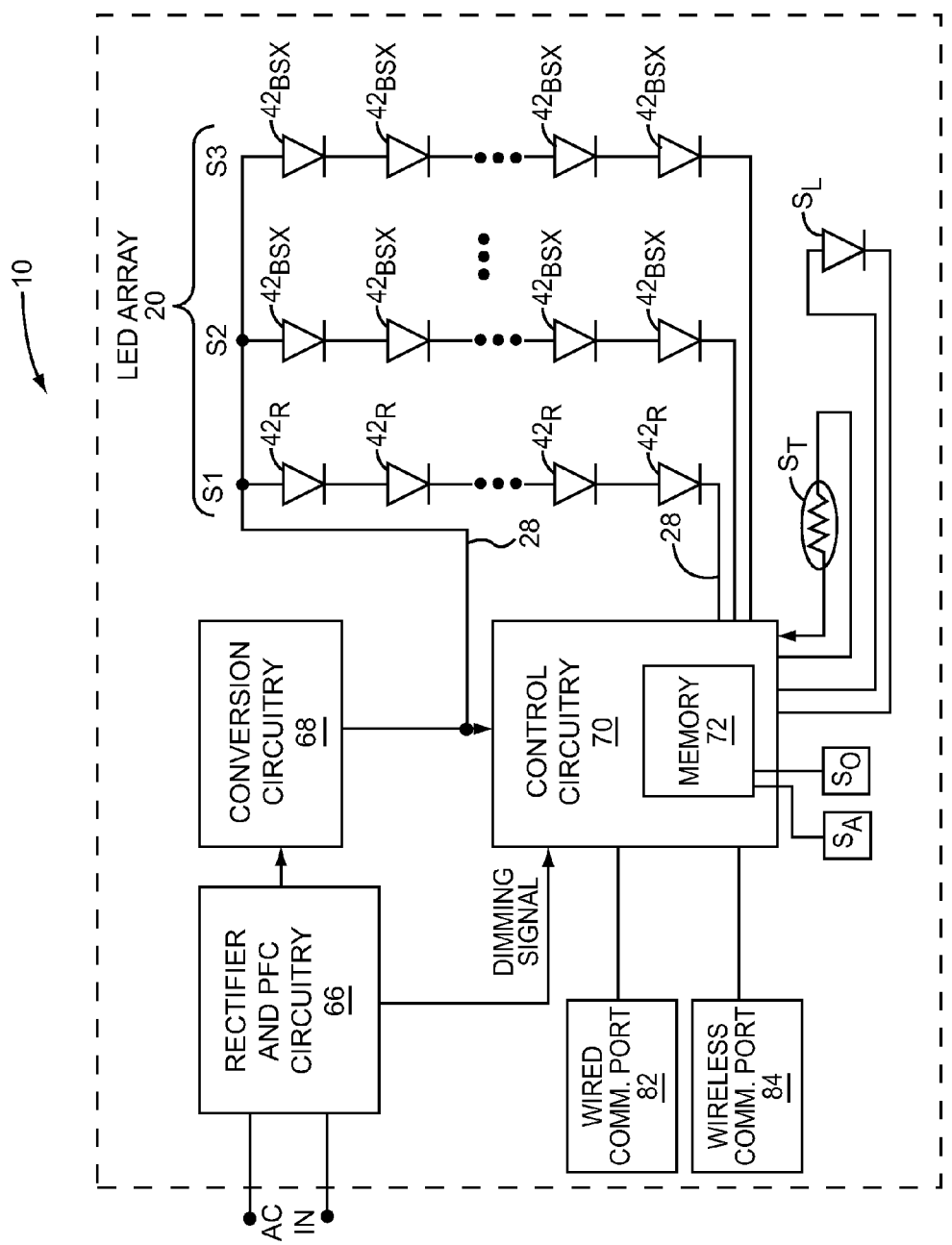
FIG. 21 is a block diagram of a lighting system wherein the functionality of the driver module and the communications module is integrated.

With reference to FIG. 21, an embodiment is provided wherein the functionality of the above-described driver module 30 and communications module 32 are integrated. In essence, the control circuitry 70 is expanded to include the functionality of the communications module 32. As such, the control circuitry 70 may be associated with various wired or wireless communication ports 82' and 84' to facilitate communications with the other lighting fixtures 10 and remote control entities, as described above. Such an embodiment is generally less expensive to manufacture, but may not provide as much flexibility as the above embodiments that employ distinct communications modules and driver modules 30.

Figure 22:
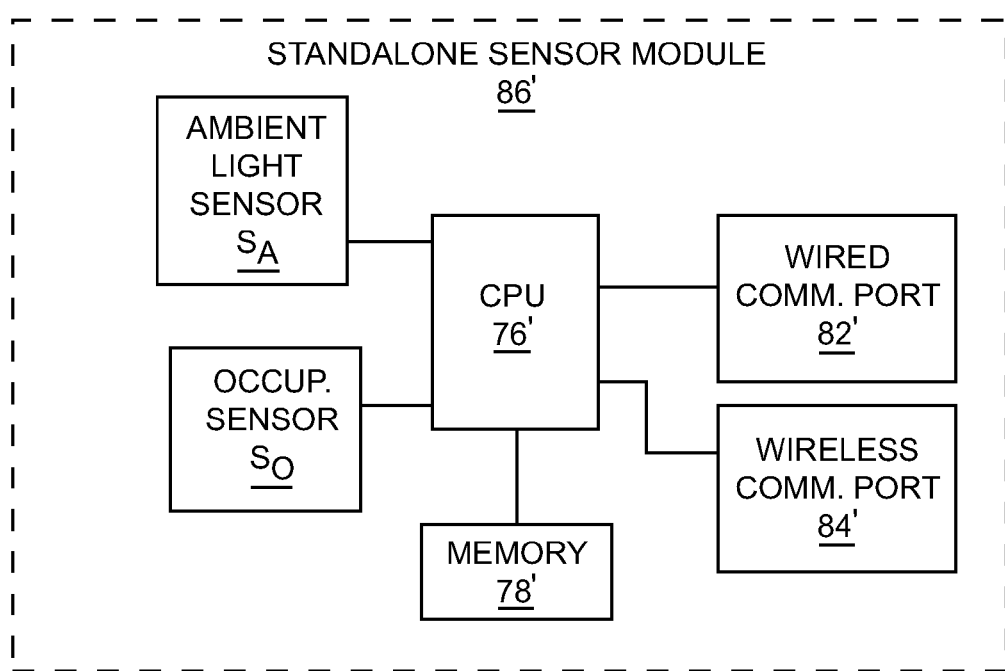
FIG. 22 is a block diagram of a standalone sensor module according one embodiment of the disclosure.

As shown in FIG. 22, a standalone sensor module 86' may be provided in the lighting system. The standalone sensor module 86' may include one or more sensors, such as an ambient light sensor $S_A$ and an occupancy sensor $S_O$ as shown, and be proximately located with lighting fixtures 10 that do not have these sensors. As such, the communications modules 32 of the lighting fixtures 10 that do not have these sensors may communicate with the standalone sensor modules 86' to obtain ambient light, occupancy, or other available sensor data and then function as described above. As such, some or all of the lighting fixtures 10 in a zone or area of the lighting system need not have sensors or certain types of sensors. For example, some or all of the lighting fixtures 10 in a room may have ambient lighting sensors $S_A$; however, none of the lighting fixtures 10 may need an occupancy sensor $S_O$, if one or more standalone sensor modules 86' are available with at least an occupancy sensor $S_O$ in the room.

The electronics of the standalone sensor module 86' may appear similar to a communications module 32. For example, the communications module 32 includes a CPU 76' and associated memory 78' that contains the requisite software instructions and data to facilitate operation as described herein. The CPU 76' may also be associated with a wired communication port 82, a wireless communication port 84, or both, to facilitate wired or wireless communications with the other lighting fixtures 10 or remote control entities. The standalone sensor modules 86' may also be configured to provide control instructions, in addition to just sensor data, to the other lighting fixtures 10 of a lighting system. Various types of control may be provided based on its own sensor data as well as sensor data collected from other lighting fixtures 10 and standalone sensor modules 86'.

Figure 23:
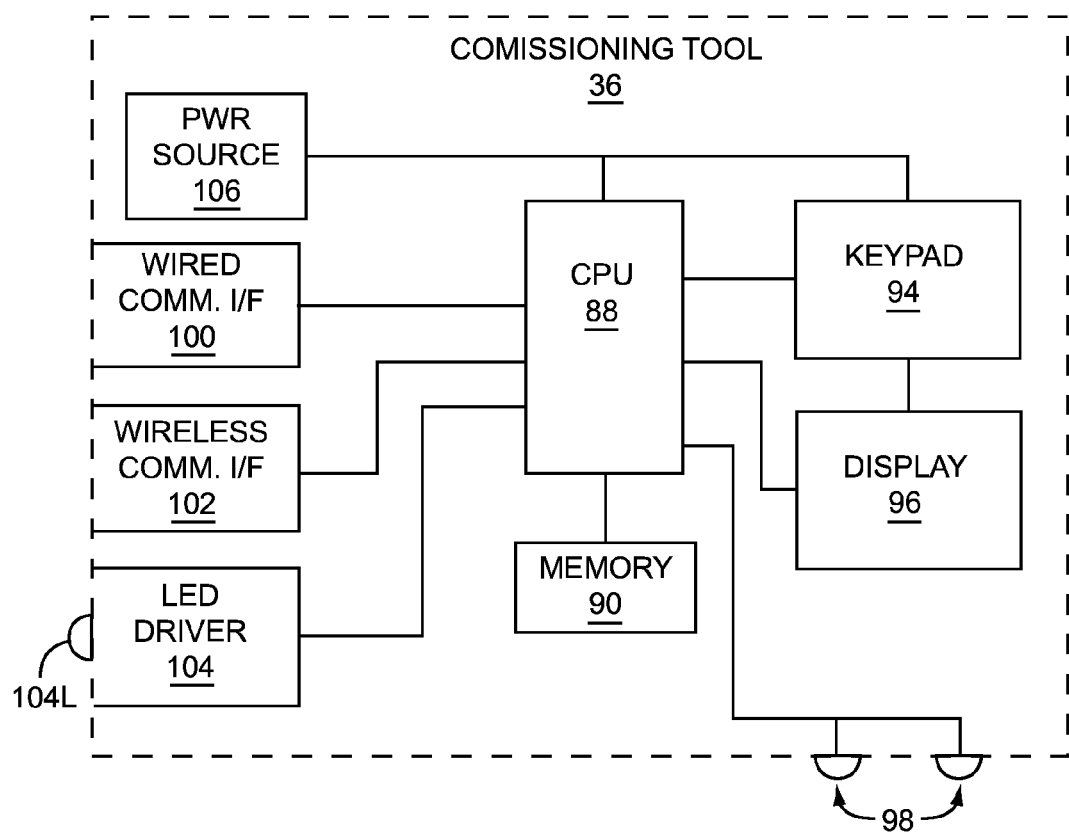
FIG. 23 is a block diagram of a commissioning tool according to one embodiment of the disclosure.

With reference to FIG. 23, an exemplary commissioning tool 36 is illustrated. The commissioning tool 36 may include a CPU 88, and sufficient memory 90 to facilitate the functionality described above. The CPU 88 may be associated with a keypad 94 and display 96, which act in combination to provide a user interface. The keypad may be a traditional alpha-numeric keypad and/or a series of buttons that have specifically assigned functions. The display 96 may be a touchscreen display, wherein a separate hardware-based keypad 94 is not needed. Status indicators 98 may be used to provide the user feedback regarding the status of a function, a certain activity, and the like. The CPU 88 is associated with one or more communication interfaces, such as a wired communication interface 100 and a wireless communication interface 102, which facilitates wired or wireless communications with any of the lighting fixtures 10, other control entities, standalone sensor modules 86', and the like. The LED driver 104 may also function as a communication interface to allow the commissioning tool 36 to communicate with the lighting fixtures 10, sensors, and switches that are equipped with an ambient light sensor $S_A$ or other light receiver. The ambient light used for communications may reside in the visible and/or non-visible light spectrum. For instance, the communications may be infrared.

All of the electronics in the commissioning tool 36 may be powered from an appropriate power source 106, such as a battery. The commissioning tool 36 may be used to program the lighting fixtures 10, sensors, and switches, as well as adjust any settings, load settings, receive sensor data, provide instructions, and the like. In essence, the commissioning tool 36 may act as a portable user interface for each of the lighting fixtures 10 and standalone sensors and switches as well as act as a remote control entity via which various data processing and control may be provided. Typically, the commissioning tool 36 will be used to initiate the setup of a lighting network, make adjustments to the network, and receive information from the lighting network. The commissioning tool 36 is particularly useful when the lighting network has no other interface to facilitate connection to another remote control entity.

Once the lighting fixtures 10 and any standalone sensors and switches are installed, the commissioning tool 36 may initially be used to assign addresses or IDs to the lighting fixtures 10 and standalone sensors and switches, if addresses or IDs are not pre-programmed into the devices. The commissioning tool 36 may also be used to assign the various lighting fixtures 10 and standalone sensors and switches into various groups, which will represent the lighting entities for a particular zone. The commissioning tool 36 may also be used to change group assignments as well as remove a lighting fixture 10 or a standalone sensor or switch from a group or lighting system in general. The commissioning tool 36 may also be able to instruct a particular lighting fixture 10 or standalone sensor or switch to provide this functionality for a particular zone or for the overall lighting system. Exemplary commissioning processes that employ the commissioning tool 36 are illustrated further below.

For access control, the commissioning tool 36 will be able to establish communications with a particular entity and authenticate itself. Once the commissioning tool 36 has authenticated itself with a lighting fixture 10 or a standalone sensor or switch in a particular group or in the overall lighting system, the commissioning tool 36 may be authenticated automatically with the other members of the group or lighting system. Further, various lighting fixtures 10 or standalone sensor or switch may be able to facilitate communications between other lighting fixtures 10 and standalone sensor or switch and the commissioning tool 36. Alternatively, the commissioning tool 36 may be configured only to communicate with a lighting fixture 10 or standalone sensor or switch when in close proximity. This may be accomplished through a physical plug-in connection or through a low-power infrared or radio frequency communication link. Employing direct or short-range communication techniques allows the commissioning tool 36 to be placed in close proximity to a particular lighting fixture 10 or standalone sensor or switch and only communicate with the entity or entities within the limited communication range.

The internal logic or programming of the standalone sensors or switches may be downloaded from, modified by, or replaced by the commissioning tool 36, or by any other remote control entity. As such, lighting designers and maintenance technicians are equipped to configure the overall lighting network to function in a way that best achieves their intended lighting goals. Accordingly, all or various groups of lighting fixtures 10 and standalone sensors or switches may be configured to act in synch with one another for certain applications and independently from one another in other applications. The commissioning tool 36 may take various forms, such as a handheld device with a form factor similar to a smartphone or tablet. Various ports on the communication interface 100 may be used to install external sensors, displays, keypads, and the like, as well as facilitate an interface to a personal computer or computer network. The commissioning tool 36 may also be a device with an architecture as described above and connected with a portable computing device such as a notebook PC, tablet, or smart phone. The combination could perform the commissioning tool functionality As indicated above, the various lighting fixtures 10, as well as the standalone sensors or switches, share sensor data, instructions, and other information. In many instances, such information may need to be routed through one or more intermediate lighting fixtures 10 or standalone sensor modules 86' before reaching an intended destination. As such, these lighting fixtures 10 and standalone sensors or switches may function as routing nodes within the overall lighting system. The following describes unique and efficient techniques for assigning addresses, configuring routing tables, and accessing these routing tables to facilitate the exchange of information among the various entities of the lighting system. These techniques make lighting systems such as the one described above more reliable and predictable in terms of their requirements.

Figure 24:
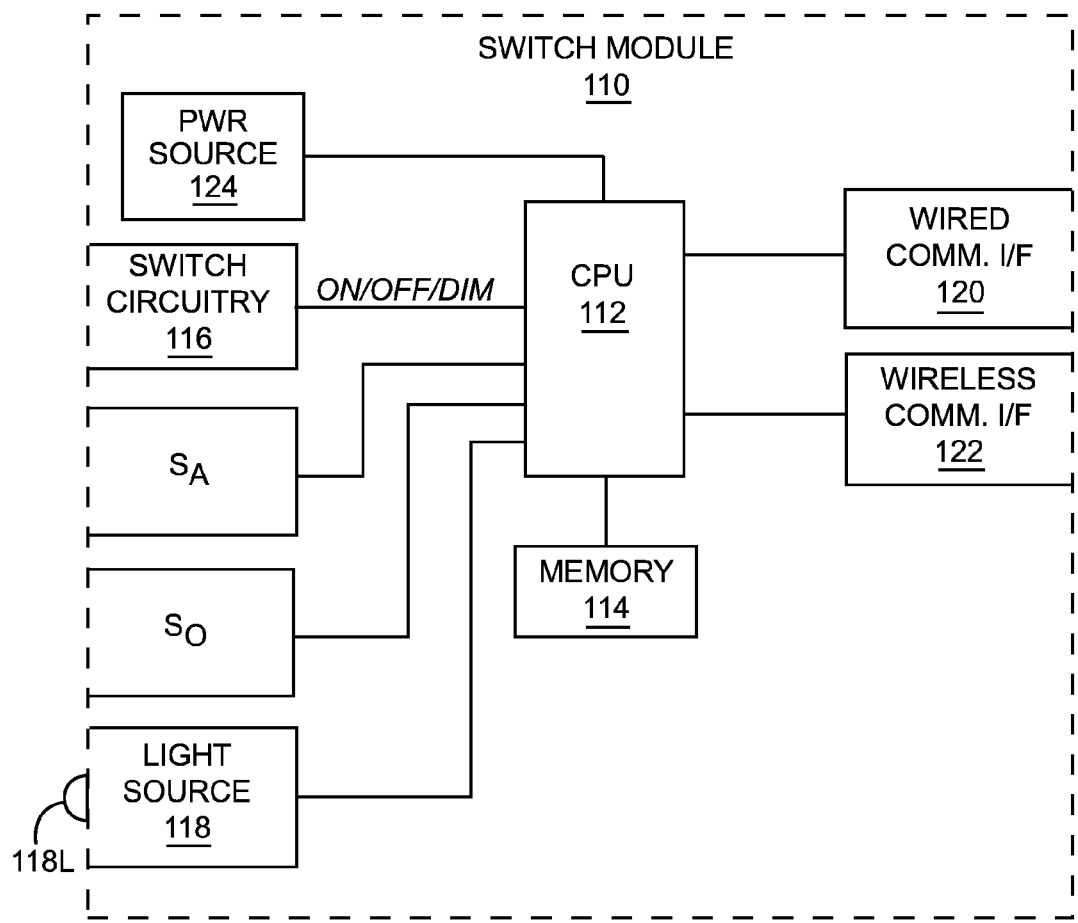
FIG. 24 is a block diagram of a switch module according to one embodiment of the disclosure.

With reference to FIG. 24, an exemplary standalone switch module 110 is provided. The switch module 110 may include a CPU 112 and sufficient memory 114 to facilitate operation of the switch. Switch circuitry 116 is capable of determining whether the switch should be on or off, as well as a dimming position. Based on the on/off/dimming position, the switch circuitry 116 will provide corresponding information to the CPU 112, which is capable of processing the information and determining whether or not to send a command or corresponding status information to one or more nodes in the lighting network. The switch module 110 may communicate with other nodes in the lighting network through a wired communication interface 120 or a wireless communication interface 122. For the wired communication interface 120, the type of connectivity may range from running signals over existing AC lines, a separate interface cabling, which would perhaps support serial bus communications, or a proprietary interface. The wireless communication interface 122 may facilitate communications wirelessly with the network and effectively be another node in the mesh network provided by the lighting network. The switch module 110 may also include an ambient light sensor $S_A$ and an occupancy sensor $S_O$, which can provide ambient light conditions and/or occupancy information to the CPU 112, which may process ambient light conditions and/or occupancy information in order to control how to instruct the other nodes in the lighting network to function, or merely pass the ambient light and/or occupancy information to a controlling node in the lighting network. The switch module 110 may also include a light source 118, such as an LED, to provide status indication or facilitate near field visible or non-visible light-based communications with the commissioning tool 36 or other device. The ambient light sensor $S_A$ may also receive visible or non-visible light-based communications from the commissioning tool 36 or other device. Notably, the switch module 110 may include additional or less functionality relative to that illustrated in FIG. 24.

Network Devices in Exemplary Lighting System

The following is a description of a particular system that employs exemplary wireless communication techniques of the present disclosure. The devices in the system may include switches, sensors, and lighting fixtures 10 of varying configurations. The system's communications topology may be an RF mesh network based on the IEEE 802.15.4 standard. As such, the various nodes on the network may communicate on one or more channels in the 2.4 GHz band. The data rate in this configuration is nominally 200 kbps but actual throughput depends heavily on messaging overhead and traffic volume.

Once the network is formed, most communications occur within groups, where groups include devices, such as the switches, sensors, and lighting fixtures, operating in tandem. With this particular system's emphasis on grouping, RF traffic should be relatively minimal once the system is up and running. Consequently for most applications, the RF mesh network will provide a perceptually instantaneous response, such that delays are not noticeable to the user. In practice, this means that lighting fixtures 10 may typically respond within 100 msec to switch, sensor, or other control operations within their group.

Figure 25:
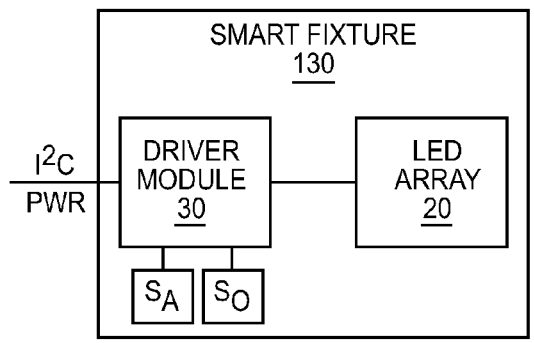
FIG. 25 is a block diagram of a smart fixture according to one embodiment of the disclosure.

The following describes the particular components and configurations of the switches, sensors, and lighting fixtures 10 of the illustrated system. As illustrated in FIG. 25, a smart fixture 130 is a component that includes a driver module 30, which is integrally associated with an LED array 20, ambient light sensor $S_A$, and occupancy sensor $S_O$. Communications with other modular components, as described below, are facilitated via an I²C serial bus or the like, as noted above. In this configuration, the driver module 30 is capable of providing DC power to modules or components connected thereto.

Figure 26:
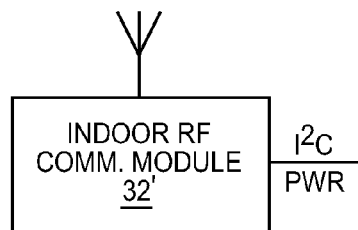
FIG. 26 is a block diagram of an indoor RF communication module
Figure 27:
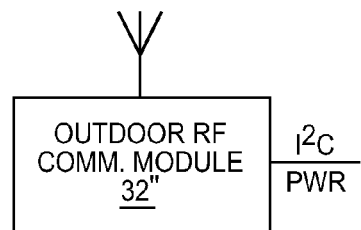
FIG. 27 illustrates an outdoor RF communication module according to one embodiment of the disclosure.
Figure 28:
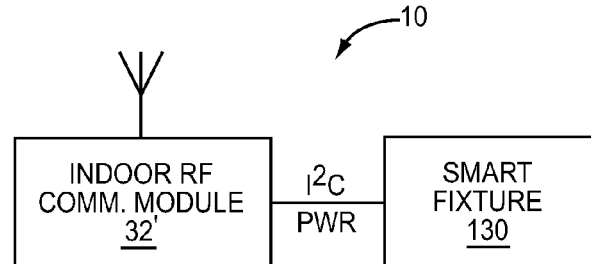
FIG. 28 is a block diagram of a lighting fixture comprising a smart fixture and an indoor RF communication module according to one embodiment of the disclosure.

As illustrated in FIGS. 26 and 27, an indoor RF communication module iRFM 32' and outdoor RF communication module 32" oRFM are variants of the communication module 32. The iRFM 32' and the oRFM 32" may connect to and provide wireless connectivity to the mesh network for various lighting components, such as the smart fixture 130. The iRFM 32' and the oRFM 32" may receive power from and communicate with a coupled smart fixture 130 or other component via a standard connector. The iRFM 32' and oRFM 32" support wireless connectivity to other devices that have wireless communication capabilities. FIG. 28 illustrates an iRFM 32' directly coupled to a smart fixture 130 to create a variant of a lighting fixture 10. DC power is provided to the iRFM 32' by the smart fixture 130. The iRFM 32' and the smart fixture 130 communicate with each other via the I²C serial bus.

Figure 29:
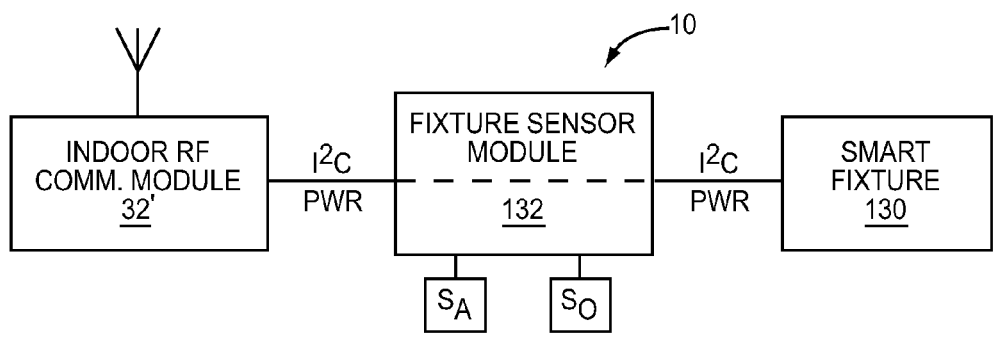
FIG. 29 is a block diagram of a lighting fixture comprising a smart fixture, an indoor RF communication module, and a fixture sensor module according to one embodiment of the disclosure.

As illustrated in FIG. 29, a fixture sensor module (FSM) 132 may be connected to the iRFM 32' and smart fixture 130 of FIG. 28 to add additional sensing capabilities to the lighting fixture 10. The FSM 132 is a type of auxiliary module 86 (FIG. 20) and is configured to obtain power from the smart fixture 130 and provide pass-through connectors for plugging in the iRFM 32' and the smart fixture 130. When the ambient light sensor $S_A$, occupancy sensor $S_O$, or other sensor type generates an output change, the FSM 132 communicates the changes via the local I²C bus to both the attached smart fixture 130, and if present, the iRFM 32'. If an iRFM 32' is connected, it wirelessly communicates the FSM sensor updates to an associated group of lighting devices in the system.

Figure 30:
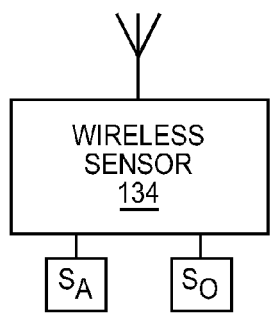
FIG. 30 is a block diagram of a wireless sensor according to one embodiment of the disclosure.

As illustrated in FIG. 30, an indoor or outdoor wireless sensor module 134, which is either AC or battery-powered, may also be provided. The wireless sensor 134 has a wireless communications interface and is configured to monitor ambient light conditions, room occupancy, or the like using one or more ambient light or occupancy sensors $S_A$, $S_O$. To maximize battery life, the wireless sensor's communication and processing circuitry may remain turned off over 99% of the time. When outputs from the sensors change, the communication and processing circuitry turns on and sends a sensor update to lighting devices in an associated group. The wireless sensor 134 is intended to be located physically apart from other lighting fixtures 10, smart fixtures 130, and the like. Wireless sensors 134 may be placed in locations where sensors, but not necessarily lighting elements, are needed or desired.

Figure 31:
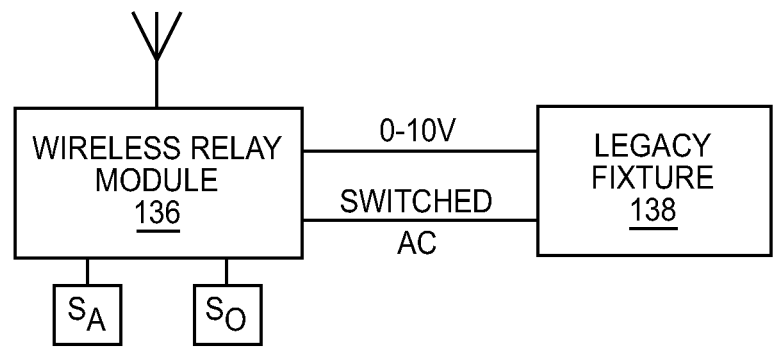
FIG. 31 is a block diagram of a wireless relay module that is capable of driving a legacy fixture according to one embodiment of the disclosure.

As illustrated in FIG. 31, a wireless relay module 136 may be used to allow wireless control of legacy (light) fixtures 138 to provide on/off control and dimming thereof. When wireless communication circuitry receives a wireless control signal, a relay may control AC power supplied to the legacy fixture 138 and/or a control signal (0-10V) may be provided to control a dimming level. The wireless relay module 136 may also include ambient light and occupancy sensors $S_A$, $S_O$, and report output changes wirelessly to other devices in the associated group.

Figure 32:
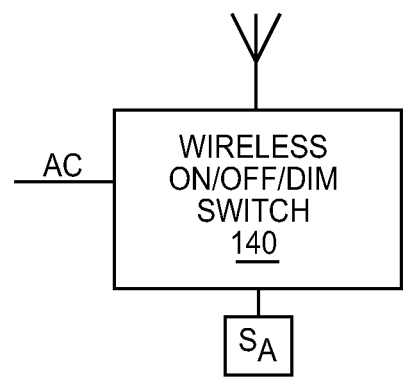
FIG. 32 is a block diagram of a wireless switch according to one embodiment of the disclosure.

As illustrated in FIG. 32, a version of the switch module 110 configured as a wireless on/off/dimming switch (WS) 140 is provided. The WS 140 resides on the wireless communications network, and as described above, may include an ambient light sensor $S_A$, on/off control, and dimming circuitry. When ambient light sensor $S_A$ activates, the WS 140 sends an update to the devices in its group. The RF design supports low power operation for battery power, but may be hardwired to an AC power source.

Exemplary Network Commissioning Procedure

Commissioning generally includes the steps of 1) forming the network, 2) collecting data for grouping network devices into groups, 3) running the grouping process, 4) assigning groups for each device, and 5) revising group assignments.

In this example, the handheld commissioning tool 36 is used to initiate and control the commissioning process. For an uninitialized system, a user asserts a 'Start Commissioning' process from the commissioning tool 36 to begin network formation. This may simply entail moving the commissioning tool 36 near a routing node, such as a lighting fixture 10, and then initiating a one-button command on the commissioning tool 36, which sends a 'start network formation' message. A routing node may be any device on the network, such as a lighting fixture 10, that is capable of acting as the coordinator and is able to route information from one node to another.

For a routing node to become the coordinator, it may monitor a received signal strength indicator (RSSI) associated with a message or the like, and determine that the RSSI is above a defined threshold. Other routing nodes may receive the message, but the RSSI will be below the defined threshold. Sleeper nodes, such as battery-powered wireless sensors 134, wireless switches 140, and the like, will either be asleep or ignore the start network formation message.

In this embodiment, assume the proximate routing node accepts the start network formation message and asserts itself as the coordinator. The coordinator broadcasts a Join My Network (JMN) message to the other non-coordinator routing nodes and subsequently allows the non-coordinator nodes in the system to join the network. The coordinator permits joining and may assign "short" network addresses, which may be 24, 16, 8 or so bits, to those non-coordinator routing nodes that joined the network. The short addresses are "short" in that they are shorter than the corresponding MAC addresses for the devices, and will be used instead of the MAC addresses to facilitate communications throughout the network once they are assigned. In this first stage of network formation, the coordinator effectively establishes a network that includes all of the routing nodes.

In particular, the coordinator is tasked with sending a JMN message on multiple, if not all, available communication channels. In that JMN message, the coordinator may indicate a selected channel on which the non-coordinator routing nodes should respond. During the joining process, the coordinator will provide short addresses to those non-coordinator routing nodes that are joining the network. The coordinator will also have a default short address, or will assign itself a short address. As noted, these short addresses will be used for communications during normal network operation. The coordinator will also build its own routing tables to use when routing information from one routing node to another.

In a cooperative fashion, the non-coordinator routing nodes will initially listen for the JMN message. When the broadcasted JMN message is received, the non-coordinator routing nodes will respond on the selected channel identified by the coordinator. The routing nodes will also receive the short addresses assigned by the coordinator, store the short addresses, and build their own routing tables. The unique MAC addresses for the various routing nodes may also be exchanged during this process. The coordinator will keep track of the nodes that have responded and may inform each node of the other nodes that make up the network and the respective short addresses to effectively form the routing core of the network.

After allowing sufficient time for all routing nodes to join, the coordinator will initiate and control the above described lightcasting process to help group the various routing nodes into different groups. As such, the coordinator will enter itself and then sequentially request each routing node to enter a lightcast mode. An exemplary lightcast would entail providing a light output at 50% duty cycle at a pre-defined PWM frequency. As an alternative to the PWM frequency for the lightcast signal, an on-off sequencing could be used.

While lightcasting, a routing node is considered a 'lightcaster' and will transmit to routing nodes a stream of RF messages identifying itself and indicating it is the current lightcaster. The other routing nodes act as lightcast receivers (or 'lightcatchers') by monitoring the lightcast signal from the given lightcaster, calculating the magnitude of the lightcast signal, and storing the magnitudes of the lightcast signal for the given lightcaster. Sleeper nodes, such as battery-powered wireless sensors 134, wireless switches 140, and the like, may receive the lightcast signal and turn on their radio receivers to hear the RF message indicating the identity of the lightcaster. During the lightcasting process, sleeper nodes may be triggered to wake up and request to join the network. The coordinator node will assign them short addresses while approving their join requests. After lightcasting wraps up for all devices, the coordinator will send a message to the commissioning tool 36 that network formation is complete.

Accordingly, the coordinator will sequentially send lightcast request messages to the routing nodes, accept join requests from sleeper nodes, and assign short addresses to those joining sleeper nodes. The coordinator will also save lightcast reception data, which is gathered when the other lightcasters are lightcasting. The coordinator will also retain the lightcast reception data until requested by the commissioning tool 36 or other device. The non-coordinator lighting nodes will perform lightcasting when requested as well as gather and save lightcast reception data during lightcasting from other lightcasters. Again, the lightcast reception data is stored until requested by the commissioning tool 36 or other device. For the sleeper nodes, which are normally asleep, they will fully power on and submit Join Network' (JN) request messages upon sensing the presence of a lightcast signal. The sleeper nodes will receive short addresses from the commissioning tool 36 as well as gather and save lightcast reception data. The lightcast reception data is saved until requested by the commissioning tool 36 or another device. In other embodiments, the lightcast reception data may be sent to a designated node, such as the coordinator, or to the commissioning tool 36, as it is gathered.

Assuming that the lightcast reception data is stored until requested, the following process may be employed. To collect the lightcast reception data, the commissioning tool 36 queries each node for its lightcast reception data. Since a wireless mesh network is already formed, the commissioning tool 36 may communicate with any routing node to establish the entry point to the network. Each node responds with its lightcast data.

In particular, the commissioning tool 36 may send out a request for the lightcast reception data. Both the coordinator and the non-coordinator routing nodes will respond with the lightcast reception data. In certain embodiments, the sleeper nodes may share their lightcast reception data with a non-sleeper node, such as the non-coordinator routing nodes and the coordinator. If this is the case, the lightcast reception data for the sleeper nodes may be provided to the commissioning tool 36. If the sleeper nodes did not share their lightcast reception data with a non-sleeper node, the sleeper nodes may respond with their own lightcast reception data, if they are awake or when they are ultimately awakened automatically or through a lightcast or light signal.

After collecting the lightcast reception data, the commissioning tool 36 proceeds with a grouping process. The commissioning tool 36 itself, or possibly an attached notebook computer, executes a grouping algorithm for determining optimal node grouping based on the lightcast reception data. Once the commissioning tool 36 (or attached PC) runs the grouping algorithm, it communicates the group assignments and a group address to each routing node in the network, wherein the group assignment data (inducing the group address) is sent to each routing node and includes all nodes within that routing node's group.

All sleeping nodes are grouped with at least one routing node. Sleeping nodes may receive their group assignment by either of two methods. First, each sleeping node wakes up periodically to send out its sensor data and to request system status updates from the network. In response to the sleeper node's message, the associated routing node may respond and provide the sleeper node with its group assignment via the group assignment data. The second method for assigning the group address to the sleeper nodes requires that a routing node with sleeper nodes in its group perform lightcasting to awaken the sleeper nodes. An awakened sleeper node subsequently sends out its sensor data and requests system status updates from the network. In response to the sleeper node's message, the associated routing node responds and provides the sleeper node its group assignment data.

Inevitably some group assignments will need to be modified. The commissioning tool 36 provides a way for checking and changing group assignments. The commissioning tool 36 may include an LED (or other visible or non-visible light) output that the user may point at an ambient light sensor $S_A$, which is embedded in a lighting fixture 10, wireless sensor 134, wireless relay module 136, wireless switch 140, or the like that needs to be assigned to a different group. The commissioning tool 36 may use the LED to provide a lightcast signal as well as send and receive RF messages to effect a group assignment change.

An exemplary process for reassigning a node, such as a smart fixture 130, from one group to another follows. Initially, a user will point the commissioning tool 36 at the smart fixture 130 to be reassigned and provide a user input that is associated with reassigning a node from one group to another. The commissioning tool 36 will initiate a corresponding lightcast signal via its LED output, as well as send an RF message to request the short address of the smart fixture 130. The smart fixture 130 will receive the lightcast signal and listen for the RF message. The smart fixture 130 will provide an RF acknowledgement message, which includes the short address and the group address for the smart fixture 130.

Next, the user will point the commissioning tool 36 at a node in the new group to which the smart fixture 130 is being moved. The user will press a button or provide an input instructing the commissioning tool 36 to move the smart fixture 130 to the new group. In response, the commissioning tool 36 will initiate a lightcast signal as well as send a corresponding RF message indicating that a node is being moved to the new group. The RF message will include the short address of the smart fixture 130. The node in the new group that is receiving the lightcast signal will also receive the RF message from the commissioning tool 36.

Upon receipt, the node in the new group will send an acknowledgement to the commissioning tool 36 as well as send a message to the smart fixture 130 using the appropriate short address to provide the address for the new group. The smart fixture 130 will update its group address and send a message to the commissioning tool 36 indicating that the move has been completed. Information associated with the other nodes in the new group may also be provided to the smart fixture 130 via the mesh network. After receiving the new group address from the node in the new group, the smart fixture 130 may also send an acknowledgement back to the commissioning tool 36 as well as send a message to one or more nodes in the old group indicating that it is changing groups. At this point, the smart fixture 130 may monitor any sensor levels and provide any available sensor data to the nodes in the new group via the mesh network. While the example reassigned a smart fixture 130 from one group to another, this technique applies to any type of node in the network.

If the network requires re-initialization, the user may employ the commissioning tool 36 to instruct the network nodes to revert to their pre-commissioned settings. Presumably, starting this process will require a multi-step sequence to prevent inadvertent undo commands. Once commissioning is completed, and grouping corrections are made, the system is ready to operate. In general, switches and sensors provide inputs to the system. Lighting fixtures 10 interpret these inputs within the framework of their energy-saving settings and function accordingly.

Operation of the different types of devices in the network is described below. A wireless relay module 136 (FIG. 31) monitors input data from its group. This includes data from other switches, remote sensors, and its own internal sensors. Data from switches and remote sensors arrives via wireless network communications. Data from internal sensors is gathered and stored internally. The wireless relay module 136 independently executes internal logic that interprets the various inputs and settings, and correspondingly outputs the 0-10V dimming control and relay on/off control. The wireless relay module 136 relies on its wireless communication circuitry to perform message routing within the mesh network. Routing occurs as a background activity and has no impact on the light-control operation.

The wireless relay module 136 may hold a message for a sleeping sleeper node in its group. When the node next awakens and requests an update, the wireless relay module 136 sends the held message to the awakened sleeper node. Notably, the wireless relay module 136 processes its internal ambient light sensor data looking for a lightcast signal. With the network in normal operating mode, the only expected lightcast signal will be from the commissioning tool 36. When the wireless relay module 136 receives a commissioning tool's lightcast signal, it will perform the requested wireless command.

In most respects, a smart fixture 130 operates similarly to the wireless relay module 136. One major difference is that smart fixtures 130 are generally coupled with a communication module 32 to form a lighting fixture. The two modules may communicate with each other via the I²C bus. Either of the modules may be used to process and store the sensor data; however, communications are provided by the communications module 32.

Wireless sensors 134 provide ambient light and occupancy sensor data to their groups. The wireless switches 140 provide on/off and dimming information via RF messages. The wireless sensors 134 periodically wake up, monitor the sensors, and send sensor update messages to their group. The wireless switches 140 provide RF messages to indicate on, off, and dimming state changes. This allows group members to monitor the wireless sensors 134 and wireless switches 140 within the group, process the information provided in the messages, and react accordingly. If routing nodes within the group have messages for the wireless sensors 134, they communicate these messages during the waking interval.

Automatic Coordinator Selection and Grouping Initiation

The preceding example relied on the commissioning tool 36 to initiate network formation by selecting a routing node, such as a lighting fixture 10, to act as the coordinator. The coordinator will then assign short addresses to the various network elements and assist the commissioning tool 36 in making group assignments through the lightcasting process. For the next embodiment, a variant is described wherein routing nodes automatically discover each other and work together to identify a coordinator, without external aid from the commissioning tool 36 or other entity. The coordinator will automatically assign short addresses for use with normal communications within the network as well as automatically initiate and control the grouping process using the previously described lightcasting.

Identification of the coordinator in this embodiment is an iterative process wherein the various routing nodes will essentially exchange their typically 64-bit MAC addresses and decide that the routing node with the lower (or higher) MAC address should be the coordinator, at least for the time being. The routing node with the lower MAC address (coordinator) will assign the routing node with the higher MAC address a unique short address. The coordinator and the other routing nodes will periodically send out requests, such as the JMN requests, to join their networks. If a first routing node that has been assigned as coordinator exchanges MAC addresses with a second routing node that has a lower MAC address, the first routing node will relinquish its coordinator role to the second routing node having the lower MAC address. The second routing node will promptly assign a short address to the first routing node. After a few iterations, the routing node with the lowest (or highest) MAC address in the network will be set as the coordinator and will have assigned short addresses for to each routing node in the network. Again, the coordinator assignment process could just as easily find the routing node with the highest MAC address as opposed to the one with the lowest MAC address. Also, other unique identifying criteria may be exchanged to identify the coordinator in an analogous process. Further, short addresses are optional, and are used merely to speed up the routing process during normal operation. Alternative embodiments may forego the use of short addresses and rely on the MAC or other addresses for routing, as done in traditional mesh networks.

Sleeper or other non-routing nodes will wake up periodically and obtain their short addresses from the coordinator directly or from the coordinator via an associated routing node. All other functions, such as overall control, exchanging switch and sensor information, setting up routing tables, routing messages through the network, lightcasting control, grouping, and the like can be handled as described above. Further, a commissioning tool 36 may still be used to tweak settings, regroup elements, and the like as described above.

A few exemplary communication flows are described below to illustrate various scenarios for selecting a coordinator for a network. In these flows, four different routing nodes A through D are described. In the various flows, 64-bit MAC addresses are provided for these nodes. For simplicity's sake, the MAC addresses used are: EEEE EEEE EEEE EEEE (the highest MAC address in the examples); AAAA AAAA AAAA AAAA; 8888 8888 8888 8888; and 1111 1111 1111 1111 (the lowest MAC address in the examples). For conciseness and readability, these MAC addresses are referenced below and in the associated communication flows as [E-E], [A-A], [8-8], and [1-1], respectively.

Figure 33:
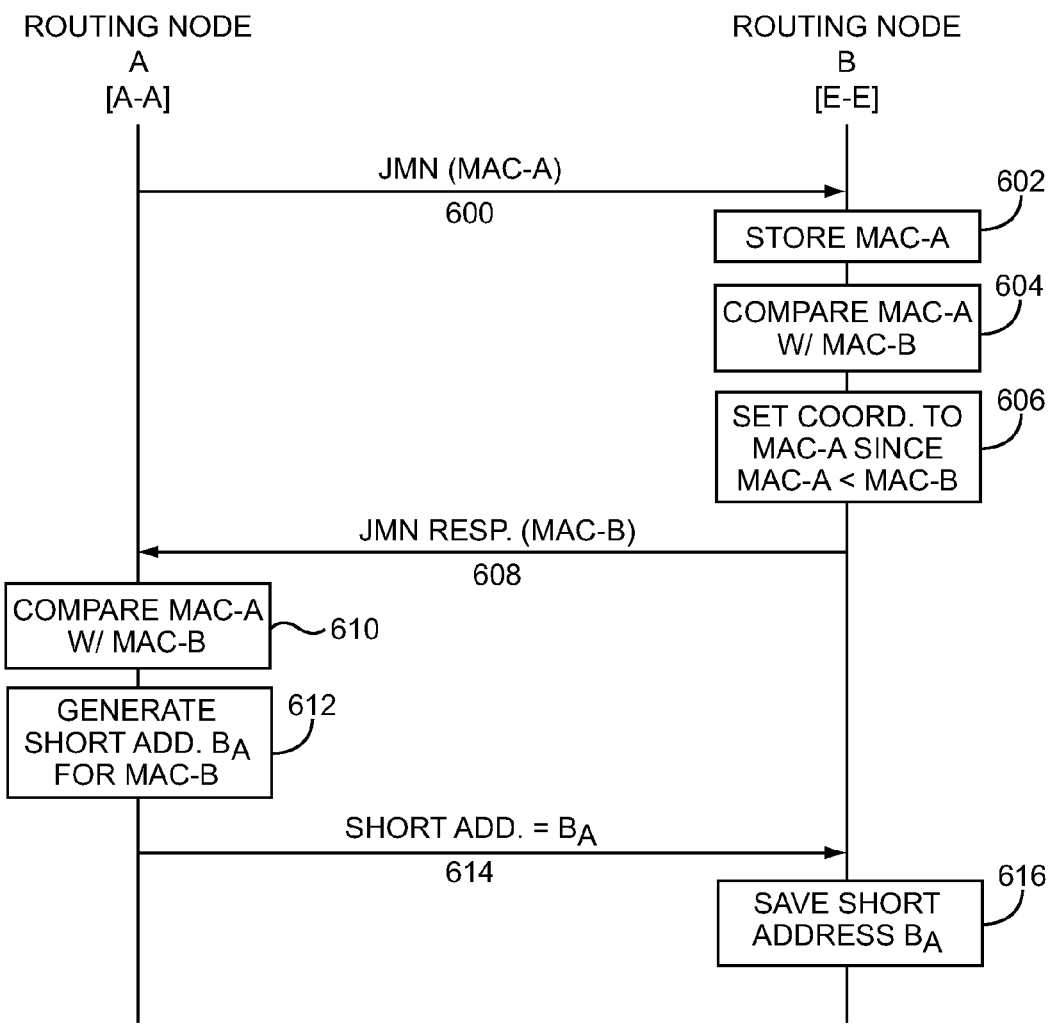
FIG. 33 is a communication flow diagram illustrating an iterative process for selecting a coordinator according to one embodiment of the disclosure.

With reference to the communication flow of FIG. 33, assume routing node A has a MAC address of [A-A], and routing node B has a MAC address of [E-E]. As such, routing node B has a higher MAC address than routing node A. In this example and in the examples following this one, assume that the coordinator role should be assigned to the routing node with the lowest MAC address. Initially, routing node A is set to its default settings and is programmed to periodically broadcast a JMN (Join My Network) message to request other routing nodes to join routing node A's network, which at this point is a one-element network. As such, routing node A's initial network will only include routing node A. In essence, routing node A may default to thinking that it is a coordinator.

With continued reference to FIG. 33, assume that routing node A broadcasts a JMN message, including its MAC address (MAC-A) (step 600). Routing node B will be listening for JMN messages, and will respond to routing node A's JMN message by storing the MAC address (MAC-A) for routing node A (step 602) and then comparing routing node A's MAC address (MAC-A) with its own MAC address (MAC-B) (step 604). Routing node B will recognize that routing node A's MAC address [A-A] is less than routing node B's MAC address [E-E] and will set the coordinator for its associated network to routing node A's MAC address (step 606). At this point, routing node B assumes that routing node A, which is associated with the MAC address [A-A], is the coordinator of the network to which it belongs.

In response to the JMN message, routing node B will also send a JMN response with its MAC address (MAC-B) back to routing node A (step 608). Routing node A will compare its MAC address (MAC-A) with that of routing node B (MAC-B) (step 610) and will recognize that it has the lower MAC address, and thus should remain the coordinator of the network. Accordingly, routing node A will generate a short address ($B_A$) for routing node B's MAC address (MAC-B) (step 612) and will send the short address to routing node B (step 614). Routing node B will then save the short address ($B_A$), which was assigned by routing node A (step 616), and if not subsequently changed by another routing node that becomes the coordinator, will use the short address for communications and routing within the network.

Figure 34:
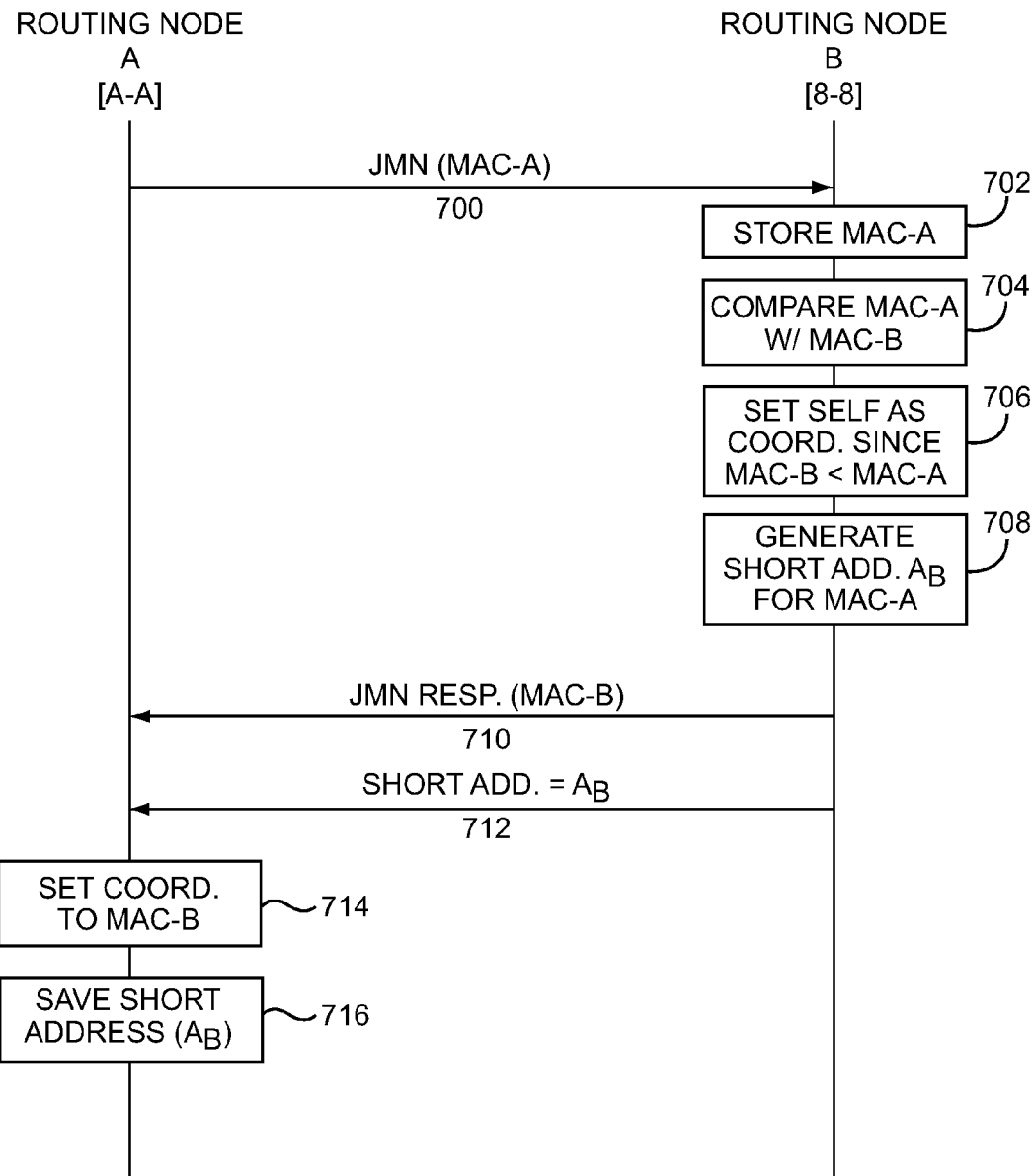
FIG. 34 is a communication flow diagram illustrating an iterative process for selecting a coordinator according to another embodiment of the disclosure.

In the above example, the routing node (A) with the lower MAC address originated the JMN message, and the routing node (B) with the higher MAC address joined the JMN message originator's network. In the next example, illustrated in FIG. 34, the routing node (B) receiving the JMN message becomes the coordinator because it has a lower MAC address. In this example and with reference to FIG. 34, routing node A is associated with a higher MAC address [A-A] than routing node B, which has a lower MAC address [8-8]. At some point, assume that routing node A broadcasts a JMN message, which includes routing node A's MAC address (MAC-A) (step 700). The broadcast message is received by routing node B, which proceeds to store the MAC address (MAC-A) for routing node A (step 702) and then compares routing node A's MAC address (MAC-A) with routing node B's MAC address (MAC-B) (step 704). In contrast with the example illustrated in FIG. 33, routing node B will recognize that it should set itself as the coordinator, since its MAC address (MAC-B) is less than routing node A's MAC address (MAC-A) (step 706). Since routing node B is the coordinator, it will generate a short address ($A_B$) associated with routing node A's MAC address (MAC-A) (step 708). Next, routing node B will send a JMN response message, which includes routing nodes B's MAC address (MAC-B) to routing node A (step 710) and immediately follow with a message providing the short address ($A_B$) to routing node A (step 712). Routing node A will then recognize that it is no longer the coordinator, and will set the coordinator to routing node B's MAC address (MAC-B) (step 714), which effectively recognizes routing node B as the coordinator for the network to which routing node A belongs. Routing node A will also save the short address ($A_B$) as the short address that routing node A will use for communications over the network (step 716).

Figure 35A:
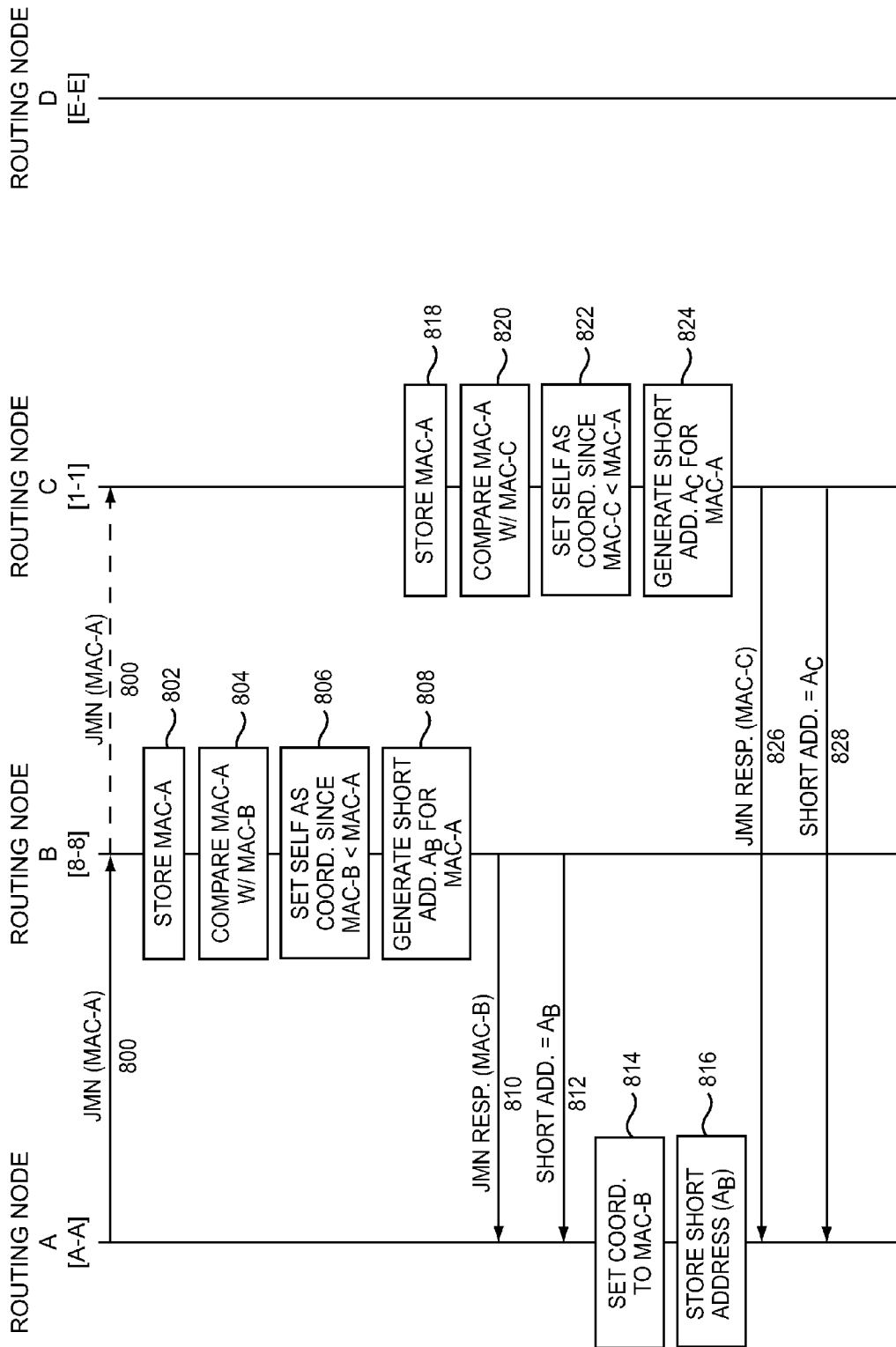
FIGS. 35A-35C are communication flow diagrams illustrating an iterative process for selecting a coordinator according to another embodiment of the disclosure.
Figure 35B:
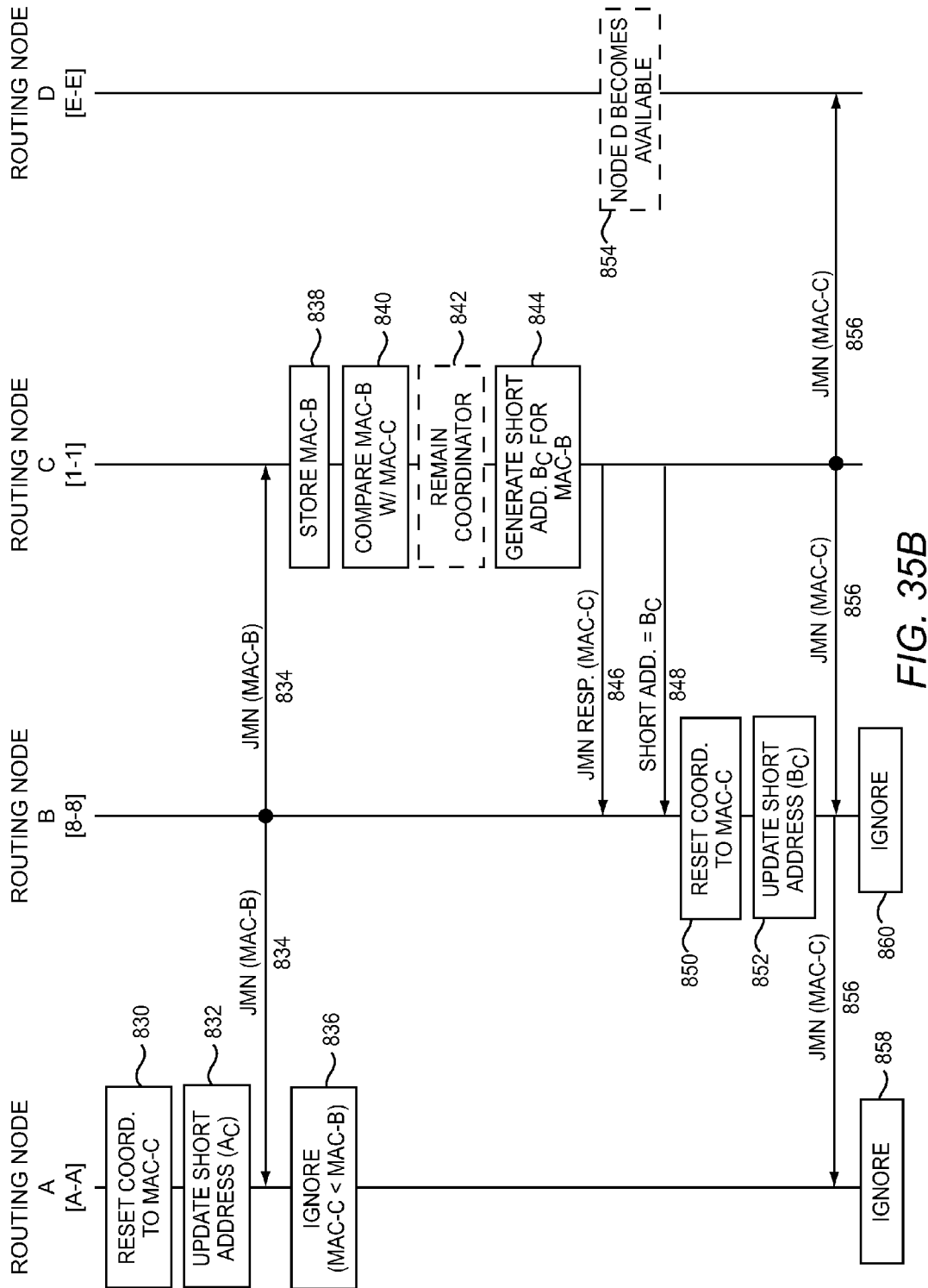
Figure 35C:
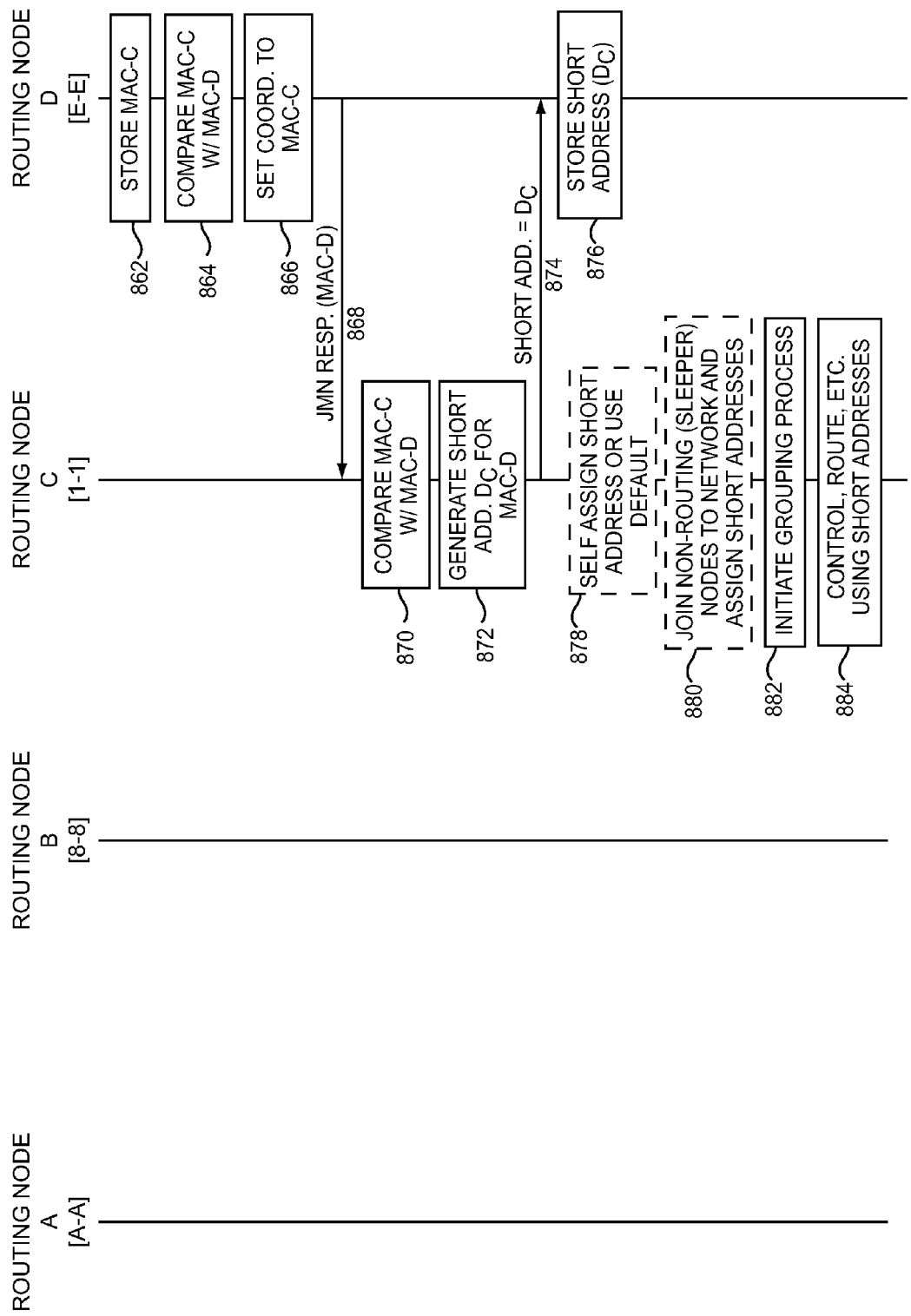

Turning now to the communication flow illustrated in FIGS. 35A-35C, a more complex scenario is illustrated wherein multiple routing nodes (B and C) receive an initial JMN message from routing node A. The example also shows a fourth routing node (D) that does not initially receive the JMN message of routing node A, but ultimately joins the network, recognizes the network's coordinator, and receives a short address from the coordinator. This example shows the coordinator being transitioned from routing node A to routing node B and then to routing node C. Assume that the MAC addresses for routing nodes A, B, C, and D are as follows:

MAC-A [A-A];
MAC-B [8-8];
MAC-C [1-1]; and
MAC-D [E-E].

Thus, routing node C has the lowest MAC address and routing node D has the highest MAC address.

Initially, assume that routing node A broadcasts a JMN message with its MAC address (MAC-A) (step 800). Assume that routing node B and routing node C receive the JMN message, and that routing node D does not receive the JMN message. Further assume that routing node B is the faster routing node to respond to the JMN message. As such, routing node B will process the JMN message by storing routing node A's MAC address (MAC-A) (step 802) and comparing routing node A's MAC address (MAC-A) with its own MAC address (MAC-B) (step 804). As with the previous example, routing node B will set itself as the coordinator since routing node B's MAC address (MAC-B) is less than routing node A's MAC address (MAC-A) (step 806). Routing node B will generate a short address ($A_B$) for routing node A's MAC address (MAC-A) (step 808) and send an appropriate JMN response including routing node B's MAC address (MAC-B) to routing node A (step 810). Routing node B will also send the short address for routing node A ($A_B$) to routing node A in a separate message (step 812). Although separate messages are used for the JMN response and providing the short address, those skilled in the art will recognize that this information may be provided in a single message. Again, routing node A, having the higher MAC address, will set the coordinator to routing node B's MAC address (MAC-B), indicating that routing node B will become the coordinator, at least for the time being (step 814). Routing node A will also store the short address ($A_B$) assigned by routing node B (step 816).

Substantially concurrently, routing node C will also process the JMN message that was provided by routing node A (in step 800). In response, routing node C will store routing node A's MAC address (MAC-A) (step 818) and compare routing node A's MAC address (MAC-A) with routing node C's MAC address (MAC-C) (step 820). Routing node C will also recognize that its MAC address (MAC-C) is lower than routing node A's MAC address (MAC-A) and set itself as the coordinator (step 822). As the coordinator, routing node C will generate a short address ($A_C$) for routing node A's MAC address (step 824). Routing node C will then send a JMN response message including its MAC address (MAC-C) (step 826) and another message providing the short address (Ac) for routing node A (step 828) to routing node A. Routing node A will recognize that routing node C thinks it should be the coordinator, and will reset the identified coordinator to routing node C's MAC address (MAC-C), since routing node C's MAC address is less than routing node B's MAC address (step 830). Routing node A will also update its short address with the short address ($A_C$), assigned by routing node C (step 832). As such, routing node B has been uprooted as the coordinator from the perspective of routing node A. In certain examples, if routing node B would have had the lower MAC address, routing node A would have maintained that routing node B was the coordinator and would have ignored the messages from routing node C. This portion of the example highlights the fact that multiple routing nodes may think they are the coordinator during this iterative coordinator identification process.

At this time, routing node B may continue to think that it is the coordinator, and will periodically broadcast JMN messages to other routing nodes. In this instance, routing node B broadcasts a JMN message including routing node B's MAC address (MAC-B) that is received by both routing node A and routing node C (step 834). Routing node A will effectively ignore the JMN message sent by routing node B, because it recognizes that the currently assigned coordinator, routing node C, has a MAC address less than that of routing node B (step 836). However, routing node C will respond differently, because routing node C has a lower MAC address (MAC-C) than routing node B. As such, routing node C will store routing node B's MAC address (MAC-B) (step 838) and compare routing node B's MAC address (MAC-B) with routing node C's MAC address (MAC-C) (step 840). Routing node C will then recognize that it should remain the coordinator, because it has a lower MAC address (step 842) and then generate a short address ($B_C$) for routing node B's MAC address (MAC-B) (step 844). Routing node C will then send a JMN response including its MAC address (MAC-C) (step 846) and a short address message including the short address ($B_C$) for routing node C (step 848) to routing node B. In response, routing node B will reset the coordinator to routing node C using routing node C's MAC address (MAC-C) (step 850) and store $B_C$ as its short address (step 852).

During this time, assume that routing node D becomes available (step 854), and as coordinator, routing node C begins periodically broadcasting JMN messages. As such, routing node C will send a JMN message including its MAC address (MAC-C), which is received by routing node A, routing node B, and routing node D (step 856). Routing nodes A and B will effectively ignore the JMN messages, because they recognize that these messages are sent by the recognized coordinator, routing node C (steps 858 and 860). Since routing node D is a new party within communication range of the network, routing node D will process the JMN message. Accordingly, routing node D will store routing node C's MAC address (MAC-C) (step 862) and compare routing node C's MAC address (MAC-C) with routing node D's MAC address (MAC-D) (step 864). Since routing node D will recognize that it has a higher MAC address than routing node C, routing node D will recognize that routing node C should be the coordinator and will set the coordinator to routing node C's MAC address (MAC-C) (step 866). As such, routing node D will not assign a short address for routing node C, since routing node C is the coordinator. Routing node D will simply respond to the JMN message by providing a JMN response message, which includes routing node D's MAC address (MAC-D) to routing node C (step 868). Routing node C will compare its MAC address (MAC-C) with routing node D's MAC address (MAC-D) (step 870). Since routing node C has the lower MAC address and should remain the coordinator, routing node C will generate a short address ($D_C$) for routing node D's MAC address (MAC-D) (step 872) and will send a message including the short address ($D_C$) for routing node D to routing node D (step 874). Routing node D will store the short address ($D_C$) for use with subsequent communications (step 876).

At some point during the process, if routing node C does not have a default short address that is known to the other routing nodes, it will assign itself a short address (step 878). Routing node C may assign itself a short address and provide the short address to the other routing nodes in any desired fashion. The benefit of having a default short address for the coordinator is that all other routing nodes, whether they have been assigned a short address or not, may use a short address to route messages through the network to the coordinator using traditional mesh network routing techniques.

At this point, the coordinating routing node C can join non-routing (sleeper) nodes to the network and assign them short addresses (step 880) as well as initiate the aforementioned grouping process (step 882) and carry out various control, routing, and the like using the assigned short addresses (step 884). Nodes that are subsequently added to the network may have lower MAC addresses than that of routing node C, and in those situations, the newly added routing node with the lower MAC address may take over as coordinator and reassign short addresses to all the routing and non-routing nodes in the network. Further, the commissioning tool 36 may interact with the automatically identified coordinator to modify grouping assignments and the like. The coordinator may also be changed or reassigned by the commissioning tool 36 as desired by the network administrator.

Multiple Master Lighting Fixture Configuration

Figure 36:
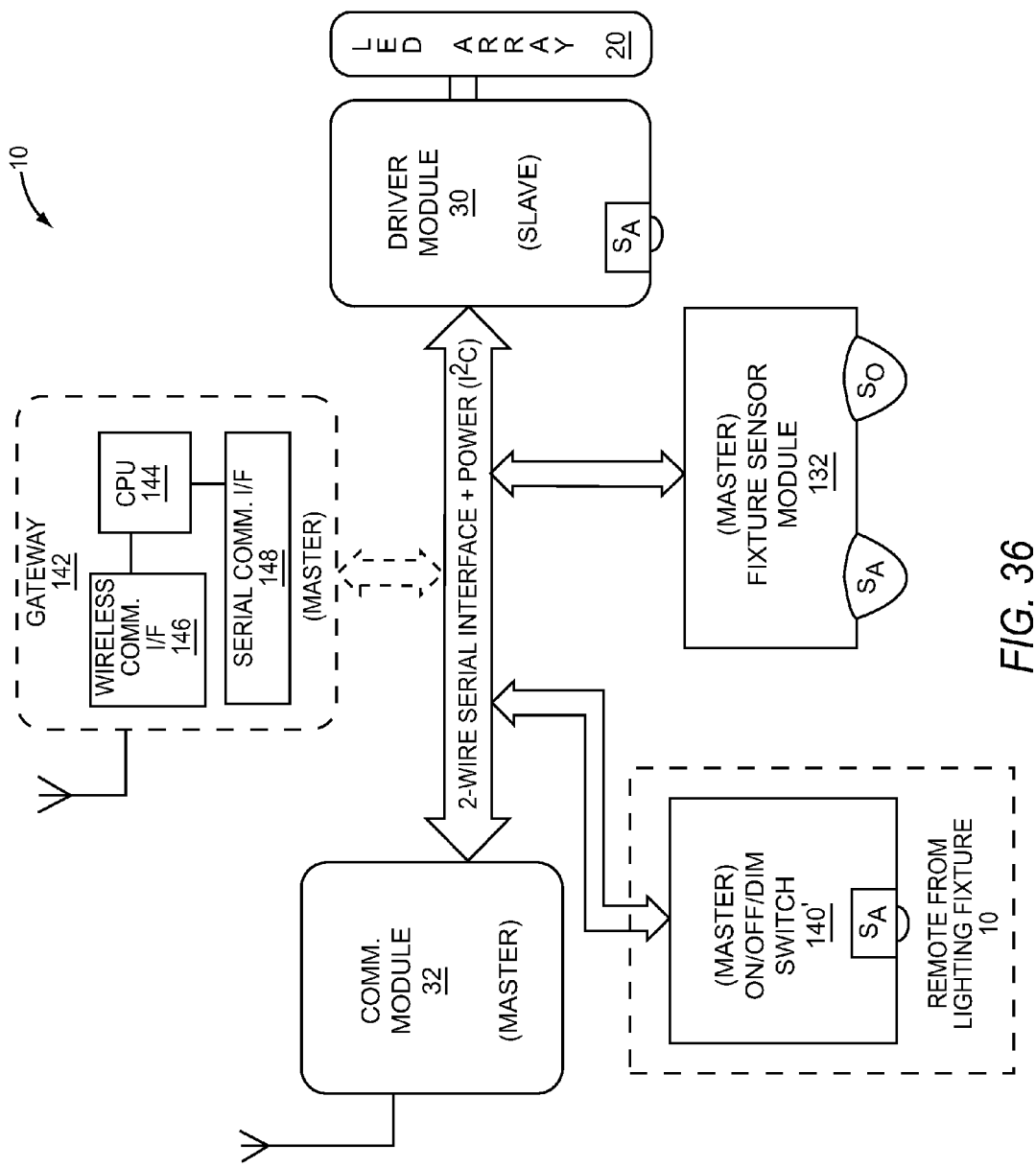
FIG. 36 is a block diagram of an exemplary lighting fixture according to one embodiment of the disclosure.

With reference to FIG. 36, an exemplary lighting fixture 10 is illustrated as having a driver module 30 with an associated LED array 20, a communication module 32, a fixture sensor module 132, and a gateway 142. The driver module 30, communication module 32, fixture sensor module 132, and the gateway 142 may be configured to communicate with each other over a 2 or more wire serial interface, such as the I$^2$C bus, to allow each of the devices to exchange information, such as data and control information, as desired. As described above, the communication module 32 may facilitate wireless communications with other nodes in the wireless network, and essentially act as a communication interface for the lighting fixture 10 in general, and in particular for the gateway 142, the driver module 30, and the fixture sensor module 132. The gateway 142 may facilitate wireless communications with entities outside of the network, such as a remote controller or to a remote network, perhaps using a different wireless communication interface. For example, the communication module 32 may facilitate wireless communications with other nodes in the lighting network using the IEEE 802.15.4 standard on one or more channels in the 2.4 GHz band, whereas the gateway 142 may facilitate communications in a different band, using a different communication standard, such as cellular or other IEEE standard, or the like. Accordingly, one of the lighting fixtures 10 may be provided with the gateway 142, which will act as an access point or node for the entire lighting network. The gateway 142 is shown with a CPU 144, a wireless communication interface 146, and a serial communication interface 148. The wireless communication interface 146 supports wireless communications with external networks or devices, whereas the serial communication interface 148 facilitates communications over the 2-wire serial interface.

Also shown is an exemplary (on/off/dim) switch 140', which has an ambient light sensor $S_A$, and in this embodiment, a cable that is capable of interfacing with the 2-wire serial interface of the lighting fixture 10. As such, the switch 140' may be located remotely from the lighting fixture 10, and yet be integrated via the 2-wire serial interface. On, off, and dimming control may be provided to the communication module 32 or the driver module 30 via the 2-wire serial interface, where either of the communication module 32 or the driver module 30 will process these commands internally as well as provide the commands to other nodes, such as other lighting fixtures, that reside within the same group as the lighting fixture 10. The fixture sensor module 132 may have both ambient light and occupancy sensors $S_A$ and $S_O$, wherein ambient light and occupancy measurements may be shared with either the communication module 32 or the driver module 30, either of which may process the commands and react accordingly internally as well as share the information with other members of the group. Again, the driver module 30 may also include various sensors, such as the ambient light sensor $S_A$ that is illustrated.

Overall control for the lighting fixture 10 may be provided by the communication module 32, wherein all internal and directly attached control information is sent to the communication module 32, which will process the information according to its internal logic and control the associated driver module 30 accordingly, as well as send control information to other nodes in its group or to the network in its entirety. Conversely, the driver module 30 may provide this functionality, wherein sensor and switch information is provided to the driver module 30 and processed by its internal logic to control the LED array 20. The driver module 30 may also share this control information or the data and sensor information with other members of the network via the communication module 32. A further modification of this scenario would be wherein the on/off/dim switch 140' is capable of wirelessly communicating with the communication module 32 to share its sensor input, as well as send information to other devices on the network.

As noted, various serial interface technologies may be employed. In the following example, an I$^2$C interface is employed in an uncharacteristic fashion. In this embodiment, primary control of the lighting fixture 10 is provided in the driver module 30. If an I$^2$C interface is used, the driver module 30 is configured as a slave device, whereas the other entities that are communicating over the I$^2$C interface, including the communication module 32, fixture sensor module 132, gateway 142, and the on/off/dim switch 140', are all configured as master devices. This configuration is counterintuitive to previous implementations of an I$^2$C based bus structure. With the driver module 30 acting as a slave device, the other master devices can initiate transfers, and thus send or request data to or from the driver module 30, at any time without having to wait or alert the driver module 30 in advance of initiating the transfer. As such, the driver module 30 does not have to periodically or constantly poll the other devices that are attached to the I$^2$C interface in search of switch, sensor, or communication changes. Instead, the master devices are configured to automatically initiate switch, sensor, or communication changes to the driver module 30, wherein the driver module 30 is configured to readily receive this information and process it accordingly. The master devices may also request information from the driver module 30, which may have the information on hand and provide it back to the requesting master device, or may retrieve the information from another network node via the communication module 32, or another device within or associated with the lighting fixture 10.

As an example, if the ambient light sensor $S_A$ or the occupancy sensor $S_O$ of the fixture sensor module 132 detects a change, the fixture sensor module 132 is configured to initiate a transfer of information representative of the sensor change or changes to the driver module 30. The driver module 30 will process the information and determine whether or not the LED array 20 needs to be turned on or off or varied in light output based on its own internal logic. The driver module 30 may also generate a control command or message that includes the sensor information that is sent to other nodes in its associated group or the network in general via the communication module 32. For a control command, the receiving device may respond as directed. For the sensor information, the receiving device may process the sensor information and determine how to control itself based thereon. Similar operation is provided by the on/off/dim switch 140', wherein an on/off or dimming adjustment is detected, and the on/off/dim switch 140' will initiate a transfer of the switch status or status change to the driver module 30, which will again process the information to control the LED array 20 as needed and provide any necessary instructions to other nodes on the network via the communication module 32.

Commands or shared data, such as sensor information, may also arrive at the lighting fixture 10 via the communication module 32. As such, the communication module 32 will receive a command or the shared data from another node in the associated group or the network in general, and initiate a transfer to the driver module 30, which will process the command or interpret the shared data based on its own internal logic and control the LED array 20 in an appropriate fashion. In addition to simply providing status information, data, and commands to the driver module 30, any of these devices may request information that the driver module 30 maintains. For example, in a lightcasting process, the communication module 32 may receive a request for the lightcast data from the commissioning tool 36. The communication module 32 will initiate a request for the information to the driver module 30, which will provide the information back to the communication module 32. The communication module 32 will then route the information back to the commissioning tool 36, directly or indirectly through other routing nodes in the network.

While the illustrated master-slave configuration is very beneficial, it is not necessary to practice the concepts disclosed herein. A benefit of this type of configuration is that the other devices within the lighting fixture 10 need not be aware of the others' existence, if their data and status information is collected and maintained on the driver module 30. Other nodes need only make requests of the communication module 32 or the gateway 142, which will obtain the information from the driver module 30 and respond accordingly. Notably, the driver module 30 may maintain or collect all types of status or performance information for the lighting fixture 10 and make it available to any device within the lighting fixture 10, on the network via the communication module 32, or to a remote entity via the gateway 142. Further, the master and slave devices for a given lighting fixture 10 need not be maintained within the housing of the lighting fixture 10.

In certain embodiments, the functionality of the communication module 32 may be integrated into the driver module 30, or vice versa. For instance, the integrated module would have a microcontroller with a built in or closely associated radio frequency transceiver, wherein the microcontroller would provide all of the requisite processing of the driver module 30 and the communication module 32. The transceiver would facilitate RF communications with other elements (fixtures, sensors, switches, etc.) of the lighting network as well as the commissioning tool 36 and other remote entities. As such, the integrated module could also provide the functionality of the gateway 142. The integrated module could also include various sensors, such as the ambient light sensor $S_A$, the occupancy sensor $S_O$, and the like. Any AC-DC conversion could be provided on the same PCB as the microcontroller and transceiver or may be provided by a remote module or PCB.

Figure 37:
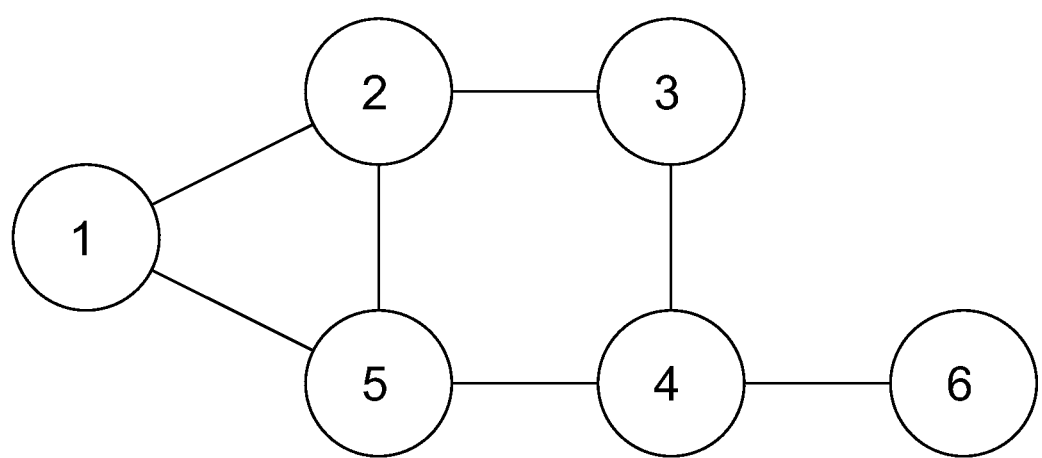
FIG. 37 illustrates a routing diagram for a first lighting system configuration.

Extensive research has been performed in the last few decades on improving wireless networks in general. However, much of this research has focused on reducing power requirements or increasing throughput. For a lighting system, these priorities should be shifted to increasing response time and reducing cost. In a first embodiment, the lighting nodes, such as lighting fixtures 10 and standalone sensors and switches, may be assigned unique addresses starting from the number one. Further, the maximum number of lighting nodes in a given lighting system is bounded at a defined number, such as 256. For the following example, assume that there are six lighting nodes in the lighting network, and each node is sequentially addressed 1-6. A representation of such a lighting network is provided in FIG. 37.

Routing tables are used to identify the next hop along a routing path, and perhaps a number of hops necessary to reach a destination from the current location. An exemplary routing table for lighting node 1, constructed according to related art techniques, is provided immediately below (Table A). For this example, assume that a packet of data needs to be routed from lighting node 1 to lighting node 6. In the below routing table, three columns of information are required: the destination address, the next hop address, and the number of hops to the destination from the current location. In operation, the lighting node will identify a destination address for the packet of data being routed, and search the destination address field in the routing table to find a match. If the destination address for the packet to be routed is number 6, lighting node 1 will search the entries in the destination address field to find one for lighting node 6. The corresponding next hop address (5) for destination address 6 is identified, and the packet of data is routed to the next hop address (5), wherein the process repeats at each lighting node until the packet of data reaches its intended destination.

TABLE A

| Destination Address | Next Hop Address | Number of Hops |
|---|---|---|
| 5 | 5 | 1 |
| 3 | 2 | 2 |
| 2 | 2 | 1 |
| 6 | 5 | 3 |
| 4 | 5 | 2 |

For the present disclosure, the size of the routing table can be reduced by approximately one third, and thus save on the amount of required system memory as well as the processing necessary to identify the next hop address. As shown in the table below (Table B), the column for destination address is removed. Instead, the routing table is reorganized such that the rows correspond to the destination address. In other words, the first entry in the routing table corresponds to destination address 1, the second row of the routing table corresponds to destination address 2, the third row in the routing table corresponds to destination address 3, and so on and so forth. Accordingly, and again assuming that the routing table below corresponds to lighting node 1, a routing decision is determined as follows. The destination for the packet of data is determined. Since the destination address directly corresponds to the location in the routing table, lighting node 1 need only access the sixth entry in the routing table to identify the next hop address for routing a packet of data to destination address 6, which corresponds to lighting node 6. Notably, the routing tables are preferably ordered corresponding to destination address. However, the destination address does not need to match the position in the routing table. Offsets and the like may be used to compensate for lighting networks or zones that employ lighting nodes that are not associated with addresses starting with one. With this embodiment, the size of the routing table is reduced and the amount of processing required to compare a destination address with various entries in a routing table is reduced. In essence, there is no need to scan through the table to find a matching destination address, because the position in the table corresponds to the destination address.

TABLE B

| Next Hop Address | Number of Hops |
|---|---|
| 1 | 0 |
| 2 | 1 |
| 2 | 2 |
| 5 | 2 |
| 5 | 1 |
| 5 | 3 |

Figure 38:
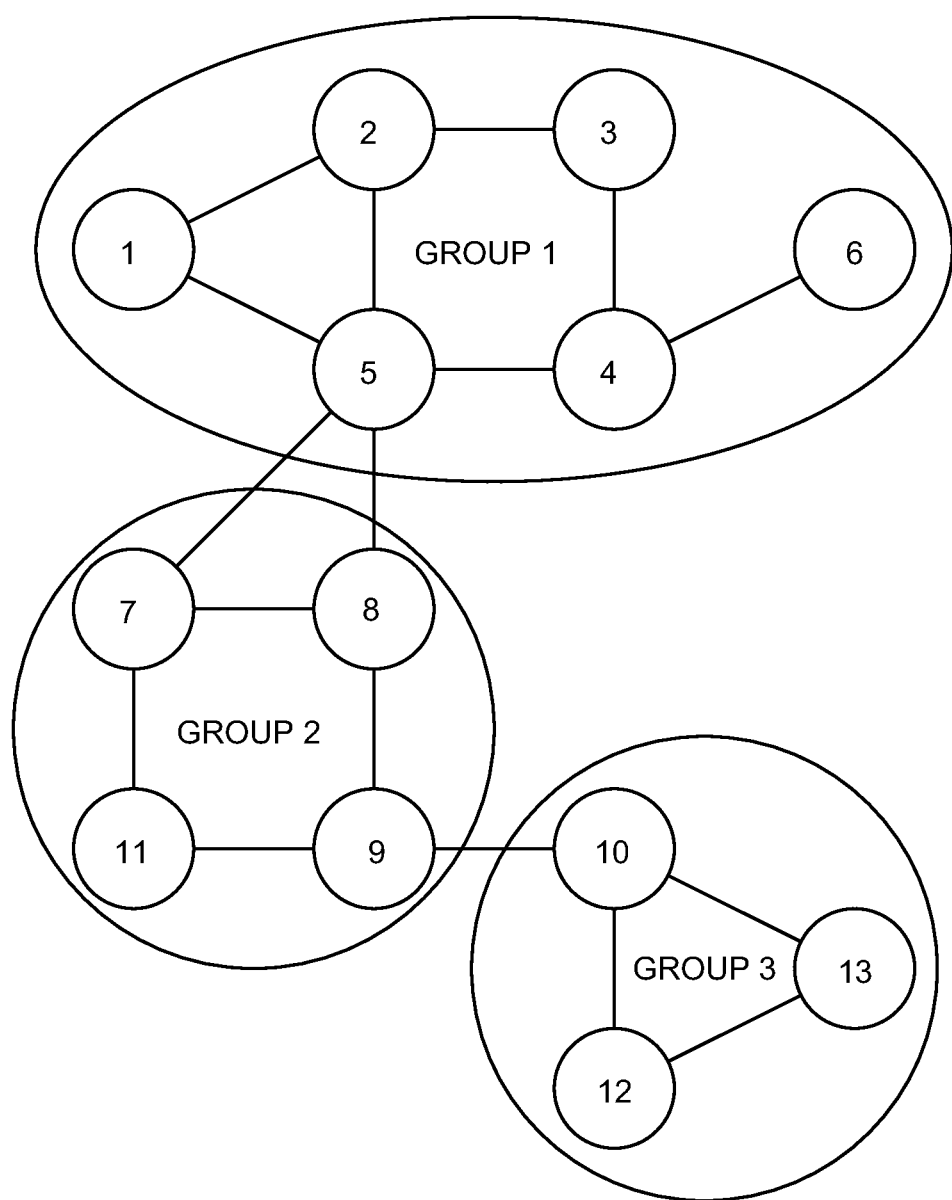
FIG. 38 illustrates a routing diagram for a second lighting system configuration.

With reference to FIG. 38, the addresses for the lighting nodes may be assigned based on the lighting zone in which the lighting nodes reside. For example, there are three lighting zones: group 1, group 2, and group 3. Lighting nodes 1-6 are in group 1, lighting nodes 7-9 and 11 are in group 2, and lighting nodes 10, 12, and 13 are in group 3. Table C corresponds to a routing table for lighting node 9 wherein a traditional routing table architecture is employed. From analyzing the configuration for FIG. 38, a large number of the lighting nodes, including all the nodes within group 1, will route through lighting node 8 when routing data from one group to another. Applicants have discovered that it is more efficient for lighting node 9 to have two separate sections, which correspond to Table D and Table E below.

TABLE C

| Destination Address | Next Hop Address | Number of Hops |
|---|---|---|
| 6 | 8 | 4 |
| 2 | 8 | 3 |
| 12 | 10 | 2 |
| 8 | 8 | 1 |
| 7 | 8 | 2 |
| 5 | 8 | 2 |
| 10 | 10 | 1 |
| 3 | 8 | 4 |
| 1 | 8 | 3 |
| 11 | 11 | 1 |
| 13 | 10 | 2 |
| 4 | 8 | 3 |

TABLE D

| Destination Group | Next Hop Address | Number of Hops |
|---|---|---|
| 3 | 10 | 1 |
| 1 | 8 | 2 |
| 2 | See Next Section | |

The first section of the routing table for lighting node 9 includes three fields (or columns): destination group, next hop address, and number of hops. This is referred to as the group section. When determining the next hop address, lighting node 9 will identify the group in which the destination address resides and use the table to determine the next hop address for that group destination. Thus, if the destination address corresponds to 10, 12, or 13 of group 3, the routing table will identify the next hop address as 10. If the destination address is 1-6, which correspond to group 1, the next hop address for group 1, which is destination address 8, is selected and used for routing the packet of data. Notably, if the destination address resides in the same group, the second section of the routing table is searched. The second section may take the configuration of a traditional routing table, wherein the destination address is used, such as that shown in Table E below.

TABLE E

| Destination Address | Next Hop Address | Number of Hops |
|---|---|---|
| 7 | 8 | 2 |
| 11 | 11 | 1 |
| 8 | 8 | 1 |

Alternatively, the entire destination address field may be dropped from the second section of the routing table. Using the techniques described in association with FIG. 37, the next hop addresses in the second section of the routing table may be positioned in the routing table in a position corresponding to the destination address. Thus, when the second section of the routing table is used, the positioning of the next hop address in the routing table will correspond to the actual destination address.

Figure 39:
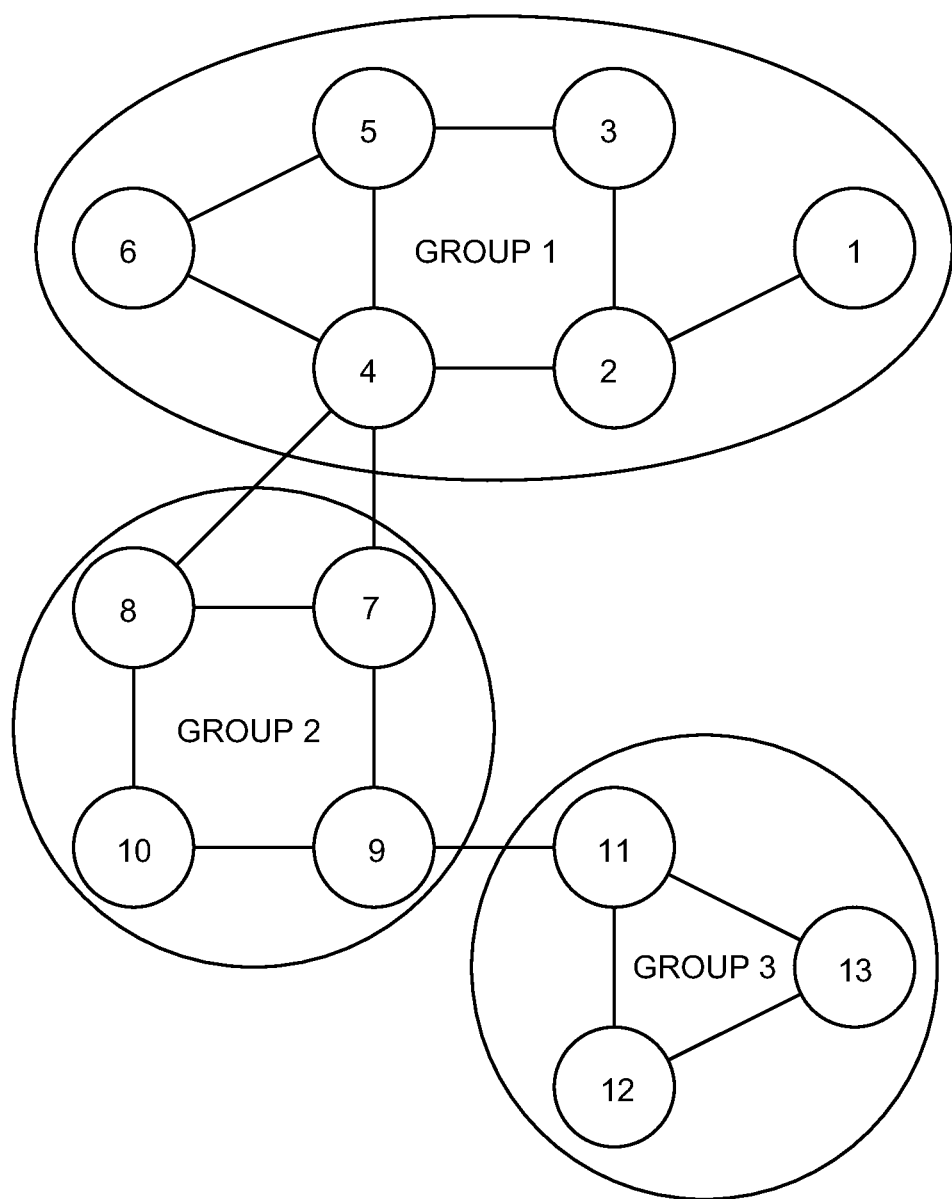
FIG. 39 illustrates a routing diagram for a third lighting system configuration.

With reference to FIG. 39, yet another routing table configuration is illustrated. The basic configuration of the lighting network shown in FIG. 39 is the same as that of FIG. 38. The only difference is that the addresses for the respective lighting nodes have been reassigned to facilitate the creation of very condensed routing tables. An exemplary routing table for lighting node 9 is shown below (Table F).

TABLE F

| Criterion | Next Hop Address |
|---|---|
| Destination <9 | 7 |
| Destination = 10 | 10 |
| Destination >10 | 11 |

As illustrated, the routing table only has two fields, and instead of determining the next hop address based on an actual destination address or a group in which the actual destination address resides, routing criteria is defined for selecting the next hop address. The routing criteria are based on a range in which the destination addresses fall, and in certain instances, the actual destination address. For example, and again using lighting node 9, the next hop address for any destination address less than 9 is destination address 7. The next hop address for any destination address greater than 10 is destination address 11. Finally, if the destination address is 10, the next hop is destination address 10. This embodiment illustrates the concept of assigning addresses to the various lighting nodes within the individual zones (or groups) and the overall system as a whole, with an eye toward the routing tables. With routing tables in mind, addresses may be assigned to the various lighting nodes in a manner that greatly reduces the number of entries in the routing tables, and wherein at least certain next hop address selections are based on a range in which the destination address falls. These improvements in routing may be used in virtually any networking scheme, and are not limited solely to lighting applications.

Figure 40:
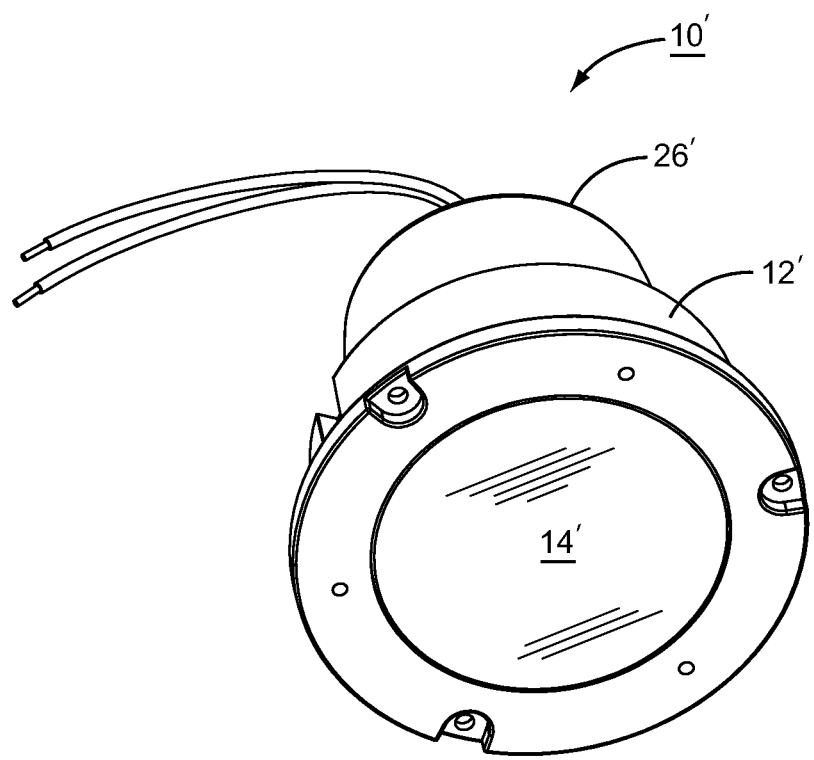
FIG. 40 is an alternative lighting fixture configuration according to a second embodiment of the disclosure.

While the embodiments described above were focused on a troffer-type lighting fixture 10, the concepts disclosed herein apply to any type of lighting fixture. For example, a recessed-type lighting fixture 10' as illustrated in FIG. 40 may also incorporate all of the concepts described above. As illustrated, the lighting fixture 10' includes a main housing 12', a lens 14', and an electronics housing 26'. The various modules described above may be housed within the electronics housing 26' or attached thereto, outside of or within supplemental plenum rated enclosures. These configurations will vary based on the particular application. However, the concepts of a modular system that allows any of the modules to be readily replaced and new modules added are considered to be within the scope of the present disclosure and the claims that follow.

The present disclosure relates to a lighting network where control of the lighting fixtures in the network may be distributed among the lighting fixtures. The lighting fixtures may be broken into groups that are associated with different lighting zones. At least some of the lighting fixtures will have or be associated with one or more sensors, such as occupancy sensors, ambient light sensors, and the like. Within the overall lighting network or the various lighting zones, the lighting fixtures may share sensor data from the sensors. Each lighting fixture may process sensor data provided by its own sensor, a remote standalone sensor, or lighting fixture, and process the sensor data according to the lighting fixture's own internal logic to control operation of the lighting fixture. The lighting fixtures may also receive control input from other lighting fixtures, control nodes, light switches, and commissioning tools. The control input may be processed along with the sensor data according to the internal logic to further enhance control of the lighting fixture.

Accordingly, control of the lighting network of the present disclosure is decentralized so that each lighting fixture essentially operates independently of the lighting network; however, the internal logic in each of the lighting fixtures is configured so that the lighting fixtures may act in concert as a group. While acting in concert, each lighting fixture may operate in a different manner depending on the goals for the particular lighting application. The lighting fixtures may also respond to any user inputs that are presented. In one embodiment, a lighting fixture having a light sensor, a solid-state light source, and associated circuitry is provided. The circuitry is adapted to determine that a given lighting fixture of a plurality lighting fixtures is entering a lightcast mode. Via the light sensor, the circuitry will monitor for a first lightcast signal provided by the given lighting fixture and effect generation of grouping data for the given lighting fixture based on receipt of the first lightcast signal. The grouping data may be used, at least in part, for grouping the lighting fixture with one or more of the plurality of lighting fixtures. For grouping the lighting fixture with one or more of the plurality of lighting fixtures, the circuitry may send the grouping data to a remote entity, which will determine how to group the plurality of lighting fixtures, and receive information identifying a group to which the lighting fixture belongs. Alternatively, the circuitry may send the grouping data to one of the plurality of lighting fixtures that will determine how to group the plurality of lighting fixtures.

For grouping the lighting fixture with one or more of the plurality of lighting fixtures, the circuitry may process the grouping data along with other grouping data received from one or more of the plurality lighting fixtures to determine a group of the plurality of lighting fixtures in which the lighting fixture belongs. If the first lightcast signal is detected, the grouping data may be indicative of a relative signal strength of the lightcast signal.

In another embodiment, the circuitry may be adapted to enter the lightcast mode and then drive the solid-state light source to provide a second lightcast signal to be monitored by the plurality of lighting fixtures. In advance of providing the lightcast signal, the circuitry may send, to the plurality of lighting fixtures, an instruction to begin monitoring for the second lightcast signal.

The circuitry may be further adapted to receive remote sensor data from at least one of the plurality of lighting fixtures and drive the solid-state light source based on the remote sensor data. As such, the circuitry may determine local sensor data from the light sensor or another local sensor of the lighting fixture and drive the solid-state light source based on both the remote sensor data and the local sensor data. The circuitry may also send the local sensor data to at least one of the plurality of lighting fixtures.

The circuitry may also identify a group of the plurality of lighting fixtures to which the lighting fixture has been assigned and drive the solid-state light source in response to an instruction intended for the group. Each lighting fixture may be assigned to just one group or may be assigned to multiple groups in the case of overlapping groups, which share at least one lighting fixture.

The circuitry may be split into a driver module that is adapted to drive the solid-state light source and a communications module that is adapted to communicate with the plurality of lighting fixtures and control the driver module. The driver module and the communications module communicate with one another over a communications bus.

In yet another embodiment, a lighting network is provided with a plurality of lighting fixtures having associated light sensors. During a monitor mode, each of the plurality of lighting fixtures is adapted to determine that a given lighting fixture of the plurality lighting fixtures is entering a lightcast mode; via the light sensor, monitor for a lightcast signal provided by the given lighting fixture; and effect generation of grouping data for the given lighting fixture based on receipt of the first lightcast signal. During a receive mode, each lighting fixture will drive an associated solid-state light source to provide the lightcast signal for monitoring by others of the plurality of lighting fixtures. Each of the plurality of lighting fixtures may be automatically assigned to at least one of a plurality of groups based on the grouping data.

The grouping data associated with any two of the plurality of lighting fixtures may indicate a relative magnitude of the lightcast signal, which was provided by a first of the two, and received by a second of the two. Further, each of the plurality of lighting fixtures may be adapted to exchange the grouping data that is gathered for others of the plurality of lighting fixtures and automatically assign itself to one of a plurality of groups based on the grouping data, such that each of the plurality of groups comprises those lighting fixtures that were able to detect the lightcast signal from other lighting fixtures in the particular group. Alternatively, each of the plurality of lighting fixtures may be adapted to exchange the grouping data that is gathered for others of the plurality of lighting fixtures and automatically assign itself to one of a plurality of groups based on the grouping data, such that each of the plurality of groups comprises those lighting fixtures that were able to detect, at a magnitude above a set threshold, the lightcast signal from other lighting fixtures in the particular group.

The grouping data gathered by each of the plurality of lighting fixtures may be sent to a remote entity, which assigns the plurality of lighting fixtures to groups based on the grouping data. The grouping data gathered by each of the plurality of lighting fixtures may also be sent to one of the plurality of lighting fixtures, which assigns the plurality of lighting fixtures to groups based on the grouping data.

Also, each lighting fixture may be adapted to share sensor data from its light sensor or another associated sensor with others of the plurality of lighting fixtures, and control light output based on the sensor data in light of its own internal logic. The internal logic may be configured such that each of the plurality of lighting fixtures operates independently from one another while providing light in a concerted fashion.

In yet another embodiment, a lighting network is provided with a group of lighting fixtures, which have sensors and solid-state light sources. Each lighting fixture of the group of lighting fixtures may be adapted to coordinate with at least one of the of the group of lighting fixtures to determine a light output level, and drive the solid-state light sources to provide the light output. At least certain of the group of lighting fixtures will concurrently provide a different light output level. Different subgroups of the group of lighting fixtures may provide different light output levels or output levels that are graduated among the group of lighting fixtures. The light output level for each lighting fixture may be determined, at least in part, on ambient light. The amount of ambient light may be detected via the light sensor of the lighting fixture. Notably, the light output level for each lighting fixture may be determined, at least in part, on an amount of ambient light detected via a light sensor of another lighting fixture of the group of lighting fixtures.

Each of the plurality of lighting fixtures, including the group of lighting fixtures, may be adapted to determine that a given lighting fixture of the plurality of lighting fixtures is entering a lightcast mode; via the light sensor, monitor for a lightcast signal provided by the given lighting fixture; and effect generation of grouping data for the given lighting fixture based on receipt of the first lightcast signal. Each of the plurality of lighting fixtures may drive an associated solid-state light source to provide the lightcast signal for monitoring by others of the plurality of lighting fixtures. Each of the plurality of lighting fixtures may be automatically assigned to at least one of a plurality of groups based on the grouping data.

The present disclosure relates to a lighting network where control of the lighting fixtures in the network may be distributed among the lighting fixtures. The lighting fixtures may be broken into groups that are associated with different lighting zones. At least some of the lighting fixtures will have or be associated with one or more sensors, such as occupancy sensors, ambient light sensors, and the like. Within the overall lighting network or the various lighting zones, the lighting fixtures may share sensor data from their sensors. Each lighting fixture may process sensor data provided by its own sensor, a remote standalone sensor, or lighting fixture, and process the sensor data according to the lighting fixture's own internal logic to control operation of the lighting fixture. The lighting fixtures may also receive control input from other lighting fixtures, control nodes, light switches, commissioning tools, gateways, and remote devices via the Internet or other like network. The control input may be processed along with the sensor data according to the internal logic to further enhance control of the lighting fixture.

Accordingly, control of the lighting network of the present disclosure may be decentralized so that each lighting fixture essentially operates independently of the lighting network; however, the internal logic in each of the lighting fixtures is configured so that the lighting fixtures may act in concert as a group. While acting in concert, each lighting fixture may operate in a different manner, such as providing different light output levels, depending on the goals for the particular lighting application. The lighting fixtures may also respond to any user inputs that are presented.

In one embodiment, each lighting fixture includes a solid-state light source and circuitry to control operation. In particular, the circuitry is adapted to receive remote sensor data from at least one other lighting fixture and drive the solid-state light source based on the remote sensor data. The lighting fixture may include a local sensor, such as an ambient lighting sensor, occupancy sensor, or the like. With the local sensor, the circuitry is further adapted to determine local sensor data from the local sensor and drive the solid-state light source based on both the remote sensor data and the local sensor data. The local sensor data may also be sent to other lighting fixtures, which may use the local sensor data to help control those lighting fixtures. In addition to controlling the lighting fixtures, sensor activity can show use patterns in fine detail. Some examples would be occupancy sensor patterns within a room showing what areas are used in a room over an extended time period, or the ambient light sensors showing how efficiently daylight is being captured and distributed from the windows to the room.

As such, these lighting fixtures may share their sensor data with other lighting fixtures in a lighting network and control their light output based on the local and remote sensor data in view of their own internal logic. The internal logic is configured such that each of the lighting fixtures operates independently from one another while providing light or functionality in a concerted fashion.

For example, a switch may be used to turn on all of the lighting fixtures in a particular zone. However, the amount of light provided by the various lighting fixtures may vary from one lighting fixture to the next based on the amount of ambient light present in the different areas of the lighting zone. The lighting fixtures closer to windows may provide less light or light of a different color or color temperature than those lighting fixtures that are near an interior wall.

The present disclosure relates to a lighting network where control of the lighting fixtures in the network may be distributed among the lighting fixtures. The lighting fixtures may be broken into groups that are associated with different lighting zones. At least some of the lighting fixtures will have or be associated with one or more sensors, such as occupancy sensors, ambient light sensors, and the like. Within the overall lighting network or the various lighting zones, the lighting fixtures may share sensor data from their sensors. Each lighting fixture may process sensor data provided by its own sensor, a remote standalone sensor, or lighting fixture, and process the sensor data according to the lighting fixture's own internal logic to control operation of the lighting fixture. The lighting fixtures may also receive control input from other lighting fixtures, control nodes, light switches, and commissioning tools. The control input may be processed along with the sensor data according to the internal logic to further enhance control of the lighting fixture.

Accordingly, control of the lighting network of the present disclosure may be decentralized so that each lighting fixture essentially operates independently of the lighting network; however, the internal logic in each of the lighting fixtures is configured so that the lighting fixtures may act in concert as a group. While acting in concert, each lighting fixture may operate in a different manner, such as providing different light output levels, depending on the goals for the particular lighting application. The lighting fixtures may also respond to any user inputs that are presented.

In such a lighting system, the lighting fixtures need to communicate information between them, and in many instances, route information in the form of data packets from one lighting fixture to another. As such, the lighting fixtures may generate data packets and route them to another lighting fixture, which may process the information in the data packet or route the data packet toward another lighting fixture.

In a first embodiment, each lighting fixture includes a light source and circuitry to control operation. For providing light output, the circuitry is adapted to drive the lighting source to provide light output. For routing data packets, the circuitry employs a routing table having a next hop address for each of a plurality of destination addresses. Each next hop address is positioned in the routing table based on a corresponding one of the plurality of destination addresses. As such, the plurality of destination addresses need not be used to access the routing table.

The circuitry may first determine a position in the routing table based on a destination address of the data packet. Next, the next hop address for the destination address is accessed based on the position in the routing table; and then the data packet is routed toward the next hop address. In essence, the next hop address for each of the plurality of destination addresses may be positioned in the routing table in an order corresponding to a numerical ordering of the plurality of destination addresses. To access the next hop address for the destination address, the circuitry may use the destination address as an index to identify the next hop address for the destination address from the routing table. The routing table may include a number of hops for each next hop address. The number of the plurality of nodes may correspond to a number of positions in the routing table. In one scenario, a value of each destination address directly corresponds to a position that contains a corresponding next hop address in the routing table.

In a second embodiment, the routing table is broken into at least a first section and a second section. The first section includes a next hop address for each of a plurality of groups of lighting fixtures to which the lighting fixture does not belong. The second section comprises a next hop address corresponding to each of a plurality of destination addresses associated with a group of lighting fixtures to which the lighting fixture belongs.

In one implementation, the second section comprises each of the plurality of destination addresses in association with the corresponding next hop address. The next hop address is accessed based directly on the corresponding destination address. In another implementation, each next hop address is positioned in the routing table based on a corresponding one of the plurality of destination addresses such that the plurality of destination addresses are not used to access the routing table.

If the data packet is intended for one of the plurality of groups of lighting fixtures to which the lighting fixture does not belong, the circuitry will access the first section and determine the next hop address based on the one of the plurality of groups of lighting fixtures to which the lighting fixture does not belong. If the data packet is intended for the group of lighting fixtures to which the lighting fixture belongs, the circuitry will access the second section to determine the next hop address for the data packet. Once the next hop address is identified, the circuitry will route the data packet toward the next hop address.

In a third embodiment, a lighting fixture comprising routing criteria is provided that has a next hop address for each of at least two ranges of destination addresses. When routing a data packet toward one of the at least two ranges of destination addresses, the circuitry will first determine a destination address for the data packet. Next, the circuitry will select a next hop address from the routing criteria based on one of the at least two ranges of destination addresses in which the destination address falls; and then route the data packet toward the next hop address. The routing criteria may also include a next hop address for at least one destination address. If the next hop address is directly associated with a destination address instead of a range of addresses, the circuitry will determine a destination address for the data packet, select a next hop address from the routing criteria based on the at least one destination, and route the data packet toward the next hop address.

The present disclosure relates to a lighting network where control of the lighting fixtures in the network may be distributed among the lighting fixtures. The lighting fixtures may be broken into groups that are associated with different lighting zones. At least some of the lighting fixtures will have or be associated with one or more sensors, such as occupancy sensors, ambient light sensors, and the like. Within the overall lighting network or the various lighting zones, the lighting fixtures may share sensor data from their sensors. Each lighting fixture may process sensor data provided by its own sensor, a remote standalone sensor, or lighting fixture, and process the sensor data according to the lighting fixture's own internal logic to control operation of the lighting fixture. The lighting fixtures may also receive control input from other lighting fixtures, control nodes, light switches, and commissioning tools. The control input may be processed along with the sensor data according to the internal logic to further enhance control of the lighting fixture.

Accordingly, control of the lighting network of the present disclosure may be decentralized so that each lighting fixture essentially operates independently of the lighting network; however, the internal logic in each of the lighting fixtures is configured so that the lighting fixtures may act in concert as a group. While acting in concert, each lighting fixture may operate in a different manner, such as providing different light output levels, depending on the goals for the particular lighting application. The lighting fixtures may also respond to any user inputs that are presented.

In one embodiment, a handheld device may be used to setup, configure, and control the various lighting fixtures through wired or wireless communications means once the lighting fixtures are installed in a lighting network. The handheld device may be used to configure the internal logic of the various lighting fixtures to operate in a desired, coordinated fashion; assign the lighting fixtures to groups associated with defined lighting zones; reassign the lighting fixtures to other groups, and the like. For grouping, the handheld device may be configured to receive grouping data from the various lighting fixtures and group the lighting fixtures based on the grouping data. Once the groups have been determined, the handheld device may inform each lighting fixture of the group or groups to which the lighting fixture has been assigned.

The present disclosure relates to a lighting fixture that includes a driver module and at least one other module that provides a lighting fixture function, such as a sensor function, lighting network communication function, gateway function, and the like. The driver module communicates with the other modules in a master/slave scheme over a communication bus. The driver module is configured as a slave communication device, and the other modules are configured as master communication devices. As such, the other modules may initiate communications with the driver to send information to or retrieve information from the driver module.

In one embodiment, a lighting fixture is provided that includes a driver module and a communications module. The driver module is adapted to drive an associated light source and to facilitate communications over a communication bus as a slave communication device. The communications module is adapted to facilitate wireless communications with other elements in a lighting network and communicate as a master communication device with the driver module over the communication bus. The lighting fixture may also include an auxiliary module adapted to provide a lighting fixture function for the lighting fixture as well as facilitate communications as a master communication device with the driver module over the communication bus. Being master communication devices, both the auxiliary device and the communications module may initiate communications with the driver module. The driver module may be adapted to receive AC power and provide DC power to the communications module and the auxiliary module. The communication bus may be a serial communication bus, such as an $I^2C$ bus.

Communications with the driver module may include requesting information from the driver module and transferring information to the driver module. The auxiliary module may be configured to have 1) an occupancy sensor wherein the lighting fixture function is detecting occupancy, 2) an ambient light sensor wherein the lighting fixture function is detecting ambient light, and 3) a communication gateway wherein the lighting fixture function is providing a wireless communication gateway to at least one of a remote device and a network outside of the lighting network.

In one scenario, the communications module is adapted to wirelessly receive first information from one of the other elements of the lighting network and, as the master communication device, initiate transfer of the first information to the driver module, which will control the light source based on the first information. Further, the auxiliary module may include a sensor and be adapted to determine second information bearing on an output of the sensor. As the master communication device, the auxiliary module may initiate transfer of the second information to the driver module, which will control the light source based on the second information.

The communications module may be adapted to wirelessly receive information from one of the other elements of the lighting network and, as the master communication device, initiate transfer of the information to the driver module, which will control the light source based on this information.

The driver module may be further adapted to communicate with a remote switch via the communication bus, wherein the remote switch is also configured as a master communication device, which is adapted to initiate transfer of switch information to the driver module, which will control the light source based on the switch information.

The present disclosure relates to lighting fixtures for use in a lighting network where the lighting fixtures and other elements are able to communicate with each other via wired or wireless communication techniques. When the lighting network is being formed or modified, the lighting fixtures may be able to communicate with each other and automatically determine a single lighting fixture to act as a coordinator during a commissioning process. In essence, the lighting fixtures can exchange their communication addresses, such as MAC addresses, wherein the lighting fixture with the lowest (or highest) normal communication address becomes the coordinator. The coordinator may also be configured to assign short addresses to use for communications once the lighting network is formed instead of the longer MAC, or like, addresses. The short addresses can reduce routing overhead, and thus make the routing of messages including control information, sensor data, and the like, more efficient.

In one exemplary embodiment, a lighting fixture is provided that has a first address and is intended to be employed in a lighting network with any number of elements. The lighting fixture generally includes a light source, a communication interface, and circuitry for controlling the lighting fixture. In addition to controlling the light source, the circuitry is adapted to receive from a first remote lighting fixture a first 'join my network' message, which includes a second address for the first remote lighting fixture. The circuitry will compare the first address with the second address. If the first address does not have a predefined relationship with the second address, the circuitry may recognize the first remote lighting fixture as the coordinator for the lighting network. If the first address has the predefined relationship with the second address, the circuitry may set its own lighting fixture as the coordinator for the lighting network. The predefined relationship may simply be whether the first address is higher or lower than the second address; however, the concepts disclosed herein are not limited to these two relationships.

If short addresses are to be used, the circuitry may generate a short address for the first remote lighting fixture and send the short address to the first remote lighting fixture, if the first address has the predefined relationship with the second address. In this case, the lighting fixture will, at least temporarily, consider itself the coordinator for the first remote lighting fixture. Again, the first short address is shorter than the first address. For example the first address may be a 64-bit MAC address, and the short address may be an 8, 16, or 24-bit address or the like. The circuitry will send the first short address to the first remote lighting fixture. If the first address does not have the predefined relationship with the second address, the circuitry may wait to receive a first short address for the lighting fixture to use for communications within the lighting network, wherein the first short address is shorter than the first address.

The lighting fixture may receive 'join my network' messages from different lighting fixtures during the commissioning process. The lighting fixture may initially think it is the coordinator relative to one remote lighting fixture during a first exchange and the then give up its coordinator role during a second exchange with another remote lighting fixture. For example, the circuitry may be adapted to receive from a second remote lighting fixture a second 'join my network' message including a third address for the second remote lighting fixture, and compare the first address with the third address. If the first address does not have the predefined relationship with the third address, the circuitry may recognize the first remote lighting fixture as the coordinator for the lighting network. If the first address has the predefined relationship with the third address, the circuitry may set its own lighting fixture as the coordinator, at least temporarily, for the lighting network.

When the lighting fixtures are mostly routing nodes for a mesh network, the circuitry for the lighting fixture that ultimately becomes the coordinator may assign short addresses to each of the non-routing elements, which may include sensor modules, switch modules, certain lighting fixtures, and the like in the lighting network.

The circuitry for the coordinator may effect delivery of instructions to the various elements, both routing and non-routing, to initiate a grouping process, wherein the elements coordinate with each other to form a plurality of groups of elements. The grouping process may employ lightcasting processing wherein as one element emits a lightcast signal, other ones of the elements monitor the lightcast signal to determine lightcast data that is used determine the plurality of groups of elements. One or more elements, such as a coordinator, may collect the lightcast data from the other ones of the elements as well as send to the other ones of the elements information that identifies a group to which each of the ones of the elements are assigned. The coordinator may actually determine the groups or use a remote entity, such as a commissioning tool or other control system, to determine the groups. Alternatively, certain of the elements may exchange all of the data and independently identify themselves with a group.

The present disclosure relates to lighting fixtures for use in a lighting network where the lighting fixtures and other elements are able to communicate with each other via wired or wireless communication techniques. When the lighting network is being formed or modified, a lighting fixture is selected to act as a coordinator for forming the lighting network. For example, a user may employ a commissioning tool to select a particular lighting fixture as the coordinator. The coordinator will send out one or more 'join my network' messages toward the other elements of the lighting network. The elements that receive the 'join my network' message may respond in order to make the coordinator aware of their presence and join them to a lighting network.

In certain embodiments, the coordinator will assign short addresses to itself and to the other elements in the lighting network. While the elements already have MAC or like addresses, once the short addresses are assigned, the elements of the routing network will use the short addresses for normal communications. The short addresses can reduce routing overhead, and thus make the routing of messages including control information, sensor data, and the like, more efficient.

The lighting network may be a mesh network formed from the various elements wherein some elements act as routing nodes and other elements act as non-routing nodes. For example, some or all of the lighting fixtures may be routing nodes while switches, stand-alone sensors, and the like may be non-routing nodes in select embodiments. However, there is no limitation as to whether a particular type of element can be configured as a routing or non-routing element.

The coordinator may effect delivery of instructions to the various elements, both routing and non-routing, to initiate a grouping process, wherein the elements coordinate with each other to form a plurality of groups of elements. The grouping process may employ lightcasting processing wherein as one element emits a lightcast signal, other ones of the elements monitor the lightcast signal to determine the plurality of groups of elements. One or more elements, such as a coordinator, may collect the lightcast data from the other ones of the elements as well as send information to the other ones of the elements that identifies a group to which each of the ones of the elements are assigned. The coordinator may actually determine the groups or it may use a remote entity, such as a commissioning tool or other control system, to determine the groups. Alternatively, certain of the elements may exchange all of the data and independently identify themselves with a group.

The concepts of the present disclosure may also be applied in a power over Ethernet (PoE) environment. PoE allows a single cable to carry both power and data communications. The IEEE 802.3af and 802.3at standards, which are incorporated herein by reference in their entireties, set forth PoE standards that have found wide acceptance. CISCO has set forth criteria for an alternative PoE standard, which was developed prior to the IEEE 802.3af/at standards being developed. With either standard, two devices may communicate with each other over a single cable wherein one device provides power to the other device over the cable. The device providing power is referred to as power sourcing equipment (PSE), while the device receiving power is referred to as the powered device (PD). As such, the PSE operates to supply the PD power over a single cable, and the PD consumes power that it receives from the PSE over that cable.

Figure 41:
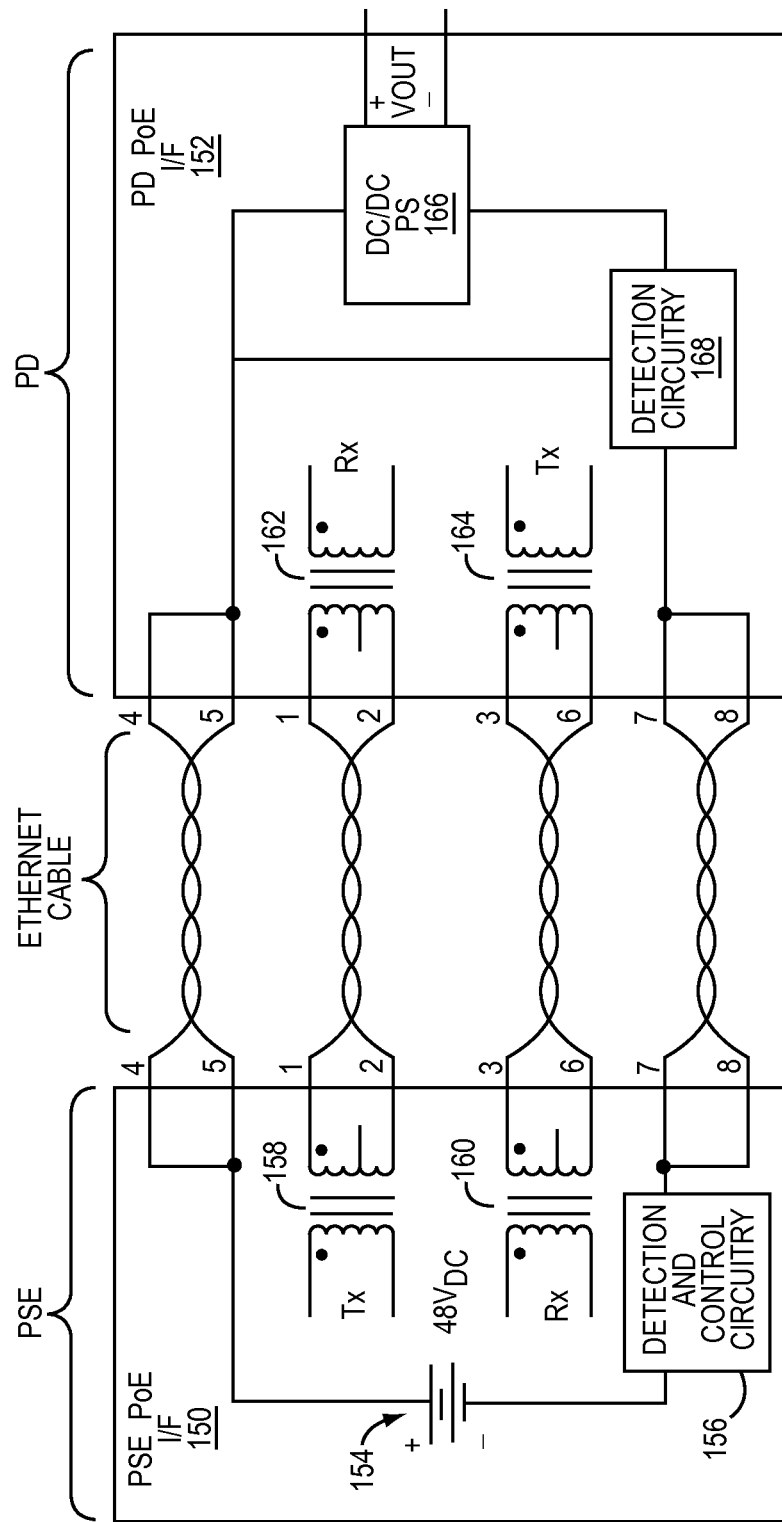
FIG. 41 illustrates a POE interface architecture in a spare-pair power feed embodiment.

FIG. 41 illustrates the respective interfaces for a PSE and PD for a "spare-pair" power feed configuration. An alternative "phantom" power feed configuration is described further below. The PSE PoE interface 150 will form part of the PSE and function as both the communication and power delivery interface, which is connected to the PD by an appropriate cable, such as a CAT-5 or CAT-6 Ethernet cable. An Ethernet cable generally has eight wires, which are configured as four twisted pairs of wire. Similarly, the PD has a PD PoE interface 152.

The PSE PoE interface 150 is shown with a power supply 154, which has a positive supply output coupled to pins 4 and 5 of an Ethernet jack and a negative supply output coupled to pins 7 and 8 via detection and control circuitry 156. As such, the voltages developed by the power supply 154 may be provided across pins 4/5 and pins 7/8 and delivered to the corresponding pins of the Ethernet jack provided by the PD over the Ethernet cable.

The PSE PoE interface 150 has a transmit (TX) transformer 158 and a receive (RX) transformer 160. Data to be transmitted by the PSE over the Ethernet cable is presented to the left primary side of the transmit transformer 158 by the requisite control and communication circuitry (not shown) of the PSE, coupled to the right secondary side of the transmit transformer 158, and delivered to the Ethernet cable in a differential fashion via pins 1 and 2 of the Ethernet jack of the PSE. Data received from the PD is received in a differential fashion via pins 3 and 6 of the Ethernet jack, presented to the right primary side of the receive transformer 160, coupled to the left secondary side of the receive transformer 160, and delivered to the requisite communication circuitry (not shown).

On the PD side, data transmitted by the PSE and received via pins 1 and 2 of the PD's Ethernet jack is received in a differential fashion by the left primary side of the receive transformer 162, coupled to the right secondary side of a receive transformer 162, and delivered to the requisite communication circuitry (not shown) of the PD. Data to be transmitted by the PD over the Ethernet cable is presented to the right primary side of a transmit transformer 164 by the requisite communication circuitry (not shown) of the PD, coupled to the left secondary side of the transmit transformer 164, and delivered to the Ethernet cable in a differential fashion via pins 3 and 6 of the PD's Ethernet jack.

The voltages presented between pins 4/5 and pins 7/8 are effectively presented to a DC-DC power supply (PS) 166, which is controlled by detection circuitry 168 and capable of providing a DC output voltage, VOUT, based on the direction of the detection circuitry 168. Notably, the detection circuitry 168 not only controls the level of the DC output voltage VOUT, but also controls whether the DC output voltage VOUT is presented at all.

The detection and control circuitry 156 of the PSE and the detection circuitry 168 of the PD effectively communicate with one another such that the PSE can detect that the PD is a PoE device and classify the PD as falling into one of the defined IEEE 802.3 af PoE power classes. During detection, the detection and control circuitry 156 of the PSE measures the current being provided to the PD via pins 4/5 and 7/8 at two different voltage levels. These two voltage levels are relatively low reach levels, such as 2.8 V and 5.6 V, respectively. When presented with these different voltage levels, the detection circuitry 168 of the PD will provide a standard-defined input resistance. Based on these currents, a differential input resistance for the PD is determined by the detection and control circuitry 156 of the PSE. If the differential input resistance falls within an appropriate range, the detection and control circuitry 156 will determine that the PD is an appropriate PoE device. Otherwise, the detection and control circuitry 156 will determine that PD is not a PoE device.

For classification, the detection and control circuitry 156 of the PSE will provide an intermediate voltage and measure the resulting current. The PD will be expecting this intermediate voltage and will modify its input impedance to a level that indicates its particular power classification. In other embodiments, information may be exchanged over the data lines to assist with classification. Once the PD is classified, the detection and control circuitry 156 of the PSE will present the standard 48V PoE supply voltage across pins 4/5 and 7/8. The PD will receive this voltage via pins 4/5 and 7/8. The voltage is provided to the DC-DC power supply 166 and regulated to a desired output voltage VOUT to power electronics of the PD. The detection circuitry 168 may be configured to control the particular voltage level for the output voltage VOUT.

In the above embodiment, data is transmitted from the PSE to the PD over a twisted-pair, which couples pins 1 and 2 of both devices. Data is transmitted from the PD to the PSE over a twisted-pair coupling pins 3 and 6 of both devices. In this configuration, power is not supplied on the wires used for communicating data. The positive supply voltage is provided over the spare twisted-pair coupling pins 4/5, and the negative supply voltage is provided over the spare twisted-pair coupling pins 7/8. As such, this embodiment is referred to as a spare-pair power feed. In the following embodiment, power is supplied over the wires used for communicating data in a phantom power feed configuration.

Figure 42:
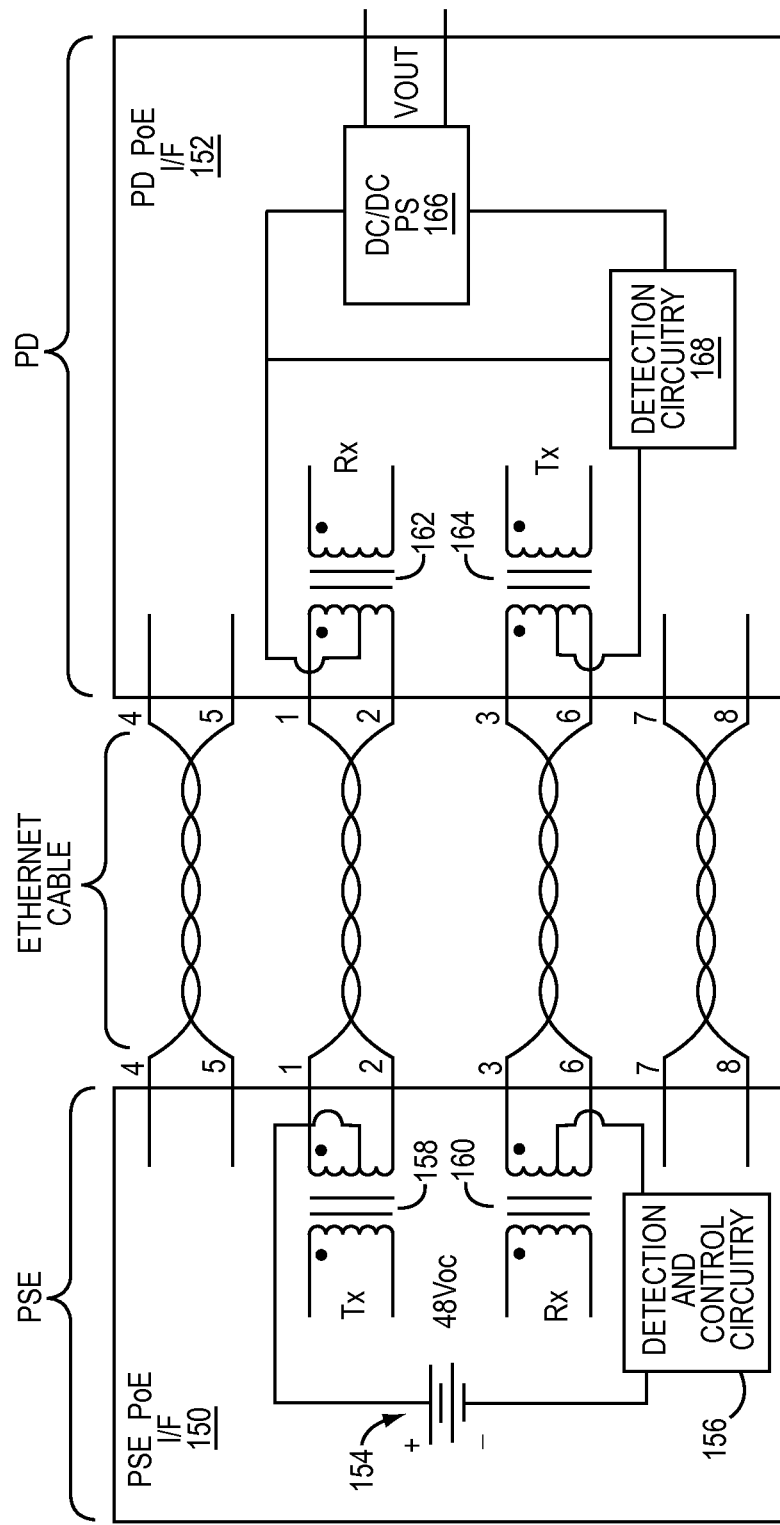
FIG. 42 illustrates a POE interface architecture in a phantom power embodiment.

With reference to FIG. 42, the PSE and PD in FIG. 41 are slightly modified. In particular, the positive supply voltage from the power supply 154 is coupled to a center tap of the right secondary of the transmit transformer 158. The negative supply voltage is coupled to the center tap of the right primary of the receive transformer 160. As such, the positive supply voltage is provided over the twisted-pair coupling pins 1/2 along with data transmitted to the PD, and the negative supply voltage is provided over the twisted-pair coupling pins 3/6 along with data received from the PD.

In the PD PoE interface 152, the DC-DC power supply 166 is coupled to the center tap of the left primary of the receive transformer 162, and the detection circuitry 168 is coupled to the center tap of the left secondary of the transmit transformer 164. As such, the positive supply voltage is received over the twisted-pair coupling pins 1/2 along with data received from the PSE, and the negative supply voltage is received over the twisted-pair coupling pins 3/6 along with data transmitted from the PD. The twisted pairs that run between pins 4/5 and 7/8, respectively, are unused. The handshaking used to detect and classify the PD is similar to that described above.

Figure 43:
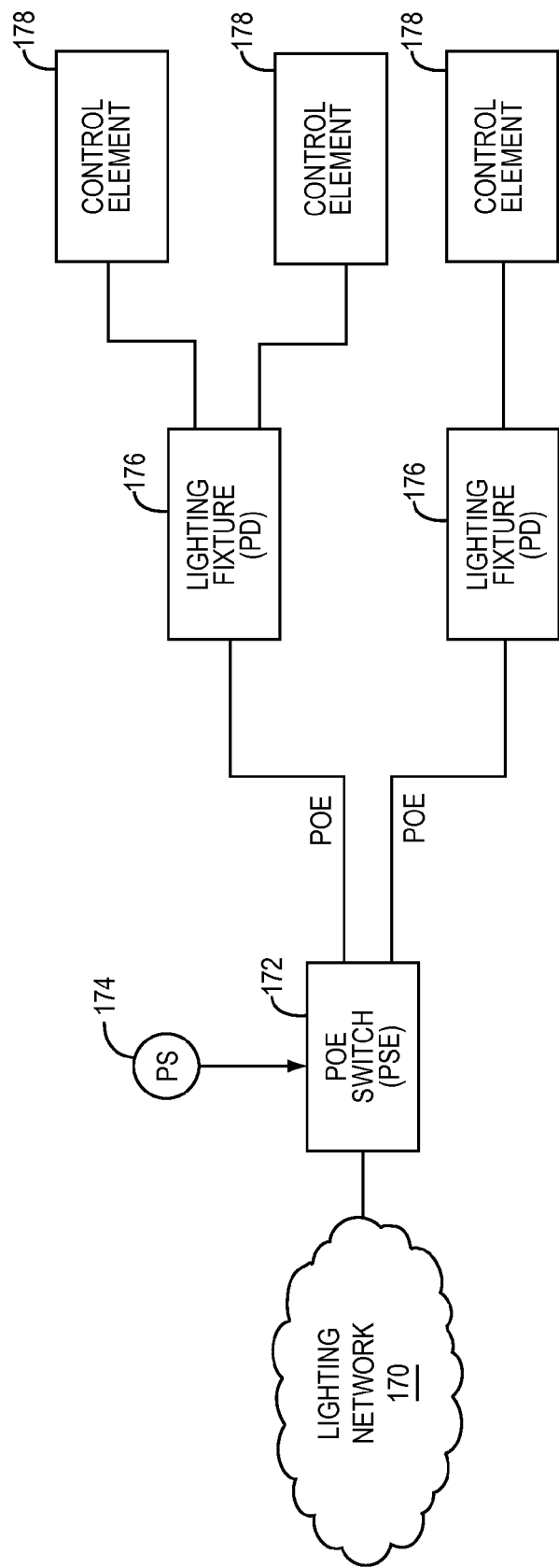
FIG. 43 is a lighting network environment wherein the lighting fixture acts as a POE PD device.

Turning now to FIG. 43, a network lighting environment that employs PoE is illustrated according to a first embodiment. In this embodiment, a lighting network 170 is coupled to a PoE switch 172, which receives power from a power supply (PS) 174. The PoE switch 172 is configured as a PSE and is coupled to multiple lighting fixtures 176, which are configured as PDs. As such, the PoE switch 172 facilitates Ethernet-based communications between the lighting network 170 and the lighting fixtures 176. While the PoE switch 172 receives power from the power supply 174, the lighting fixtures 176 receive power from the PoE switch 172 over Ethernet or like cables. Data is exchanged between the PoE switch 172 and the lighting fixtures 176 over the same cabling through which power is provided from the PoE switch 172 to the lighting fixtures 176, as described above.

Further, various control elements 178 may be coupled to the lighting fixtures 176. These control elements 178 may represent integrated or separate occupancy sensors, ambient light sensors, temperature sensors, wireless access points, emergency lighting fixtures, cameras, thermostats, speakers, security sensors, smoke alarms, telephones, and the like. Notably, the lighting fixtures 176, which are receiving power from the PoE switch 172, may be able to provide power to some or all of the control elements 178. In certain embodiments, the control elements 178 may have their own power sources, and as such, not receive power from the corresponding lighting fixture 176. As described further below, the lighting fixtures 176 and the control elements 178 are able to communicate with one another such that the lighting fixtures 176 may respond to information provided from the control elements 178 as well as provide information to control the control elements 178. The lighting fixtures 176 may exchange information, including control messages or data, with each other as well as with other entities, including other lighting fixtures 176 that form part of the lighting network 170.

Figure 44:
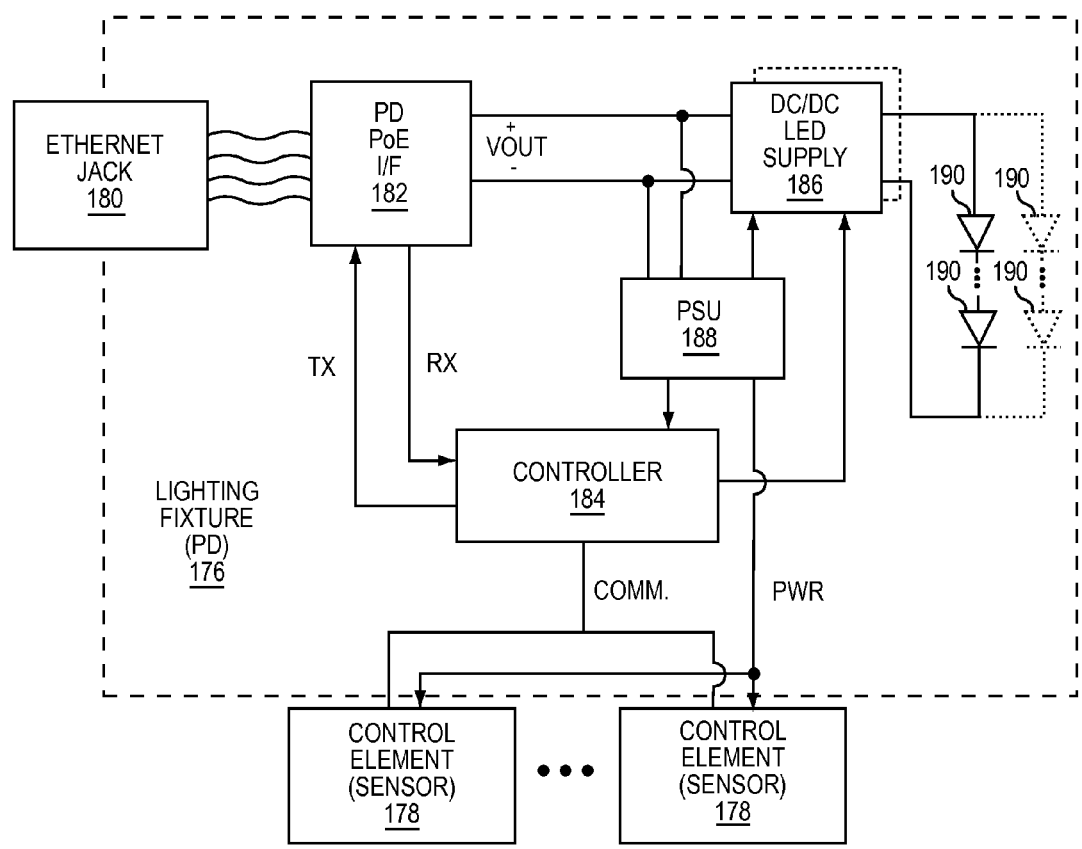
FIG. 44 illustrates a lighting fixture configured as a POE PD device.

FIG. 44 illustrates an exemplary lighting fixture 176, which is configured as a PD. The lighting fixture 176 includes an Ethernet jack 180, which is coupled to a PD PoE interface 182 that is configured similar to what is shown in FIG. 41. The PD PoE interface 182 provides data (RX) at the Ethernet jack 180 from a PoE device, such as the PoE switch 172, to a controller 184. The PD PoE interface 182 passes data (TX) to be transmitted from controller 184 to the Ethernet jack 180 for delivery to the PoE device.

The PD PoE interface 182 also provides the output voltage VOUT to one or more DC-DC LED supplies 186 as well as a power supply unit (PSU) 188. Each DC-DC LED supply 186 may be configured to drive one or more strings of LEDs 190, wherein each string may have LEDs of the same or different color, as previously described. The DC-DC LED supply 186 may receive a control signal from the controller 184. The control signal may be analog or digital and is used to set the drive voltage placed across each string of LEDs 190 by the DC-DC LED supply 186. Controlling the current through each string of LEDs 190 will effectively set the brightness level for each of the respective LEDs 190.

The PSU 188 acts as a low voltage power supply, voltage reference, or the like for various components of the lighting fixture 176. In this example, the PSU 188 provides a supply voltage for the controller 184 and a voltage reference or bias voltage for the DC-DC LED supply 186. The PSU 188 may also provide a supply voltage to power (PWR) some or all of the control elements 178, which are integrated within or coupled to the lighting fixture 176. Alternatively, power may be supplied to the control elements 178 from the PD PoE interface 182.

Communications between the controller 184 and the various control elements 178 may take place over a proprietary or industry-standard communication bus (COMM), such as the I²C serial bus. The interface between the controller 184 and the control elements 178 could also be Ethernet based. Again, the control elements 178 may take various forms as noted above. For example, the control elements 178 may be an occupancy sensor and an ambient light sensor. Information from the sensors may be processed by the controller 184 and used to control how the various strings of LEDs 190 are driven. The controller 184 may share the information from the sensors with other lighting fixtures 176 or control entities via the PD PoE interface 182 as well as generate control information, which is sent to these lighting fixtures 176 or control entities, based on this information as previously described.

Figure 45:
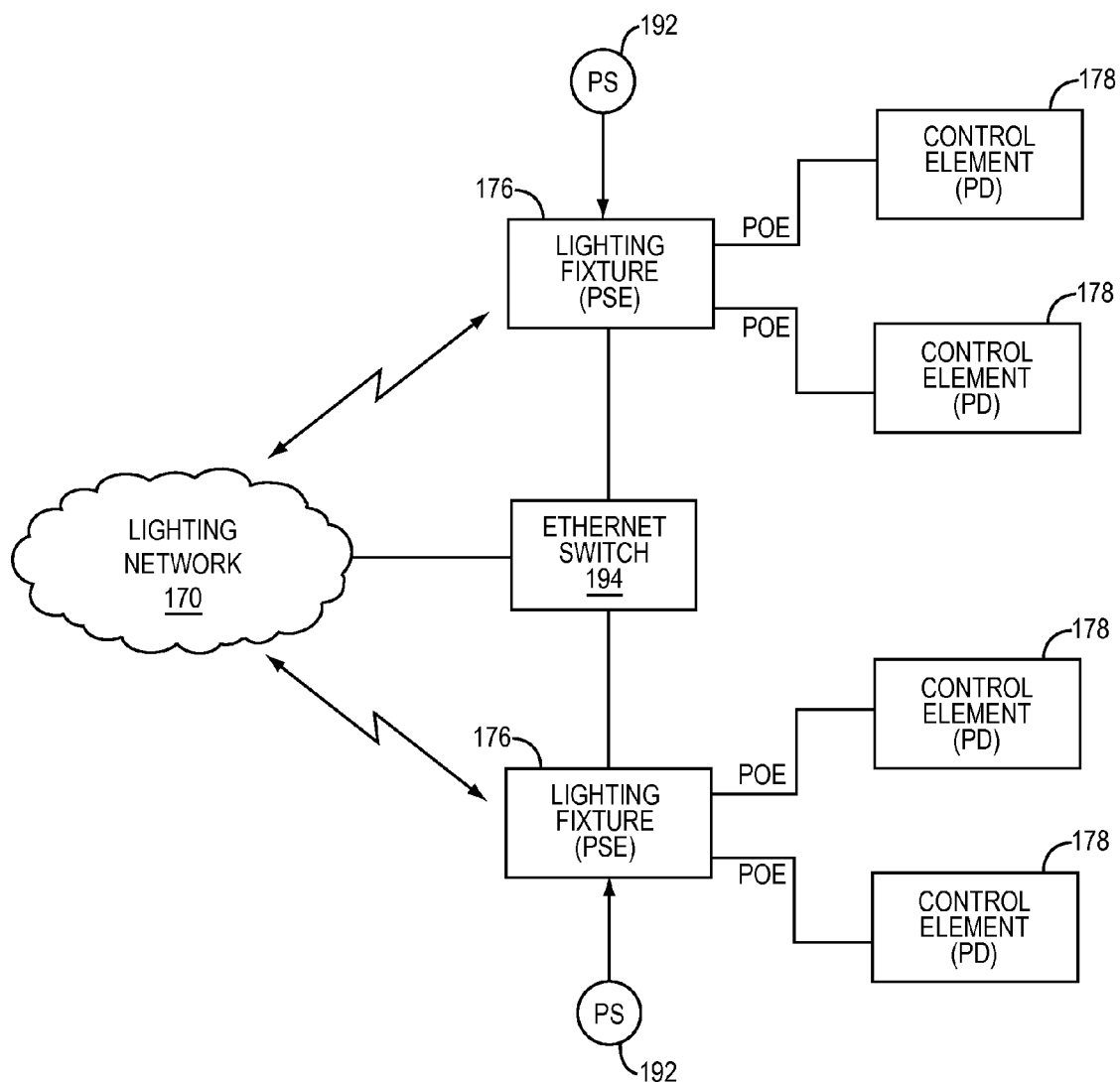
FIG. 45 is a lighting network environment wherein the lighting fixture acts as a POE PSE device.

FIG. 45 illustrates a lighting environment wherein the lighting fixtures 176 are configured as PSEs instead of PDs. Further, the control elements 178 are now configured as PDs. As such, each lighting fixture 176 will receive power from a separate AC or DC power supply (PS) 192 and provide power, via a PoE interface, to one or more control elements 178. The lighting fixtures 176 may communicate with the lighting network 170 using wired or wireless techniques. For a wired connection, the lighting fixture 176 may have an Ethernet interface, which is coupled to an Ethernet switch 194 that is connected to the lighting network 170. For a wireless connection, a lighting fixture 176 may have a wireless communication interface that is capable of communicating with a wireless access point (not shown) of the lighting network 170, another lighting fixture 176 having a wireless communication interface, or other device as described above.

Figure 46:
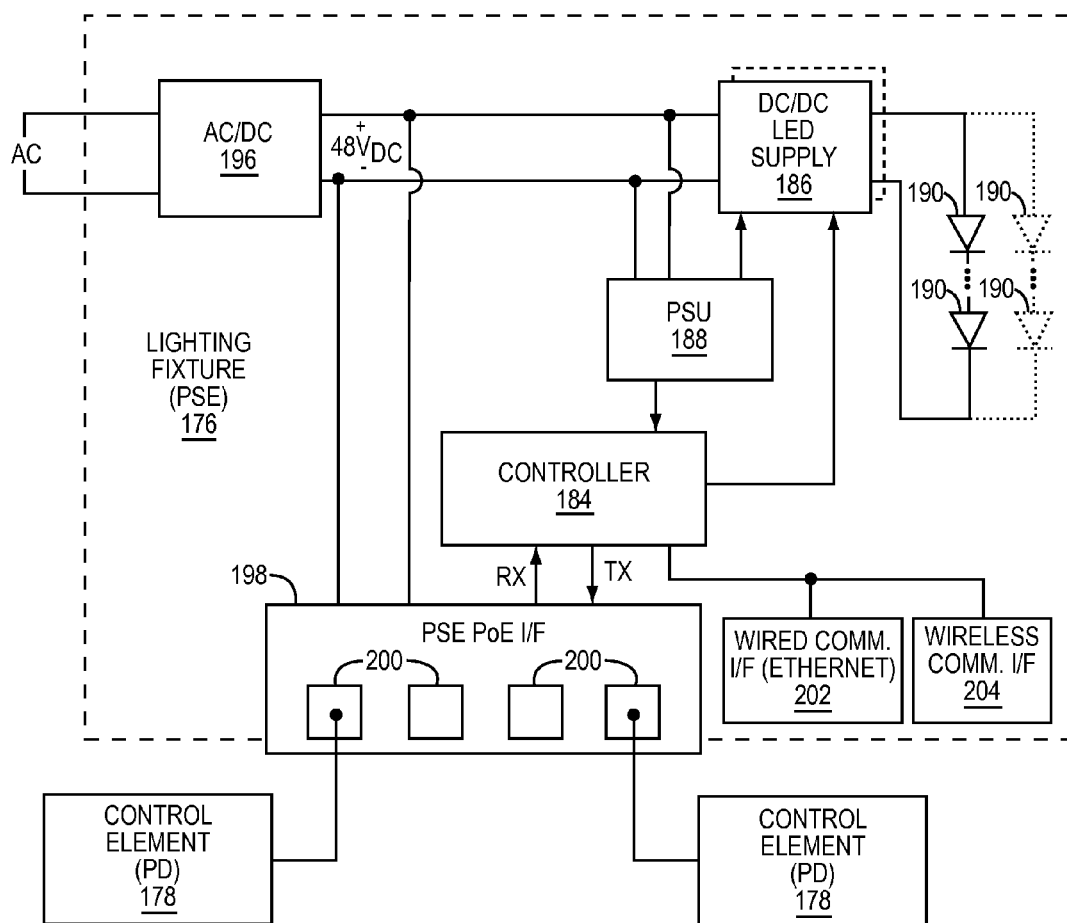
FIG. 46 illustrates a lighting fixture configured as a POE PSE device.

With reference to FIG. 46, an exemplary architecture for a lighting fixture 176, which is configured as a PSE, is described. In this configuration, the lighting fixture 176 is powered from an AC source, and can be supplied with an external DC source or power supply. In similar fashion to the lighting fixture 176 of FIG. 44, a DC-DC LED supply 186 is used to control the current through one or more strings of LEDs 190. In certain embodiments, multiple DC-DC LED supplies 186 may be provided wherein each is capable of independently controlling the current provided through a corresponding string of LEDs 190. The current provided to each string of LEDs 190 is controlled by the controller 184, which receives its power from the PSU 188. An AC/DC converter 196 is capable of converting an AC signal to a desired DC signal. In this instance, the output of the AC/DC converter 196 is approximately 48V DC, which corresponds to standard supply voltage for PoE applications. This output voltage is provided to the DC-DC LED supply 186, the PSU 188, as well as a PSE PoE interface 198.

The PSE PoE interface 198 is similar to that illustrated in and described in association with FIG. 42. The lighting fixture 176 is also associated with one or more other communication interfaces, such as a wired communication interface 202 and a wireless communication interface 204. The PSE PoE interface 198 has multiple PoE ports 200 to which various control elements 178 may be connected via an appropriate cable, such as an Ethernet cable. One or more the control elements 178 may be PoE devices that are configured as PDs. The control element 178 may take any of the forms described above, such as occupancy sensors, ambient light sensors, light switches, and the like. As such, the PSE PoE interface 198 may facilitate the appropriate PoE handshaking with, provide power to, and facilitate Ethernet communications with the control elements 178 according to a desired PoE standard.

The controller 184 not only controls the operation of lighting fixture 176, but also coordinates communications between any of the devices that are coupled to the PoE ports 200 of the PSE PoE interface 198, the wired communication interface 202, and the wireless communication interface 204. In one embodiment, the wired communication interface 202 is a non-PoE Ethernet interface. As such, the PoE ports 200, the wired communication interface 202, and the wireless communication interface 204 may be associated to provide an Ethernet hub, Ethernet switch, router, or a combination thereof. As such, the controller 184 may facilitate the exchange of information between any two control elements 178 (or other devices) that are coupled to the PoE ports 200 as well as facilitate the exchange of information between any control element 178 that is coupled to a PoE port 200 and any control device, lighting fixture 176, or network that is coupled to the wired or wireless communication interfaces 202, 204 on a frame or packet level. In short, the controller 184 may act as a hub, switch, router, or like control entity, and the lighting fixture 176 will effectively have an integrated hub, switch, router, or like control entity integrated therein.

In addition to relaying or routing information between networks or network devices, the controller 184 may also process information, make lighting decisions for itself, and make lighting decisions for other lighting fixtures 176 that are associated with its lighting network 170. These decisions may be based partially or solely on information obtained from the attached control elements 178, other lighting fixtures 176, remote control entities, and the like, as described above. The terms hub, switch, and router are intended to carry their customary meanings.

For example, if the two control elements 178 are configured as an occupancy sensor and an ambient light sensor, respectively, sensor data may be provided to controller 184 and may be: used to control the string of LEDs 190; passed on to other lighting fixtures or control entities via the wired or wireless communication interfaces 202, 204; used to generate commands that are sent to other lighting fixtures 176 or control entities via the wired or wireless communication interfaces 202, 204; or any combination thereof. Further, the controller 184 may also receive sensor information or other data from other lighting fixtures 176 or remote control entities and use this information or data to help determine how to control the string of LEDs 190 or generate commands to send to other lighting fixtures 176 or remote entities. All of these functions may be provided on top of basic hub, switch, and router functions for the various interfaces of the lighting fixture 176.

When the control elements 178 are configured as PoE PD devices, they may be associated with an Internet protocol (IP) address. As such, a control element 178 configured as a sensor or the like will have an IP address and receive power from the PoE port 200 of the PSE PoE interface 198 of the lighting fixture 176.

The following discussion provides specific examples of how to use the commissioning tool 36 to interact with and set parameters with and the various devices of the lighting network. In this example, the lighting network may include any number of lighting fixtures 10, switch modules 110, and the like. In general, the commissioning tool 36 may instruct the various devices of the lighting network to enter into a configuration mode. While in the configuration mode, the devices of the lighting network will stop their normal operation, which includes the sharing of sensor, state, and control information and controlling operation based thereon. Instead, the devices of the lighting network will primarily interact with the commissioning tool 36 to achieve various commissioning goals, several of which are discussed further below. Once the commissioning is complete, the devices of the lighting network will return to normal operation, and resume sharing sensor, state, and control information and controlling operation based on this information, as desired.

Any discussion of the commissioning tool 36 taking an action will generally do so in direct or indirect response to an input from a user. The commissioning tool 36 may provide a graphical user interface that steps the user through the following processes and queries the user for any necessary user input. Further, certain of the following processes involve the user operating the commissioning tool 36 to select a lighting fixture 10. This process generally involves the user aiming the commissioning tool 36 toward the lighting fixture 10 to be selected, such that the LED 104L of the commissioning tool 36 emits light that can be received by the ambient light sensor $S_A$, or the like, of the lighting fixture 10. General communications are provided between the devices of the lighting network using wired or wireless communications.

Figure 47:
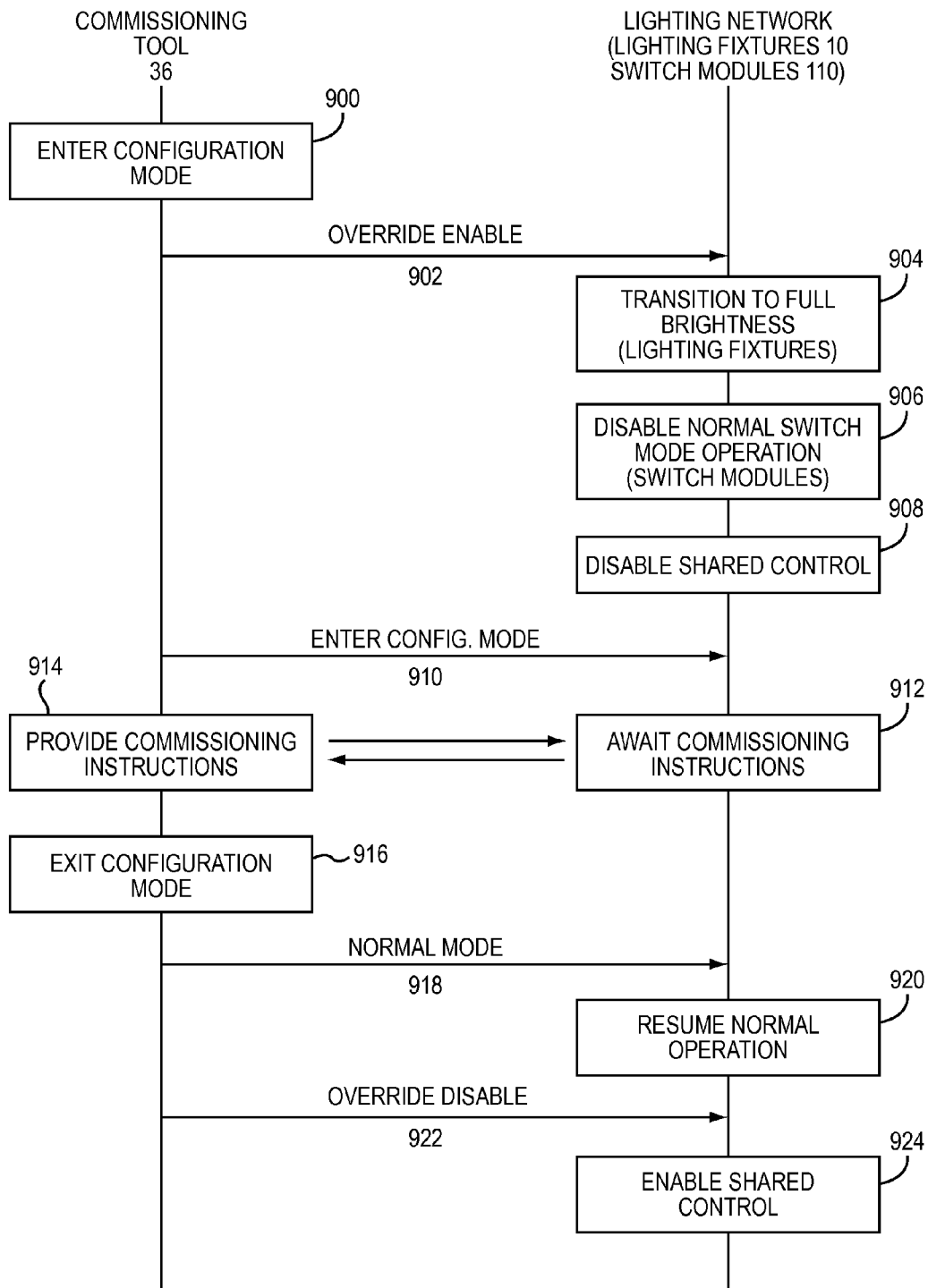
FIG. 47 is a flow diagram illustrating a process for placing devices into a configuration mode according to one embodiment.

An exemplary process for entering and exiting a configuration mode is illustrated in FIG. 47. Initially, the commissioning tool 36 will enter the configuration mode based on input from the user (step 900). In response to entering the configuration mode, the commissioning tool 36 will send an override enable message to the various devices of the lighting network (step 902). In response to receiving the override enable message, the lighting fixtures 10 may halt all normal network traffic in order reduce network traffic for better reception of subsequent messages. The lighting devices may also disable shared control (step 904), which means that the various devices will stop sharing or responding to sensor, status, or control information as required during normal operation.

Next, the commissioning tool 36 will instruct the devices of the lighting network to enter the configuration mode (step 906). In response to receiving the enter configuration mode message, the lighting fixtures 10 may transition to full brightness (step 908) and the switch modules 110 may disable their normal switch module operation (step 910). As an alternative to transitioning to full brightness, the lighting fixtures 10 may provide any other type of visual feedback to the user. Transitioning to full brightness is just one example of how the lighting fixtures 10 may provide feedback to the user. For the switch modules 110, disabling normal operation may simply mean not responding to user input that would normally cause one or more of the lighting fixtures 10 to turn off, turn on, or dim to a desired level. At this point, the devices of the lighting network will await commissioning instructions from the commissioning tool 36 (step 912). To facilitate the desired commissioning, the commissioning tool 36 will provide commissioning instructions (step 914). Steps 912 and 914 represent a generic commissioning process, several of which are described further below. Once the commissioning process is complete, the commissioning tool 36 will exit the configuration mode in response to user input (step 916). The commissioning tool 36 will send an instruction to enter normal mode to the various devices of the lighting network (step 918). In response, the various devices of the lighting network will resume normal operation (step 920). At this point, the various devices of the lighting network may operate independently, as they normally would do, without sharing or responding to sensor, status, or control information. The commissioning tool 36 will subsequently send an override disable message (step 922), which will cause the various devices of the lighting network to enable shared control (step 924). At this point, the various devices of the lighting network will be able to share and respond to sensor, status, and control information.

Figure 48:
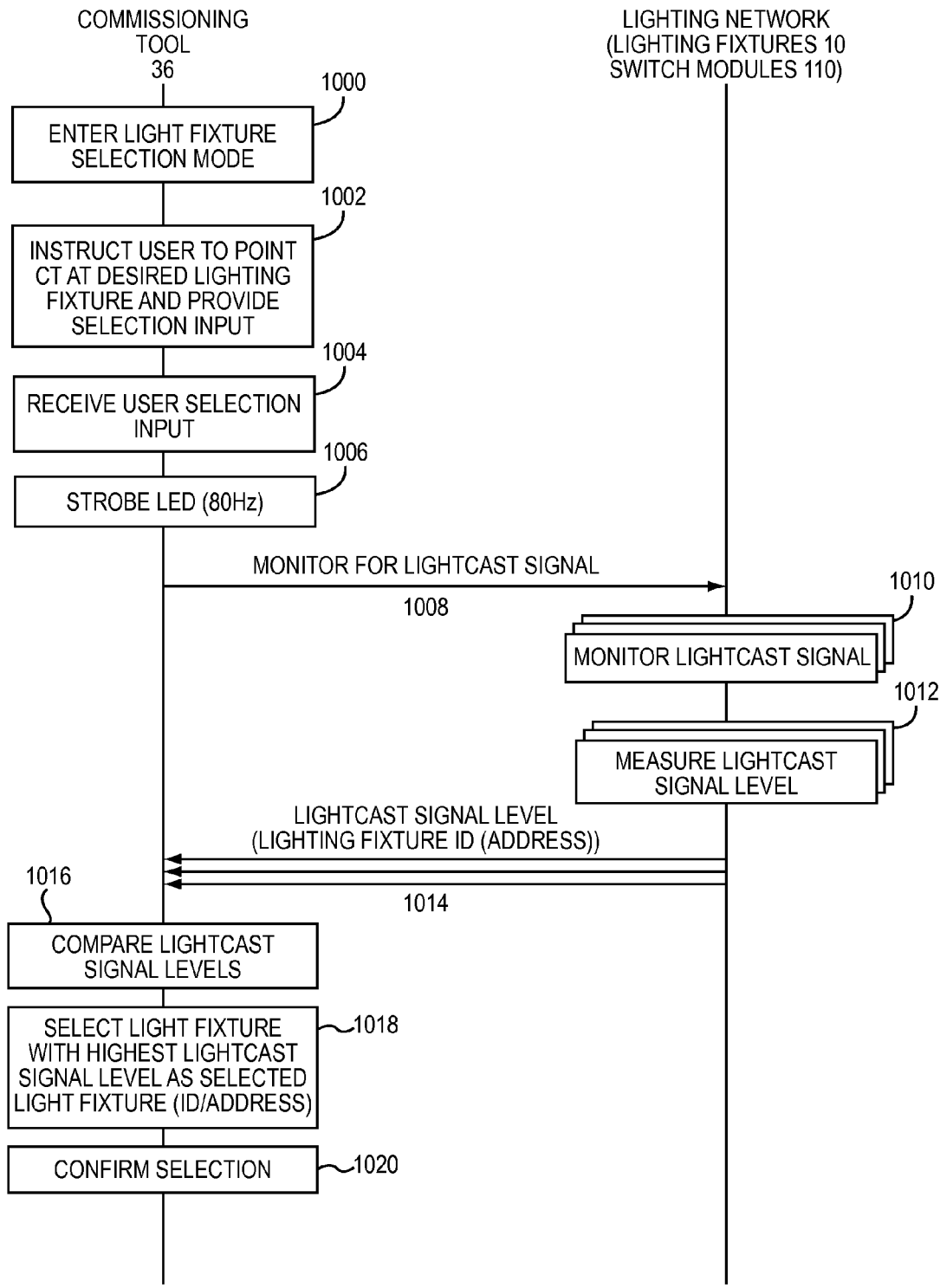
FIG. 48 is a flow diagram illustrating a process for selecting a lighting fixture according to one embodiment.

Prior to describing some exemplary commissioning procedures, common functions required in the various commissioning procedures are described, including selecting a particular lighting fixture 10 or switch module 110. FIG. 48 illustrates an exemplary process for selecting a particular lighting fixture 10. As noted above, this process takes place after the commissioning tool 36 has instructed the various devices of the lighting network to enter the configuration mode. Initially, the commissioning tool 36 will enter a light fixture selection mode, based on user input (step 1000). The commissioning tool 36 will instruct the user to point the light beam emitted from the LED 104L of commissioning tool 36 (FIG. 23) toward the desired lighting fixture 10 and provide a selection input once the commissioning tool 36 is pointing at the desired lighting fixture 10 (step 1002). Upon receiving the user selection input (step 1004), the commissioning tool 36 will strobe the LED 104L, preferably at a frequency that is not humanly perceptible (step 1006). For example, the LED 104L may be strobed at 80 Hz.

At this point, the commissioning tool 36 will send a message to the various devices of the lighting network to monitor for a lightcast signal (step 1008). In response, the lighting fixtures 10 and the lighting network will begin monitoring for the lightcast signal that is being emitted from the commissioning tool 36 (step 1010). Each of the lighting fixtures 10 will measure the level of the lightcast signal (step 1012) and send a message back to the commissioning tool 36 that includes the light cast signal level that it received (step 1014). The commissioning tool 36 will compare the various lightcast signal levels (step 1016), and select the lighting fixture 10 with the highest lightcast signal level as the selected lighting fixture (step 1018). Notably, the lighting fixtures 10 will include their identification information or address when they send their lightcast signal levels to the commissioning tool 36. As such, the commissioning tool 36 can use this identification information or address to identify the lighting fixture 10 from which the various lightcast signal levels were received.

Prior to this process, the commissioning tool 36 will have retrieved from the various devices of the lighting network the identities or addresses of each device in the lighting network. Therefore, the commissioning tool 36 will already have a map or listing of the various devices of the lighting network, and based upon the selection will know which one of the lighting fixtures 10 was selected. Once the lighting fixture 10 that had the highest lightcast signal level is selected, the commissioning tool 36 may provide a visual confirmation of the selection to the user (step 1020). The lighting fixture 10 that was selected need not know that it was selected. This information is maintained in the commissioning tool 36 and may be used by the commissioning tool 36 as needed.

Figure 49:
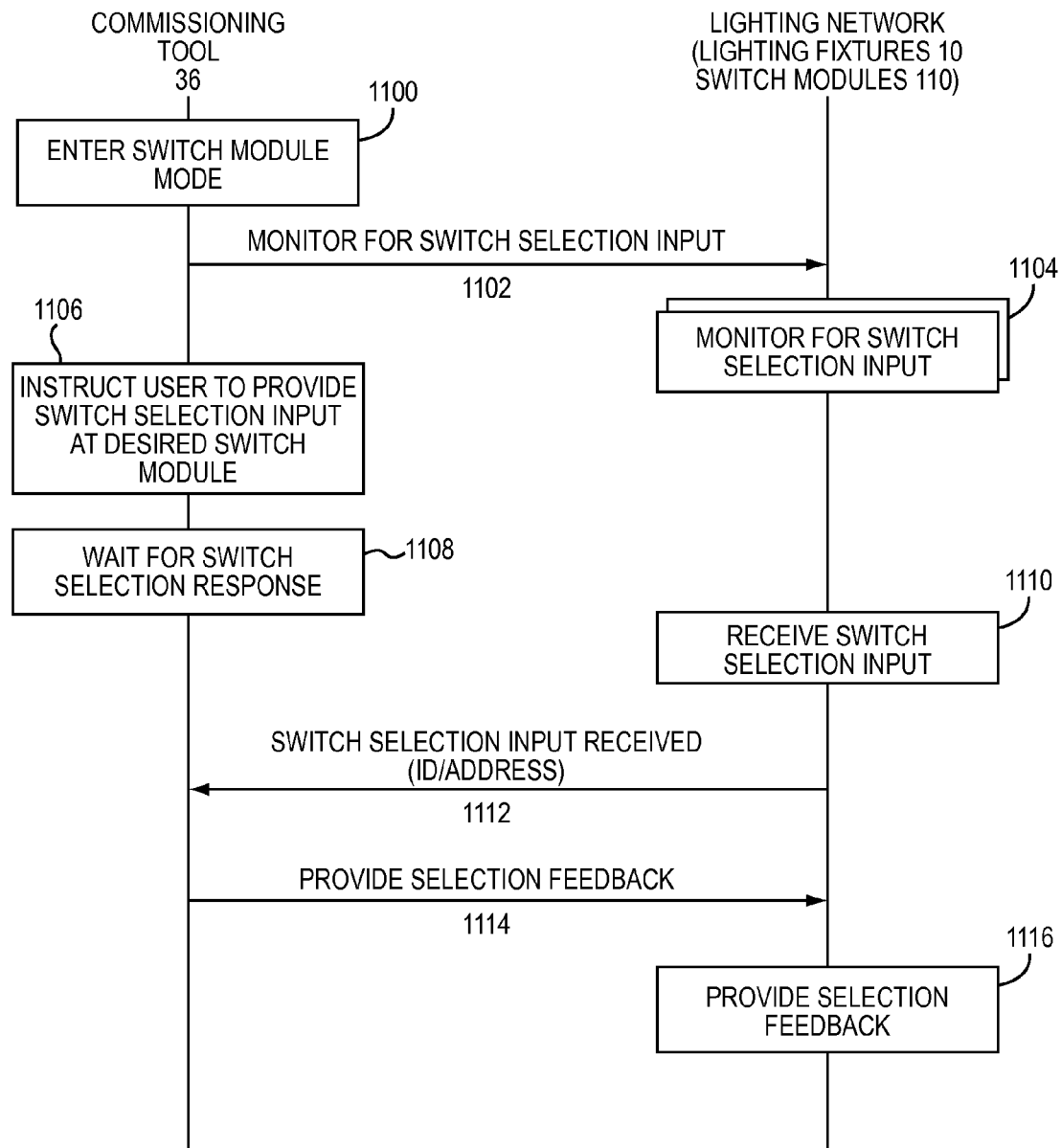
FIG. 49 is a flow diagram illustrating a process for selecting a switch module according to one embodiment.

An exemplary process for selecting a switch module 110, which may be used to turn on, turn off, or dim one or more lighting fixtures 10, is described in association with FIG. 49. Again, during this process, the lighting fixtures 10 and the one or more associated switch modules 110 in a particular group are in configuration mode during this process. In this example, assume that there are at least two switch modules 110 associated with a particular group of lighting fixtures 10.

Initially, the commissioning tool 36 will enter a switch module selection mode (step 1100) and send out a message for the switch modules 110 to monitor for a switch selection input, which will be provided by the user (step 1102). Each of the switch modules 110 will begin monitoring for the switch selection input (step 1104). The commissioning tool 36 will instruct the user to provide the switch selection input at the desired switch module 110 (step 1106) and begin waiting for a switch selection response (step 1108), which will ultimately be received from the selected switch module 110.

As instructed, the user will go to the switch module 110 to be selected and provide a desired input at the switch module 110. The desired input may include depressing the switch, a desired keypad, or the like of the switch circuitry 116 in a desired way or for a certain amount time. For example, a logo may be placed on a specific key of the keypad, and the user will be instructed to press the key with the logo for five seconds. The selected switch module 110 will receive the switch selection input (step 1110) and send a message back to the commissioning tool 36 to indicate that the switch selection input was received (step 1112). The message sent from the switch module 110 to the commissioning tool 36 will include the identity or address of the particular switch module 110 that was selected. As such, the commissioning tool 36 will know which switch module 110 was selected.

The commissioning tool 36 will send to the selected switch module 110 an instruction to provide feedback to the user (step 1114). In response, the selected switch module 110 will provide selection feedback to the user (step 1116). The selection feedback may include having the switch module 110 illuminate or flash the LED 118L of the light source 118 (FIG. 24) to provide a visual indication that selection of the desired switch module 110 was successful.

In the following discussion, the terms configuration mode, vacancy mode, occupancy mode, control group, and occupancy group are used. These terms have specific meanings that will be described prior to discussing exemplary commissioning examples. The term configuration mode was introduced above. Configuration mode refers to a state that the lighting fixtures 10 and switch modules 110 can be placed in to receive special commands that could not be sent during normal network operation. Examples of commands that will be accepted in configuration mode are: selection commands, group assignments, dim/full commands, and occupancy setting assignments.

In one embodiment, all of the devices in the lighting network are associated with a control group and an occupancy group. A control group is a collection of devices that may be controlled by any switch modules 110 in that control group. For example, a hallway with six lighting fixtures 10 and two switch modules 110, which are located on opposite ends of the hallway, would likely be in the same control group so that both switch modules 110 can turn off, turn on, or dim all six of the lighting fixtures 10. When a control group contains at least one switch module 110, it generally runs in vacancy mode. Vacancy mode is where the lighting fixtures 10 initially turn on after being off for an extended period in response to a command from a switch module 110 and turn off in response to two conditions: a command from the switch module 110 or inactivity based on an occupancy timeout. An occupancy timeout occurs when the lighting fixtures 10 collectively fail to detect movement through their associated occupancy sensors $S_O$ after a certain period of time.

In certain embodiments, a grace period is set after the lighting fixtures 10 are turned off in response to an occupancy timeout. If occupancy is detected during the grace period, the lighting fixtures 10 will turn on again. If occupancy is not detected during the grace period, the lighting fixtures 10 will remain off until an appropriate turn-on command is received from an associated switch module 110, even if occupancy is detected.

A control group does not need to be associated with a switch module 110. For example, a bathroom with three lighting fixtures 10 and no switch modules 110 may be configured to have the three lighting fixtures 10 turn on in response to occupancy being detected and turn off after a period of time when occupancy is no longer detected. Such an operating mode is referred to as an occupancy mode, as opposed to the vacancy mode described above.

In essence, a control group determines how a lighting fixture 10 will be controlled. An occupancy group, on the other hand, is a collection of devices that share occupancy events. When an occupancy sensor $S_O$ on a lighting fixture 10 detects occupancy, the lighting fixture 10 will send an occupancy status update to the other lighting fixtures 10 in its occupancy group. The lighting fixture 10 that detected the occupancy event as well as the other lighting fixtures 10 that received the occupancy status update will respond according to whether it is in vacancy mode or occupancy mode. Control groups include a wall control, while occupancy groups generally do not. Further, occupancy and control groups may overlap, as described in further detail below. Fixtures operating in vacancy mode have both an occupancy group assignment and a control group assignment. The control group would necessarily include a wall control. Fixtures operating in occupancy mode (without a wall control) require an occupancy group assignment; however, their control group assignment is unused/ignored, and may be unchanged from the original commissioning assignment. Occupancy mode fixtures are not typically configured to respond to wall controls, although they may be configured that way if desired. In such a case, the occupancy mode fixtures would be in the same control group as the associated wall control.

Figure 50A:
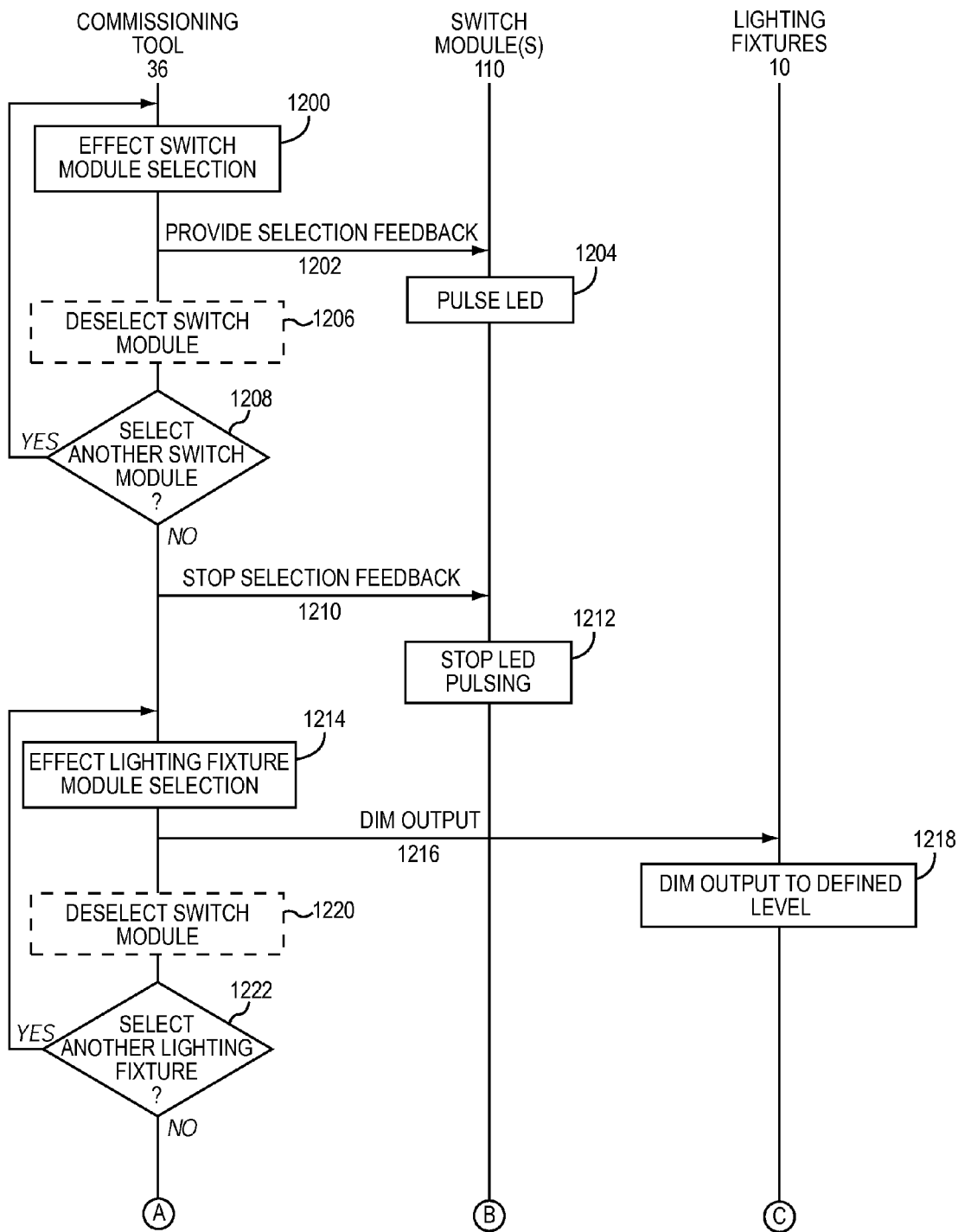
FIGS. 50A and 50B are a flow diagram illustrating a process for creating a new control group according to one embodiment.
Figure 50B:
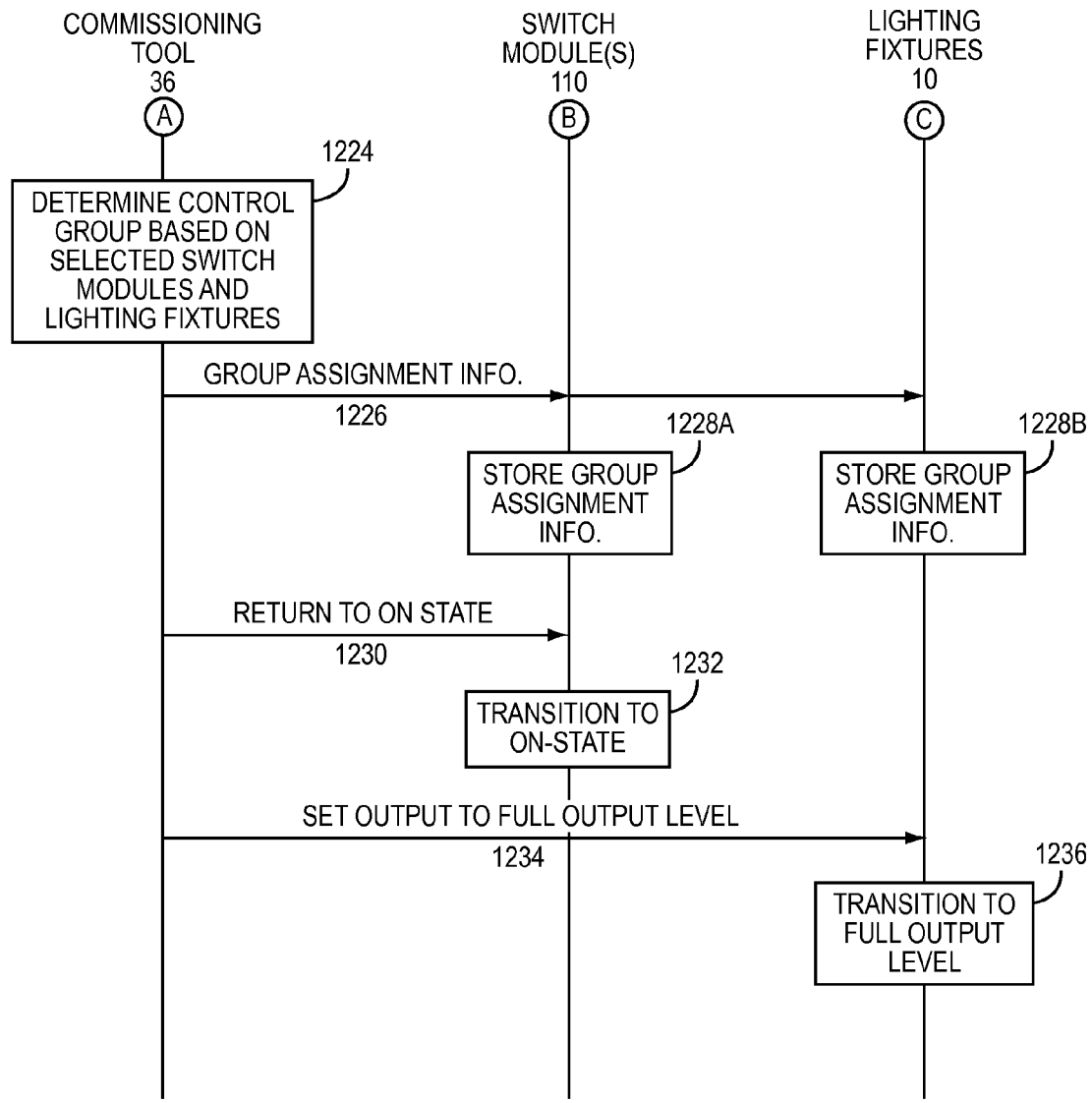

With reference to FIGS. 50A and 50B, an exemplary process is illustrated for creating a control group that includes one or more switch modules 110 and one or more lighting fixtures 10. Initially, the commissioning tool 36 will effect switch module selection for each of the switch modules 110 in the control group. The switch module selection was previously described in detail in association with FIG. 49. In essence, a first switch module 110 is selected via the commissioning tool 36 using the switch module selection process (step 1200). Once the first switch module 110 is selected, the commissioning tool 36 will send a message to the selected switch module 110 to provide selection feedback (step 1202). The selected switch module 110 may respond by pulsing the LED 118L in a humanly perceptible fashion, such that the user will have visible feedback that the first switch module 110 has been selected (step 1204).

Once the first switch module 110 is selected, the commissioning tool 36 may provide the user with an option to deselect the first switch module 110 (step 1206). If deselected, the commissioning tool 36 will instruct the first switch module 110 to stop pulsing the LED 118L to provide visible feedback to the user that the first switch module 110 has been deselected (step not shown). For the current example, assume that the first switch module 110 is not deselected.

Once the first switch module 110 is selected, the commissioning tool 36 presents another switch module 110 (step 1208). To select additional switch modules 110 to add to the control group, the above process is repeated for each additional switch module 110. Once selected, the switch modules 110 will continue to pulse their LEDs 118L until the user indicates that there are no further switch modules 110 to add to the switch group (step 1208). In one embodiment, the switch modules 110 will continue their LED sequence throughout the rest of the group creation process. Alternatively, once there are no further switch modules 110 to add to the switch group, the commissioning tool 36 sends a message to the selected switch modules 110 to stop providing their selection feedback (step 1210). In this example, the switch modules 110 will respond by stopping their LEDs 118L from pulsing (step 1212).

Next, the commissioning tool 36 will effect lighting fixture selection. Under the control of the user, the commissioning tool 36 will effect selection of a first lighting fixture 10 (step 1214), and send an instruction to the selected lighting fixture 10 to dim its output to a defined level (step 1216). The selected lighting fixture 10 will dim its output to the defined level to provide visual feedback indicative of being selected (step 1218). In this embodiment, or any of the others provided herein, the visual feedback provided for individual or group selections may include transitioning to a defined light output level, color, or color temperature, as well as flashing a certain number of times or at a certain rate, or any combination thereof.

The commissioning tool 36 will also provide the option to deselect the selected lighting fixture 10 (step 1220). If the selected lighting fixture 10 is deselected, the commissioning tool 36 will instruct the lighting fixture 10 to return to its full output level. Assume for this example that the selected lighting fixture 10 is not deselected.

The commissioning tool 36 will determine whether the user wants to select another lighting fixture 10 to add to the control group (step 1222). As such, the process is repeated for each lighting fixture 10 that will be added to the control group. Once all of the lighting fixtures 10 have been selected for the control group (step 1222), the commissioning tool 36 will determine a control group based on the currently selected switch modules 110 and lighting fixtures 10 (step 1224). Each control group will have unique group assignment information, which is assigned by the commissioning tool 36. The group assignment information is sent to the selected switch modules 110 and lighting fixtures 10 (step 1226), which will store the group assignment information (steps 1228A and 1228B).

At this point, the commissioning tool 36 will send an instruction for the selected switch modules 110 to return to their on-state (step 1232), and the switch modules 110 will transition to an on-state (step 1230). Similarly, the commissioning tool 36 will send an instruction for the selected lighting fixtures 10 to set their output to the full output level (step 1234). The lighting fixtures 10 will respond by transitioning from the dimmed level associated with being selected to their full output level (step 1236).

Figure 51:
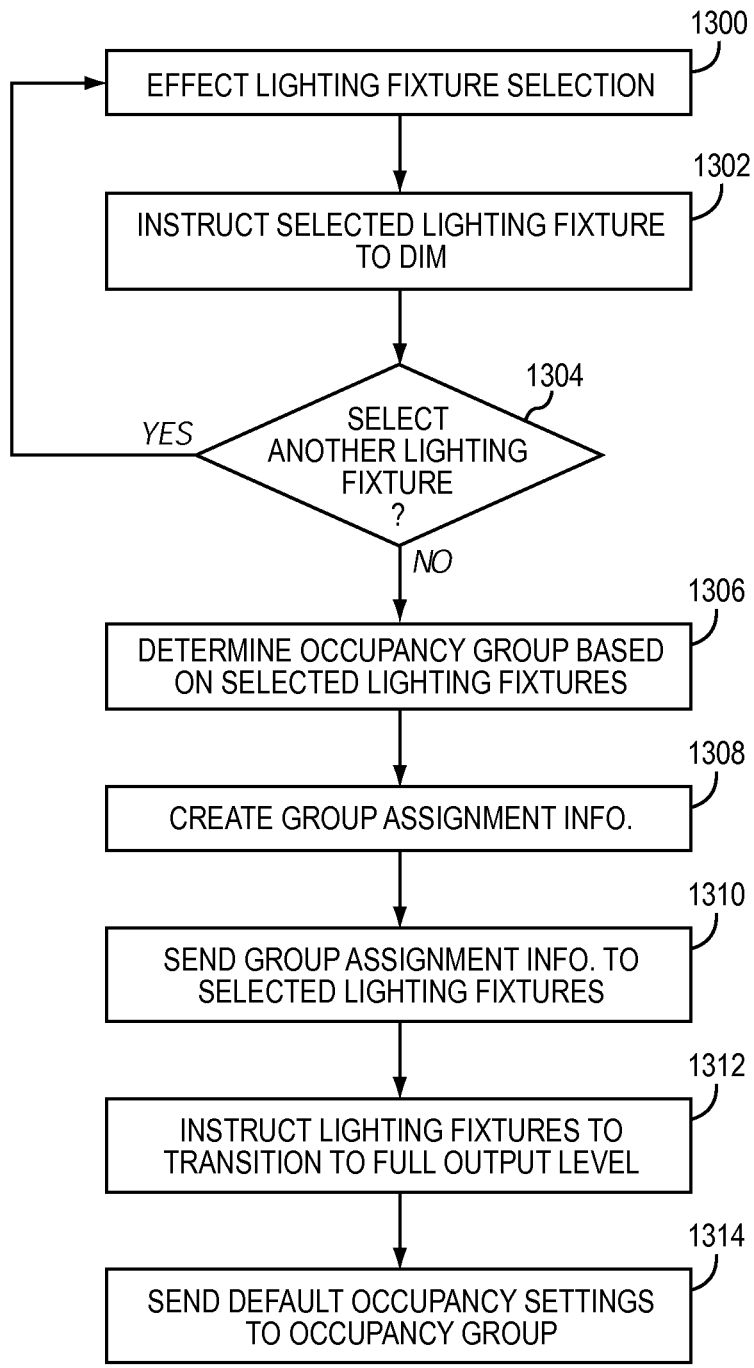
FIG. 51 is a flow diagram illustrating a process for creating a new occupancy group according to one embodiment.

Creating a new occupancy group is analogous to creating a control group, with the exception that the occupancy group may not have the associated switch modules 110. In the following embodiment the occupancy group will only include lighting fixtures 10, even though these lighting fixtures 10 may be in a control group with one or more switch modules 110. An exemplary process for forming a new occupancy group, from the perspective of the commissioning tool 36, is shown in FIG. 51.

Initially, the commissioning tool 36 will effect lighting fixture selection for a first lighting fixture 10 (step 1300), as previously described. The commissioning tool 36 will instruct the selected lighting fixture 10 to dim to a defined dimming level (step 1302). The commissioning tool 36 will then ask the user if another lighting fixture 10 should be selected (step 1304). If another lighting fixture 10 should be selected, the process is repeated for each desired lighting fixture 10. Once all of the desired lighting fixtures 10 are selected (step 1304), the commissioning tool 36 will determine an occupancy group based on the selected lighting fixtures 10 (step 1306) and create group assignment information for the new occupancy group (step 1308). The commissioning tool 36 will send the group assignment information to the selected lighting fixtures 10 (step 1310) and instruct the lighting fixtures 10 to transition to their full output levels (step 1312). Finally, the commissioning tool 36 will provide the lighting fixtures 10 in the new occupancy group with default occupancy settings (step 1314). The default occupancy settings may relate to sensitivity levels, timeout periods, and the like for the various lighting fixtures 10, which are associated with an occupancy sensor $S_O$. At this point, the lighting fixtures 10 that were selected will have the group assignment information and start operating according to the default occupancy settings that were provided by the commissioning tool 36. As such, the lighting fixtures 10 may respond to occupancy updates that are received from other lighting fixtures 10 in the same occupancy group.

Figure 52:
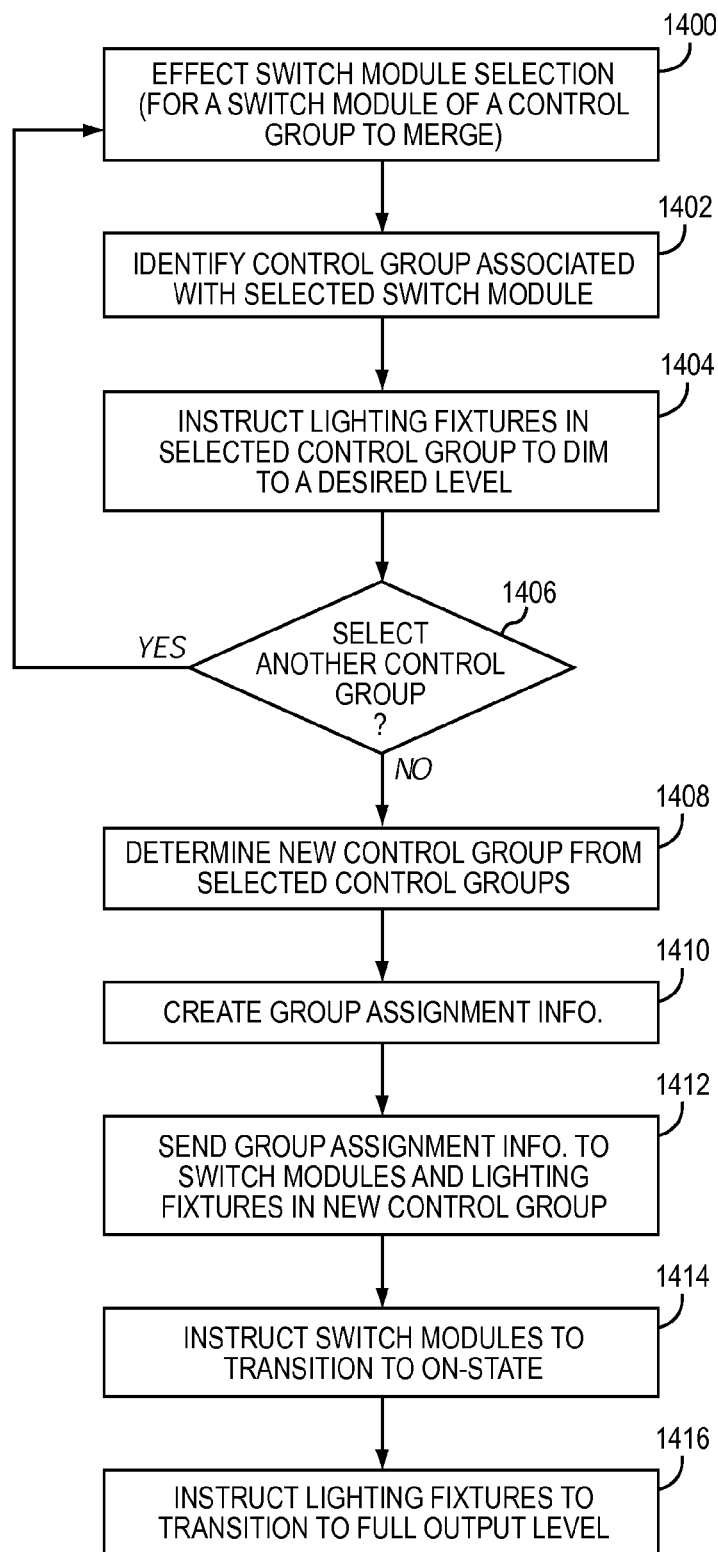
FIG. 52 is a flow diagram illustrating a process for merging control groups according to one embodiment.

With reference to the flow diagram of FIG. 52, a process to merge two or more control groups into a single control group is described according to one embodiment of the disclosure. Merging of the control groups will allow all of the lighting fixtures 10 from the original control groups to be controlled from any of the switching modules 110 from the original control groups.

Initially, the commissioning tool 36 will effect switch module selection for a switch module 110 of a first control group, which the user wants to merge with one or more other control groups (step 1400). The switch module selection process is the same as that described in association with FIG. 48. The commissioning tool 36 will then identify the control group that includes the selected switch module 110 (step 1402) and instruct the lighting fixtures 10, which are in the selected control group, to dim to a desired level (step 1404). Having the lighting fixtures 10 of the selected control group dim provides the user with visual feedback that the control group has been selected and clearly identifies the lighting fixtures 10 that are in the selected control group.

Once the first control group has been selected, the commissioning tool 36 presents the user with the opportunity to select another control group to merge with the first control group (step 1406). This process may be repeated for any number of control groups. Once all of the control groups that need to be merged have been selected, the commissioning tool 36 will determine a new control group from all of the devices in the selected control groups (step 1408), and create group assignment information for the new control group (step 1410). The commissioning tool will then send the group assignment information for the new control group to the affected switch modules 110 and lighting fixtures 10 (step 1412). Next, the commissioning tool 36 will instruct the affected switch modules 110 to transition to their on-state (step 1414) and the affected lighting fixtures 10 to transition to their full output levels (step 1416) to provide visual feedback that the selected control groups have been merged into a single, new control group.

Figure 53:
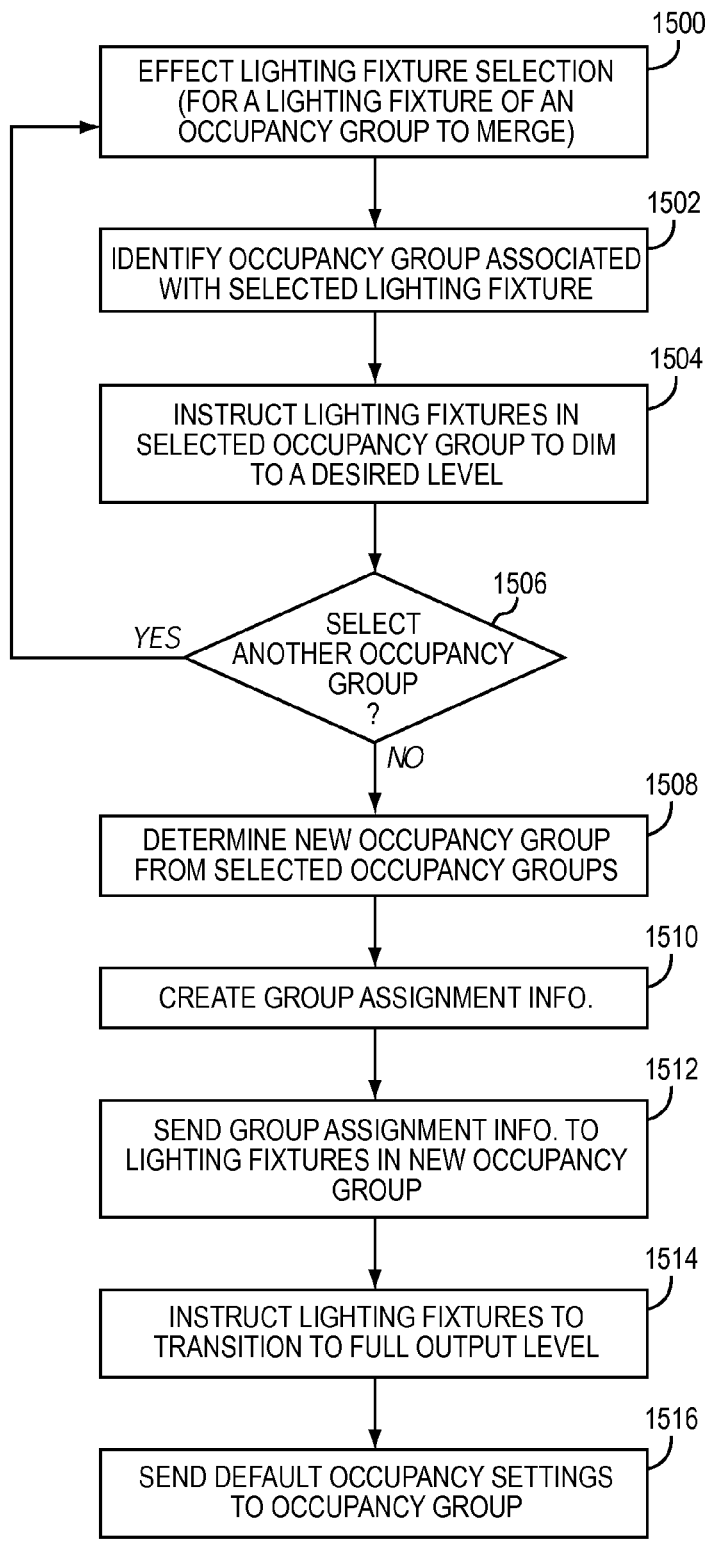
FIG. 53 is a flow diagram illustrating a process for merging occupancy groups according to one embodiment.

With reference to the flow diagram of FIG. 53, a process to merge two or more occupancy groups into a single occupancy group is described according to one embodiment. Merging of the occupancy groups will allow all of the lighting fixtures 10 from the original occupancy groups to share and respond to occupancy events.

Initially, the commissioning tool 36 will effect lighting module selection for a lighting fixture 10 of a first occupancy group, which the user wants to merge with one or more other occupancy groups (step 1500). The lighting fixture selection process is the same as that described in association with FIG. 49. The commissioning tool 36 will then identify the occupancy group that includes the selected lighting fixture 10 (step 1502) and instruct the lighting fixtures 10 in the selected control group to dim to a desired level (step 1504). Having the lighting fixtures 10 of the selected control group dim provides the user visual feedback that the selected occupancy group has been selected and clearly identifies the lighting fixtures 10 that are in the selected control group.

Once the first occupancy group has been selected, the commissioning tool 36 presents the user with the opportunity to select another occupancy group to merge with the first occupancy group (step 1506). This process may be repeated for any number of occupancy groups. Once all of the occupancy groups that need to be merged have been selected, the commissioning tool 36 will determine a new occupancy group from all of the lighting fixtures 10 in the selected occupancy groups (step 1508) and create group assignment information for the new occupancy group (step 1510). The commissioning tool will then send the group assignment information for the new occupancy group to the affected lighting fixtures 10 (step 1512). Next, the commissioning tool 36 will instruct the affected lighting fixtures 10 to transition to their full output levels (step 1514) to provide visual feedback that the selected occupancy groups have been merged into a single, new occupancy group. Finally, the commissioning tool 36 will send default occupancy settings to each lighting fixture 10 in the occupancy group (step 1516).

Figure 54A:
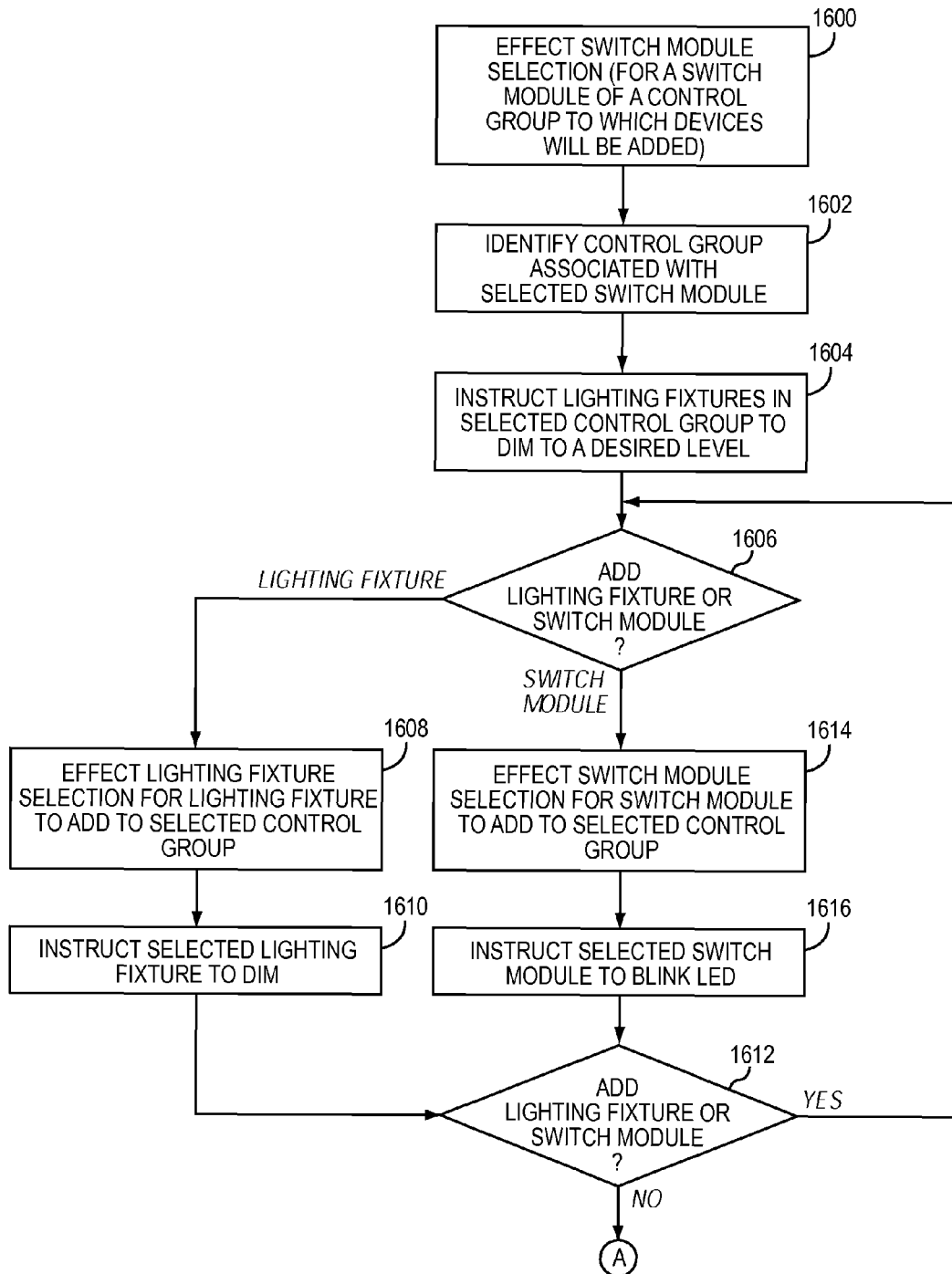
FIGS. 54A and 54B are a flow diagram illustrating a process for adding devices to a control group according to one embodiment.
Figure 54B:
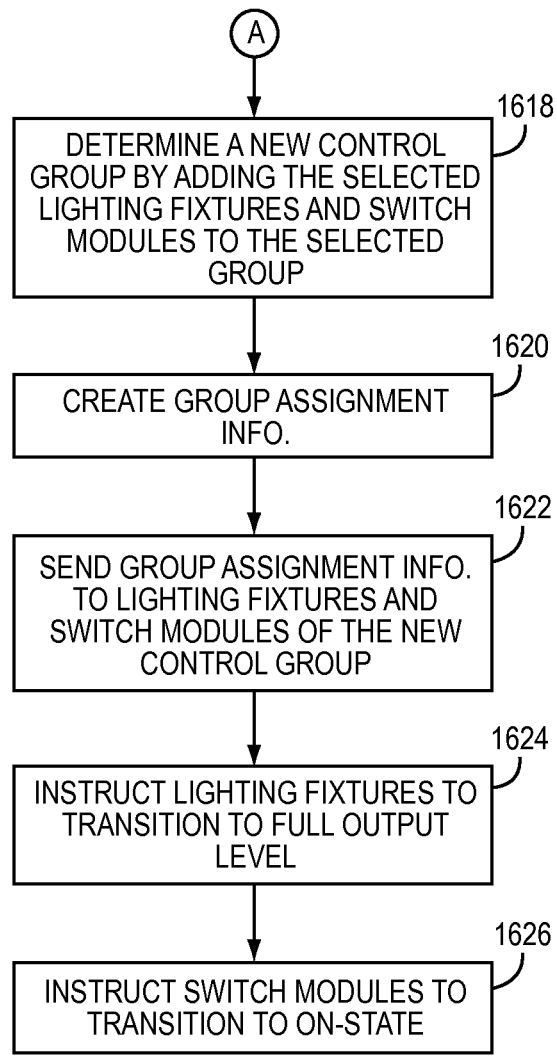

Turning now to FIGS. 54A and 54B, a process for adding a lighting fixture 10 or a switch module 110 to an existing control group is described, according to one embodiment. Initially, the user will select the appropriate mode on the commissioning tool 36 to accomplish this feature and use the commissioning tool 36 to effect switch module selection, as described above (step 1600). In particular, the user will choose a switch module 110 that is part of the control group to which other devices, such as a lighting fixture 10, switch module 110, or other network device, will be added. Once selected, the commissioning tool 36 may instruct the selected switch module 110 to visibly blink its LED 118L.

The commissioning tool 36 will identify the control group associated with the selected switch module 110 (step 1602) and instruct the lighting fixtures 10 in the selected control group to dim to a desired level (step 1604). Based on user input, the commissioning tool 36 will determine whether the user desires to add a lighting fixture 10 or a switch module 110 to the selected control group (step 1606). If a lighting fixture 10 is selected for adding to the selected control group, the commissioning tool 36 will effect lighting fixture selection for the lighting fixture 10 to be added to the selected control group (step 1608). Once selected, the commissioning tool 36 may instruct the selected lighting fixture 10 to dim to a desired level (step 1610). Next, the commissioning tool 36 will query the user to determine if there is a need to add another device to the selected control group (step 1612). If there is a desire to add another device to the selected control group, the process returns to step 1606.

If the user desires to add a switch module 110 (step 1606), the commissioning tool 36 will effect switch module selection for the particular switch module 110 to be added to the selected control group (step 1614). Once selected, the commissioning tool 36 may instruct the newly selected switch module 110 to visibly blink its LED 118L (step 1616). Again, the commissioning tool 36 will present the user with the opportunity to add yet another device (step 1612). This process is repeated until all devices that need to be added to the selected control group are selected.

Once all of the devices to be added to the selected control group are selected, the commissioning tool 36 will determine a new control group by adding the selected lighting fixtures 10 and switch modules 110 to the selected group (step 1618). The commissioning tool 36 will create group assignment information for the new control group (step 1620) and send the group assignment information to the lighting fixtures 10 and the switch modules 110 of the new control group (step 1622). Notably, the group assignment information is sent to all of the lighting fixtures 10 and switch modules 110 that were in the originally selected control group as well as the lighting fixtures 10 and switch modules 110 that were selected to be added to the selected control group. The commissioning tool 36 may then instruct the lighting fixtures 10 to transition to their full output level (step 1624) and instruct the switch modules 110 to transition to their on-state (step 1626).

Figure 55A:
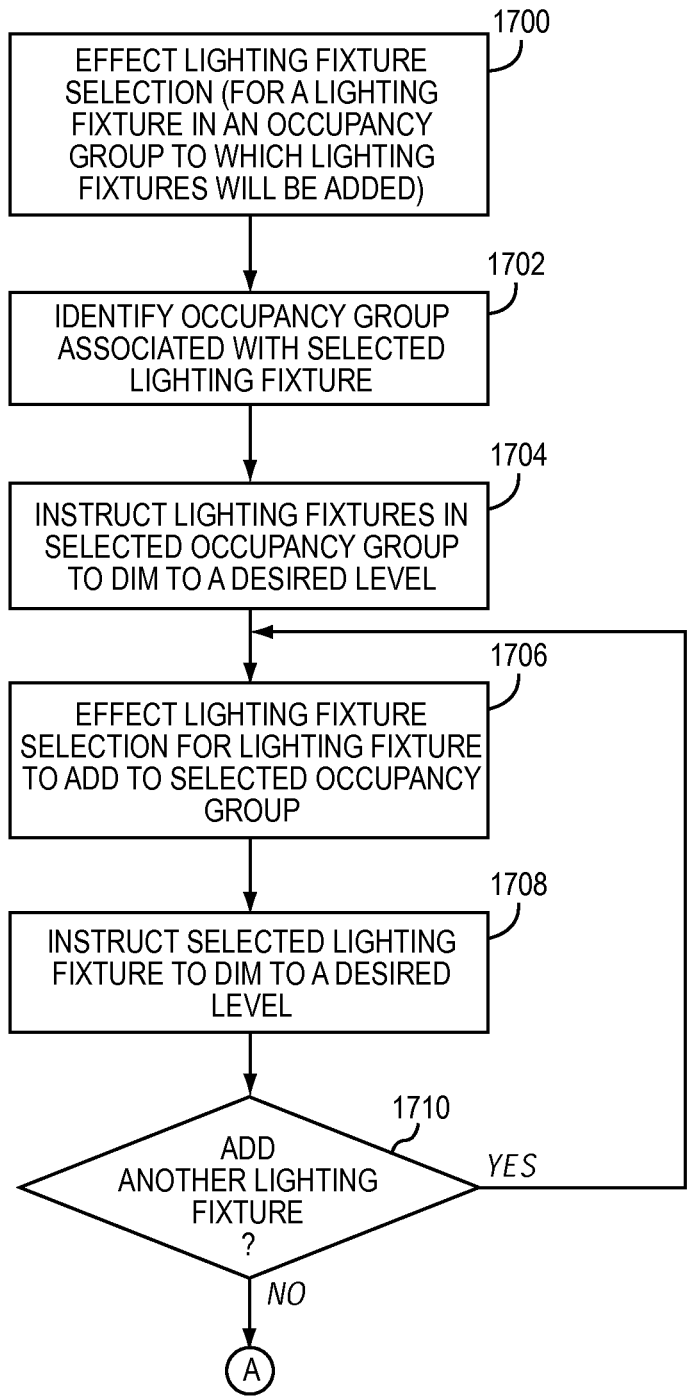
FIGS. 55A and 55B are a flow diagram illustrating a process for adding devices to an occupancy group according to one embodiment.
Figure 55B:
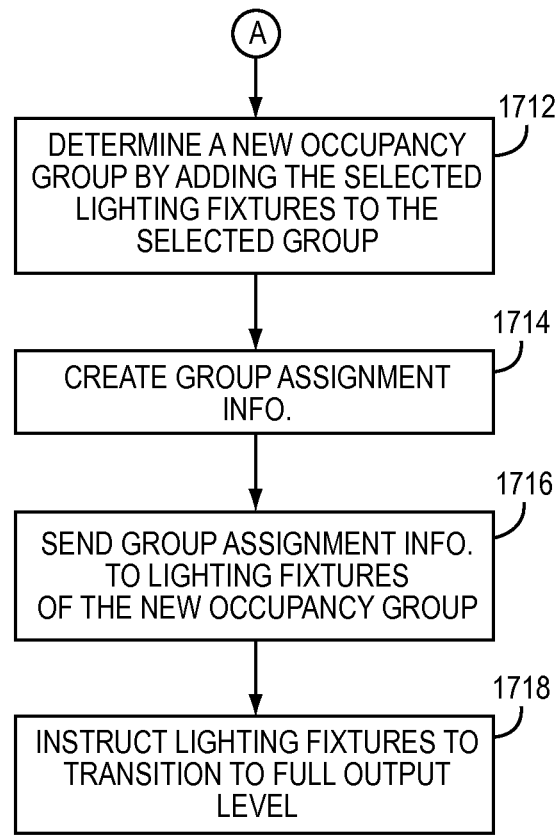

Turning now to FIGS. 55A and 55B, a process for adding a lighting fixture 10 to an existing occupancy group is described, according to one embodiment. Initially, the user will select the appropriate mode on the commissioning tool 36 to accomplish this feature and use the commissioning tool 36 to effect lighting fixture selection, as described above (step 1700). In particular, the user will choose a lighting fixture 10 that is part of the occupancy group to which other lighting fixtures 10 will be added.

The commissioning tool 36 will identify the occupancy group associated with the selected lighting fixture 10 (step 1702) and instruct the lighting fixtures 10 in the selected occupancy group to dim to a desired level (step 1704). Next, the commissioning tool 36 will effect lighting fixture selection for the lighting fixture 10 to be added to the selected occupancy group (step 1706). Once selected, the commissioning tool 36 may instruct the selected lighting fixture 10 to dim to a desired level (step 1708). Next, the commissioning tool 36 will query the user to determine if there is a need to add another lighting fixture 10 to the selected occupancy group (step 1710). If there is a desire to add another device to the selected occupancy group, the process returns to step 1706. This process is repeated until all lighting fixtures 10 that need to be added to the selected occupancy group are selected.

Once all of the lighting fixtures 10 to be added to the selected occupancy group are selected, the commissioning tool 36 will determine a new occupancy group by adding the selected lighting fixtures 10 to the selected occupancy group (step 1712). The commissioning tool 36 will create group assignment information for the new occupancy group (step 1714) and send the group assignment information to the lighting fixtures 10 of the new occupancy group (step 1716). Notably, the group assignment information is sent to all of the lighting fixtures 10 that were in the selected occupancy group as well as the lighting fixtures 10 that were selected to be added to the originally selected occupancy group. The commissioning tool 36 may then instruct the lighting fixtures 10 to transition to their full output level (step 1718).

Figure 56:
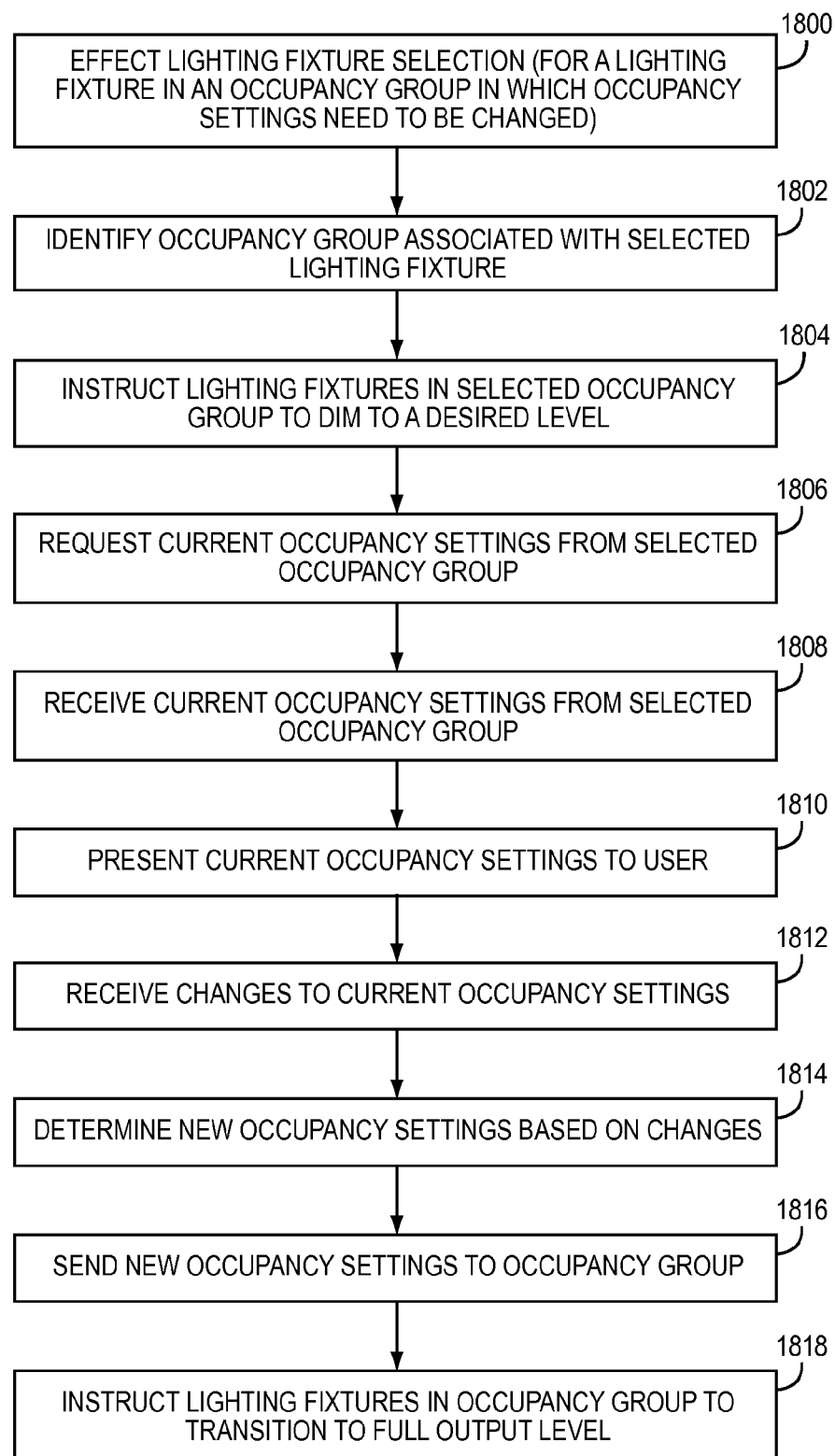
FIG. 56 is a flow diagram illustrating a process for changing settings in an occupancy group according to one embodiment.

With reference to FIG. 56, a process is illustrated for changing the occupancy settings in an occupancy group according to one embodiment of the disclosure. Initially, the commissioning tool 36 will effect lighting fixture selection for a lighting fixture 10 in an occupancy group in which occupancy settings need to be changed (step 1800). Once the lighting fixture 10 is selected, the commissioning tool 36 will identify the occupancy group associated with the selected lighting fixture 10 (step 1802), and instruct the lighting fixtures 10 in the selected occupancy group to dim to a desired level (step 1804).

The commissioning tool 36 will also request the current occupancy settings from the selected occupancy group (step 1806). This may be accomplished by obtaining the current occupancy settings from one, some, or all of the lighting fixtures 10 in the selected occupancy group. In response to the request, the commissioning tool 36 will receive the current occupancy settings from the selected occupancy group (step 1808).

Through a user interface provided by the commissioning tool 36, the current occupancy settings will be presented to the user (step 1810). The user will be able to review and change the current occupancy settings. The commissioning tool 36 will receive the changes to the current occupancy settings (step 1812) and determine new occupancy settings based on these changes (step 1814). The commissioning tool 36 will then send the new occupancy settings to the occupancy group (step 1816). Finally, the commissioning tool 36 will instruct the lighting fixtures 10 in the occupancy group to transition to their full output levels (step 1818).

As indicated above, the same or similar processes may be used to change any type of operational setting that is used for a defined group of lighting fixtures 10. In additional to occupancy settings, the commissioning tool 36 may be used to provide settings that dictate how the group of lighting fixtures handle and react to ambient light levels, input from associated switch modules 110, input from associated lighting fixtures 10, and the like. The commissioning tool 36 may be used to provide settings that dictate the intensity, dimming levels, color temperature, color, lighting schedules (i.e. defined periods for different lighting scenes or light levels), and the like for a given group during normal operation or in response to various input from associated lighting fixtures 10 or switch modules 110. The commissioning tool 36 may also act as a simple remote control to adjust any of these parameters in real time for an individual lighting fixture 10 or a group thereof. For example, the commissioning tool 36 may be used to directly change the color temperature, color, output level, on-off state, or the like for one or more selected lighting fixtures 10 or one or more groups thereof.

Figure 57:
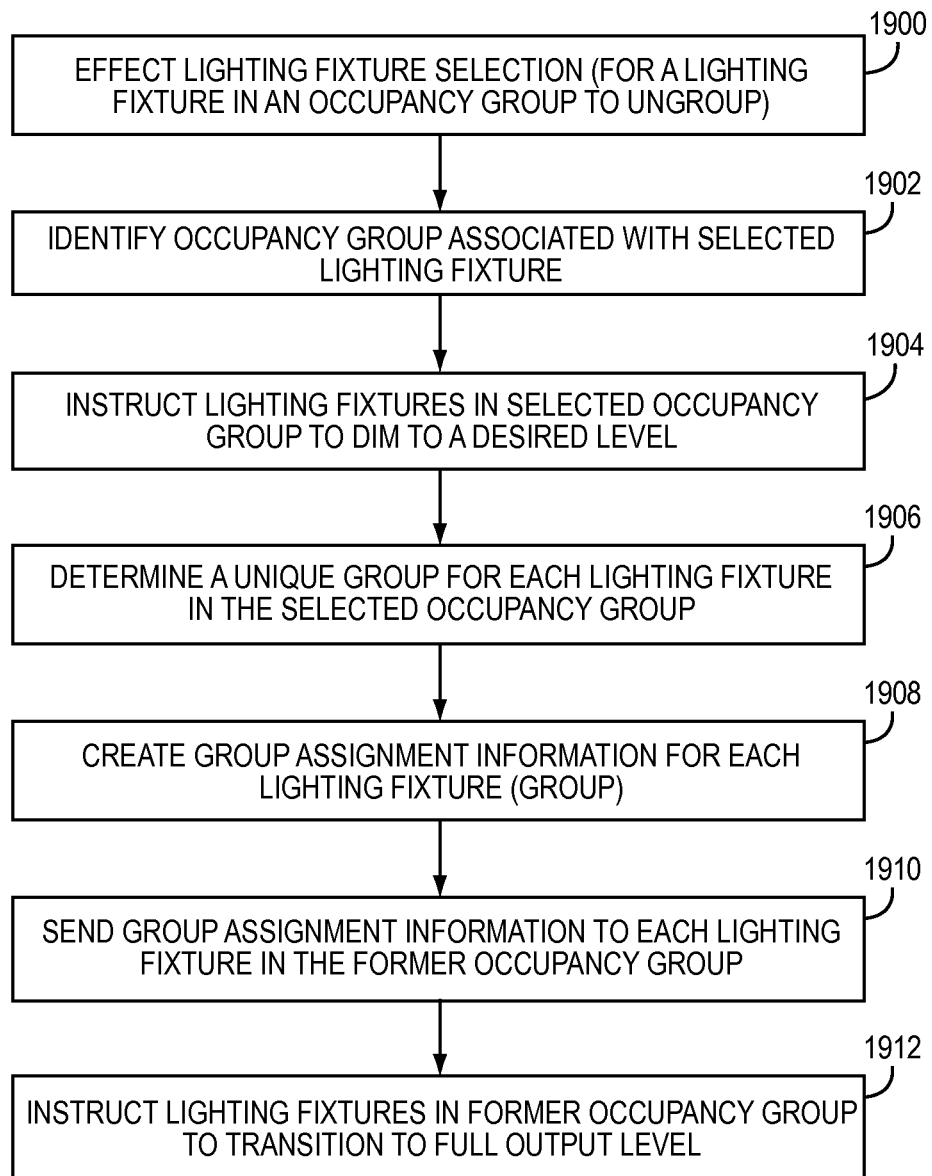
FIG. 57 is a flow diagram illustrating a process for ungrouping devices according to one embodiment.

With reference to FIG. 57, a process is illustrated for ungrouping an occupancy group according to one embodiment of the disclosure. Ungrouping an occupancy group will effectively have each of the lighting fixtures 10 in the occupancy group disassociate from another and operate independently, from an occupancy perspective. Ungrouping an occupancy group will not affect control grouping. Further, the process for ungrouping devices in a control group will take place in a similar fashion.

Initially, the commissioning tool 36 will effect lighting fixture selection for a lighting fixture 10 in an occupancy group to be ungrouped (step 1900). Once the lighting fixture 10 is selected, the commissioning tool 36 will identify the occupancy group associated with the selected lighting fixture 10 (step 1902), and instruct the lighting fixtures 10 in the selected occupancy group to dim to a desired level (step 1904).

At this point, the commissioning tool 36 essentially needs to provide a unique occupancy group to each lighting fixture 10 in the selected occupancy group. As such, the commissioning tool 36 will determine a unique group for each lighting fixture 10 in the selected occupancy group (step 1906) and create unique group assignment information for each lighting fixture 10, or group, in the selected occupancy group (step 1908). The commissioning tool 36 will then send the group assignment information to each lighting fixture in the former occupancy group (step 1910) and instruct the lighting fixtures in the former occupancy group to transition to their full output levels (step 1912).

In any of the above scenarios, the selection of a particular lighting fixture 10, switch module 110, control group, or occupancy group may be readily undone during the selection process. Once one of these devices or groups is selected, the commissioning tool 36 may provide the user an option to deselect the just selected device or group in case the user made an errant selection or changed her mind. If deselected, the deselected lighting fixture 10 or group of lighting fixtures 10 will be instructed to return to their full output level from the dimmed state, and the deselected switch module 110 or group of switch modules 110 will be instructed to return to their on-state by the commissioning tool 36.

Replacing or Adding Devices

The following discussions relate to exemplary processes for replacing a device, such as a lighting fixture 10 or switch module 110, in the lighting network, or adding a device to an existing lighting network. The processes for replacing or adding a device in the lighting network are very similar. The first few steps are required for replacing a device in the lighting network. After these first few steps, the process is essentially the same.

Initially, the commissioning tool 36 will have a table that identifies all of the devices that are in the lighting network. To replace one of the devices and the lighting network, the commissioning tool 36 will send out a request for all of the devices in the lighting network to respond, if the devices hear the request. The commissioning tool 36 will identify all of the devices that do not respond by comparing the responding devices to the list of devices in the table. The commissioning tool 36 will send reset commands to these non-responding devices, and perhaps remove the non-responding devices from the table. At this point, the process for adding a device to the lighting network and replacing a device in the lighting network is the same. Next, the commissioning tool 36 will instruct all of the devices in the lighting network to enter configuration mode, as described above.

Since the devices in the lighting network may communicate over different RF communication channels, the commissioning tool 36 will search all channels for new devices and pull these new devices into the network. During this process, the various devices in the lighting network may provide messages over the network, and the commissioning tool 36 may detect these messages. During this process, short addresses may be assigned to the various devices by the commissioning tool 36, and the commissioning tool 36 may identify a desired RF communications channel for the new and existing devices of the lighting network to use for communications.

The commissioning tool 36 will update its table to include any newly discovered devices. If no new devices were discovered, the process ends. If only switch modules 110 were discovered, the next few steps are skipped, as they are primarily relevant to lighting fixtures 10.

If new lighting fixtures 10 were detected, the commissioning tool 36 will instruct all of the lighting fixtures 10, including both newly detected and previously existing lighting fixtures 10, to perform a calibration routine for the ambient light sensors $S_A$. As described in detail above, this process may include having all of the lighting fixtures 10 in the lighting network simultaneously turn off (or to a desired dimming level), take an ambient light measurement while the lighting fixtures and are off, turn on (or to another desired dimming level), and take another ambient light measurement while the lighting fixtures are all on. Each lighting fixture 10 will use the difference between these ambient light measurements and calibrate itself to provide a desired light output based on the light contributions from itself, its peers, and potentially any ambient light provided by sources other than the lighting fixtures 10.

Next, the commissioning tool 36 will initiate a lightcast process to facilitate grouping the new lighting fixtures 10 with one another or with groups of devices that were already part of the lighting network. For each new lighting fixture 10, the commissioning tool 36 will instruct the new lighting fixture 10 to initiate a lightcast as a lightcaster, wherein the lighting fixture 10 will modulate its light output. For the other lighting fixtures 10, the commissioning tool 36 will instruct them to listen for the lightcast signal, and thus act as lightcatchers. The lightcatchers will monitor the relative strength of the lightcast signal and report back to the commissioning tool 36. As such, each new lighting fixture 10 will take its turn providing a lightcast signal, which is monitored and reported by the rest of the lighting fixtures 10 in the lighting network back to the commissioning tool 36.

The commissioning tool 36 may process the lightcast information that is reported back from the lightcatchers as follows. Initially, the commissioning tool 36 takes a first newly joined lighting fixture 10 and looks at the link strengths with all of the other newly joined lighting fixtures 10. The commissioning tool 36 temporarily creates a group that includes the first newly joined lighting fixture 10 and any other newly joined lighting fixtures 10 that have a sufficiently strong link strength with the first newly joined lighting fixture. As an example, assume that the newly joined lighting fixtures 10 include lighting fixtures A, B, C, D, and E. If the first newly joined lighting fixture A has a high link strength with other newly joined lighting fixtures C and D, but not with lighting fixtures B or E, a temporary group that includes lighting fixtures A, C, and D is created and stored in the commissioning tool 36.

Next, the commissioning tool 36 will analyze the link strengths that the other newly joined lighting fixtures C and D, which are in the temporary group, have with those newly joined lighting fixtures B and E, which are not in the temporary group. Any of the newly joined lighting fixtures B and E that has sufficiently strong link strength with any other newly joined lighting fixture in the temporary group is added to the temporary group. For example, if lighting fixture E has a sufficiently high link strength with lighting fixture D, lighting fixture E will be added to the temporary group. This occurs even if lighting fixture E does not have a sufficiently high link strength with the other lighting fixtures A and C of the temporary group. Assuming that lighting fixture B does not have a sufficiently highly link strength with any of the lighting fixtures A, C, D, or E, the temporary group will include lighting fixtures A, C, D, and E. Lighting fixture B may be assigned to its own unique temporary group.

For each temporary group, the link strengths between each of the lighting fixtures 10 in the temporary group and each of the original lighting fixtures 10 that were already part of the lighting network are analyzed. The strongest link between any of the newly joined lighting fixtures 10 and the original lighting fixtures 10 is identified, and if the link is sufficiently strong, all of the lighting fixtures 10 in the temporary group are merged into the group to which the original lighting fixtures 10 associated with the strongest link to the temporary group, belonged.

For example, assume that there is strong link strength between lighting fixture A of the temporary group (A, C, D, and E) and original lighting fixture F, which belongs to a group with lighting fixtures G and H. The commissioning tool 36 will add the lighting fixtures (A, C, D, and E) of the temporary group to the same occupancy and control group as lighting fixture F to create a new group that includes lighting fixtures A, C, D, E, F, G, and H. If the commissioning tool 36 does not find a sufficiently strong link strength between any lighting fixture 10 of the temporary group and an original lighting fixture 10, the lighting fixtures 10 of the temporary group are assigned to a new permanent group.

For all of the devices in the network, the commissioning tool 36 will determine whether the device should operate in the vacancy or occupancy mode, since the addition of a device may affect the mode of an original device and the newly joined devices will need a mode assignment. The commissioning tool 36 will then send out the grouping (control or occupancy group) and mode (vacancy, occupancy, etc.) assignments to the newly joined and original devices in the lighting network.

The commissioning tool 36 will identify all groups to which new devices were added. For such a group, the commissioning tool 36 will request the occupancy settings of an original device of the group, and provide these occupancy settings to the newly added devices of the group, in a fashion similar to that done in the above-described process for adding devices to a group. For any groups that are made up entirely of newly added devices, the commissioning tool 36 will send these devices default occupancy settings, in a fashion similar to that done in the above-described process for creating a new group.

The commissioning tool 36 will also identify any switch modules 110 that are not grouped with at least one lighting fixture 10, such as those that are not grouped with any other device or only grouped with other switch modules 110. For such switch modules 110, the commissioning tool 36 will identify these switch modules 110 to the user and instruct the user to address the situation by manually creating a new group, merging existing groups, adding devices to a group, or the like. Once complete, the commissioning tool 36 will instruct the devices of the lighting network to return to normal mode.

State Diagram

Figure 58:
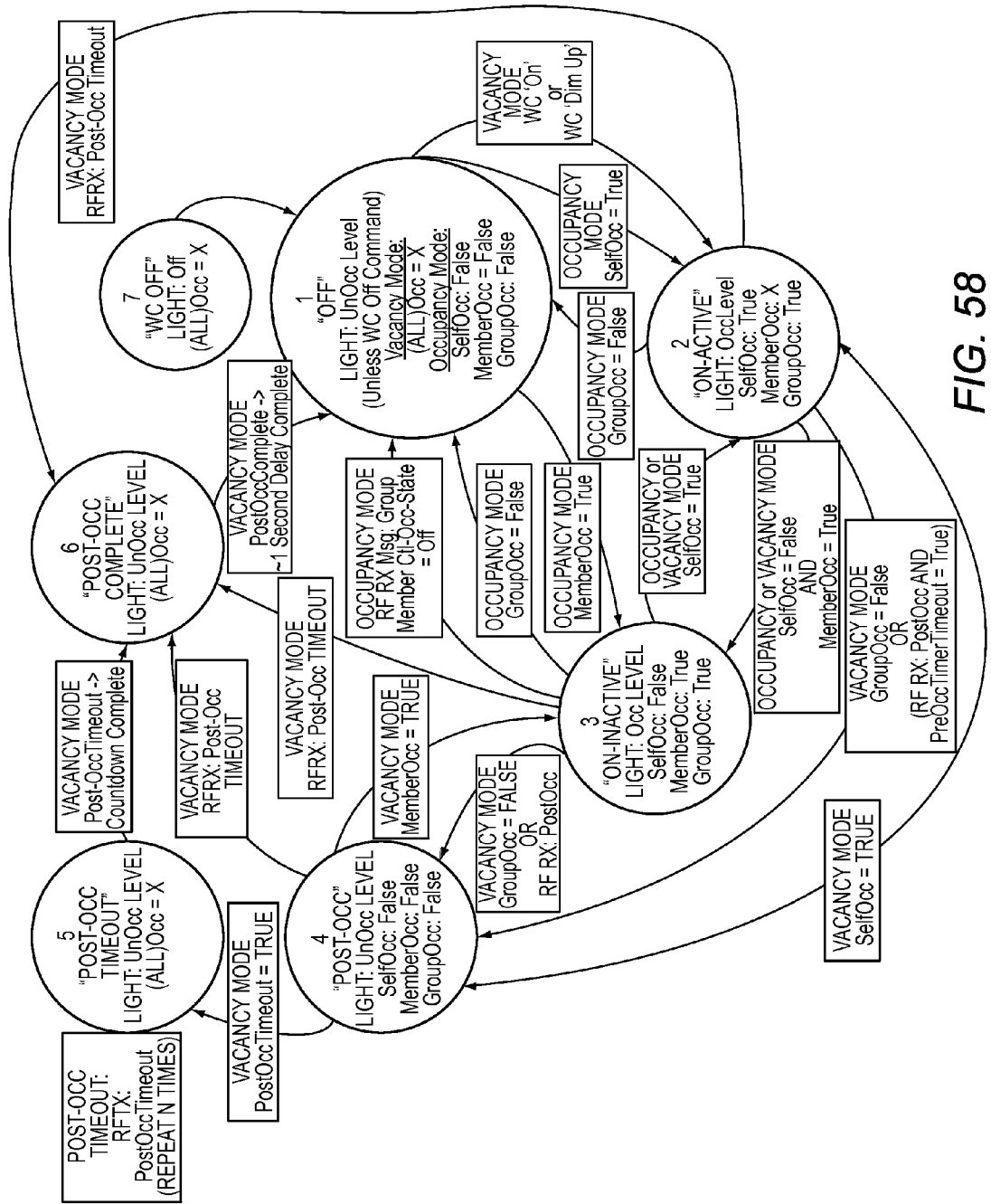
FIG. 58 is a state diagram illustrating operation of a lighting fixture in both occupancy and vacancy modes according to one embodiment.

The state diagram of FIG. 58 illustrates how an exemplary lighting fixture 10 will operate in both occupancy and vacancy modes. As illustrated, there are seven states, which are provided in circular boxes and numbered 1 through 7. These states include state 1—"Off" state 2—"On-Active" state 3—"On-Inactive" state 4—"Post-Occ" state 5—"Post-Occ Timeout" state 6—"Post-Occ Complete" and state 7—"WC Off." The acronym WC stands for 'wall controller' and may be any type of switch module 110, with or without dimmer controls. All states are used for vacancy mode. In certain embodiments, only the Off, On-Active, and On-Inactive states are used for occupancy mode.

In general, the Off state is state where the lighting fixture 10 has either been turned off or has transitioned to a predetermined light level after detecting a period where there is no (occupancy) activity. The On-Active state is a state in which the lighting fixture 10 is sensing activity with its own occupancy sensor $S_4$. The On-Inactive state is a state in which another member of the group is sensing activity. In vacancy mode, the PostOcc (post occupancy) state is a grace period that generally occurs after all of the group members stop sensing activity. The PostOcc Timeout state is a state that occurs after the grace period provided by the PostOcc state has expired. The Post Occ Timeout state is temporary and automatically transitions to the PostOcc Complete state, which is also temporary and leads back to the Off state. The WC Off state is a temporary state where the switch module 110 has turned off the lighting fixtures 10 of the group. The lighting fixture 10 will automatically transition from the WC Off state to the Off state. Further detail about these states and the transitions between the states is provided below.

In general, each lighting fixture 10 will monitor and update three occupancy fields: SelfOcc, MemberOcc, and GroupOcc. The lighting fixture 10 will update the SelfOcc field based on its own occupancy sensor readings. The lighting fixture 10 will update the MemberOcc field based on information received from other lighting fixtures 10 in the same control group when operating in vacancy mode or in the same occupancy group when operating in occupancy mode. The lighting fixture 10 will update the GroupOcc field by providing a logic OR of the SelfOcc and MemberOcc fields.

The lighting fixtures 10 send messages to each other to share occupancy related information. Certain messages are sent upon a state transition. Other messages are sent on a periodic basis as well as upon any state change, except when changing from WC Off to Off. The messages are generally broadcast and may include various fields including the sender's address, group ID, (occupancy) activity status of itself or the group, the current state, and the previous state. The group ID allows any lighting fixture 10 receiving the message to determine whether or not the message is intended for the group in which the lighting fixture 10 resides. The activity status indicates whether or not the light fixture 10 sending message is sensing activity or whether there is an indication that any other member of the group is sensing activity. The current state indicates the current state in the state diagram, and the previous state indicates the previous state in the state diagram since the last message or set of messages.

If there is a recent state change, the current state and the previous state fields will differ. If there has not been a recent state change, the current state and the previous state fields will be the same. As such, a lighting fixture 10 receiving the message can determine whether or not there has been a recent state change based on determining whether the current state and previous state fields are different for the incoming message.

Based on the activity status, the lighting fixture 10 that is receiving the message is able to determine whether one of its members is sensing activity or believes that another member is sensing activity. If a lighting fixture 10 determines that one of its members is sensing activity, the lighting fixture 10 will set the MemberOcc field as true, and vice versa. If a lighting fixture 10 is sensing activity with its own occupancy sensor, the lighting fixture 10 will set the SelfOcc field to true, and vice versa. The lighting fixture 10 will set the GroupOcc field based on providing a logic OR of the SelfOcc and MemberOcc fields.

In the state diagram of FIG. 58, the states will identify the values of the SelfOcc field, MemberOcc field, and GroupOcc field as well as a light field. The light field indicates the light level provided by the lighting fixture 10 at the various states. The light levels may take on one of three levels: an occupied level (OccLevel); an unoccupied level (UnOcc Level), and Off. The occupied level may be fully on or at any desired dimming level. The unoccupied level may be fully off or at any desired dimming level, which is less than the occupied level. The light level for the Off state is that of the unoccupied level. The light levels for the on-active state and the on-inactive state are at the occupied levels. The light levels for the Post-Occ, Post-Occ Timeout, and Post-Occ states are at the unoccupied levels. The light level for the WC Off state is off. While in On-Active or On-Inactive modes, devices in vacancy mode also respond to dim up/down commands, and will set their light level accordingly.

The following discussion will first describe the lighting fixture 10 as it operates in occupancy mode. A discussion of vacancy mode operation will follow the occupancy mode discussion. In occupancy mode, all of the lighting fixtures 10 that are in a particular group will turn on when any one member of the group senses activity. If none of the members are sensing activity, all of the lighting fixtures 10 that are in the group will turn off.

Assume that the lighting fixture 10 is operating in occupancy mode and is in the Off state. Notably, occupancy mode operation only employs the Off, On-Active, and On-Inactive states. In the Off state, the lighting fixture 10 is providing light at the unoccupied level and the SelfOcc, MemberOcc, and GroupOcc fields are all false. From the Off state, the lighting fixture 10 may transition to the On-Active and On-Inactive states. The rectangular boxes identify the information or activity required to trigger a state change.

The lighting fixture 10 will transition from the Off state to the On-Active state in response to determining that the SelfOcc field is true. The lighting level will be set to the occupied level. As noted, the SelfOcc field is set to true when the lighting fixture 10 senses activity with its own occupancy sensor $S_A$. Notably, the lighting fixture 10 will include an occupancy timer, which is reset any time the lighting fixture 10 senses activity via its occupancy sensor $S_A$. If the occupancy timer times out due to not sensing activity, the SelfOcc field is set to false.

Upon reaching the on-active state, the lighting fixture 10 will send out a message, which indicates a state change. In this example, the current state field is filled with the on-active state and the previous state field is filled with the Off state. Further, the lighting fixture 10 will change the GroupOcc field to true, because of the SelfOcc field is now true. While in the on-active state, the lighting fixture 10 can transition back to the Off state, if the GroupOcc field becomes false. The GroupOcc field will become false if the SelfOcc field becomes false when the MemberOcc field is also false. Transitioning back to the Off state will trigger the lighting fixture 10 to change the light level to the unoccupied level. Update messages will be broadcast to the members of the group.

The lighting fixture 10 will transition from the Off state to the On-Inactive state in response to determining that the MemberOcc field is true. The lighting level will be set to the occupied level. As noted, the MemberOcc field is set to true when the lighting fixture 10 receives a message that indicates one of its group members senses activity. Upon reaching the On-Inactive state, the lighting fixture 10 will send out a message indicating a state change. In this example, the current state field is filled with the On-Inactive state and the previous state field is filled with the Off state. Further, the lighting fixture 10 will change the GroupOcc field to true, because of the MemberOcc field is now true. While in the On-Inactive state, the lighting fixture 10 can transition back to the Off state if the GroupOcc field becomes false. The GroupOcc field will become false if the MemberOcc field becomes false when the SelfOcc is also false. Transitioning back to the Off state will trigger the lighting fixture 10 to change the light level to the unoccupied level. Update messages will be broadcast to the members of the group.

The lighting fixture 10 will transition from the On-Active state to the On-Inactive state if the SelfOcc field becomes false and the MemberOcc field becomes true. This means that the lighting fixture 10 is no longer sensing occupancy activity, but one of its group members is sensing occupancy activity. The lighting fixture 10 will transition from the On-Inactive state to the On-Active state if the SelfOcc field becomes true. Transitioning between these two states will not affect the light level, which will remain at the occupied level. Again, update messages will be broadcast to the members of the group in response to the state change.

For vacancy mode, the each lighting fixtures 10 in a control group will turn on in response to an 'on' or 'dim up' command from the switch module 110. Each lighting fixture 10 in the group will turn off after none of the members in the group have sensed activity for a while. After the lighting fixtures 10 in the group are turned off, a grace period is provided wherein any activity sensed by any of the lighting fixtures 10 in the group will trigger the lighting fixtures 10 to turn back on. If there is no activity sensed during the grace period by any of the lighting fixtures 10 in the group, all of the lighting fixtures 10 will turn off, wherein a command from the switch module 110 will be required to turn the lighting fixtures 10 in the group back on.

The exemplary state diagram is described for vacancy mode. Assume that the lighting fixture 10 is operating in vacancy mode and is in the Off state. Notably, vacancy mode operation employs all seven states. In the Off state, the lighting fixture 10 is providing light at the unoccupied level and does not care (X) about the state of the SelfOcc, MemberOcc, and GroupOcc fields. From the Off state, the lighting fixture 10 may transition to the On-Active and On-Inactive states.

The lighting fixture 10 will transition from the Off state to the On-Active state in response to receiving a WC 'On' or WC Dim Up' command from a switch module 110 that is in the same group as the lighting fixture 10. Regardless of whether the lighting fixture 10 is actually sensing activity, the SelfOcc field is initially forced to be true and the occupancy timer is reset. The lighting level will be set to the occupied level. As noted, the SelfOcc field is set to true if the lighting fixture 10 senses activity with its own occupancy sensor $S_A$. The occupancy timer is reset any time the lighting fixture 10 senses activity via its occupancy sensor $S_A$. If the occupancy timer times out due to not sensing activity, the SelfOcc field is set to false.

In certain embodiments, the switch module 110 is configured to send the WC 'On' or WC Dim Up' commands in a rapid succession of messages that essentially flood the lighting network. Each message may be the exact same message. For example, the message may be sent out four to ten times, wherein each message is spaced apart by around 100 ms. Repeating the message in a sequential burst helps to ensure that each member of the group will receive the message. For further assurance, any lighting fixture 10 or device in the group that receives a message with the WC 'On' or Dim Up' command from a switch module 110 may retransmit the message once.

Upon reaching the On-Active state, the lighting fixture 10 will send out a message indicating a state change. In this example, the current state field is filled with the On-Active state and the previous state field is filled with the Off state. Further, the lighting fixture 10 will change the GroupOcc field to true, because of the SelfOcc field is now true.

While in the On-Active state, the lighting fixture 10 can transition to the Post-Occ state, if the GroupOcc field becomes false. The GroupOcc field will become false if the SelfOcc field becomes false when the MemberOcc field is also false. Transitioning to the Post-Occ state will cause the light level to transition to the unoccupied level. Update messages will be sent to the members of the group.

Upon reaching the Post-Occ state, a post occupancy timer is set for a relatively short grace period, such as 15-30 seconds. If the post occupancy timer times out (PostOccTimeout=True), the lighting fixture moves to the Post-Occ Timeout state and the light level will remain at the unoccupied level. At this point, the lighting fixture will immediately send a rapid succession of post occupancy timeout messages (PostOccTimeout). Each message may be the exact same message. As with the WC 'On' and WC Dim' messages, the message may be sent out four to ten times, wherein each message is spaced apart by around 100 ms. Providing the message in a sequential burst helps to ensure that each member of the group will quickly receive the message. Any lighting fixture 10 or device that receives the post occupancy timeout message from a member will retransmit the message as well as quickly transition from the On-Active, On-Inactive, and Post-Occ states to the Post-Occ Complete state.

Once the Post-Occ Timeout state is reached, the lighting fixture 10 automatically moves to the Post-Occ Complete state after a set countdown (PostOccTimeout->Countdown Complete) takes place. The lighting level remains at the unoccupied level. As with the Post-Occ Timeout state, the Post-Occ Complete state does not care about the status of the SelfOcc, MemberOcc, and GroupOcc fields. After a relatively short delay, such as around one second, the lighting fixture 10 will automatically move to the Off state, wherein the process may repeat.

Returning to the Post-Occ state (state 4), the grace period provided by the post occupancy timer is described. As noted above, if the post occupancy timer expires, there is an automatic progression of states that lead to the Off state. However, if the lighting fixture 10 or another member in the group detects activity before the occupancy timer times out, the lighting fixture 10 will return to either the On-Active state or the On-Inactive state, respectively.

In particular, the lighting fixture 10 will transition from the Post-Occ state to the On-Active state if the SelfOcc field is changed to true in response to the lighting fixture 10 detecting activity prior to the post occupancy timer timing out. Similarly, the lighting fixture 10 will transition from the Post-Occ state to the On-Inactive state, if the MemberOcc field is changed to true in response to the lighting fixture 10 receiving a message indicating that a member of the group has detected occupancy prior to the post occupancy timer timing out. In either case, the lighting fixture 10 will transition from providing light at the unoccupied level to providing light at the occupied level.

Any lighting fixture 10 that receives a post occupancy timeout message from another member of the group will quickly transition from the On-Active, On-Inactive, and Post-Occ states to the Post-Occ Complete state. Receiving a post occupancy timeout message indicates that another member of the group has reached the Post-Occ state and its post occupancy timer has timed out. Once this happens for any member, that member will automatically progress toward the Off state and all other members will follow upon receiving a message indicating the same. This ensures that all of the members of the group turn off at substantially the same time and in a concerted fashion.

In either vacancy or occupancy mode, An 'Off' command from a switch module 110 or other device forces a transition from any state to the WC Off state. The WC Off state is a momentary state in which the lighting fixture 10 is turned off, such that the light level is set to off. After brief period in the WC Off state, the lighting fixture 10 will transition to the Off state. Notably, the 'WC Off' state forces the light level to transition to Off, while the "Off" state may leave the light level at a reduced level if they are not already off. This may occur when entering the 'Off' State from On-Active state or the On-Inactive state wherein the lighting fixture 10 provides light at the unoccupied level, which may be off or at a lower dimming level.

A few other miscellaneous transitions are now discussed. A transition from the On-Active state to the Post-Occ state may take place when the lighting fixture 10 receives a message from a member that indicates that the member's occupancy timer has timed out and the member has transitioned to the Post-Occ state (RF RX:PostOcc AND PreOccTimerTimeout=True). In this case, the member has transitioned to the Post-Occ state and the lighting fixture 10 should do so as well. The light level will transition from the occupied level to the unoccupied level. A transition from the On-Inactive state to the Off state may take place, generally in occupancy mode, if a message from a member indicates that the member has transitioned to the Off state from any other state (Group Member Ctl-Occ-State=Off). In this case, the member has transitioned to the Off state and the lighting fixture 10 should do so as well.

Also Dim Up and Dim Down commands are accepted from the switch modules 110 that are in the group while the lighting fixture is in the On-Active and On-Inactive states. From any state except the Off state, an Off command from any switch module 110 in the group will force the lighting fixtures 10 to transition to the Off state.

By operating in this manner, each lighting fixture 10 in the group will turn off after none of the members in the group have sensed activity for a while. After the lighting fixtures 10 in the group are turned off, a grace period is provided wherein any activity sensed by any of the lighting fixtures 10 in the group will trigger the lighting fixtures 10 to turn back on. If there is no activity sensed during the grace period by any of the lighting fixtures 10 in the group, all of the lighting fixtures 10 will turn off, wherein a command from the switch module 110 will be required to turn the lighting fixtures 10 in the group back on.

Overlapping Control and Occupancy Groups

Figure 59:
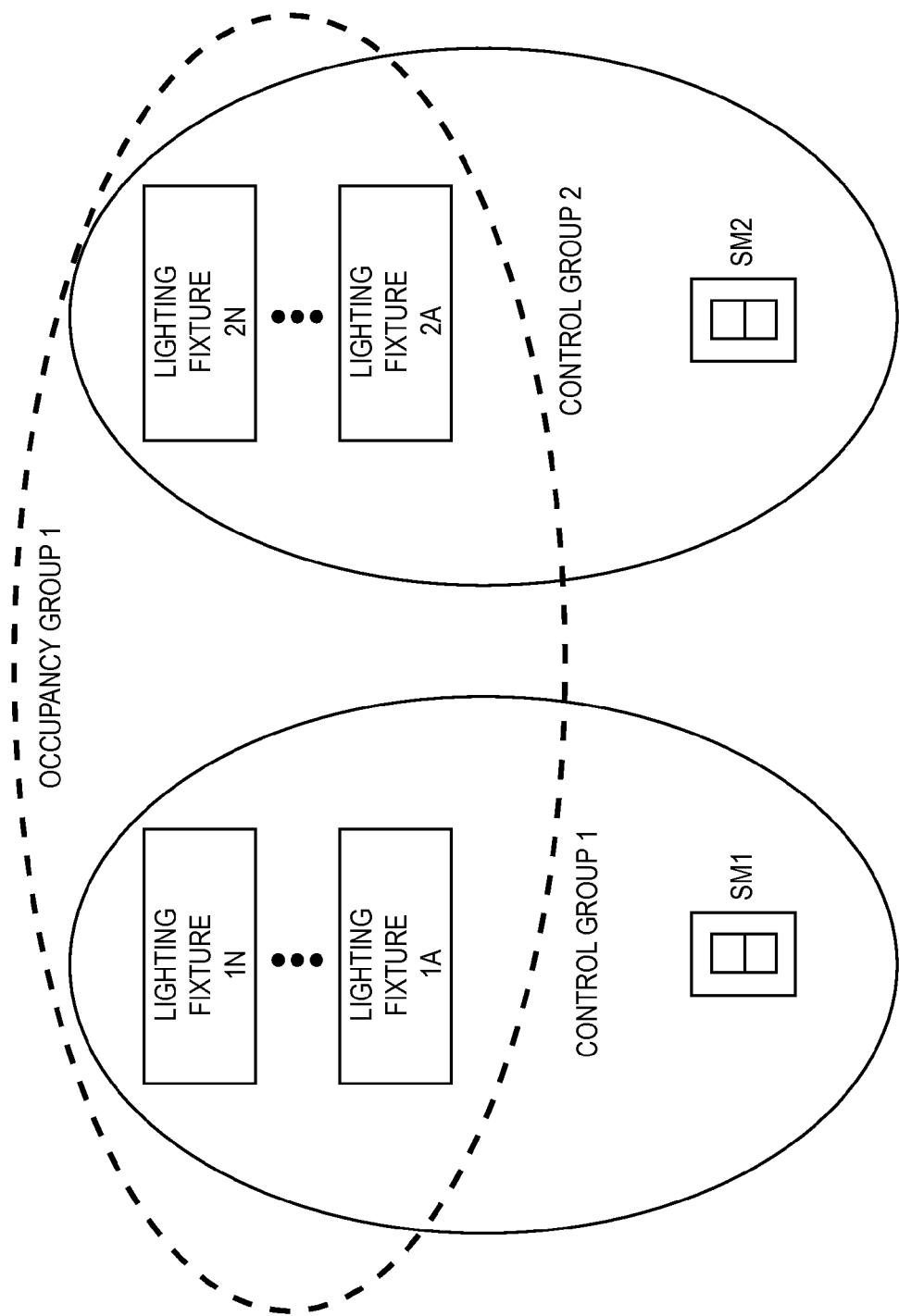
FIG. 59 is a diagram illustrating overlapping control and occupancy groups according to one embodiment.

In one embodiment, the lighting network may be configured such that one or more control groups overlay one or more occupancy groups, wherein any lighting fixtures 10 that are in different control groups reside in the same occupancy group. An illustrative example is shown in FIG. 59 and involves two control groups, referred to as control group 1 and control group 2. Control group 1 has one switch module SM 1, and one or more lighting fixtures 1A-1N. Similarly, control group 2 has one switch module SM 2, and one or more lighting fixtures 2A-2N. Overlaying part of both control groups 1 and 2 is a single occupancy group 1, which includes the lighting fixtures 1A-1N of control group 1 and lighting fixtures 2A-2N of control group 2. Switch module SM 1 and switch module SM 2 are not part of the occupancy group 1. For the following discussion, 'lighting fixture 1' generally refers to any lighting fixture 1A-1N in control group 1, and 'lighting fixture 2' generally refers to any lighting fixture 1A-1N in control group 1.

For vacancy mode operation in such an overlapping scenario, the lighting fixtures 1 or 2 can be turned on or off by the switch module SM 1 or SM 2 of the corresponding control group 1 or 2. In other words, lighting fixtures 1 of control group 1 are turned on and off by switch module SM 1. Switch module SM 2 has no impact on the operation of the lighting fixtures 1 of control group 1. Similarly, lighting fixtures 2 of control group 2 are turned on and off by switch module SM 2. Switch module SM 1 has no impact on the operation of the lighting fixtures 2 of control group 2. For this example, turning on or dimming up from an off state is considered turning on. The off state may include light output being off or at an unoccupied level.

If lighting fixtures 1 of control group 1 are turned on and the lighting fixtures 2 of control group 2 remain off, the lighting fixtures 1 of group 1 will stay on if any of the lighting fixtures 1 and 2 of the occupancy group 1 sense activity before the respective occupancy timers expire. Thus, even though the lighting fixtures 2 remain off, they will still monitor activity, reset their occupancy timers upon detecting activity, and share their occupancy information with each other as well as the lighting fixtures 1 of control group 1, because lighting fixtures 1 and 2 are part of occupancy group 1.

The same process of monitoring, sharing, and responding to activity for lighting fixtures 1 and 2 will continue if the lighting fixtures 2 are turned on by switch module SM 2. If lighting fixtures 1 are turned off by switch module SM 1, lighting fixtures 1 will turn off. However, the lighting fixtures 1 will still monitor activity and share occupancy information with all lighting fixtures 1 and 2 of the occupancy group, until the lighting fixtures 2 are turned off by the switch module SM 2 or turn off due to lack of activity and expiration of the grace period. In essence, the state of the switch module SM 1 or SM 2 will control the light output of the lighting fixtures 1 and 2; however, these lighting fixtures 1 and 2 may continue to monitor activity and share occupancy information with other lighting fixtures 1 and 2 that are in the same and different control groups 1 and 2 even if their light output is set to off or an unoccupied level by the switch modules 1 or 2.

If the corresponding switch module SM 1 or SM 2 is used to turn off the lighting fixtures 1 or 2, the lighting fixtures 1 and 2 will need to be turned back on by the corresponding switch module SM 1 or SM 2. Detection of an occupancy event will not trigger the lighting fixtures 1 and 2 to turn back on. If the lighting fixtures 1 and 2 turn off due to lack of activity and expiration of the grace period, the lighting fixtures 1 and 2 will need to be turned back on by the corresponding switch module SM 1 or SM 2. However, if activity is detected prior to the grace period expiring, the lighting fixtures 1 and 2 may turn back on if any member of the occupancy group (lighting fixtures 1 or 2) detects activity (assuming they have not been turned off by the corresponding switch module SM 1 and SM2).

The following provides the basic rules for operation in this situation:

1. An 'On' or Dim Up' command from a switch module 110 turns on the lighting fixtures 10 that are in the associated control group regardless of (occupancy) activity.
2. The 'On' or Dim Up' command from a switch module 110 also enables occupancy based operation of the lighting fixtures 10 that are in the associated control group, until the post occupancy grace period has expired.
3. An 'Off' command from a switch module SM 1 or SM 2 turns the lighting fixtures 10 that are in the associated control group off and disables occupancy based operation of the lighting fixtures in the associated control group.
4. Once turned on by a switch module 110, the lighting fixtures 10 in the associated control group will stay on as long as the lighting fixture 10 itself or any member of the occupancy group senses activity and the lighting fixtures 10 are not turned off by the switch module 110.
5. All of the lighting fixtures 10 in the occupancy group will turn off as a group after all of the members in the occupancy group 1 fail to detect activity.

Another mode that is possible is vacancy-retriggerable mode, which is a hybrid of the vacancy and occupancy modes. Vacancy-retriggerable mode works similarly to occupancy mode. Once an initial on command is received from the switch module 110, the lighting fixtures 10 will effectively operate in occupancy mode until an off command is received from the switch module 110. As such, the lighting fixtures 10 in the occupancy group will indefinitely turn on and off (such as that described for the occupancy mode state machine) based on activity within the group after an on command is received and until an off command is received. This mode essentially allows occupancy mode to be selected by the switch module 110.

In certain embodiments, some lighting fixtures 10 within a group may be configured for occupancy mode, while other lighting fixtures 10 within the same group may be configured for vacancy mode. The main behavioral difference is that, when no occupancy is detected and occupancy timeout occurs, vacancy mode devices will transition to "Post-Occ" while occupancy mode devices will transition to "Off."

Those skilled in the art will recognize improvements and modifications to the embodiments of the present disclosure. Further, all of the processes and functionality described herein may be incorporated as software instructions on a computer readable medium, such as a memory, solid state drives, hard drives, optical disks and the like, and may be downloaded from a remote device to the lighting fixtures or handheld devices through wired or wireless means. All such improvements and modifications are considered within the scope of the concepts disclosed herein.

The invention claimed is:
1. A handheld device comprising:
a light source;
a communication interface configured to wirelessly communicate with a plurality of lighting fixtures; and
circuitry configured to
provide a light signal via the light source;
receive light level information from the plurality of lighting fixtures via the communication interface, wherein the light level information for a given lighting fixture of the plurality of lighting fixtures relates to a light level at which the light signal was received at the given lighting fixture; and effect selection of a first light fixture in a first group of lighting fixtures based on the light level information via the communication interface, wherein the light signal is visible and the light level information is received via radio frequency communication by the communication interface;

identify the first group of lighting fixtures based on the light level information from the first lighting fixtures;

determine new settings for the first group of lighting fixtures; and send the new settings to each of the first group of lighting fixtures via the communication interface, wherein the first group of lighting fixtures includes a defined plurality of lighting fixtures that are associated to operate in a coordinated manner.

2. The handheld device of claim 1 wherein the circuitry is further configured to receive current settings for the first group of lighting fixtures from the first lighting fixture prior to determining the new settings.

3. The handheld device of claim 2 wherein the circuitry is further configured to send a request for the current settings for the first group of lighting fixtures to the first lighting fixture such that the current settings are received in response to the request.

4. The handheld device of claim 2 further comprising a user interface and wherein the circuitry is further configured to present the current settings to a user and receive input from the user such that the new settings are based at least in part on the input from the user.

5. The handheld device of claim 1 wherein the circuitry is further configured to, upon selection of the first lighting fixture, instruct the first group of lighting fixtures to change its light output to provide human perceptible feedback indicative of being selected.

6. The handheld device of claim 1 wherein the new settings dictate how each lighting fixture in the first group of lighting fixtures responds to occupancy events that are detected by at least one lighting fixture in the first group of lighting fixtures.

7. The handheld device of claim 1 wherein the new settings dictate how each lighting fixture in the first group of lighting fixtures responds to ambient light level measurements that are detected by at least one lighting fixture in the first group of lighting fixtures.

8. The handheld device of claim 1 wherein the new settings dictate a color temperature of a light output for each lighting fixture in the first group of lighting fixtures.

9. The handheld device of claim 1 wherein the new settings dictate a color of a light output for each lighting fixture in the first group of lighting fixtures.

10. The handheld device of claim 1 wherein the new settings dictate a light output level for each lighting fixture in the first group of lighting fixtures.

11. A non-transitory computer readable medium comprising instructions for control circuitry of a handheld device to:

provide a light signal via a light source of the handheld device;

receive light level information from a plurality of lighting fixtures via a communication interface, wherein the light level information for a given lighting fixture of the plurality of lighting fixtures relates to a light level at which the light signal was received at the given lighting fixture; and effect selection of a first lighting fixture in a first group of lighting fixtures based on the light level information via the communication interface, wherein the light signal is visible and the light level information is received via radio frequency communication by the communication interface;

identify the first group of lighting fixtures based on the light level information from the first lighting fixture;

determine new settings for the first group of lighting fixtures; and send the new settings to each of the first group of lighting fixtures via the communication interface, wherein the first group of lighting fixtures includes a defined plurality of lighting fixtures that are associated to operate in a coordinated manner.

12. The non-transitory computer readable medium of claim 11 wherein the instructions are further configured to cause the control circuitry to receive current settings for the first group of lighting fixtures from the first lighting fixture prior to determining the new settings.

13. The non-transitory computer readable medium of claim 12 wherein the instructions are further configured to cause the control circuitry to send a request for the current settings for the first group of lighting fixtures to the first lighting fixture such that the current settings are received in response to the request.

14. The non-transitory computer readable medium of claim 12 wherein the instructions are further configured to cause the control circuitry to present the current settings to a user and receive input from the user such that the new settings are based at least in part on the input from the user.

15. The non-transitory computer readable medium of claim 11 wherein the instructions are further configured to cause the control circuitry to, upon selection of the first lighting fixture, instruct the first group of lighting fixtures to change its light output to provide human perceptible feedback indicative of being selected.

16. The non-transitory computer readable medium of claim 11 wherein the new settings dictate how each lighting fixture in the first group of lighting fixtures responds to occupancy events that are detected by at least one lighting fixture in the first group of lighting fixtures.

17. The non-transitory computer readable medium of claim 11 wherein the new settings dictate how each lighting fixture in the first group of lighting fixtures responds to ambient light level measurements that are detected by at least one lighting fixture in the first group of lighting fixtures.

18. The non-transitory computer readable medium of claim 11 wherein the new settings dictate a color temperature of a light output for each lighting fixture in the first group of lighting fixtures.

19. The non-transitory computer readable medium of claim 11 wherein the new settings dictate a color of a light output for each lighting fixture in the first group of lighting fixtures.

20. The non-transitory computer readable medium of claim 11 wherein the new settings dictate a light output level for each lighting fixture in the first group of lighting fixtures.

* * * * *

UNITED STATES PATENT AND TRADEMARK OFFICE
CERTIFICATE OF CORRECTION

PATENT NO. : 9,723,696 B2
APPLICATION NO. : 14/498219
DATED : August 1, 2017
INVENTOR(S) : Brian Carrigan et al.

It is certified that error appears in the above-identified patent and that said Letters Patent is hereby corrected as shown below:

In the Specification

In Column 1, Line 28, replace "Ser. No. 14/498,147filed Sep. 26," with --Ser. No. 14/498,147 filed Sep. 26,--.

In Column 27, Line 30, replace "Internally, ThE" with --Internally, The--.

In Column 42, Line 44, replace "address (Ac)" with --address ($A_c$)--.

In Column 60, Line 7, replace "defined IEEE 802.3 af PoE" with --defined IEEE 802.3af PoE--.

In Column 81, Line 9, replace "control group 1" with --control group 2--.

In the Claims

In Column 82, Line 67, replace "lighting fixture; and" with --lighting fixture and includes identifier information for the given lighting fixture; and--.

In Column 83, Line 1, replace "a first light fixture" with --a first lighting fixture--.

In Column 83, Line 4, replace "information is received" with --information along with the identifier information is received--.

In Column 83, Line 8, replace "lighting fixtures;" with --lighting fixture;--.

In Column 83, Line 67, replace "fixture; and" with --fixture and includes identifier information for the given lighting fixture; and--.

In Column 84, Line 4, replace "information is received" with --information along with the identifier information is received--.

Signed and Sealed this
Twentieth Day of August, 2019

Andrei Iancu
*Director of the United States Patent and Trademark Office*